(12) United States Patent
Kawamura et al.

(10) Patent No.: US 10,297,761 B2
(45) Date of Patent: May 21, 2019

(54) ORGANIC ELECTROLUMINESCENT ELEMENT

(71) Applicant: Idemitsu Kosan Co., Ltd., Tokyo (JP)

(72) Inventors: Masahiro Kawamura, Sodegaura-shi (JP); Hitoshi Kuma, Sodegaura-shi (JP); Toshinari Ogiwara, Sodegaura-shi (JP); Satomi Tasaki, Sodegaura-shi (JP); Yumiko Mizuki, Sodegaura-shi (JP); Kazuki Nishimura, Sodegaura-shi (JP); Tomoharu Hayama, Sodegaura-shi (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 269 days.

(21) Appl. No.: 14/650,821

(22) PCT Filed: Dec. 10, 2013

(86) PCT No.: PCT/JP2013/083093
§ 371 (c)(1),
(2) Date: Jun. 9, 2015

(87) PCT Pub. No.: WO2014/092083
PCT Pub. Date: Jun. 19, 2014

(65) Prior Publication Data
US 2016/0197286 A1    Jul. 7, 2016

(30) Foreign Application Priority Data

Dec. 10, 2012  (JP) ................................ 2012-269850
Mar. 15, 2013  (JP) ................................ 2013-054058

(51) Int. Cl.
*H01L 51/00* (2006.01)
*C09K 11/06* (2006.01)
(Continued)

(52) U.S. Cl.
CPC ........ *H01L 51/0067* (2013.01); *C09K 11/025* (2013.01); *C09K 11/06* (2013.01);
(Continued)

(58) Field of Classification Search
CPC ............... H01L 51/0067; H01L 51/005; H01L 51/0071–51/0073; H01L 51/5012;
(Continued)

(56) References Cited

U.S. PATENT DOCUMENTS

2012/0068170 A1* 3/2012 Pflumm ............... C07D 209/82
257/40
2012/0080670 A1    4/2012 Park et al.
(Continued)

FOREIGN PATENT DOCUMENTS

WO    WO 2011/070963 A1    6/2011
WO    WO 2011/139055 A2    11/2011
WO    WO 2012/133188 A1    10/2012

OTHER PUBLICATIONS

Chihaya Adachi, Yuki Hando-tai no Debaisu Bussei (Device Physics of Organic Semiconductors), Kodansha, pp. 261-262 (2012).
(Continued)

*Primary Examiner* — Ruiyun Zhang
(74) *Attorney, Agent, or Firm* — Oblon, McClelland, Maier & Neustadt, L.L.P.

(57) ABSTRACT

An organic electroluminescence device includes: an anode; a cathode; and a single- or multi-layer organic layer interposed between the anode and the cathode. The organic layer includes at least one emitting layer containing a dopant material represented by a formula below. In the formula, $X_1$ to $X_5$ each independently represent $CR_1$ or a nitrogen atom, at least one of $X_1$ to $X_5$ is a nitrogen atom, $L_1$ represents a divalent aromatic hydrocarbon group or a divalent hetero-
(Continued)

cyclic group, A and B each independently represents a cyclic structure, at least one of the cyclic structure A and the cyclic structure B has a substituent, and $R_1$ represents an aryl group, alkyl group or the like.

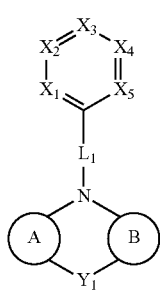

(1)

51 Claims, 3 Drawing Sheets

(51) Int. Cl.
H05B 33/14 (2006.01)
C09K 11/02 (2006.01)
H01L 51/50 (2006.01)

(52) U.S. Cl.
CPC ........ *H01L 51/005* (2013.01); *H01L 51/0071* (2013.01); *H01L 51/0072* (2013.01); *H05B 33/14* (2013.01); *C09K 2211/1007* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1088* (2013.01); *C09K 2211/1092* (2013.01); *H01L 51/0073* (2013.01); *H01L 51/5012* (2013.01)

(58) Field of Classification Search
CPC ... H01L 51/5024; C09K 11/06; C09K 11/025; C09K 2011/1007; C09K 2011/1029; C09K 2011/1033; C09K 2011/1044; C09K 2011/1059; C09K 2011/1088; C09K 2011/1092
USPC ............ 428/690; 257/40, E51.017, E51.035; 252/301.16, 301.26, 301.31
See application file for complete search history.

(56) References Cited

U.S. PATENT DOCUMENTS

2012/0241732 A1   9/2012   Endo et al.
2012/0248968 A1   10/2012  Ogiwara et al.
2013/0056720 A1   3/2013   Kim et al.

OTHER PUBLICATIONS

Hiroyuki Tanaka et al., "Efficient green thermally activated delayed fluorescence (TADF) from a phenoxazine-triphenyltriazine (PXZ-TRZ) derivative," Chem. Commun., vol. 48, pp. 11392-11394 (2012).
Chihaya Adachi, "Expression of highly-efficient thermally-activated delayed-fluorescence and application thereof to OLED," Organic EL Symposium, proceeding for the tenth meeting held at the National Museum of Emerging Science and Innovation (Mirai CAN Hall), S2-5, pp. 11-12 (Jun. 17-18, 2010).
Katumi Tokumaru, "Organic Photochemical Reaction Theory," pp. 79-82 (1973).
Hikarikagaku no Sekai, "Measurement of Fluorescent Spectrum and Phosphorescent Spectrum," The World of Photochemistry, pp. 50-57 (1993).
International Search Report issued in related International Patent Application No. PCT/JP2013/083093, completed Mar. 3, 2014.
Translation of the International Preliminary Report on Patentability and the Written Opinion of the International Searching Authority corresponding to Application No. PCT/JP2013/083093, dated Jun. 16, 2015, 5 pages.

* cited by examiner

ORGANIC ELECTROLUMINESCENT ELEMENT

CROSS-REFERENCE TO RELATED APPLICATIONS

This application is a National Stage of PCT/JP2013/083093, which was filed on Dec. 10, 2013. This application is based upon and claims the benefit of priority to Japanese Application No. 2012-269850, which was filed on Dec. 10, 2012, and to Japanese Application No. 2013-054058, which was filed on Mar. 15, 2013.

TECHNICAL FIELD

The present invention relates to an organic electroluminescence device.

BACKGROUND ART

When voltage is applied to an organic electroluminescence device (occasionally simply referred to as an organic EL device hereinafter), holes and electrons are injected into an emitting layer respectively from an anode and a cathode. The injected holes and electrons are recombined in the emitting layer to provide excitons. According to the electron spin statistics theory, singlet excitons and triplet excitons are generated at a ratio of 25%:75%. An organic EL device may be classified by the emission principle into a fluorescent EL device and a phosphorescent EL device. The internal quantum efficiency of a fluorescent EL device, which uses emission caused by singlet excitons, is supposed to be 25% at a maximum. In contrast, it is known than the internal quantum efficiency of a phosphorescent EL device, which uses emission caused by triplet excitons, can be improved up to 100% as long as intersystem crossing from singlet excitons is efficiently achieved.

A technology for extending a lifetime of a fluorescent organic EL device has recently been developed and applied to full-color displays of a mobile phone, TV and the like. However, a fluorescent EL device is required to be improved in efficiency.

In view of the above, a highly efficient fluorescent organic EL device using delayed fluorescence has been suggested and developed. For instance, an organic EL device using a triplet-triplet fusion (TTF) mechanism, which is one of mechanisms of delayed fluorescence, is suggested. The TTF mechanism uses such a phenomenon that two triplet excitons collide with each other to generate triplet excitons.

Theoretically, the delayed fluorescence based on the TTF mechanism is supposed to improve the internal quantum efficiency of fluorescence emission up to 40%. However, fluorescence emission is still required to be improved in efficiency as compared with phosphorescence emission. Accordingly, in order to improve the internal quantum efficiency, a device using another delayed fluorescence mechanism has been studied.

For instance, a thermally activated delayed fluorescence (TADF) mechanism has been studied. The TADF mechanism uses such a phenomenon that inverse intersystem crossing from triplet excitons to singlet excitons occurs when a material having a small energy difference between singlet energy level and triplet energy level is used. As for thermally activated delayed fluorescence, refer to, for instance, "ADACHI, Chihaya, ed. (Mar. 22, 2012), *Yuki Hando-tai no Debaisu Bussei (Device Physics of Organic Semiconductors)*, Kodansha, pp. 261-262."

For instance, Patent Literature 1 discloses an organic EL device using the TADF mechanism.

Specifically, Patent Literature 1 discloses an organic electroluminescence device in which an emitting layer contains an organic luminescent material emitting fluorescence and delayed fluorescence. According to Patent Literature 1, the organic luminescent material emitting delayed fluorescence may be a compound in which an indolocarbazole ring is bonded to a nitrogen-containing heterocycle. Especially, it is described that a compound having an energy difference ($\Delta E$) between singlet energy and triplet energy of 0.2 eV or less ($\Delta E$ corresponds to $\Delta ST$ described above) is preferable. When such a compound having a small $\Delta ST$ is used, inverse intersystem crossing from a triplet energy level to a singlet energy level is caused by a heat energy. Theoretically, the delayed fluorescence based on the TADF mechanism is supposed to improve the internal quantum efficiency of fluorescent emission up to 100%.

Non-patent Literature 1 discloses that a compound containing an electron donating unit in the form of phenoxazine and an electron accepting unit in the form of 2,4,6-triphenyl-1,3,5-triazine enables efficient luminescence based on the TADF mechanism.

CITATION LIST

Patent Literature(s)

Patent Literature 1: International Publication No. WO2011/070963

Non-Patent Literature(s)

Non-patent Literature 1: ADACHI, Chihaya, et al. (2012), *Efficient green thermally activated delayed fluorescence (TADF) from a phenoxazine-triphenylazine(PXZ-TRZ) derivative*, ChemComm, DOI: 10.1039/c2cc36237f

SUMMARY OF THE INVENTION

Problems to be Solved by the Invention

There still has been a demand for an organic EL device capable of more highly efficient luminescence than the organic EL device (organic electroluminescence device) of Patent Literature 1 and the OLED (organic light-emitting diode or organic electroluminescence diode) of Non-patent Literature 1.

An object of the invention is to provide an organic electroluminescence device with improved luminous efficiency.

Means for Solving the Problems

According to a first aspect of the invention, an organic electroluminescence device includes: an anode; a cathode; and a single- or multi-layer organic layer interposed between the anode and the cathode, the organic layer including at least an emitting layer, the emitting layer including a delayed fluorescence emitter represented by a formula (3) below.

[Formula 1]

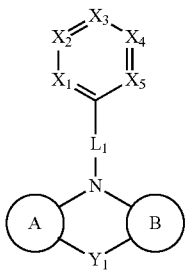

(1)

In the formula (1):

$X_1$ to $X_5$ each independently represent $CR_1$ or a nitrogen atom and at least one of $X_1$ to $X_5$ is a nitrogen atom;

$L_1$ represents a substituted or unsubstituted divalent aromatic hydrocarbon group; when A and B each independently represent a cyclic structure, at least one of the cyclic structure A and the cyclic structure B has a substituent, and when at least one of the cyclic structure A and the cyclic structure B has a plurality of substituents, adjacent ones of the substituents may form a ring;

$Y_1$ is a single bond, $CR_2R_3$, $SiR_4R_5$ or $GeR_6R_7$; and $R_1$ to $R_7$ each independently represent a hydrogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

According to a second aspect of the invention, an organic electroluminescence device includes: an anode; a cathode; and a single- or multi-layer organic layer interposed between the anode and the cathode, the organic layer including at least an emitting layer, the emitting layer including a compound represented by a formula (2) below, an emission from which is a maximum emission component of an emission from the organic electroluminescence device.

[Formula 2]

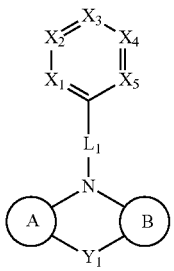

(2)

In the formula (2):

$X_1$ to $X_5$ each independently represent $CR_1$ or a nitrogen atom and at least one of $X_1$ to $X_5$ is a nitrogen atom;

$L_1$ represents a substituted or unsubstituted divalent aromatic hydrocarbon group;

when A and B each independently represent a cyclic structure, at least one of the cyclic structure A and the cyclic structure B has a substituent, and when at least one of A and B has a plurality of substituents, adjacent ones of the substituents may form a ring;

$Y_1$ is a single bond, $CR_2R_3$, $SiR_4R_5$ or $GeR_6R_7$; and $R_1$ to $R_7$ each independently represent the same as $R_1$ to $R_7$ in the formula (1).

According to a third aspect of the invention, an organic electroluminescence device includes: an anode; a cathode; and a single- or multi-layer organic layer interposed between the anode and the cathode, the organic layer including at least an emitting layer, the emitting layer including a dopant material represented by a formula (1) below.

[Formula 3]

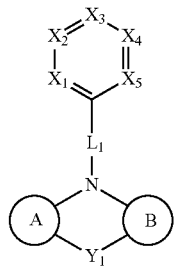

(3)

In the formula (3):

$X_1$ to $X_5$ each independently represent $CR_1$ or a nitrogen atom and at least one of $X_1$ to $X_5$ is a nitrogen atom;

$L_1$ represents a substituted or unsubstituted divalent aromatic hydrocarbon group;

when A and B each independently represent a cyclic structure, at least one of the cyclic structure A and the cyclic structure B has a substituent, and when at least one of A and B has a plurality of substituents, adjacent ones of the substituents may form a ring;

$Y_1$ is a single bond, $CR_2R_3$, $SiR_4R_5$ or $GeR_6R_7$; and $R_1$ to $R_7$ each independently represent the same as $R_1$ to $R_7$ in the formula (1).

The organic electroluminescence device of the above aspect(s) can exhibit an improved luminous efficiency.

DESCRIPTION OF EMBODIMENTS

Figure 1:
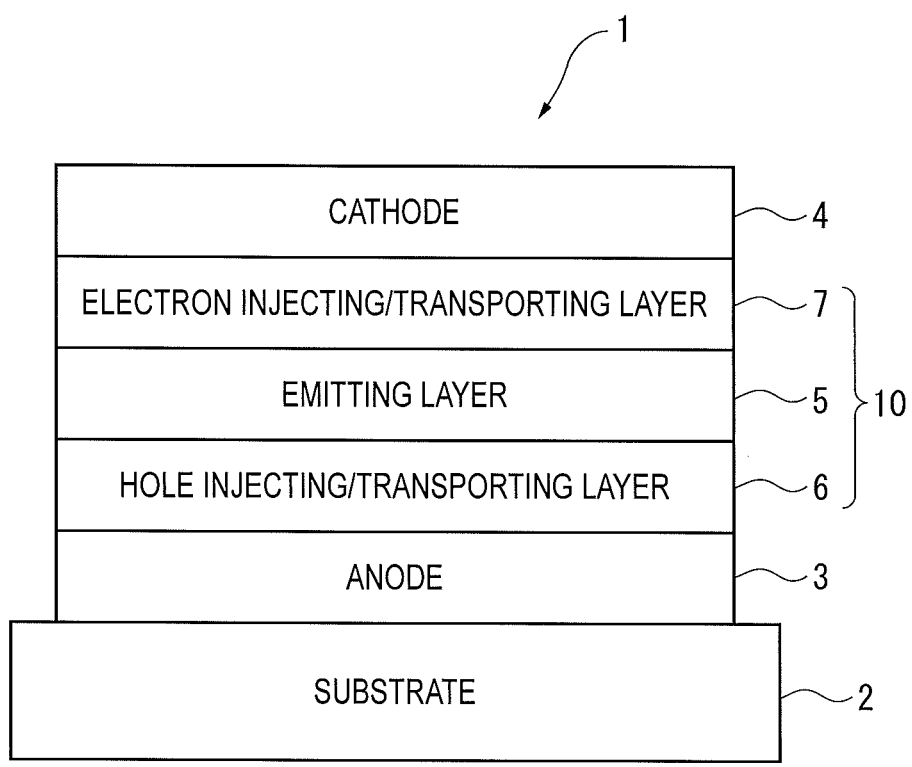
FIG. 1 schematically shows an exemplary arrangement of an organic electroluminescence device according to an exemplary embodiment of the invention.

An organic EL device according to an exemplary embodiment of the invention will be described below.

First Exemplary Embodiment

Arrangement(s) of Organic EL Device

Arrangement(s) of an organic EL device according to a first exemplary embodiment of the invention will be described below.

An organic luminous medium according to the first exemplary embodiment contains a compound represented by the following formula (1). The organic luminous medium may contain an organic luminous medium different from the compound represented by the formula (1) as needed as long as an object of the invention is achievable.

The organic EL device includes a pair of electrodes and an organic layer disposed between the electrodes. The organic layer includes at least one layer formed of an organic compound. The organic layer may further contain an inorganic compound.

The organic layer of the organic EL device of the invention includes at least one emitting layer. Specifically, for instance, the organic layer may consist of a single emitting layer or may include layers usable in a typical organic EL device, such as a hole injecting layer, a hole transporting layer, an electron injecting layer, an electron transporting layer, a hole blocking layer and an electron blocking layer.

Representative arrangement examples of an organic EL device are as follows:
(a) anode/emitting layer/cathode;
(b) anode/hole injecting•transporting layer/emitting layer/cathode;
(3) anode/emitting layer/electron injecting•transporting layer/cathode;
(d) anode/hole injecting•transporting layer/emitting layer/electron injecting•transporting layer/cathode;
(e) anode/hole injecting•transporting layer/first emitting layer/second emitting layer/electron injecting•transporting layer/cathode; and
(f) anode/hole injecting•transporting layer/emitting layer/blocking layer/electron injecting•transporting layer/cathode.

Among the above, the arrangement (d) is suitably usable, but the arrangement of the invention is not limited to the above arrangements.

It should be noted that the aforementioned "emitting layer" is an organic compound layer generally employing a doping system and including a primary material and a secondary material. In general, the primary material promotes recombination of electrons and holes and transmits exciton energy generated by the recombination to the secondary material. In view of the fact that such a material as the primary material is often referred to as a host material, the primary material herein is also referred to as a host material below. The secondary material generally receives the exciton energy from the host material (the primary material) and exhibits a high luminous performance. In view of the fact that such a material as the secondary material is often referred to as a dopant material, the secondary material herein is also referred to as a dopant material below. The dopant material is preferably a compound with a large quantum yield. It the first exemplary embodiment, the dopant material is a material capable of thermally activated delayed fluorescence. It should be noted that it is not requisite in the first exemplary embodiment that a slight amount of the dopant material be doped in the of the host material. This is because a compound capable of thermally activated delayed fluorescence according to the first exemplary embodiment, the luminous efficiency of which gradually decreases as a result of concentration quenching, is supposed to function as usual even when being mixed in the host, for instance, at the rate of 1:1.

The "hole injecting•transporting layer" means "at least one of a hole injecting layer and a hole transporting layer" while the "electron injecting•transporting layer" means "at least one of an electron injecting layer and an electron transporting layer." Herein, when the hole injecting layer and the hole transporting layer are provided, the hole injecting layer is preferably adjacent to the anode. When the electron injecting layer and the electron transporting layer are provided, the electron injecting layer is preferably adjacent to the cathode. The hole injecting layer, the hole transporting layer, the electron transporting layer and the electron injecting layer may each consist of a single layer or may alternatively include a plurality of laminated layers.

In the invention, the electron transporting layer means an organic layer having the highest electron mobility among organic layers in an electron transporting region existing between the emitting layer and the cathode. When the electron transporting region is provided by a single layer, the single layer is the electron transporting layer. A blocking layer, the electron mobility of which is not necessarily high, may be provided between the emitting layer and the electron transporting layer to prevent dissipation of an excitation energy generated in the emitting layer, as shown in the arrangement (f). Therefore, the organic layer adjacent to the emitting layer is not always the electron transporting layer.

FIG. 1 schematically shows an exemplary arrangement of an organic EL device according to the first exemplary embodiment.

An organic EL device 1 includes a light-transmissive substrate 2, an anode 3, a cathode 4, and an organic layer 10 provided between the anode 3 and the cathode 4.

The organic layer 10 includes an emitting layer 5 containing a host material and a dopant material. The organic layer 10 further includes a hole injecting/transporting layer 6 provided between the emitting layer 5 and the anode 3. The organic layer 10 still further includes an electron injecting/transporting layer 7 provided between the emitting layer 5 and the cathode 4.

Emitting Layer

In the organic EL device of the first exemplary embodiment, the organic luminous medium is provided to the emitting layer. The emitting layer also contains the host material and the dopant material.

Dopant Material

The dopant material according to the first exemplary embodiment is represented by the following formula (1-1).

[Formula 4]

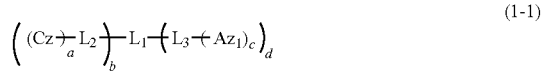

(1-1)

In the formula (1-1), Cz is a group derived from a structure represented by the following formula (10).

[Formula 5]

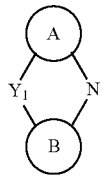
(10)

In the formula (10), $Y_1$ is a single bond, oxygen atom, sulfur atom, carbonyl group, $CR_2R_3$, $SiR_4R_5$, $GeR_6R_7$ or $NR_8$.

A and B each independently represent a cyclic structure, and at least one of the cyclic structure A and the cyclic structure B has a substituent. When at least one of the cyclic structure A and the cyclic structure B has a plurality of substituents, adjacent ones of the substituents may be bonded to each other to form a ring. When at least one of the cyclic structure A and the cyclic structure B is a substituted or unsubstituted heterocyclic structure, the heterocyclic structure has a moiety represented by the following formula (11).

[Formula 6]

(11)

In the formula (10), $Y_1$ is a single bond, oxygen atom, sulfur atom, carbonyl group, $CR_2R_3$, $SiR_4R_5$, $GeR_6R_7$ or $NR_8$. Specifically, the cyclic structure of the formula (10) is selected from the group consisting of cyclic structures represented by the following formulae (10b) to (10i).

[Formula 6]

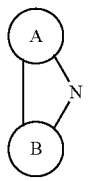
(10b)

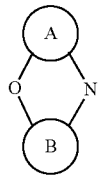
(10c)

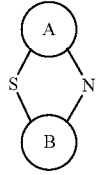
(10d)

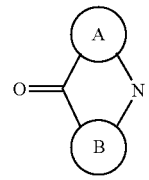
(10e)

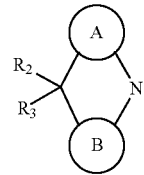
(10f)

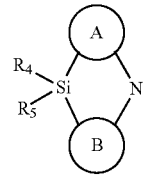
(10g)

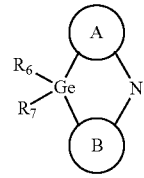
(10h)

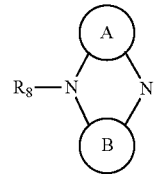
(10i)

When the $Y_1$ in the formula (10) is $CR_2R_3$, $SiR_4R_5$ or $GeR_6R_7$, the cyclic structure of the formula (10) may be selected from the group consisting of cyclic structures represented by the following formulae (10j), (10k) and (10m). In other words, the cyclic structure of the formula (10) may have a spirocyclic structure.

[Formula 8]

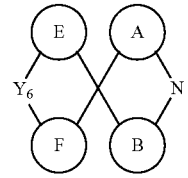
(10j)

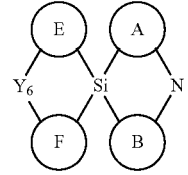
(10k)

(10m)

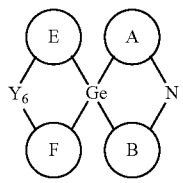

In the formulae (10), (10b) to (10i), (10j), (10k) and (10m), A and B each independently represent a cyclic structure, and at least one of the cyclic structure A and the cyclic structure B has a substituent. When at least one of the cyclic structure A and the cyclic structure B has a plurality of substituents, adjacent ones of the substituents may be bonded to each other to form a ring. The formed ring may be saturated or unsaturated. The substituents are preferably electron donating substituents. Alternatively, the adjacent ones of the substituents further form an electron donating ring.

In the formulae (10j), (10k) and (10m), E and F each independently represent a substituted or unsubstituted cyclic structure. When at least one of the cyclic structure E and the cyclic structure F has a plurality of substituents, adjacent ones of the substituents may be bonded to each other to form a ring. The formed ring may be a saturated ring or an unsaturated ring. The substituent is preferably an electron donating substituent. Alternatively, the adjacent ones of the substituents further form an electron donating ring.

In the formulae (10j), (10k) and (10m), $Y_6$ has the same meanings as $Y_1$ in the formula (10).

When at least one of the cyclic structure A and the cyclic structure B in the formulae (10), (10b) to (10i), (10j), (10k) and (10m) is a substituted or unsubstituted heterocyclic structure, the heterocyclic structure has a moiety represented by the following formula (11).

A group derived from the structure of the formula (10) is preferably a group represented by the following formula (10-1).

[Formula 9]

(10-1)

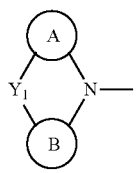

In the formula (10-1), $Y_1$ has the same meanings as $Y_1$ in the formula (10). Cz in the formula (1) is preferably selected from the group consisting of groups represented by the following formulae (10b-1) to (10i-1), (10j-1), (10k-1) and (10m-1).

[Formula 10]

(10b-1)

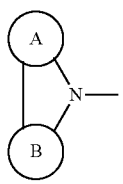

(10c-1)

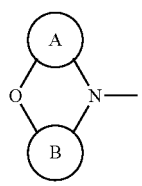

(10d-1)

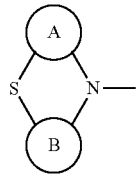

(10e-1)

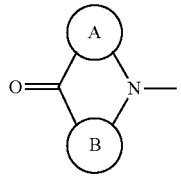

(10f-1)

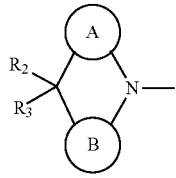

(10g-1)

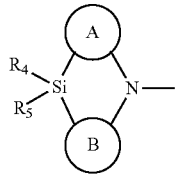

(10h-1)

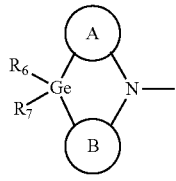

(10i-1)

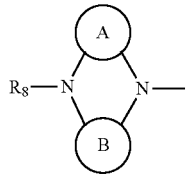

[Formula 11]

(10j-1)

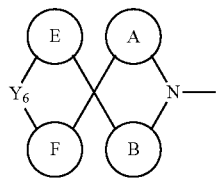

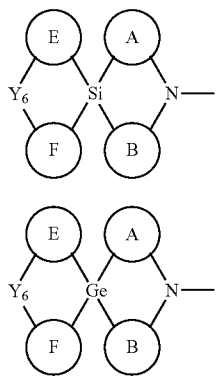

The cyclic structures A and B in the formulae (10b-1) to (10i-1), (10j-1), (10k-1) and (10m-1) respectively have the same meanings as the cyclic structures A and B in the formulae (10), (10b) to (10i), (10j), (10k) and (10m). The cyclic structures E and F and $Y_6$ in the formulae (10j-1), (10k-1) and (10m-1) respectively have the same meanings as the cyclic structures E and F and $Y_6$ in the formulae (10j), (10k) and (10m).

In the formula (1-1), $L_1$ is a single bond, substituted or unsubstituted (b+d)valent aromatic hydrocarbon group, or substituted or unsubstituted (b+d)valent heterocyclic group.

$L_2$ is a single bond, substituted or unsubstituted (a+1) valent aromatic hydrocarbon group, or substituted or unsubstituted (a+1)valent heterocyclic group.

$L_3$ is a single bond, substituted or unsubstituted (c+1) valent aromatic hydrocarbon group, or substituted or unsubstituted (c+1)valent heterocyclic group.

It should be noted that $L_1$, $L_2$ and $L_3$ are not simultaneously single bonds.

In the formula (1-1), a, b, c and d each independently represent an integer of 1 to 6, preferably an integer of 1 to 3, more preferably 1 or 2.

In the first exemplary embodiment, $L_1$ is a linking group with a valence varied depending on the values of b and d. When each of b and d is 1, $L_1$ is a divalent linking group. In the first exemplary embodiment, $L_2$ is a linking group with a valence varied depending on the value of a. When a is 1, $L_2$ is a divalent linking group. The same applies to a linking group represented by $L_3$ or the like.

In the formula (1-1), $Az_1$ is represented by the following formula (12).

[Formula 12]

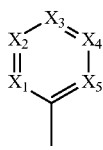

(12)

In the formula (12), $X_1$ to $X_5$ each independently represent $CR_1$ or a nitrogen atom, and at least one of $X_1$ to $X_5$ is a nitrogen atom. In the above formula (12), one to three of $X_1$ to $X_5$ each preferably a nitrogen atom. In the formula (12), adjacent $R_1$ may be bonded to each other to form a ring.

When one of $X_1$ to $X_5$ is a nitrogen atom, $X_1$ or $X_5$ is preferably the nitrogen atom. When two of $X_1$ to $X_5$ are nitrogen atoms, $X_1$ and $X_5$ are preferably the nitrogen atoms. When three of $X_1$ to $X_5$ are nitrogen atoms, $X_1$, $X_3$ and $X_5$ are preferably the nitrogen atoms. Among the above examples, $X_1$, $X_3$ and $X_5$ in the formula (12) are preferably nitrogen atoms to provide a triazine ring.

In the formulae (1-1) and (10) to (12), $R_1$ each independently represent a hydrogen atom, a cyano group, a substituted or unsubstituted aryl group having 6 to 30 carbon atoms forming the aromatic ring (i.e., ring carbon atoms), a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

$R_2$ to $R_8$ each independently represent a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

In the formula (1-1), two or more structures selected from the group consisting of Cz, $L_1$, $L_2$, $L_3$ and $Az_1$ may be bonded to each other to form a ring.

When at least two of $L_1$, $L_2$ and $L_3$ are linking groups, a ring may be formed by bonding the linking groups to each other, bonding substituents of the linking groups to each other, or bonding a substituent of a linking group to the adjacent linking group.

In the formula (1-1), when $L_2$ is a linking group, a substituent of $L_2$ may be bonded to a substituent of at least one of the cyclic structure A and the cyclic structure B to form a ring, $L_2$ may be bonded to a substituent of at least one of the cyclic structure A and the cyclic structure B to form a ring, and a substituent of $L_2$ may be bonded to at least one of the cyclic structure A and the cyclic structure B.

In the formula (1-1), when $L_2$ is a single bond and $L_1$ is a linking group, or when $L_1$ and $L_2$ are single bonds and $L_3$ is a linking group, a ring may be formed in the same manner as when $L_2$ is a linking group as described above.

In the formulae (1-1) and (10), at least one of $R_2$ to $R_8$ in $Y_1$ may be bonded to at least one of the cyclic structure A and the cyclic structure B to form a ring, or may be bonded to a substituent of at least one of the cyclic structure A and the cyclic structure B.

In the formula (1-1), when $L_3$ is a linking group, a substituent of $L_3$ may be bonded to $R_1$ in $CR_1$ of $X_1$ to $X_5$ to form a ring, L$_3$ may be bonded to R$_1$ to form a ring, or a substituent of L$_3$ may be bonded to a carbon atom C of X$_1$ to X$_5$.

In the formula (1-1), when L$_3$ is a single bond and L$_1$ is a linking group, or when L$_1$ and L$_3$ are single bonds and L$_2$ is a linking group, the linking group and Az$_1$ represented by the formula (12) may in combination form a ring in the same manner as when L$_3$ is a linking group as described above.

Hereinbelow, a ring may similarly be formed by adjacent substituents, by substituents of adjacent cyclic structures, or by a substituent of a linking group and a substituent of a cyclic structure in the following substance(s).

In the first exemplary embodiment, the compound represented by the formula (1-1) is preferably a compound represented by the following formula (1). In other words, when each of a, b, c and d is 1 and each of L$_2$ and L$_3$ is a single bond in the formula (1-1), the resulting compound is represented by the following formula (1).

[Formula 13]

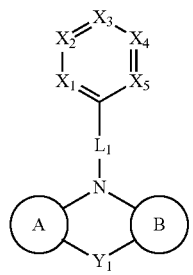

(1)

In the formula (1), X$_1$ to X$_5$ each independently represent CR$_1$ or a nitrogen atom, and at least one of X$_1$ to X$_5$ is a nitrogen atom.

In the formula (1), L$_1$ is a substituted or unsubstituted divalent aromatic hydrocarbon group.

In the formula (1): when A and B each independently represent a cyclic structure, at least one of the cyclic structure A and the cyclic structure B has a substituent; and when at least one of A and B has a plurality of substituents, adjacent ones of the substituents may be bonded to each other to form a ring. The formed ring may be a saturated ring or an unsaturated ring. The substituent is preferably an electron donating substituent. Alternatively, the adjacent ones of the substituents further form an electron donating ring.

Preferably, in the formula (1), Y$_1$ is any one of a single bond, CR$_2$R$_3$, SiR$_4$R$_5$, GeR$_6$R$_7$ and carbonyl group, among which a single bond, CR$_2$R$_3$ or SiR$_4$R$_5$ is preferable.

In the formula (1), R$_1$ represents a hydrogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

R$_2$ to R7 each independently represent a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

In the compound represented by the formula (1), a moiety represented by the following formula (1a) is an electron donating moiety, a moiety represented by the following formula (1b) is an electron accepting moiety, and both moieties are bonded to each other via a linking group represented by L$_1$, which is not a single bond. Further, in the moiety represented by the following formula (1a), at least one of the cyclic structure A and the cyclic structure B has a substituent. With the above arrangement, the balance between electron donating properties and electron accepting properties in a molecule of the compound represented by the formula (1) is easily adjustable. The inventor(s) has found that an emitting layer containing the compound represented by the formula (1) as a dopant material serves to improve a luminous efficiency. It should be noted that the an electron donating substituent according to the invention is a group represented by the following formula (1a).

In contrast, when a compound in which an electron donating moiety and an electron accepting moiety are directly bonded to each other by a single bond is contained in an emitting layer as a dopant material, the luminous efficiency of an organic EL device tends to be lowered as compared with that of the organic EL device of the first exemplary embodiment. Accordingly, when the molecule has a plurality of electron donating moieties or a plurality of electron accepting moieties, the electron donating moieties or the electron accepting moieties are preferably connected to one another at each of linking positions by a linking group different from a single bond, as in the compound represented by the formula (1). An electron donating moiety in which neither the cyclic structure A nor the cyclic structure B is substituted may be an unsubstituted phenoxazine ring. A compound in which the unsubstituted phenoxazine ring is connected to a triazine ring via a p-phenylene group (hereinafter, occasionally abbreviated as PXZ-TRZ) is difficult to adjust the balance between electron donating properties and electron accepting properties in the molecule, so that the compound represented by the formula (1) is preferred.

In the compound PXZ-TRZ, the phenoxazine ring has intensive electron donating properties. In a thermally activated delayed fluorescence material having an electron donating moiety and an electron accepting moiety in a single molecule, when chemical properties of these moieties are intensive, a singlet energy is likely to be reduced due to a charge transfer (CT) excited state. Consequently, blue emission requiring a large energy is unlikely to be designed.

In contrast, in the compound represented by the formula (1), the electron donating properties of the electron donating moiety represented by the following formula (1a), in which $Y_1$ is a single bond, $CR_2R_3$ or $SiR_4R_5$, are suppressed as compared with those of the phenoxazine ring. Especially, when $Y_1$ is a single bond, the electron donating properties are further suppressed. Consequently, the compound represented by the formula (1) prevents an excessive reduction in the singlet energy, so that a material capable of blue emission can be easily designed in combination with a variety of substituents.

Further, the compound represented by the formula (1) is more excellent in stability than the compound PXZ-TRZ.

[Formula 14]

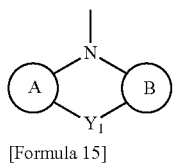

(1a)

[Formula 15]

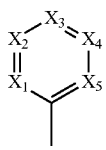

(1b)

In the first exemplary embodiment, a compound with a large photoluminescence quantum yield (PLQY) is preferably usable as a dopant material. Supposedly, an organic EL device in which a compound with a large photoluminescence quantum yield is contained in an emitting layer as a dopant material should have an enhanced photoluminescence quantum yield of the device, so that the luminous efficiency of the organic EL device is easily improvable.

The present inventor(s) has found that a compound in which the electron donating moiety represented by the formula (1a) and the electron accepting moiety represented by the formula (1b) are bonded to each other via the linking group represented by $L_1$ tends to have a large photoluminescence quantum yield as compared with a compound in which the moieties are bonded via a single bond.

Preferably, in the formula (1), $X_5$ is a nitrogen atom and $X_1$ to $X_4$ are each $CR_1$. Further, the compound represented by the formula (1) is preferably a compound represented by the following formula (1A).

[Formula 16]

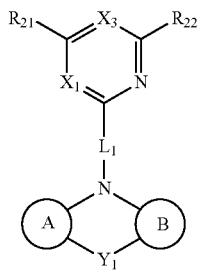

(1A)

In the formula (1A), $X_1$ and $X_3$ each independently represent $CR_1$, and $R_{21}$ and $R_{22}$ have the same meanings as $R_1$ to $R_7$ in the formula (1).

In the formula (1A), $R_1$, $L_1$, the cyclic structure A, the cyclic structure B and $Y_1$ respectively have the same meanings as $R_1$, $L_1$, the cyclic structure A, the cyclic structure B and $Y_1$ in the formula (1).

Preferably, in the formula (1), $X_1$ and $X_5$ are each a nitrogen atom, and $X_2$ to $X_4$ are each $CR_1$. Further, the compound represented by the formula (1) is preferably a compound represented by the following formula (1B).

[Formula 17]

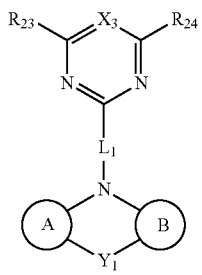

(1B)

In the formula (1B), $X_3$ represents $CR_1$, and $R_{23}$ and $R_{24}$ have the same meanings as $R_1$ to $R_7$ in the formula (1).

In the formula (1B), $R_1$, $L_1$, the cyclic structure A, the cyclic structure B and $Y_1$ respectively have the same meanings as $R_1$, $L_1$, the cyclic structure A, the cyclic structure B and $Y_1$ in the formula (1).

Preferably, in the formula (1), $X_1$, $X_3$ and $X_5$ are each a nitrogen atom, and $X_2$ and $X_4$ are each $CR_1$. Further, the compound represented by the formula (1) is preferably a compound represented by the following formula (1C).

[Formula 18]

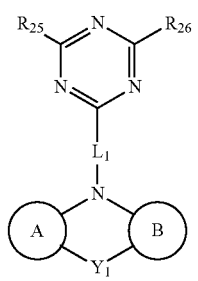

(1C)

In the formula (1C), $R_{25}$ and $R_{26}$ have the same meanings as $R_1$ to $R_7$ in the formula (1).

In the formula (1C), $L_1$, the cyclic structure A, the cyclic structure B and $Y_1$ respectively have the same meanings as $L_1$, the cyclic structure A, the cyclic structure B and $Y_1$ in the formula (1).

In the formula (1), it is preferable that $X_1$ and $X_5$ are each a nitrogen atom and $X_2$ to $X_4$ are each $CR_1$, or that $X_1$, $X_3$ and $X_5$ are each a nitrogen atom and $X_2$ and $X_4$ are each $CR_1$. Especially, the latter is more preferable. The compound represented by any one of the formulae (1A) to (1C) is preferably a compound represented by the formula (1B) or the formula (1C), more preferably a compound represented by the formula (1C). In the first exemplary embodiment, the electron accepting moiety represented by the formula (1b) is thus more preferably a triazine ring.

$L_1$ of the formula (1) preferably has a divalent six-membered ring structure, more preferably a divalent six-membered ring structure represented by a formula (4), (4a) or (4b) below, further preferably a divalent six-membered ring structure represented by the formula (4) below.

[Formula 19]

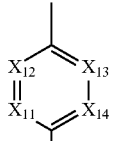
(4)

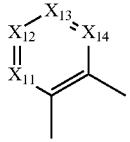
(4a)

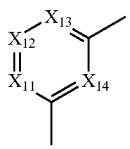
(4b)

In the formulae (4), (4a) and (4b), $X_{11}$ to $X_{14}$ each independently represent $CR_{11}$ or a nitrogen atom, in which $R_{11}$ each independently represents a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

$X_{11}$ to $X_{14}$ of the formulae (4), (4a) and (4b) are each independently preferably $CR_{11}$, in which $R_{11}$ is more preferably a hydrogen atom, alkyl group, alkoxy group, aryloxy group, cyano group, halogen atom and silyl group.

Particularly preferably, $L_1$ is represented by the formula (4); $X_{11}$ to $X_{14}$ are each independently $CR_{11}$; $X_1$, $X_3$ and $X_5$ of the formula (1) are nitrogen atoms; and $X_2$ and $X_4$ are $CR_1$. In other words, the dopant material is preferably provided by a compound in which the electron accepting moiety represented by the formula (1b) is a substituted or unsubstituted triazine ring, which is connected to the electron donating moiety represented by the formula (1a) via a substituted or unsubstituted p-phenylene group. The compound with this arrangement is represented by a formula (11) below.

[Formula 20]

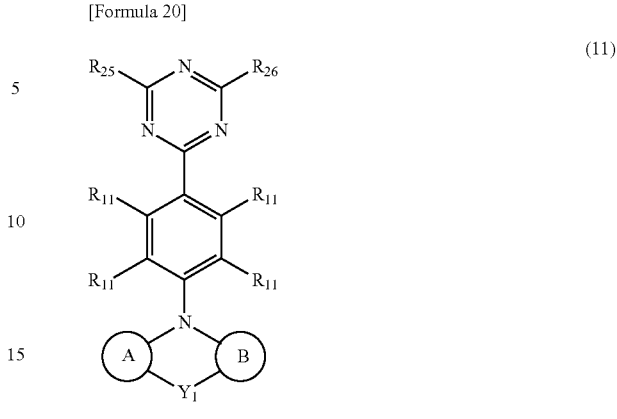
(11)

In the formula (11), $R_{11}$ each independently have the same meanings as $R_{11}$ in the formula (4), the cyclic structure A, the cyclic structure B and $Y_1$ respectively have the same meanings as the cyclic structure A, the cyclic structure B and $Y_1$ in the formula (1), and $R_{25}$ and $R_{26}$ have the same meanings as $R_1$ in the formula (1).

In the formulae (1), (1A), (1B), (1C), (10), (10-1) and (11), at least one of the cyclic structure A and the cyclic structure B preferably has a substituent selected from the group consisting of a substituted or unsubstituted aryl group having 6 to 30 ring carbon atoms, substituted or unsubstituted heterocyclic group having 5 to 30 ring atoms and substituted or unsubstituted amino group, and more preferably has a substituent selected from the group consisting of a substituted or unsubstituted heterocyclic group having 5 to 30 ring atoms and a substituted or unsubstituted amino group.

In the first exemplary embodiment, the compound represented by the formula (1) is preferably a compound represented by a formula (1-2) below.

[Formula 21]

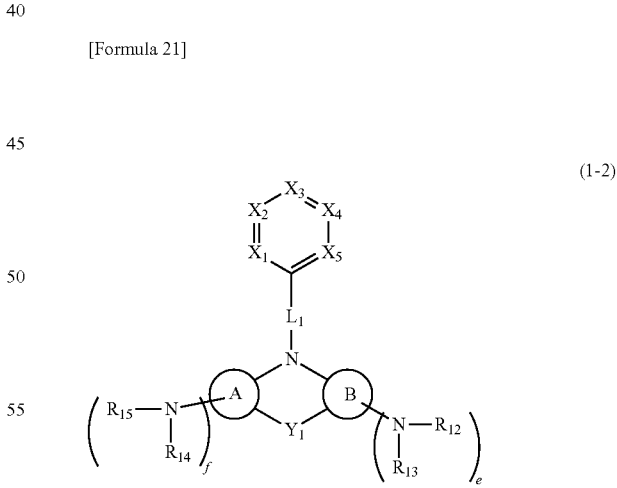
(1-2)

In the formula (1-2), $L_1$, the cyclic structure A, the cyclic structure B, $Y_1$ and $X_1$ to $X_5$ respectively have the same meanings as $L_1$, the cyclic structure A, the cyclic structure B, $Y_1$ and $X_1$ to $X_5$ in the formula (1).

In the formula (1-2), $R_{12}$ to $R_{15}$ each independently have the same meanings as $R_1$ described above. $R_{12}$ and $R_{13}$ may be bonded to each other to form a ring. $R_{14}$ and $R_{15}$ may be bonded to each other to form a ring. In the formula (1-2), $R_{12}$ to $R_{15}$ preferably each independently represent a substituted or unsubstituted aryl group having 6 to 30 ring carbon atoms, substituted or unsubstituted heterocyclic group having 5 to 30 ring atoms, or substituted or unsubstituted alkyl group having 1 to 30 carbon atoms.

In the formula (1-2), e and f are each independently an integer of 1 to 4. When e and f are each an integer of 2 or larger, amino group(s) bonded to the cyclic structure A may be mutually the same or different and, similarly, amino group(s) bonded to the cyclic structure B may be mutually the same or different.

In the formula (1-2), a nitrogen atom bonded to $R_{12}$ and $R_{13}$ is also bonded to an atom of the cyclic structure B, and a nitrogen atom bonded to $R_{14}$ and $R_{15}$ is also bonded to an atom of the cyclic structure A.

Preferably, in the compound represented by the formula (1-2), $R_{12}$ and $R_{13}$ are bonded to each other to form a ring, and $R_{14}$ and $R_{15}$ are bonded to each other to form a ring. Specifically, the compound represented by the formula (1-2) is preferably a compound represented by a formula (1-3) below.

[Formula 22]

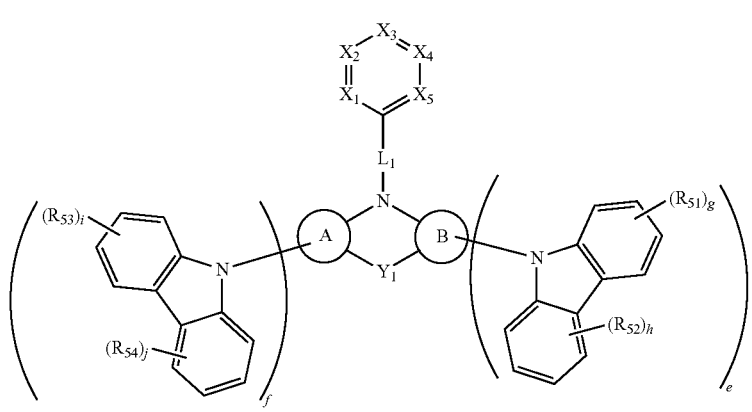

(1-3)

[Formula 23]

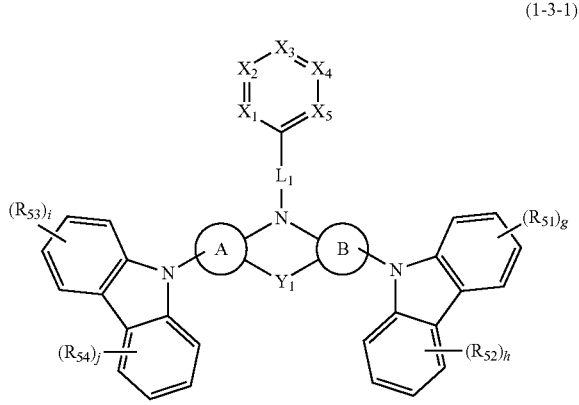

(1-3-1)

In the formula (1-3), $L_1$, the cyclic structure A, the cyclic structure B, $Y_1$ and $X_1$ to $X_5$ respectively have the same meanings as $L_1$, the cyclic structure A, the cyclic structure B, $Y_1$ and $X_1$ to $X_5$ in the formula (1).

In the formula (1-3), $R_{51}$ to $R_{54}$ each independently have the same meanings as $R_1$ described above. It should be noted that adjacent ones of $R_{51}$ may be bonded to each other to form a ring, adjacent ones of $R_{52}$ may be bonded to each other to form a ring, adjacent ones of $R_{53}$ may be bonded to each other to form a ring, and adjacent ones of $R_{54}$ may be bonded to each other to form a ring. $R_{51}$ to $R_{54}$ are each bonded to a carbon atom of a six-membered ring forming a carbazole ring.

In the formula (1-3), each of g, h, i and j is 4.

In the formula (1-3), an N-carbazolyl group is bonded to an atom of the cyclic structure A or the cyclic structure B.

In the formula (1-3), e and f are each independently an integer of 1 to 4. When e and f are integers of 2 or larger, the N-carbazolyl group(s) bonded to the cyclic structure A may be mutually the same or different and, similarly, the N-carbazolyl group(s) bonded to the cyclic structure B may be mutually the same or different.

In the formula (1-3), e and f are each independently an integer of 1 to 4. Specifically, the compound represented by the formula (1-3) is represented by a formula (1-3-1) below.

In the formula (1-3-1), $L_1$, the cyclic structure A, the cyclic structure B, $Y_1$, $X_1$ to $X_5$, $R_{51}$ to $R_{54}$, g, h, i and j respectively have the same meanings as $L_1$, the cyclic structure A, the cyclic structure B, $Y_1$, $X_1$ to $X_5$, $R_{51}$ to $R_{54}$, g, h, i and j in the formula (1-3).

In the first exemplary embodiment, the compound represented by the formula (1) is preferably a compound represented by a formula (1-4) below.

[Formula 24]

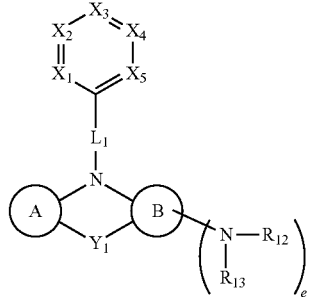

(1-4)

In the formula (1-4), $L_1$, the cyclic structure A, the cyclic structure B, $Y_1$ and $X_1$ to $X_5$ respectively have the same meanings as $L_1$, the cyclic structure A, the cyclic structure B, $Y_1$ and $X_1$ to $X_5$ in the formula (1).

In the formula (1-4), $R_{12}$ and $R_{13}$ each independently have the same meanings as $R_1$ described above. $R_{12}$ and $R_{13}$ may be bonded to each other to form a ring.

In the formula (1-4), e is an integer of 1 to 4. When e is an integer of 2 or larger, the N-carbazolyl group(s) bonded to the cyclic structure B may be mutually the same or different.

In the formula (1-4), a nitrogen atom bonded to $R_{12}$ and $R_{13}$ is also bonded to an atom of the cyclic structure B.

Preferably, in the compound represented by the formula (1-4), $R_{12}$ and $R_{13}$ are bonded to each other to form a ring. Specifically, the compound represented by the formula (1-4) is preferably a compound represented by a formula (1-5) below.

[Formula 25]

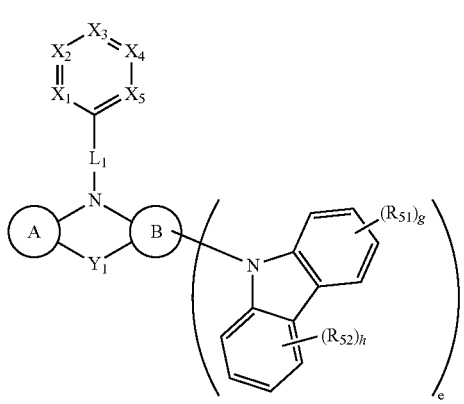

(1-5)

In the formula (1-5), $L_1$, the cyclic structure A, the cyclic structure B, $Y_1$ and $X_1$ to $X_5$ respectively have the same meanings as $L_1$, the cyclic structure A, the cyclic structure B, $Y_1$ and $X_1$ to $X_5$ in the formula (1).

In the formula (1-5), $R_{51}$ and $R_{52}$ each independently have the same meanings as $R_1$ described above. Adjacent ones of $R_{51}$ may be bonded to each other to form a ring. Adjacent ones of $R_{52}$ may be bonded to each other to form a ring. $R_{51}$ and $R_{52}$ are each bonded to a carbon atom of a six-membered ring forming a carbazole ring.

In the formula (1-5), each of g and h is 4

In the formula (1-5), an N-carbazolyl group is bonded to an atom of the cyclic structure B.

In the formula (1-5), e is an integer of 1 to 2. When e is an integer of 2 or larger, the N-carbazolyl group(s) bonded to the cyclic structure B may be mutually the same or different.

In the formula (1-5), e is preferably 1. Specifically, the compound represented by the formula (1-5) is represented by a formula (1-5-1) below.

[Formula 26]

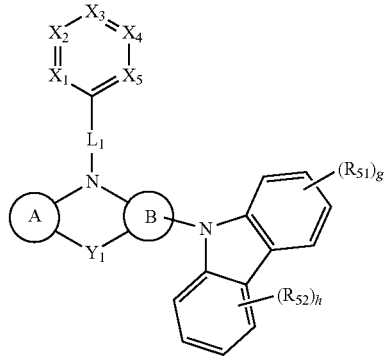

(1-5-1)

In the formula (1-5-1), $L_1$, the cyclic structure A, the cyclic structure B, $Y_1$, $X_1$ to $X_5$, $R_{51}$, $R_{52}$, g and h respectively have the same meanings as $L_1$, the cyclic structure A, the cyclic structure B, $Y_1$, $X_1$ to $X_5$, $R_{51}$, $R_{52}$, g and h in the formula (1-5).

In the first exemplary embodiment, the compound represented by the formula (1) is preferably a compound represented by a formula (1-6) below.

[Formula 27]

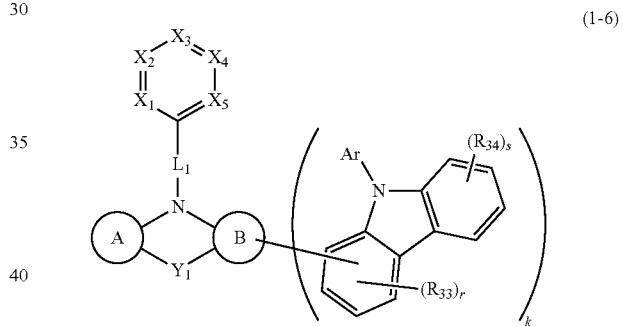

(1-6)

In the formula (1-6), $L_1$, the cyclic structure A, the cyclic structure B, $Y_1$ and $X_1$ to $X_5$ respectively have the same meanings as $L_1$, the cyclic structure A, the cyclic structure B, $Y_1$ and $X_1$ to $X_5$ in the formula (1).

In the formula (1-6), $R_{33}$ and $R_{34}$ each independently have the same meanings as $R_1$ described above. Adjacent ones of $R_{33}$ may be bonded to each other to form a ring. Adjacent ones of $R_{34}$ may be bonded to each other to form a ring. $R_{33}$ and $R_{34}$ are each bonded to a carbon atom of a six-membered ring forming a carbazole ring.

In the formula (1-6), r is 3 and s is 4.

In the formula (1-6), Ar represents a substituted or unsubstituted aryl group having 6 to 30 ring carbon atoms or a substituted or unsubstituted heterocyclic group having 5 to 30 ring atoms. It should be noted that when Ar is a substituted or unsubstituted six-membered nitrogen-containing heterocyclic group, the nitrogen-containing heterocyclic group is bonded to a nitrogen atom at the ninth position of the carbazole ring substituted with $R_{33}$ and $R_{34}$ not directly but via a linking group. Examples of the linking group between Ar and the nitrogen atom at the ninth position of the carbazole ring substituted with $R_{33}$ and $R_{34}$ are the same as those of $L_1$ in the formula (1). It should be noted that Ar is preferably a substituted or unsubstituted aryl group having 6 to 30 ring carbon atoms, specific example of which include a phenyl group, biphenyl group, terphenyl group, naphthyl group, phenanthryl group, triphenylenyl group, dibenzofuranyl group, dibenzothiophenyl group and carbazolyl group.

In the formula (1-6), a carbon atom of the six-membered ring forming the carbazole ring is bonded to an atom of the cyclic structure B.

In the formula (1-6), k is an integer of 1 to 4. When k is an integer of 2 or larger, the carbazolyl group(s) bonded to the cyclic structure B may be mutually the same or different.

In the formulae (1), (1-1) to (1-6), (1-3-1), (1-5-1), (1A), (1B), (1C) and (10), examples of the cyclic structure A and the cyclic structure B include a saturated or unsaturated five-membered ring and a saturated or unsaturated six-membered ring, among which an unsaturated six-membered ring in the form of a benzene ring or an azine ring is preferable, and a benzene ring is more preferable.

In the compounds represented by the formulae (1), (1-1) to (1-6), (1-3-1), (1-5-1), (1A), (1B), (1C) and (10), the cyclic structure A and the cyclic structure B are preferably substituted or unsubstituted benzene rings, at least one of which has a substituent. The substituent of the benzene ring(s) is preferably at least one selected from the group consisting of a substituted or unsubstituted aryl group having 6 to 30 ring carbon atoms, a substituted or unsubstituted heterocyclic group having 5 to 30 ring atoms, and a substituted or unsubstituted arylamino group having 6 to 60 ring carbon atoms.

In the first exemplary embodiment, Cz in the formula (1-1) is represented by a formula (10b-1) below.

[Formula 28]

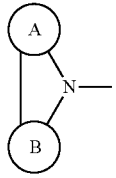

(10b-1)

In the formula (10b-1), the cyclic structure A and the cyclic structure B respectively have the same meanings as the cyclic structure A and the cyclic structure B in the formula (10).

In the first exemplary embodiment, each of the cyclic structure A and the cyclic structure B is also preferably a six-membered ring having a moiety represented by the formula (11).

In the first exemplary embodiment, the compound represented by the formula (1-1) is preferably a compound represented by a formula (13) below.

[Formula 29]

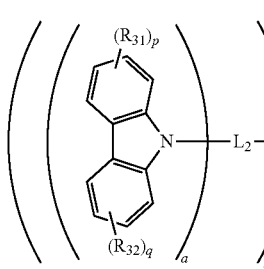

(13)

In the formula (13), $L_1$, $L_2$, $L_3$, a, b, c and d respectively have the same meanings as $L_1$, $L_2$, $L_3$, a, b, c and d in the formula (1-1).

In the formula (13), $X_1$ to $X_5$ each independently have the same meanings as $X_1$ to $X_5$ of the formula (12).

In the formula (13), $R_{31}$ and $R_{32}$ each independently have the same meanings as $R_1$ described above. $R_{31}$ and $R_{32}$ are each bonded to a carbon atom of a six-membered ring forming a carbazole ring.

In the formula (13), each of q and r is 4. Adjacent ones of $R_{31}$ may be bonded to each other to form a ring. Adjacent ones of $R_{32}$ may be bonded to each other to form a ring.

In the first exemplary embodiment, the compound represented by the formula (13) is preferably a compound represented by a formula (14) below.

[Formula 30]

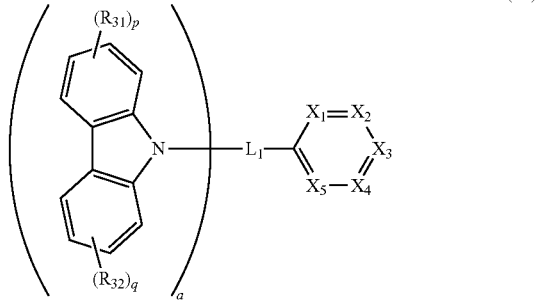

(14)

In the formula (14), $L_1$ and a respectively have the same meanings as $L_1$ and a in the formula (1).

In the formula (14), $X_1$ to $X_5$ each independently have the same meanings as $X_1$ to $X_5$ in the formula (12).

In the formula (14), $R_{31}$ and $R_{32}$ each independently have the same meanings as $R_1$ described above. $R_{31}$ and $R_{32}$ are each bonded to a carbon atom of a six-membered ring forming a carbazole ring.

In the formula (14), each of q and r is 4. Adjacent ones of $R_{31}$ may be bonded to each other to form a ring. Adjacent ones of $R_{32}$ may be bonded to each other to form a ring.

In the first exemplary embodiment, the compound represented by the formula (14) is preferably a compound represented by a formula (15) below.

[Formula 31]

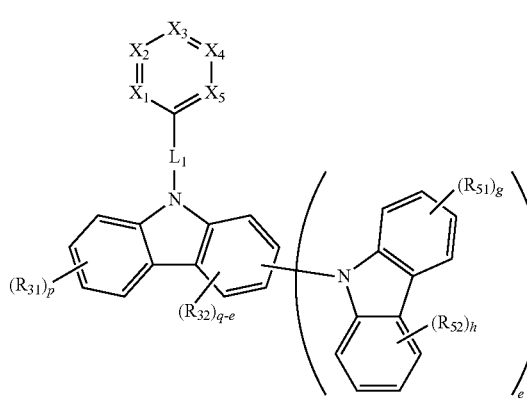

(15)

In the formula (15), $L_1$ has the same meanings as $L_1$ in the formula (1).

In the formula (15), $X_1$ to $X_5$ have the same meanings as $X_1$ to $X_5$ in the formula (12).

In the formula (15), $R_{31}$, $R_{32}$, $R_{51}$ and $R_{52}$ each independently have the same meanings as $R_1$ described above. It should be noted that adjacent ones of $R_{31}$ may be bonded to each other to form a ring, adjacent ones of $R_{32}$ may be bonded to each other to form a ring, adjacent ones of $R_{51}$ may be bonded to each other to form a ring, and adjacent ones of $R_{52}$ may be bonded to each other to form a ring. $R_{31}$, $R_{32}$, $R_{51}$ and $R_{52}$ are each bonded to a carbon atom of a six-membered ring forming a carbazole ring.

In the formula (15), each of g and h is 4

In the formula (15), each of p and q is 4, and e is an integer of 1 to 3. When e is an integer of 2 or larger, a plurality of N-carbazolyl groups having $R_{51}$ and $R_{52}$ as substituents may be mutually the same or different.

In the formula (15), a nitrogen atom of each of the N-carbazolyl groups having $R_{51}$ and $R_{52}$ as substituents is bonded to a carbon atom of a six-membered ring having $R_{32}$ as a substituent.

In the first exemplary embodiment, e in the formula (15) is preferably 1. Specifically, the compound represented by the formula (15) is a compound represented by a formula (15a) below, and more preferably a compound represented by a formula (16) below.

[Formula 32]

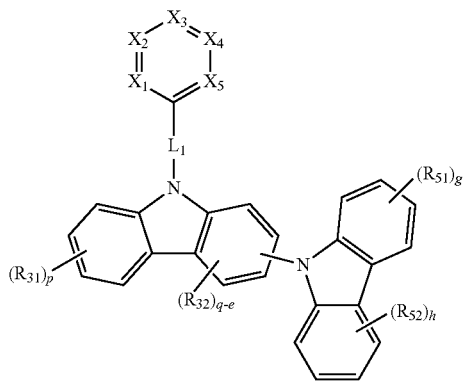

(15a)

In the formula (15a), $L_1$, $X_1$ to $X_5$, $R_{31}$, $R_{32}$, $R_{51}$, $R_{52}$, g, h, p and q respectively have the same meanings as $L_1$, $X_1$ to $X_5$, $R_{31}$, $R_{32}$, $R_{51}$, $R_{52}$, g, h, p and q in the formula (15).

[Formula 33]

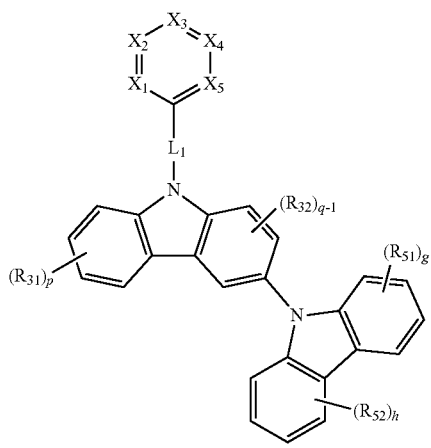

(16)

In the formula (16), $L_1$, $X_1$ to $X_5$, $R_{31}$, $R_{32}$, $R_{51}$, $R_{52}$, g, h, p and q respectively have the same meanings as $L_1$, $X_1$ to $X_5$, $R_{31}$, $R_{32}$, $R_{51}$, $R_{52}$, g, h, p and q in the formula (15).

In the first exemplary embodiment, the compound represented by the formula (14) is preferably a compound represented by a formula (17) below.

[Formula 34]

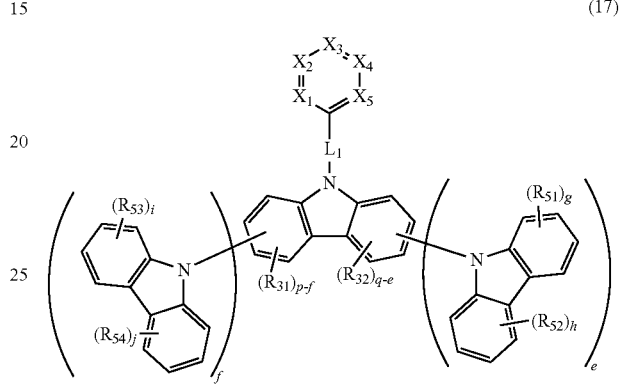

(17)

In the formula (17), $L_1$ has the same meanings as $L_1$ in the formula (1).

In the formula (17), $X_1$ to $X_5$ have the same meanings as $X_1$ to $X_5$ in the formula (12).

In the formula (17), $R_{31}$, $R_{32}$ and $R_{51}$ to $R_{54}$ each independently have the same meanings as $R_1$ described above. It should be noted that adjacent ones of $R_{31}$ may be bonded to each other to form a ring, adjacent ones of $R_{32}$ may be bonded to each other to form a ring, adjacent ones of $R_{51}$ may be bonded to each other to form a ring, adjacent ones of $R_{52}$ may be bonded to each other to form a ring, adjacent ones of $R_{53}$ may be bonded to each other to form a ring, and adjacent ones of $R_{54}$ may be bonded to each other to form a ring. $R_{31}$, $R_{32}$ and $R_{51}$ to $R_{54}$ are each bonded to a carbon atom of a six-membered ring forming a carbazole ring.

In the formula (17), each of g, h, i and j is 4.

In the formula (17), each of p and q is 4, and each of e and f is independently an integer of 1 to 3. When e is an integer of 2 or larger, a plurality of N-carbazolyl groups having $R_{51}$ and $R_{52}$ as substituents may be mutually the same or different. When f is an integer of 2 or larger, a plurality of N-carbazolyl groups having $R_{53}$ and $R_{54}$ as substituents may be mutually the same or different.

In the formula (17), a nitrogen atom of each of the N-carbazolyl groups having $R_{51}$ and $R_{52}$ as substituents is bonded to a carbon atom of a six-membered ring having $R_{32}$ as a substituent. In the formula (17), a nitrogen atom of each of the N-carbazolyl groups having $R_{53}$ and $R_{54}$ as substituents is bonded to a carbon atom of a six-membered ring having $R_{31}$ as a substituent.

In the first exemplary embodiment, e is preferably 1 and f is preferably 1 in the formula (17), and a compound represented by a formula (18) below is more preferable.

[Formula 35]

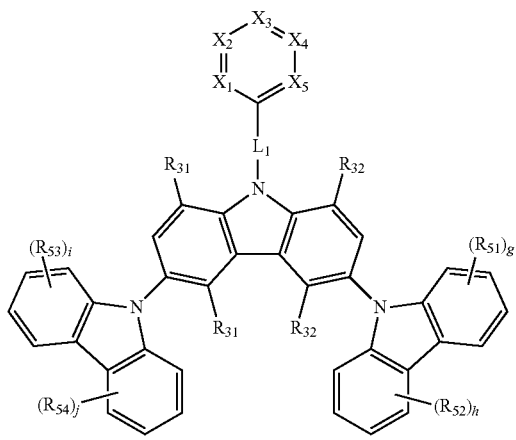

(18)

In the formula (18), $L_1$, $X_1$ to $X_5$, $R_{31}$, $R_{32}$, $R_{51}$ to $R_{54}$, g, h, i and j respectively have the same meanings as $L_1$, $X_1$ to $X_5$, $R_{31}$, $R_{32}$, $R_{51}$ to $R_{54}$, g, h, i and j in the formula (17).

In the first exemplary embodiment, the compound represented by the formula (1) is preferably a compound represented by a formula (5) below.

[Formula 36]

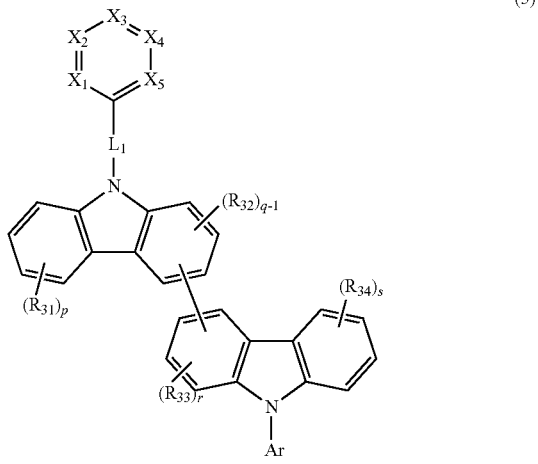

(5)

In the formula (5), $X_1$ to $X_5$ and $L_1$ respectively independently have the same meanings as $X_1$ to $X_5$ and $L_1$ in the formula (1).

In the formula (5), $R_{31}$ to $R_{34}$ each independently have the same meanings as $R_1$ in the formula (1), p is 4, q is 4, r is 3, and s is 4. $R_{31}$ to $R_{34}$ are each bonded to a carbon atom of a six-membered ring of a carbazole ring.

In the formula (5), Ar represents a substituted or unsubstituted aryl group having 6 to 30 ring carbon atoms or a substituted or unsubstituted heterocyclic group having 5 to 30 ring atoms. It should be noted that when Ar is a substituted or unsubstituted six-membered nitrogen-containing heterocyclic group, the nitrogen-containing heterocyclic group is bonded to a nitrogen atom at the ninth position of the carbazole ring substituted with $R_{33}$ and $R_{34}$ not directly but via a linking group. Examples of the linking group between Ar and the nitrogen atom at the ninth position of the carbazole ring substituted with $R_{33}$ and $R_{34}$ are the same as those of $L_1$ in the formula (1). It should be noted that Ar is preferably a substituted or unsubstituted aryl group having 6 to 30 ring carbon atoms, specific example of which include a phenyl group, biphenyl group, terphenyl group, naphthyl group, phenanthryl group, triphenylenyl group, dibenzofuranyl group, dibenzothiophenyl group and carbazolyl group.

In the formula (5), a carbon atom of the six-membered ring forming the carbazole ring substituted with $R_{32}$ is bonded to a carbon atom of the six-membered ring forming the carbazole ring substituted with $R_{33}$.

In the dopant material used in the first exemplary embodiment, as represented by the formula (5), the electron donating moiety represented by the formula (1a) preferably has a biscarbazole structure. When the moiety represented by the formula (1a) has a mono-carbazole structure consisting of a single carbazole skeleton, it is speculated that an electron donating performance of the mono-carbazole structure is less than that of the amine structure. In a compound in which an azine ring is bonded to the mono-carbazole structure directly or via a linking group, it is speculated that an electron accepting performance of the azine ring cannot be canceled by the electron donating performance of the mono-carbazole structure. Accordingly, such a compound in which the azine ring is bonded to the mono-carbazole structure directly or via a linking group is an electron accepting compound. On the other hand, in a compound in which a substituent is bonded to the carbazole skeleton, it is considered that the electron donating performance is improved. The above biscarbazole structure is preferable since the electron donating performance is improvable. In the compound represented by the formula (5) in which the azine ring is bonded to the biscarbazole structure via the linking group, it is speculated that the electron accepting performance of the azine ring and the electron donating performance of the biscarbazole structure are balanced with each other, thereby decreasing $\Delta ST$. The dopant material used in the first exemplary embodiment preferably has $\Delta ST$ of less than 0.3 [eV] as described later in detail.

The compound represented by the formula (5) is preferably any one of compounds represented by any one of formulae (5A) to (5D) below.

[Formula 37]

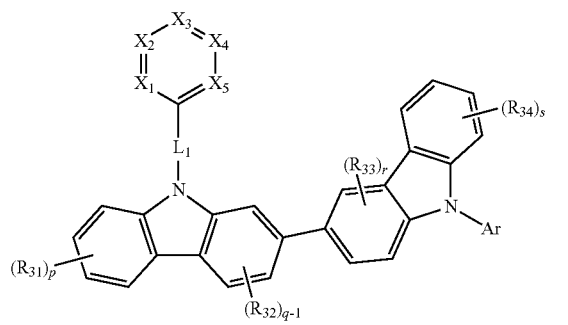

(5A)

[Formula 38]

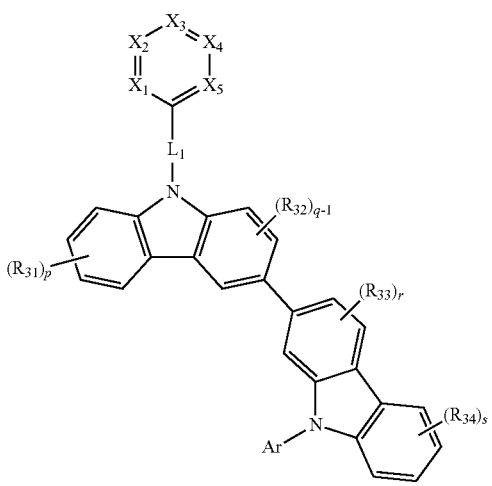

(5B)

[Formula 39]

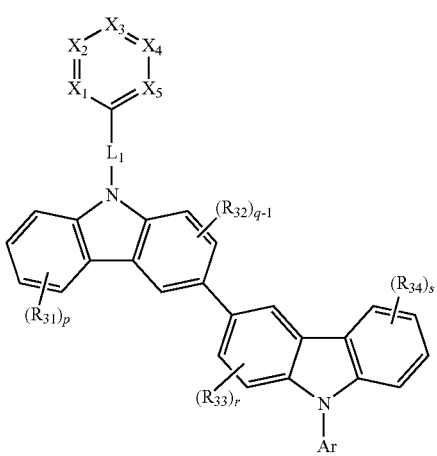

(5C)

[Formula 40]

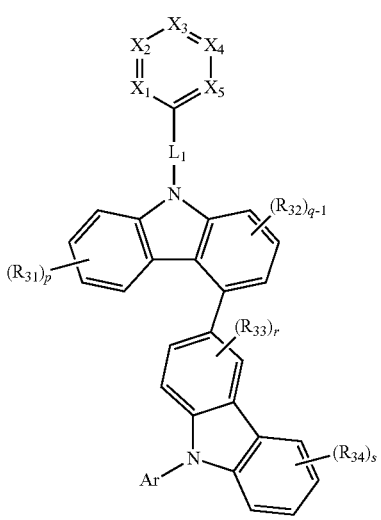

(5D)

In the formulae (5A) to (5D), $X_1$ to $X_5$ and $L_1$ respectively independently have the same meanings as $X_1$ to $X_5$ and $L_1$ in the formula (1).

In the formulae (5A) to (5D), $R_{31}$ to $R_{34}$ each independently have the same meanings as R1 in the formula (1), p is 4, q is 4, r is 3, and s is 4.

In the formulae (5A) to (5D), Ar has the same meanings as Ar in the formula (5).

In the compound represented by the formula (1), it is preferable that the cyclic structure A is a substituted or unsubstituted benzene ring and the cyclic structure B is a cyclic structure in which any ones of a plurality of five-membered rings and six-membered rings are mutually fused. In this arrangement, any one of the cyclic structures may have a substituent.

Further, the compound represented by the formula (1) is preferably a compound represented by a formula (6) below.

[Formula 41]

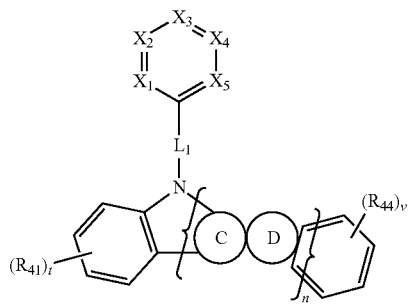

(6)

In the formula (6), $X_1$ to $X_5$ and $L_1$ respectively independently have the same meanings as $X_1$ to $X_5$ and $L_1$ in the formula (1).

In the formula (6), $R_{41}$ and $R_{44}$ each independently have the same meanings as $R_1$ to $R_7$ in the formula (1), t is 4, and v is 4. It should be noted that $R_{41}$ and $R_{44}$ in the formula (6) are each bonded to a carbon atom of a six-membered ring.

In the formula (6), C represents a cyclic structure represented by a formula (7) below and D represents a cyclic structure represented by a formula (8) below, the cyclic structure C and the cyclic structure D each being fused to an adjacent cyclic structure at any position. In the formula (6), n is an integer of 1 to 4. It should be noted that n is a repeating unit of a linking cyclic structure in which the cyclic structure C and the cyclic structure D are fused.

[Formula 42]

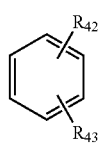

(7)

[Formula 43]

(8)

In the formula (7), $R_{42}$ and $R_{43}$ each independently have the same meanings as $R_1$ to $R_7$ in the formula (1). When $R_{42}$ and $R_{43}$ are substituents at adjacent positions, $R_{42}$ and $R_{43}$ may form a ring. It should be noted that $R_{42}$ and $R_{43}$ in the formula (7) are each bonded to a carbon atom of a six-membered ring.

In the formula (8), $Y_1$ represents $CR_{45}R_{46}$, $NR_{47}$, a sulfur atom or an oxygen atom, and $R_{45}$ to $R_{47}$ each independently have the same meanings as $R_2$ to $R_7$ in the formula (1).

In the dopant material used in the first exemplary embodiment, as represented by the formula (6), the electron donating moiety represented by the formula (1a) preferably has an indolocarbazole skeleton or a skeleton in which an indole ring is further fused to an indolocarbazole ring. With the above arrangement, the electron donating moiety can have improved electron donating properties as compared with one having the above mono-carbazole structure.

Further, as described above, the electron donating properties of a ladder structure as represented by the formula (6) are not so intensive as those of the phenoxazine ring of the compound PXZ-TRZ. Consequently, the compound represented by the formula (6) prevents an excessive reduction in the singlet energy, so that a material capable of blue emission can be easily designed in combination with a variety of substituents.

Further, the compound represented by the formula (6) is more excellent in stability than the compound PXZ-TRZ.

In the compound represented by the formula (6), it is speculated that the electron accepting performance of the azine ring and the electron donating performance of the electron donating moiety of the indolocarbazole skeleton and the like are balanced with each other, thereby decreasing $\Delta ST$. The dopant material used in the first exemplary embodiment preferably has $\Delta ST$ of less than 0.3 [eV] as described later in detail.

In the formula (6), n is preferably 1. Specifically, the compound represented by the formula (6) is represented by a formula (60) below.

[Formula 44]

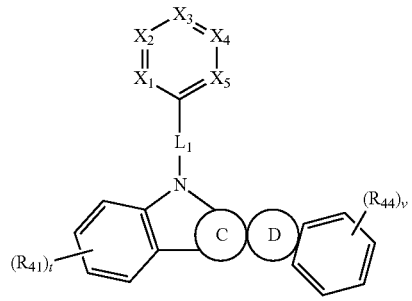

(60)

In the formula (60), $X_1$ to $X_5$ and $L_1$ respectively independently have the same meanings as $X_1$ to $X_5$ and $L_1$ in the formula (1).

In the formula (60), $R_{41}$ and $R_{44}$ each independently have the same meanings as $R_1$ to $R_7$ in the formula (1), t is 4, and v is 4.

In the formula (60), C represents a cyclic structure represented by the formula (7) and D represents a cyclic structure represented by the formula (8), the cyclic structure C and the cyclic structure D each being fused to an adjacent cyclic structure at any position.

The compound represented by the formula (6) is preferably any one of compounds represented by any one of formulae (6A) to (6F) below.

[Formula 45]

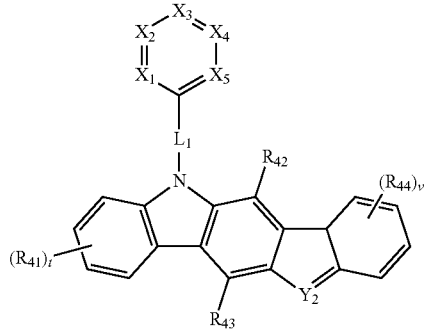

(6A)

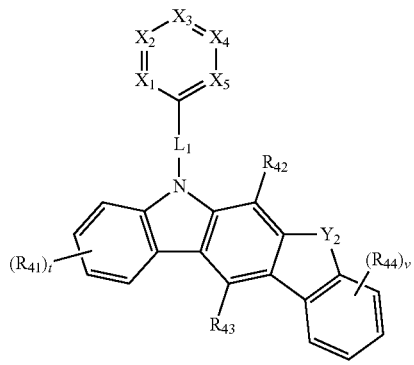

(6B)

[Formula 46]

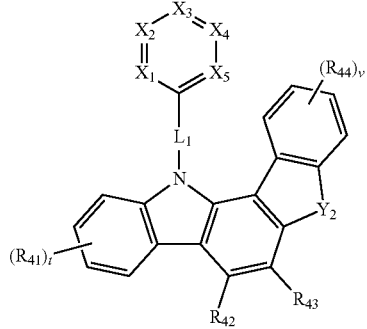

(6C)

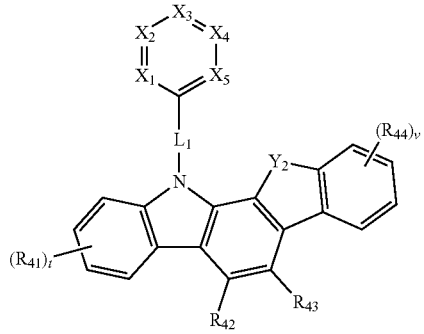

(6D)

[Formula 47]

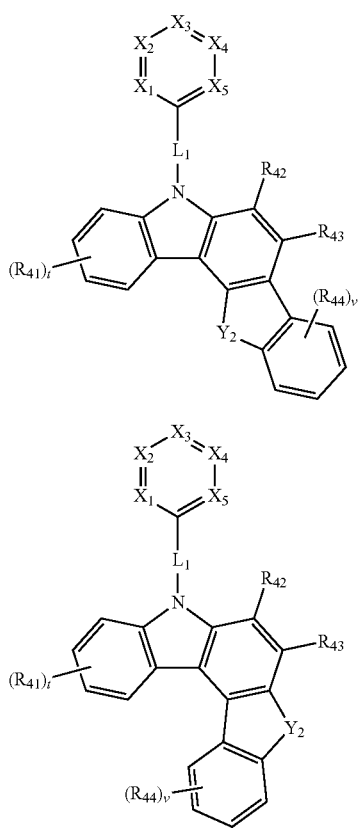

In the formulae (6A) to (6F), $X_1$ to $X_5$ and $L_1$ respectively independently have the same meanings as $X_1$ to $X_5$ and $L_1$ in the formula (1).

In the formulae (6A) to (6F), $R_{41}$, $R_{44}$, t and v respectively have the same meanings as $R_{41}$, $R_{44}$, t and v in the formula (6).

In the formulae (6A) to (6F), $R_{42}$ and $R_{43}$ respectively have the same meanings as $R_{42}$ and $R_{43}$ in the formula (7), and $Y_2$ has the same meanings as $Y_2$ in the formula (8).

In the first exemplary embodiment, it is preferable that $X_5$ is a nitrogen atom and each of $X_1$ to $X_4$ is $Cr_1$ in the formulae (1), (1-1) to (1-6), (1-3-1), (1-5-1), (13) to (18), (5), (5A) to (5D), (6) and (6A) to (6F).

It is preferable that each of $X_1$ and $X_5$ is a nitrogen atom and each of $X_2$ to $X_4$ is $Cr_1$ in the formulae (1), (1-1) to (1-6), (1-3-1), (1-5-1), (13) to (18), (5), (5A) to (5D), (6) and (6A) to (6F).

It is preferable that each of $X_1$, $X_3$ and $X_5$ is a nitrogen atom and each of $X_2$ and $X_4$ is $Cr_1$ in the formulae (1), (1-1) to (1-6), (1-3-1), (1-5-1), (13) to (18), (5), (5A) to (5D), (6) and (6A) to (6F).

Among the above, it is more preferable that each of $X_1$, $X_3$ and $X_5$ is a nitrogen atom and each of $X_2$ and $X_4$ is $CR_1$ so that a triazine ring is provided. In the first exemplary embodiment, the electron accepting moiety represented by the formula (1b) is thus more preferably a triazine ring.

It is preferable that $L_1$ has a divalent six-membered ring structure in the formulae (1), (1-1) to (1-6), (1-3-1), (1-5-1), (13) to (18), (5), (5A) to (5D), (6) and (6A) to (6F).

It is preferable that $L_1$ has a divalent six-membered ring structure represented by a formula (4A) below in the formulae (1), (1-1) to (1-6), (1-3-1), (1-5-1), (13) to (18), (5), (5A) to (5D), (6) and (6A) to (6F).

[Formula 48]

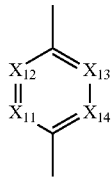

(4A)

In the formula (4A), $X_{11}$ to $X_{14}$ each independently represent $CR_{11}$ or a nitrogen atom, and $R_{11}$ each independently have the same meanings as $R_1$ in the formula (1).

$X_{11}$ to $X_{14}$ in the formula (4A) preferably each independently represent $CR_{11}$.

Especially, it is preferable that $L_1$ is represented by the formula (4A), $X_{11}$ to $X_{14}$ each independently represent $CR_{11}$, $X_1$, $X_3$ and $X_5$ in the formulae (1), (1-1) to (1-6), (1-3-1), (1-5-1), (13) to (18), (5), (5A) to (5D), (6) and (6A) to (6F) each represent a nitrogen atom, and $X_2$ and $X_4$ in these formulae each represent $CR_1$.

In the first exemplary embodiment, the dopant material is especially preferably a compound in which: (i) the electron accepting moiety represented by the formula (1b) is a substituted or unsubstituted triazine ring; (ii) the electron donating moiety represented by the formula (1a) is a bis-carbazole skeleton represented by any one of the formulae (15a), (16), (5) and (5A) to (5D) or a fused arbazole skeleton represented by any one of the formulae (6) and (6A) to (6F); and (iii) the electron accepting moiety and the electron donating moiety are connected to each other via a substituted or unsubstituted p-phenylene group.

Specifically, the compound represented by the formula (5) is represented by a formula (5E) below, and the compound represented by the formula (6) is represented by a formula (6G) below.

[Formula 49]

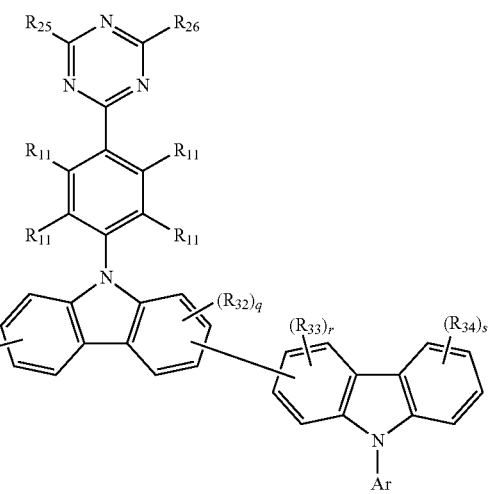

(5E)

[Formula 50]

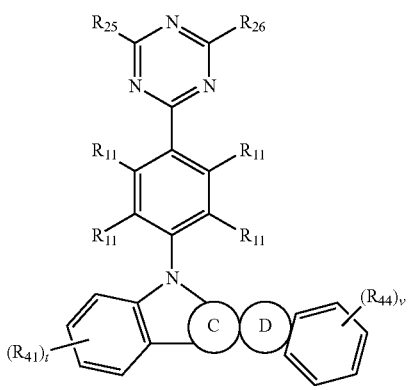

(6G)

In the formula (5E), $R_{31}$ to $R_{34}$, p, q, r, s and Ar respectively have the same meanings as $R_{31}$ to $R_{34}$, p, q, r, s and Ar in the formula (5). In the formula (5E), p is 4, q is 3, r is 3, and s is 4.

In the formula (6G), $R_{41}$, $R_{44}$, t, v, the cyclic structure C and the cyclic structure D have the same meanings as $R_{41}$, $R_{44}$, t, v, the cyclic structure C and the cyclic structure D in the formula (6).

In the formulae (5E) and the (6G), $R_{11}$ each independently have the same meanings as $R_{11}$ in the formula (4), and $R_{25}$ and $R_{26}$ have the same meanings as $R_1$ in the formula (1).

Cz in the formula (1-1) may be a group selected from the group consisting of groups derived from structures represented by formulae (116) to (119) below.

[Formula 51]

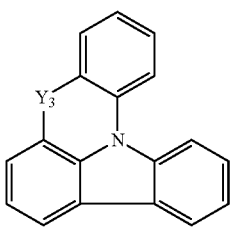

(116)

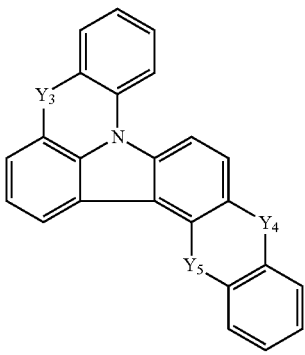

(117)

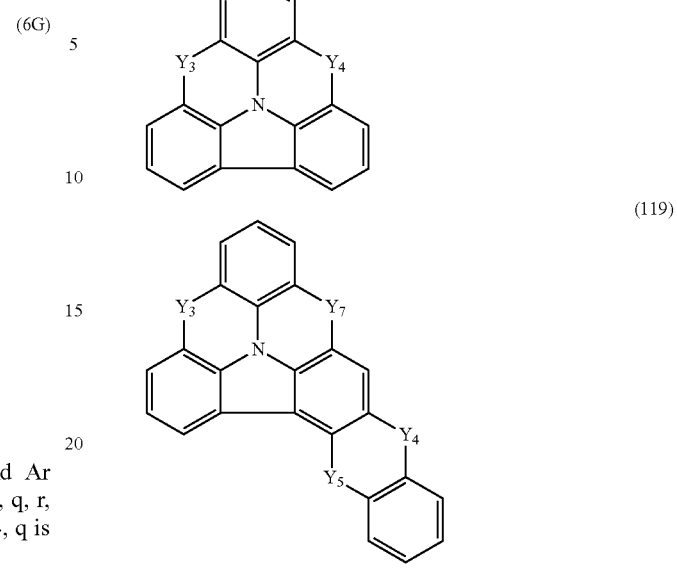

(118)

(119)

In the formulae (116) to (119), $Y_3$, $Y_4$, $Y_5$ and $Y_7$ each independently represent $CR_{48}R_{49}$, $NR_{50}$, a sulfur atom or an oxygen atom, and $R_{48}$ to $R_{50}$ each independently have the same meanings as $R_2$ to $R_7$ described above.

The groups derived from the structures represented by the formulae (116) to (119) may further have a substituent.

ΔST

In the first exemplary embodiment, it is preferable that a difference ΔST(D1) between singlet energy EgS(D1) and energy gap $Eg_{77K}$(D1) at 77[K] in the compound used as the dopant material satisfies a numerical formula (1) below.

$$\Delta ST(D1)=EgS(D1)-Eg_{77K}(D1)<0.3 \text{ [eV]} \quad \text{(Numerical Formula 1)}$$

ΔST will be described herein.

When a compound having a small energy difference (ΔST) between singlet energy EgS and triplet energy EgT is used as a dopant material, an organic EL device emits light with high efficiency in a high current density region. The ΔST(D1) means ΔST of the dopant material.

From quantum chemical viewpoint, decrease in the energy difference (ΔST) between the singlet energy EgS and the triplet energy EgT can be achieved by a small exchange interaction therebetween. Physical details of the relationship between ΔST and the exchange interaction are described, for instance, in Reference Document 1 and Reference Document 2 below.

Reference Document 1: Organic EL Symposium, proceeding for the tenth meeting edited by Chihaya Adachi et al., S2-5, pp. 11-12

Reference Document 2: Organic Photochemical Reaction Theory edited by Katsumi Tokumaru, Tokyo Kagaku Dojin Co., Ltd. (1973).

Such a material can be synthesized according to molecular design based on quantum calculation. Specifically, the material is a compound in which a LUMO electron orbit and a HOMO electron orbit are localized to avoid overlapping.

Examples of the compound having a small ΔST used as the dopant material according to the invention are compounds in which a donor element is bonded to an acceptor element in a molecule and ΔST is in a range of 0 eV or more and less than 0.3 eV in view of electrochemical stability (oxidation-reduction stability).

A more preferable compound is such a compound that dipoles formed in the excited state of a molecule interact with each other to form an aggregate having a reduced exchange interaction energy. According to analysis by the inventors, the dipoles are oriented substantially in the same direction in the compound, so that ΔST can be further reduced by the interaction of the molecules. In such a case, ΔST can be extremely small in a range of 0 eV to 0.2 eV.

TADF Mechanism

As described above, when ΔST(D1) of the organic material is small, inverse intersystem crossing from the triplet energy level of the dopant material to the singlet energy level thereof is easily caused by a heat energy given from the outside. An energy state conversion mechanism to perform spin exchange from the triplet state of electrically excited excitons within the organic EL device to the singlet state by inverse intersystem crossing is referred to as TADF Mechanism.

In the first exemplary embodiment, the dopant material is preferably a compound having a small ΔST(D1), so that inverse intersystem crossing from the triplet energy level of the dopant material to the singlet energy level thereof is easily caused by a heat energy given from the outside.

Figure 2:
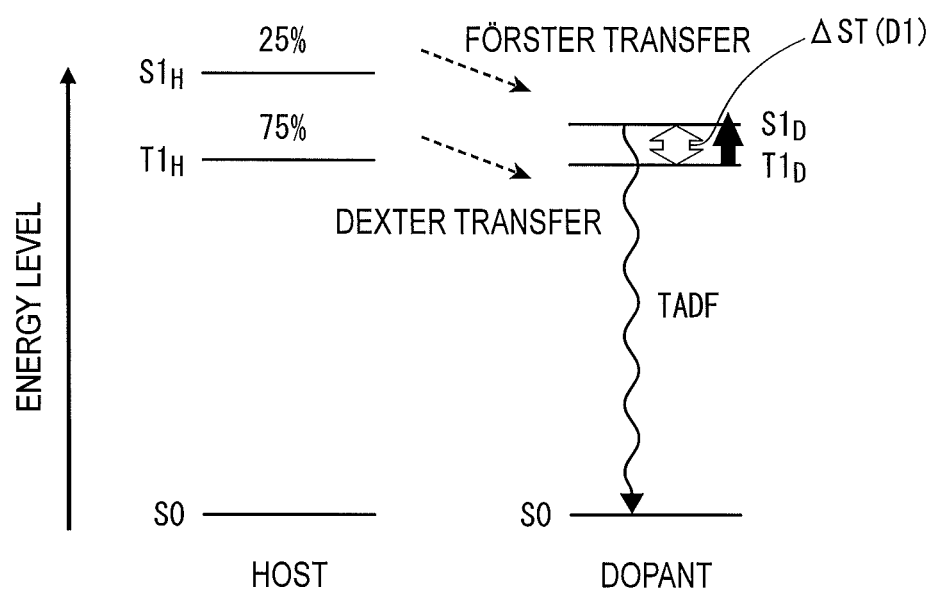
FIG. 2 shows a relationship of an energy level of a host material and a dopant material in an emitting layer and an energy transfer between the host material and the dopant material.

FIG. 2 shows a relationship in energy level between the host material and the dopant material in the emitting layer. In FIG. 2, S0 represents a ground state, $S1_H$ represents a lowest singlet state of the host material, $T1_H$ represents a lowest triplet state of the host material, $S1_D$ represents a lowest singlet state of the dopant material, and $T1_D$ represents a lowest triplet state of the dopant material. A dotted-line arrow shows energy transfer between the excited states. As shown in FIG. 2, when the dopant material is a material having a small ΔST(D1), host material, Dexter transfer from the lowest triplet state $T1_H$ of the host material results in an energy transfer to the lowest singlet state $S1_D$ or the lowest triplet state $T1_D$ of the dopant material. Further, inverse intersystem crossing from the lowest triplet state $T1_D$ of the dopant material to the lowest singlet state $S1_D$ may be caused by a heat energy and, consequently, fluorescent emission from the lowest singlet state $S1_D$ of the dopant material can be observed. It is speculated that the internal quantum efficiency can be theoretically raised up to 100% by using delayed fluorescence by the TADF mechanism.

Relationship Between EgT and $Eg_{77K}$

The triplet energy EgT is different from a triplet energy as typically defined for some reasons. The reasons will be described below.

Typically, a triplet energy is calculated in a process including: measuring a phosphorescent spectrum (ordinate axis: phosphorescent luminous intensity, abscissa axis: wavelength) of a sample, which is prepared by dissolving a compound to be measured in a solvent, at a low temperature (77[K]); drawing a tangent at the rise of the phosphorescent spectrum on the short-wavelength side to obtain a wavelength value of an intersection between the tangent and the abscissa axis; and calculating the triplet energy from the wavelength value by a predetermined conversion equation.

A compound used as the dopant material according to the first exemplary embodiment is preferably a compound having a small ΔST as described above. When ΔST is small, intersystem crossing and inverse intersystem crossing are likely to occur even at a low temperature (77[K]), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the first exemplary embodiment, an energy amount measured in the above process is defined as an energy gap $Eg_{77K}$, whereas ΔST is defined as a difference between a singlet energy EgS and the energy gap $Eg_{77K}$ so that the measured energy is differentiated from a typical triplet energy in a strict meaning even though the spectrum is measured by the same method as one for measuring the typical triplet energy EgT, the above process including: measuring a phosphorescent spectrum (ordinate axis: phosphorescent luminous intensity, abscissa axis: wavelength) of a sample, which is prepared by dissolving a compound to be measured in a solvent, at a low temperature (77[K]); drawing a tangent at the rise of the phosphorescent spectrum on the short-wavelength side to obtain a wavelength value of an intersection between the tangent and the abscissa axis; and calculating the triplet energy from the wavelength value by a predetermined conversion equation. A ST(D1) is thus represented by the numerical formula (1).

Singlet Energy EgS

The singlet energy EgS according to the first exemplary embodiment is defined as an energy calculated in a typical manner. Specifically, a compound to be measured is deposited by evaporation on a quartz substrate to prepare a sample, an absorption spectrum (ordinate axis: absorbance, abscissa axis: wavelength) of the sample is measured at a normal temperature (300K), a tangent is drawn at the rise of the absorption spectrum on the long-wavelength side to obtain a wavelength value of an intersection between the tangent and the abscissa axis, and the singlet energy EgS is calculated from the wavelength value by a predetermined conversion equation.

The calculation of the singlet energy EgS and the energy gap $Eg_{77K}$ will be described later in detail.

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, carbon atom(s) included in the substituent is not counted as the ring carbon atoms. The same applies to the "ring carbon atoms" described below, unless particularly noted. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring or a naphthalene ring is substituted, for instance, by an alkyl group, the carbon atoms of the alkyl group are not counted as the ring carbon atoms. For instance, when a fluorene ring (inclusive of a spirofluorene ring) is bonded as a substituent to a fluorene ring, the carbon atoms of the fluorene ring as a substituent are not counted as the ring carbon atoms.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring (e.g., hydrogen atom(s) for saturating the valence of the atom which forms the ring) and atom(s) in a substituent by which the ring is substituted are not counted as the ring atoms. The same applies to the "ring atoms" described below, unless particularly noted. For instance, a pyridine ring has 6 ring atoms, a quinazoline ring has 10 ring atoms, and a furan ring has 5 ring atoms. Hydrogen atoms respectively bonded to carbon atoms of the pyridine ring or the quinazoline ring and atoms forming a substituent are not counted as the ring atoms. For instance, when a fluorene ring (inclusive of a spirofluorene ring) is bonded as a substituent to a fluorene ring, the atoms of the fluorene ring as a substituent are not included in the ring atoms.

In the exemplary embodiment, examples of the aryl group having 6 to 30 ring carbon atoms include a phenyl group, biphenyl group, terphenyl group, naphthyl group, anthryl group, phenanthryl group, fluorenyl group, pyrenyl group, chrysenyl group, fluoranthenyl group, benzo[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group in the exemplary embodiment preferably has 6 to 20 ring carbon atoms, more preferably 6 to 12 ring carbon atoms. Among the above aryl group, a phenyl group, biphenyl group, naphthyl group, phenanthryl group, terphenyl group, and fluorenyl group are particularly preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms later described in the exemplary embodiment.

Examples of the heterocyclic group having 5 to 30 ring atoms in the exemplary embodiment include a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazole group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group in the exemplary embodiment preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are particularly preferable. A nitrogen atom at a position 9 of each of 1-carbazolyl group, 2-carbazolyl group, 3-carbazolyl group and 4-carbazolyl group is preferably substituted by a substituted or unsubstituted aryl group having 6 to 30 ring carbon atoms or a substituted or unsubstituted heterocyclic group having 5 to 30 ring atoms in the exemplary embodiment.

The alkyl group having 1 to 30 carbon atoms in the exemplary embodiment is preferably linear, branched or cyclic. Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

The linear or branched alkyl group in the exemplary embodiment preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group, and neopentyl group are particularly preferable.

Examples of the cycloalkyl group in the exemplary embodiment include a cyclopropyl group, cyclobutyl group, cyclopentyl group, cyclohexyl group, 4-methylcyclohexyl group, adamantyl group and norbornyl group. The cycloalkyl group preferably has 3 to 10 ring carbon atoms, more preferably 5 to 8 ring carbon atoms. Among the above cycloalkyl group, a cyclopentyl group and a cyclohexyl group are particularly preferable.

The halogenated alkyl group provided by substituting the alkyl group with a halogen atom is exemplified by a halogenated alkyl group obtained by substituting the alkyl group having 1 to 30 carbon atoms with one or more halogen atoms. Specific examples of the halogenated alkyl group includes a fluoromethyl group, difluoromethyl group, trifluoromethyl group, fluoroethyl group, trifluoromethylmethyl group, trifluoroethyl group, and pentafluoroethyl group.

The alkylsilyl group having 3 to 30 carbon atoms in the exemplary embodiment is exemplified by a trialkylsilyl group having the above alkyl group having 1 to 30 carbon atoms. Specific examples of the trialkylsilyl group include a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyldimethylsilyl group, propyldimethylsilyl group and triisopropylsilyl group. Three alkyl groups in the trialkylsilyl group may be mutually the same or different.

Examples of the arylsilyl group having 6 to 30 ring carbon atoms in the exemplary embodiment include a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group having three of the above aryl group having 6 to 30 ring carbon atoms. The triarylsilyl group preferably has 18 to 30 carbon atoms.

The alkoxy group having 1 to 30 carbon atoms in the exemplary embodiment is represented by $-OZ_1$, $Z_1$ is exemplified by the above alkyl group having 1 to 30 carbon atoms. Examples of the alkoxy group include a methoxy group, ethoxy group, propoxy group, butoxy group, pentyloxy group and hexyloxy group.

The halogenated alkoxy group provided by substituting the alkoxy group with a halogen atom is exemplified by a halogenated alkoxy group obtained by substituting the alkoxy group having 1 to 30 carbon atoms with one or more halogen atoms.

The aryloxy group having 6 to 30 ring carbon atoms in the exemplary embodiment is represented by $-OZ_2$. $Z_2$ is exemplified by the above aryl group having 6 to 30 ring carbon atoms. The aryloxy group is exemplified by a phenoxy group.

The alkylamino group having 2 to 30 carbon atoms is represented by $-NHR_V$ or $-N(R_V)_2$. $R_V$ is exemplified by the above alkyl group having 1 to 30 carbon atoms.

The arylamino group having 6 to 60 ring carbon atoms is represented by $-NHR_W$ or $-N(R_W)_2$. $R_W$ is exemplified by the above aryl group having 6 to 30 ring carbon atoms.

The alkylthio group having 1 to 30 carbon atoms is represented by $-SR_V$. $R_V$ is exemplified by the above alkyl group having 1 to 30 carbon atoms.

The arylthio group having 6 to 30 ring carbon atoms is represented by $-SR_W$. $R_W$ is exemplified by the above aryl group having 6 to 30 ring carbon atoms.

In the invention, "carbon atoms forming a ring (ring carbon atoms)" mean carbon atoms forming a saturated ring, an unsaturated ring, or an aromatic ring. "Atoms forming a ring (ring atoms)" mean carbon atoms and hetero atoms forming a hetero ring including a saturated ring, unsaturated ring, or aromatic ring.

In the invention, a hydrogen atom includes isotope having different numbers of neutrons, specifically, protium, deuterium and tritium.

Examples of substituents in the first exemplary embodiment, such as the substituent meant by "substituted or unsubstituted", the substituent of the linking group(s) of $L_1$ to $L_3$ and the substituent in the cyclic structures A and B, are an alkenyl group, alkynyl group, aralkyl group, halogen atom, cyano group, hydroxyl group, nitro group and carboxy group, in addition to the above-described aryl group, heterocyclic group, alkyl group (linear or branched alkyl group, cycloalkyl group and haloalkyl group), alkylsilyl group, arylsilyl group, alkoxy group, aryloxy group, alkylamino group, arylamino group, alkylthio group, and arylthio group.

Among the above substituents, an aryl group, heterocyclic group, alkyl group, halogen atom, alkylsilyl group, arylsilyl group and cyano group are preferable. More preferable substituents are the preferable substituents specifically described for each substituent.

The aromatic hydrocarbon group as the linking group(s) of $L_1$ to $L_3$ and the like may be a group derived from the aryl group having 6 to 30 ring carbon atoms, and the heterocyclic group as the linking group(s) of $L_1$ to $L_3$ and the like may be a group derived from the heterocyclic group having 5 to 30 ring atoms.

The alkenyl group is preferably an alkenyl group having 2 to 30 carbon atoms, which may be linear, branched or cyclic. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group, and cyclohexadienyl group.

The alkynyl group is preferably an alkynyl group having 2 to 30 carbon atoms, which may be linear, branched or cyclic. Examples of the alkynyl group includes ethynyl, propynyl, and 2-phenylethynyl.

The aralkyl group is preferably an aralkyl group having 6 to 30 ring carbon atoms and is represented by $-Z_3-Z_4$. $Z_3$ is exemplified by an alkylene group derived from the above alkyl group having 1 to 30 carbon atoms. $Z_4$ is exemplified by the above aryl group having 6 to 30 ring carbon atoms. This aralkyl group is preferably an aralkyl group having 7 to 30 carbon atoms, in which an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Examples of the halogen atom are fluorine, chlorine, bromine and iodine, among which a fluorine atom is preferable.

"Unsubstituted" in "substituted or unsubstituted" herein means that a group is not substituted by the above-described substituents but bonded with a hydrogen atom.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. "YY" is larger than "XX" and each of "XX" and "YY" represents an integer of 1 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. "YY" is larger than "XX" and each of "XX" and "YY" represents an integer of 1 or more.

The same description as the above applies to "substituted or unsubstituted" in the following compound or a partial structure thereof.

Specific examples of the compound represented by the formula (1) are shown below, but the invention is not limited thereto.

[Formula 52]
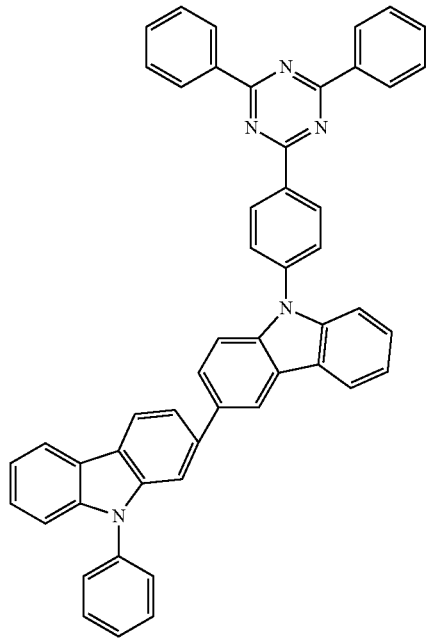 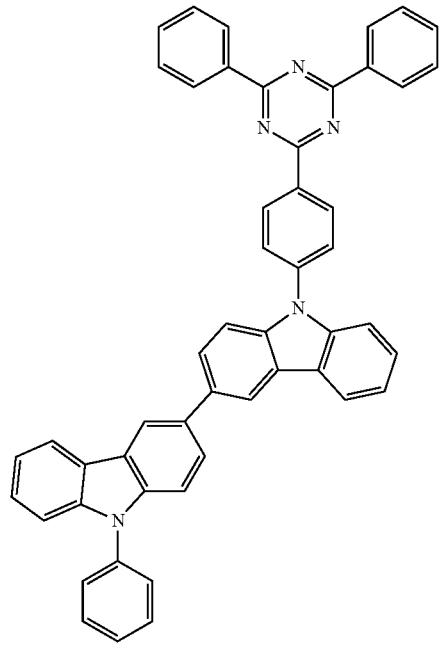
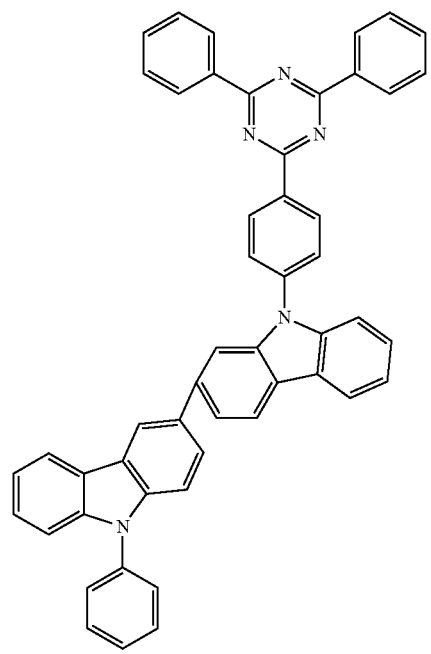 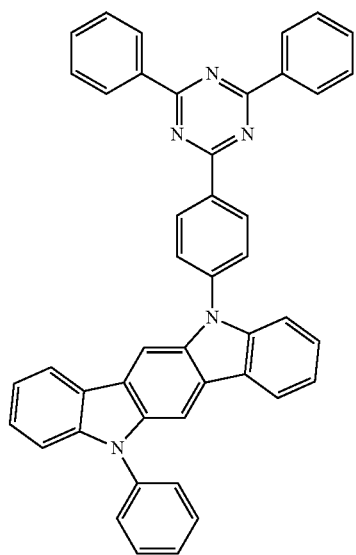

-continued
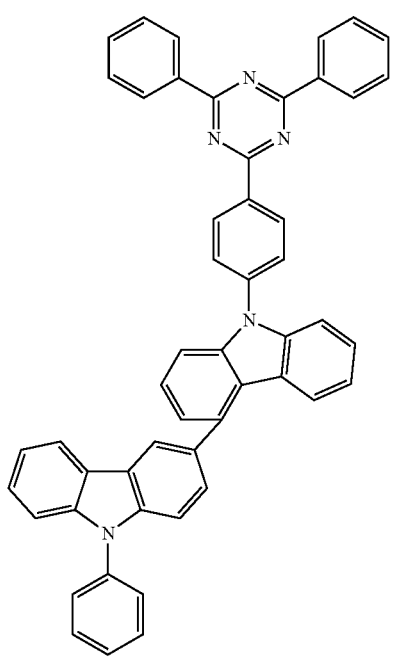
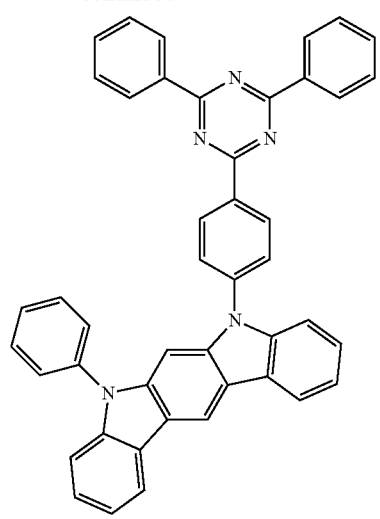
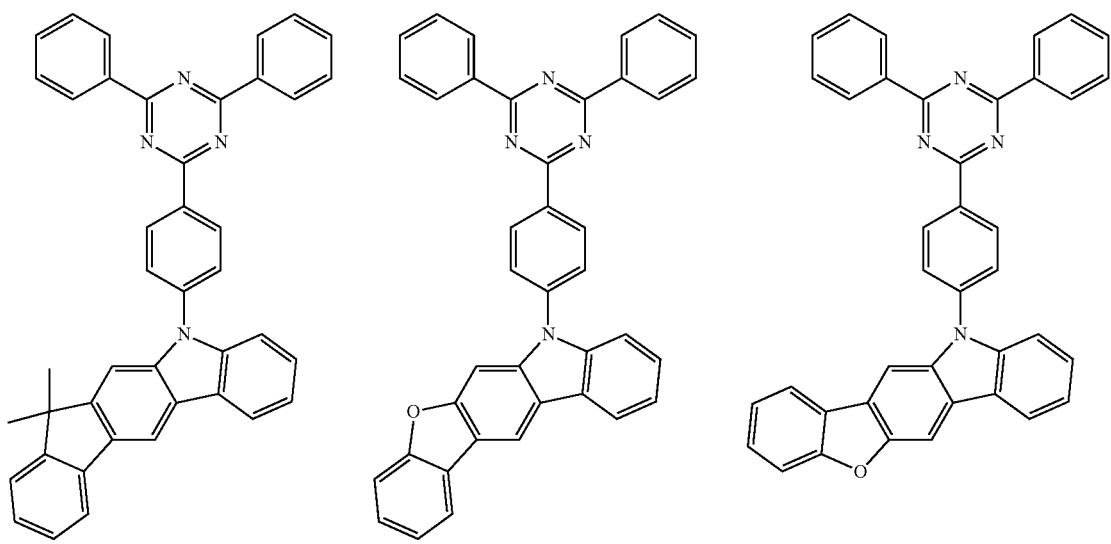

[Formula 53]
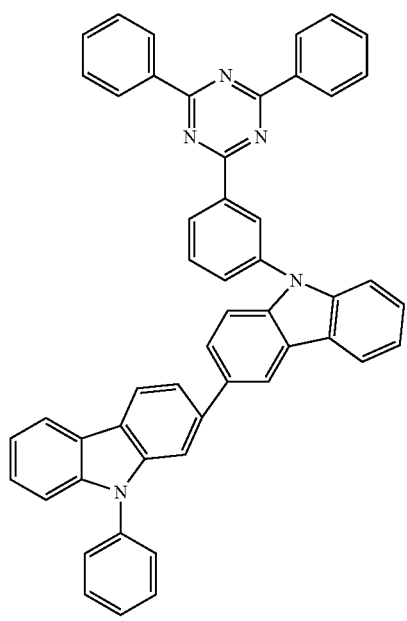 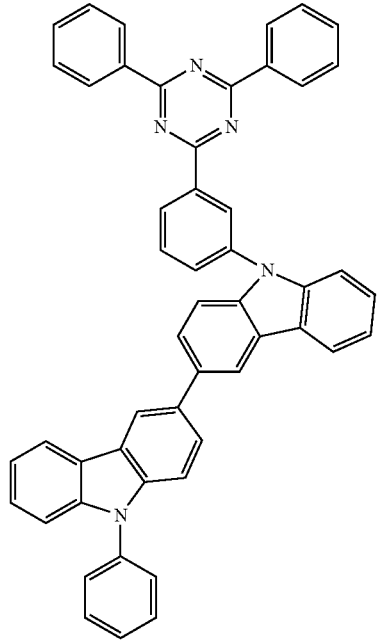
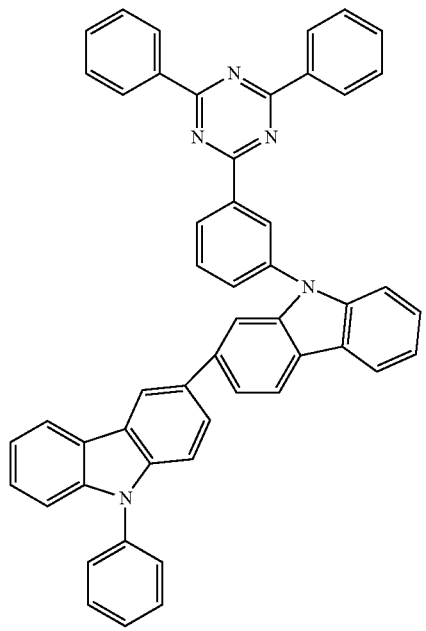 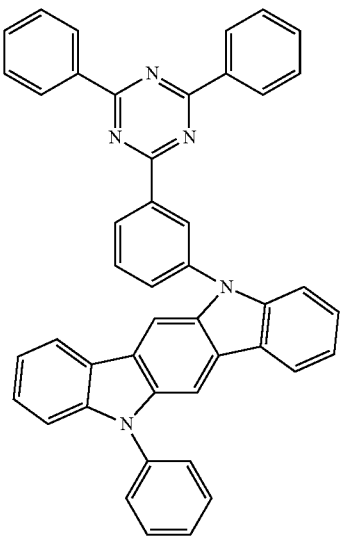

-continued
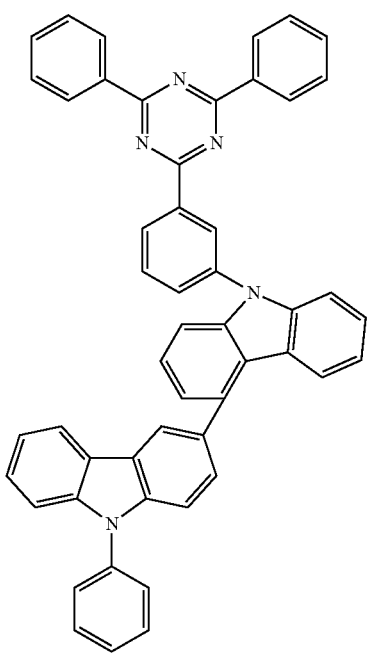
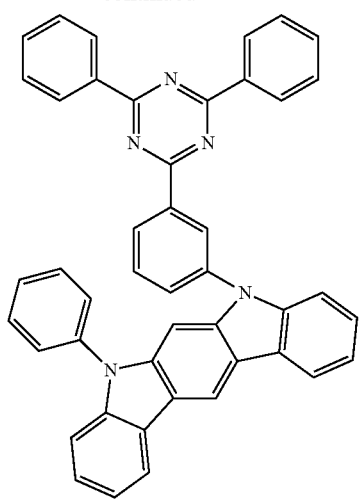
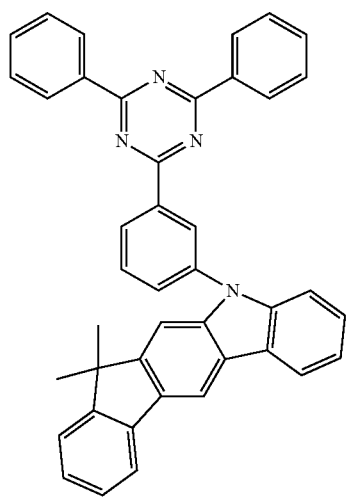
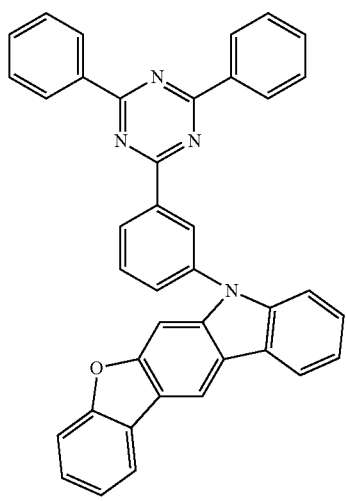
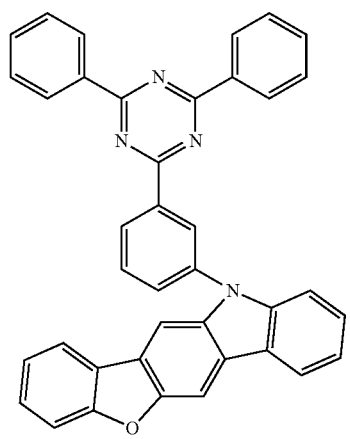

[Formula 54]
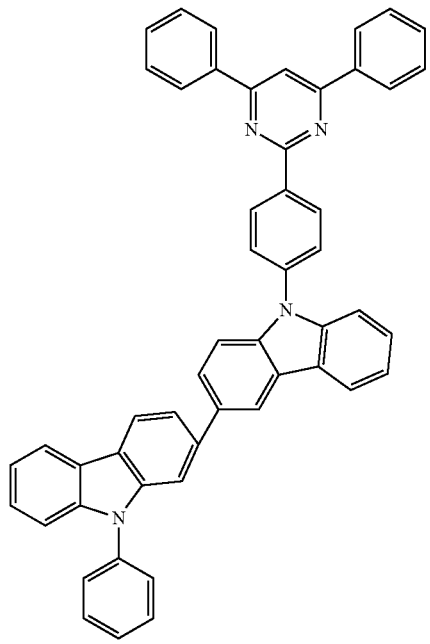 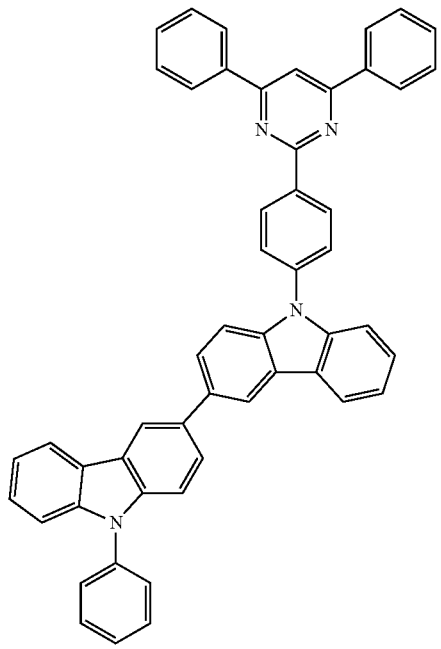
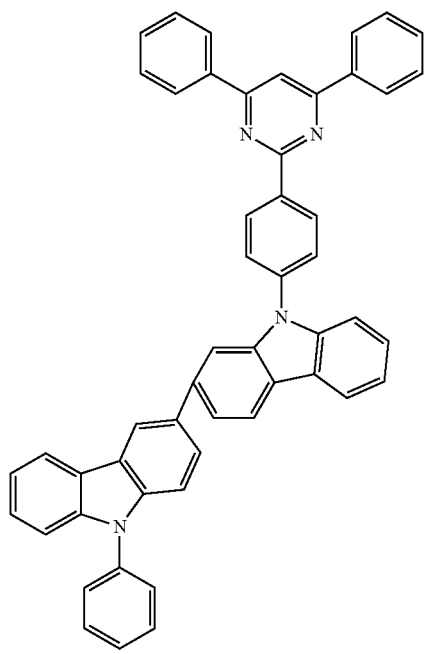 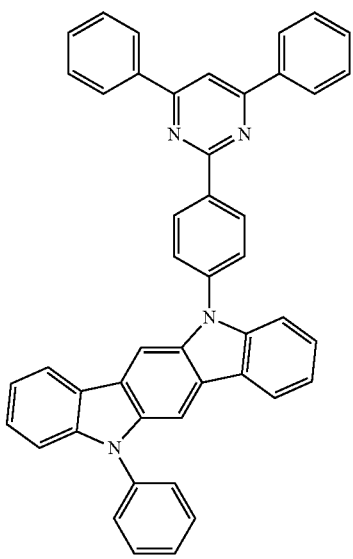

-continued
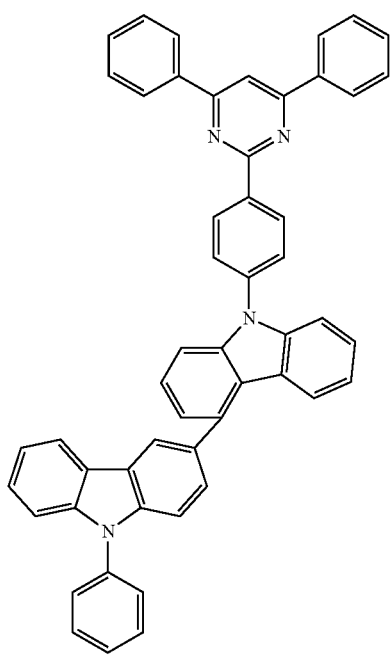
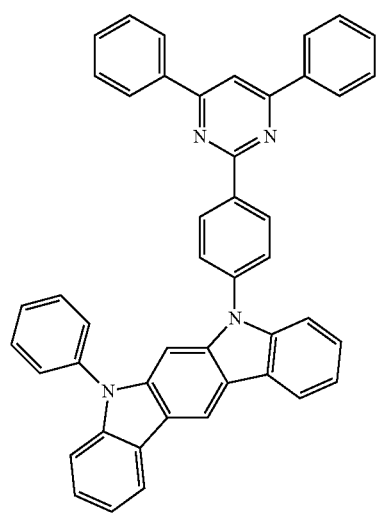
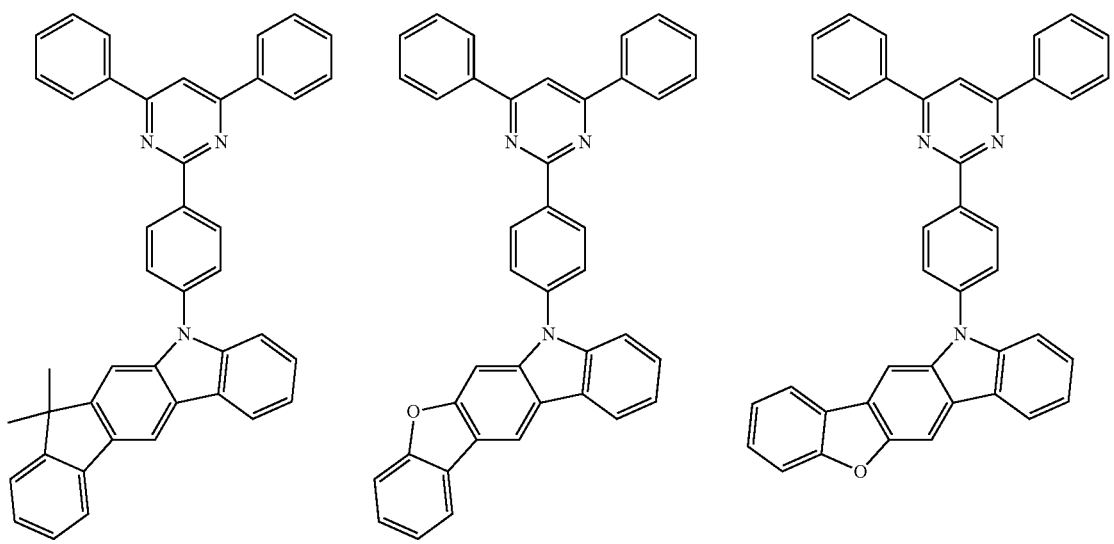

[Formula 55]
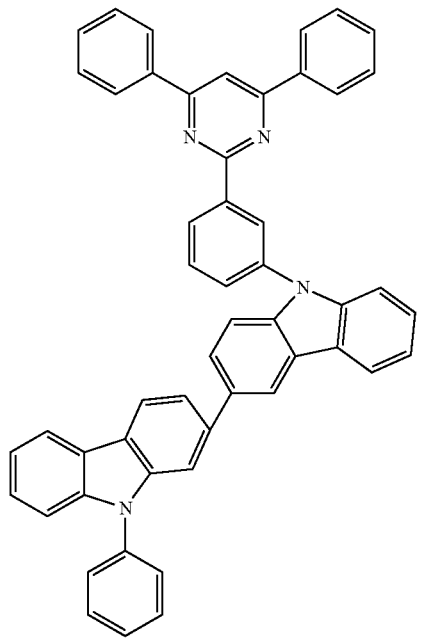
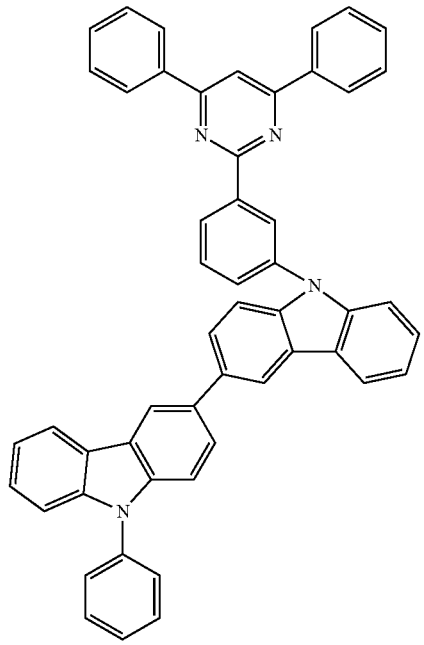
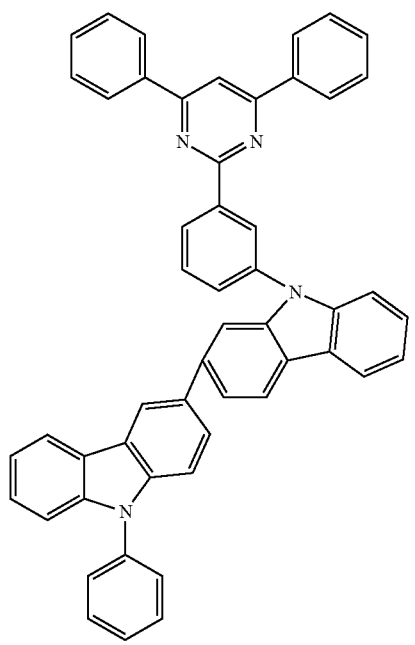
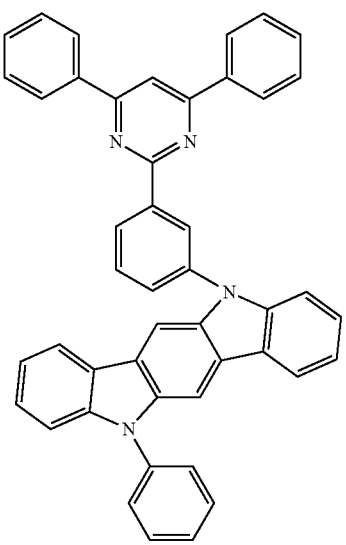

-continued
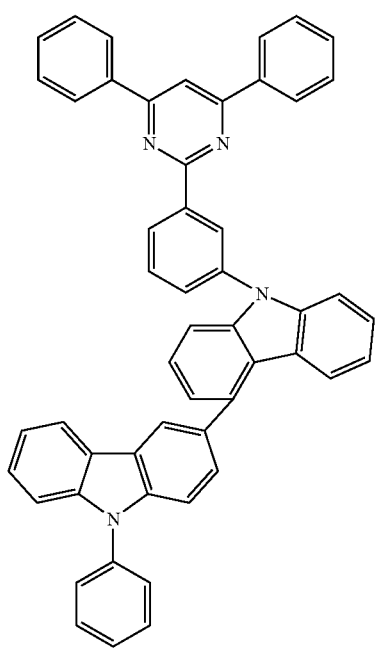
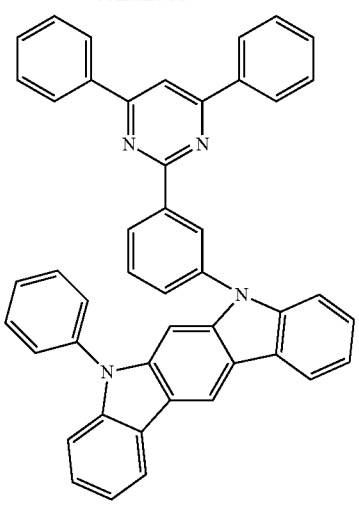
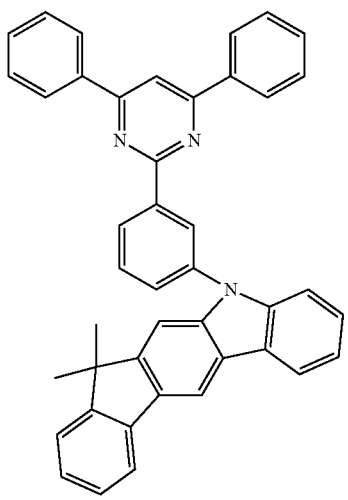
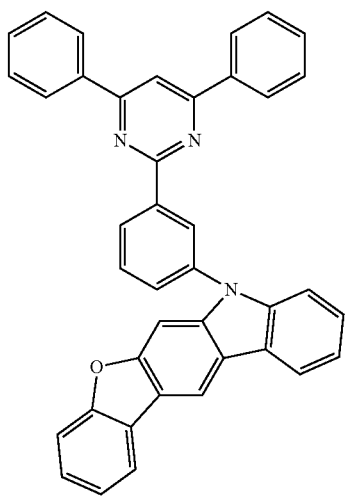
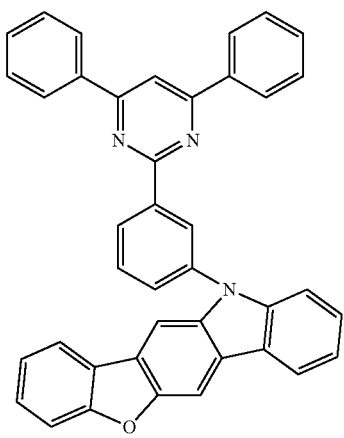

[Formula 56]
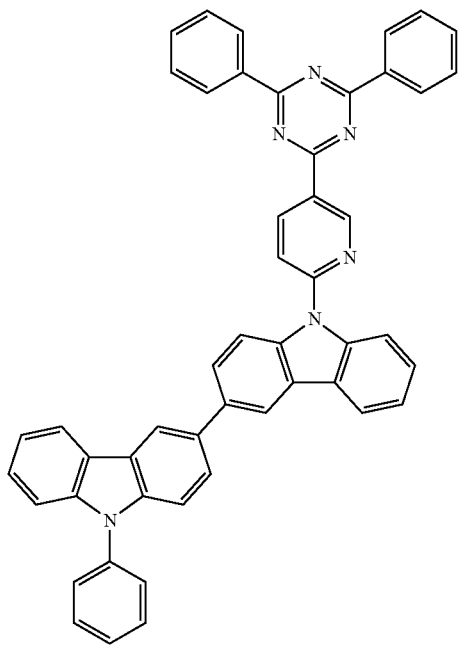
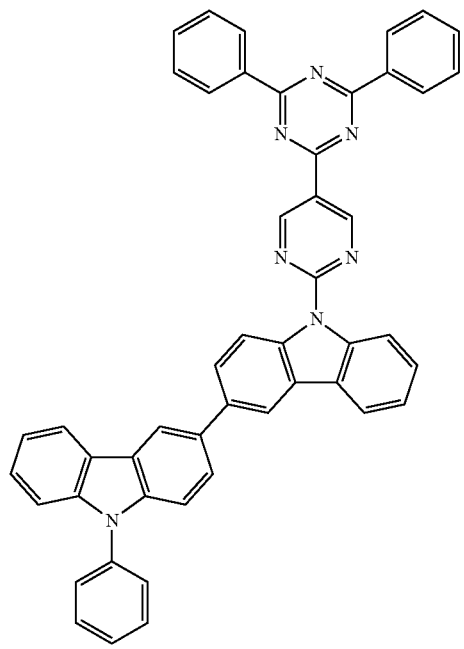
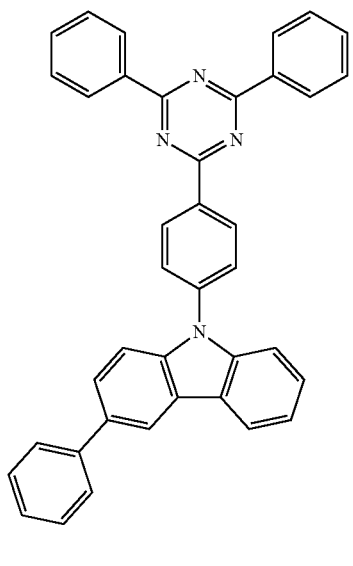
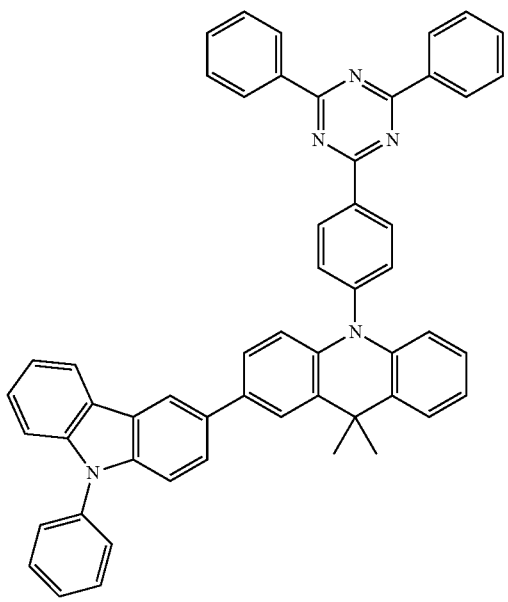

61
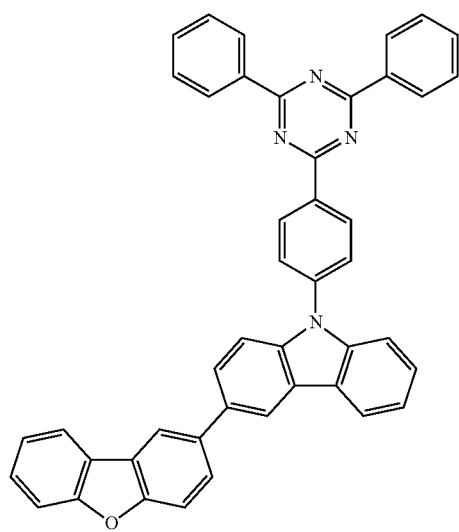
62
-continued
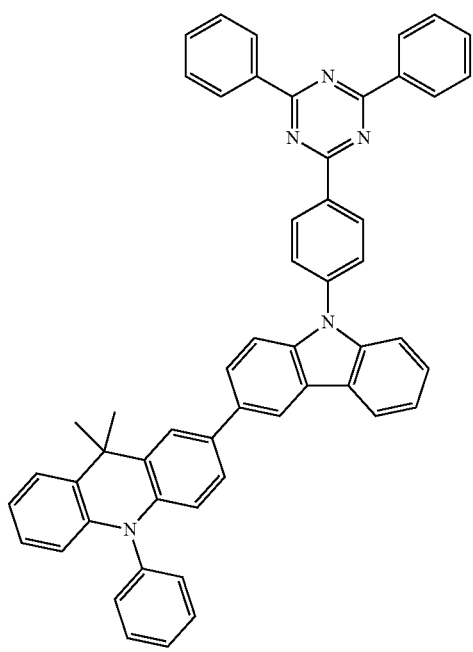
[Formula 57]
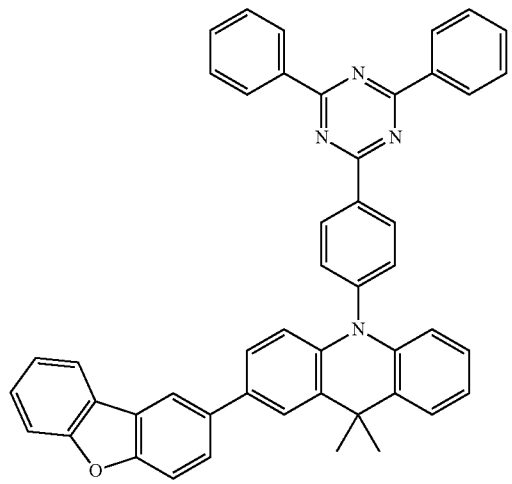
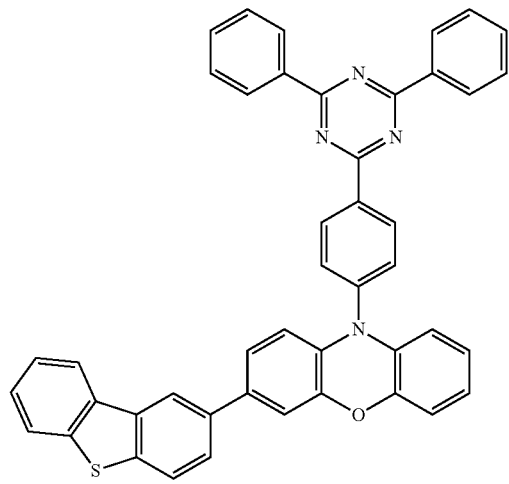

63
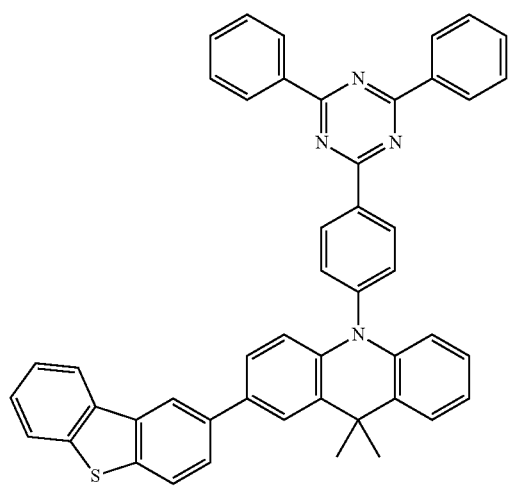
64
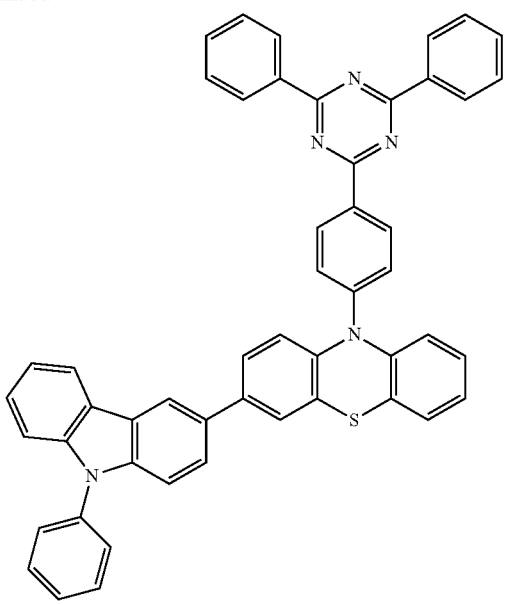
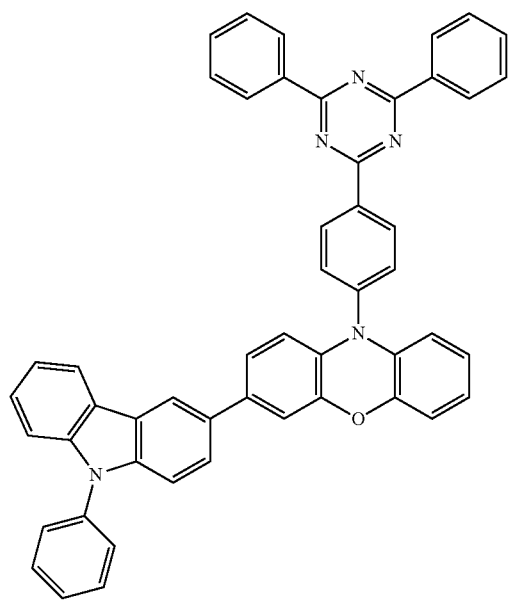
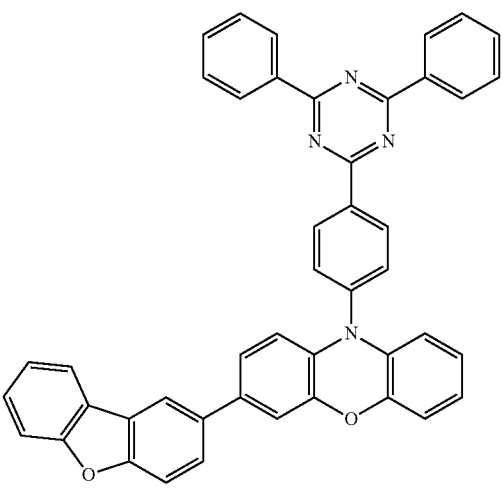

-continued
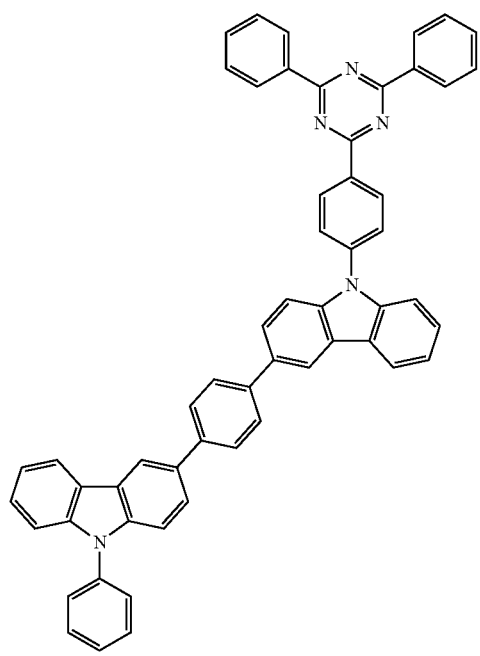
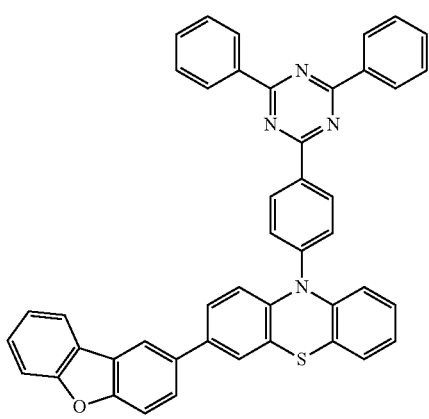
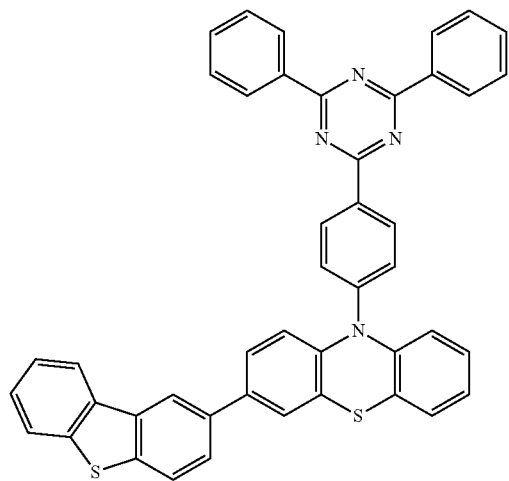
[Formula 58]
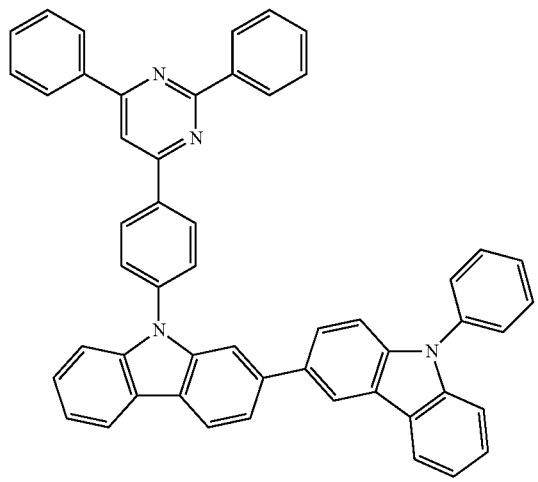
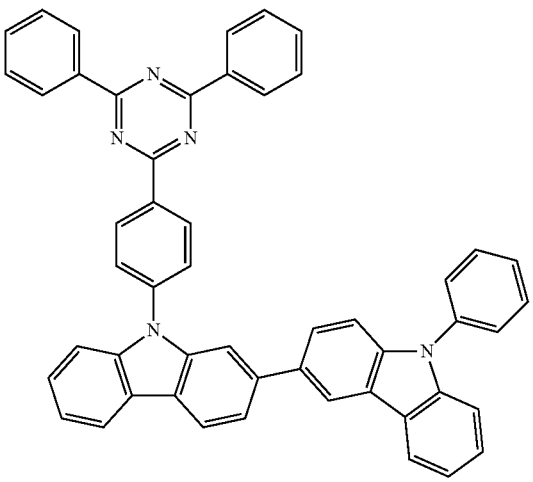

[Formula 59]
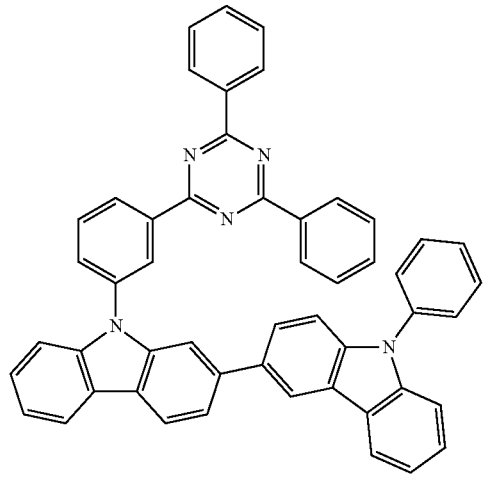 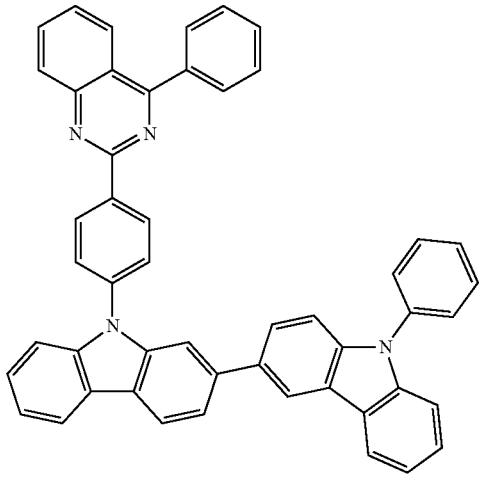
[Formula 60]
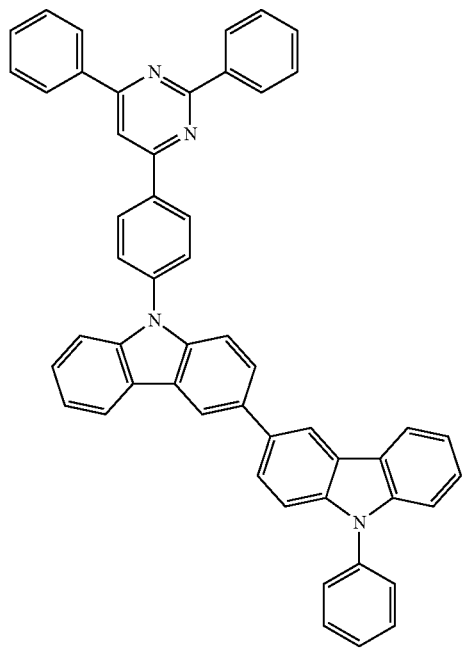 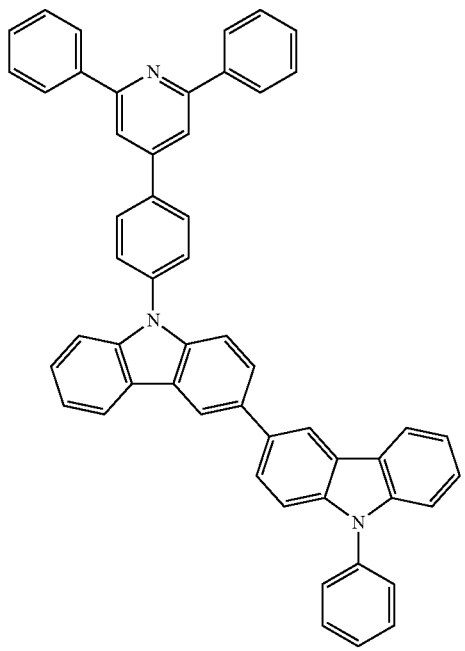

-continued
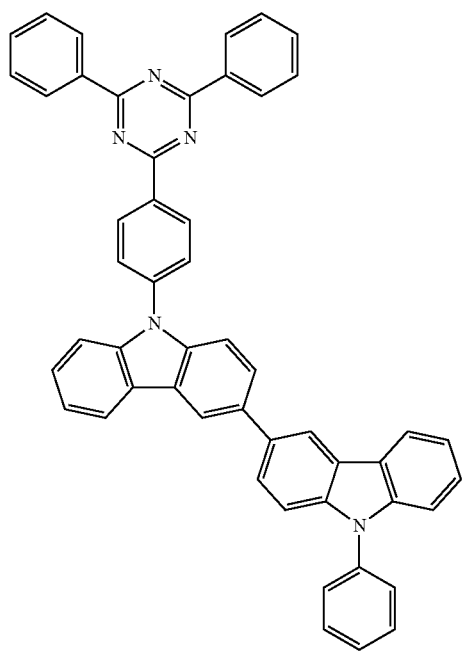
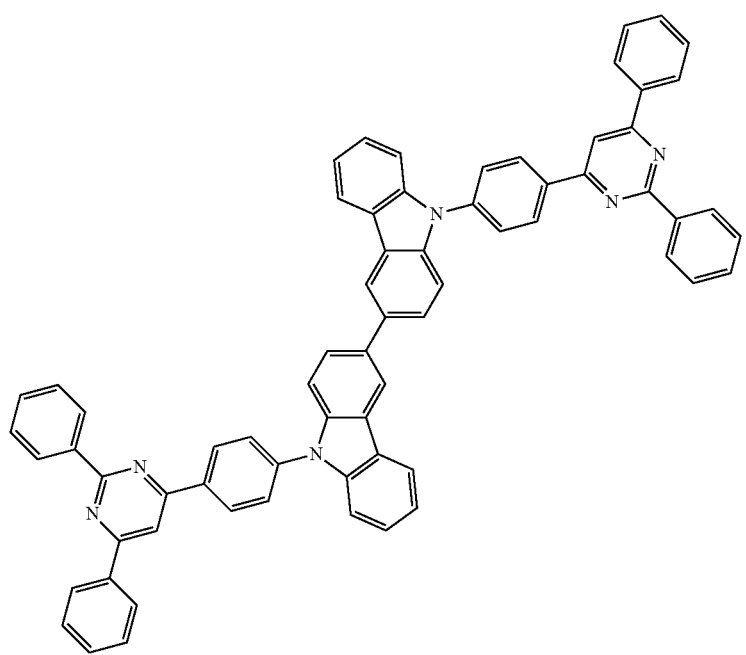

-continued
[Formula 61]
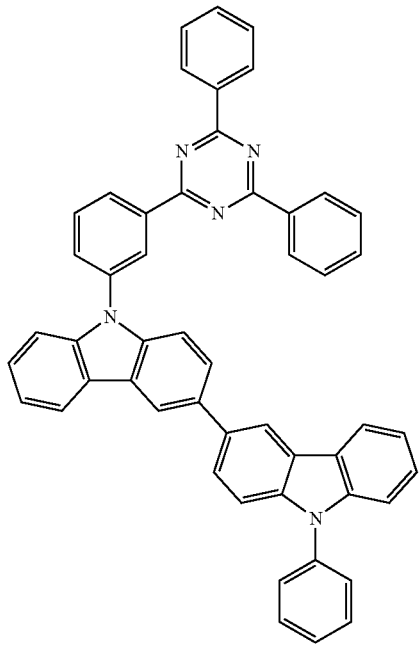
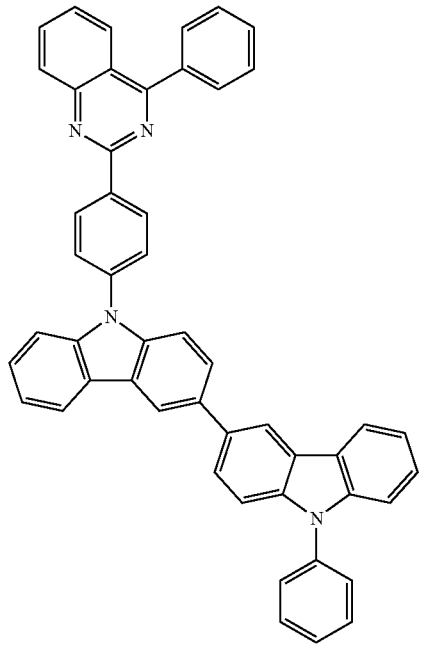
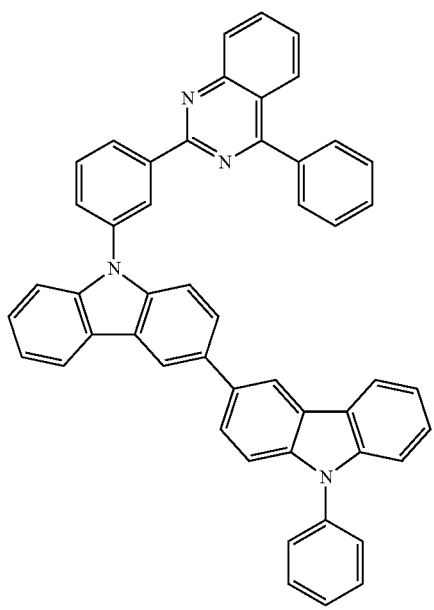

[Formula 62]
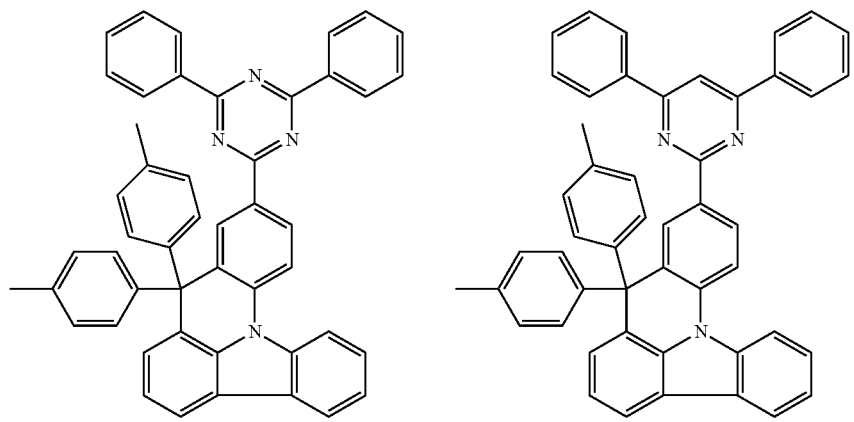
[Formula 63]
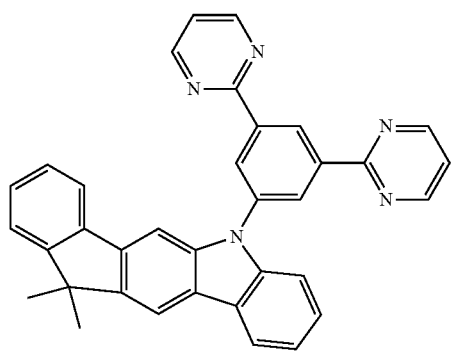
[Formula 64]
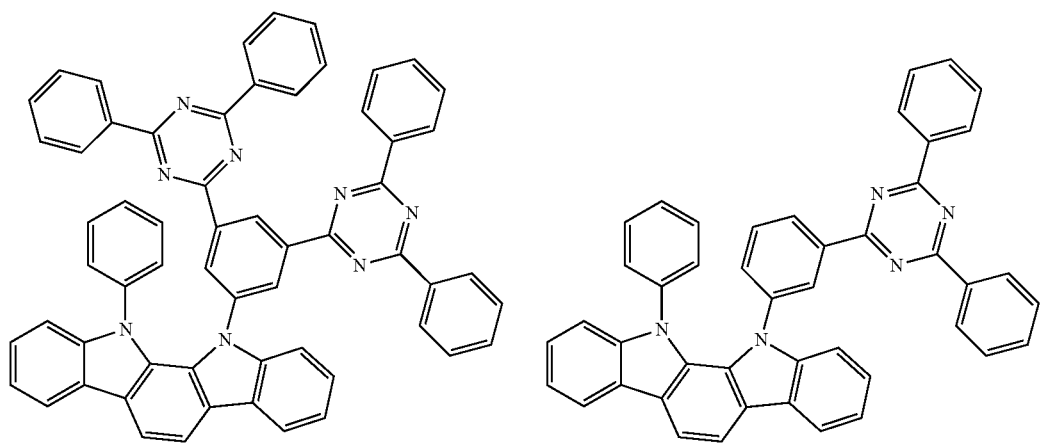

-continued
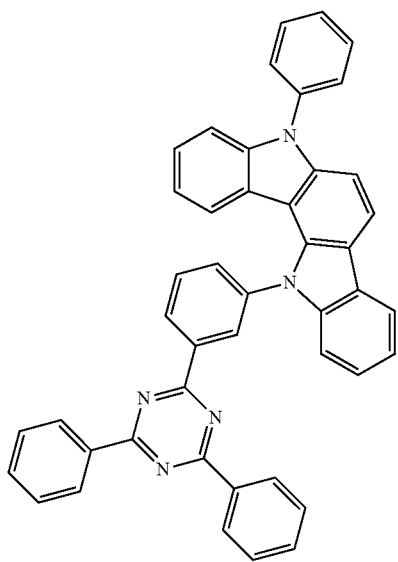
[Formula 65]
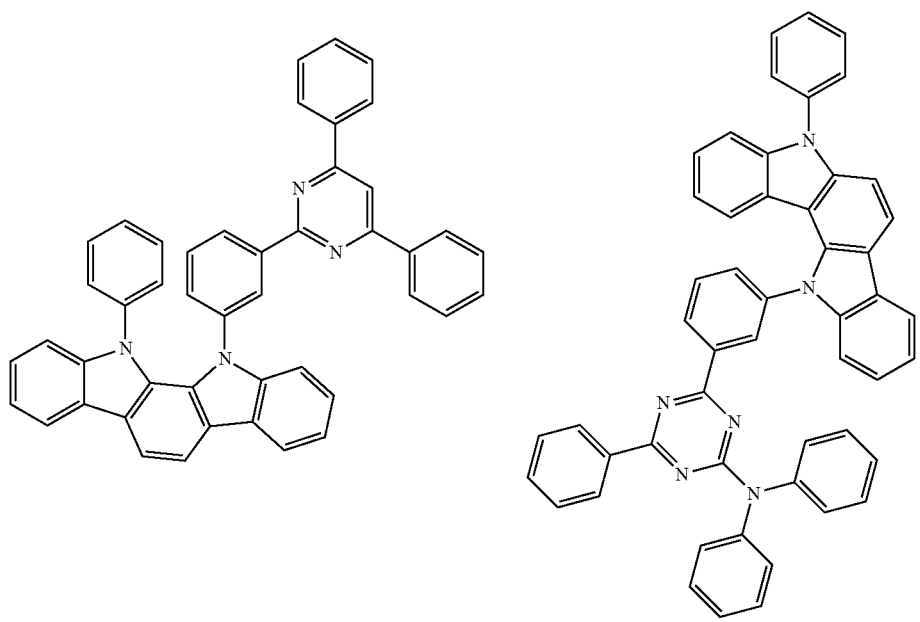

[Formula 66]
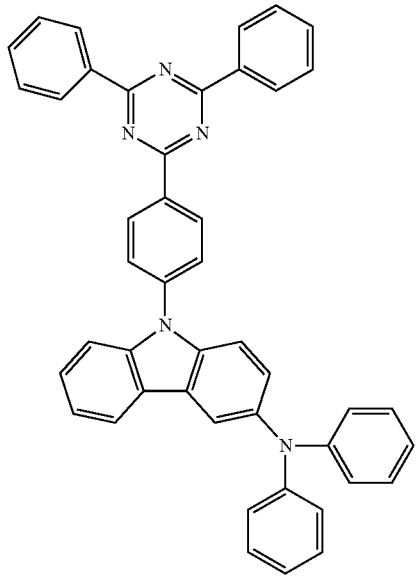
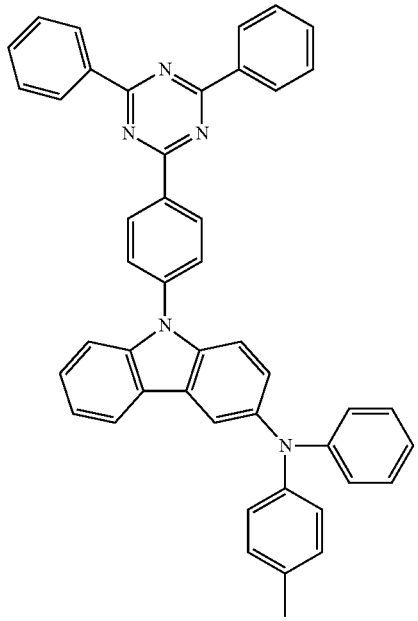
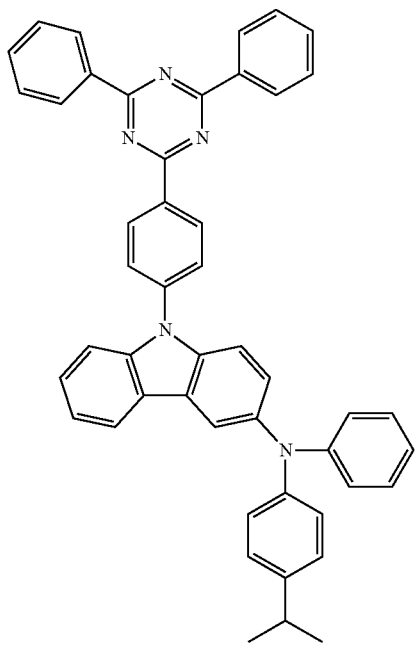
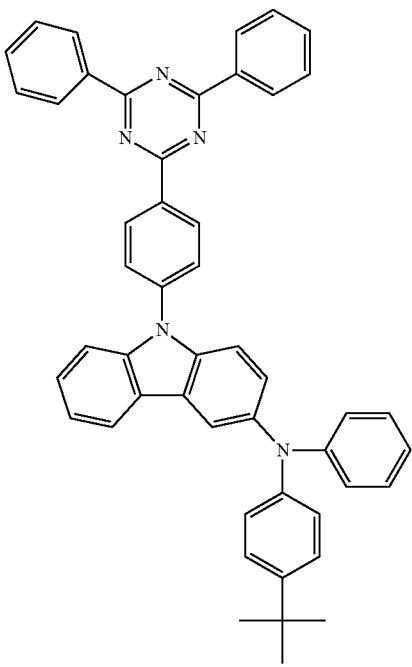

79
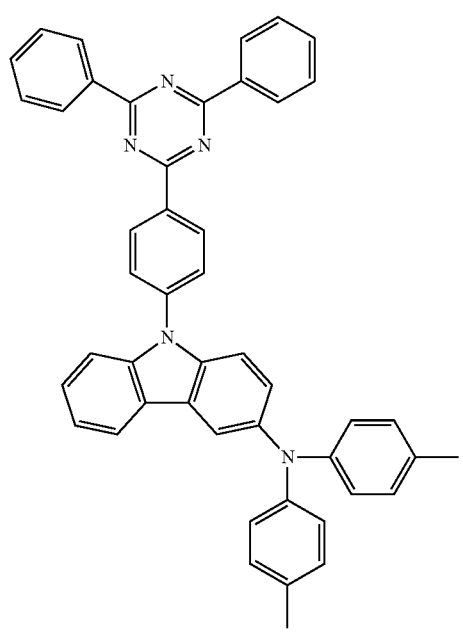
80
-continued
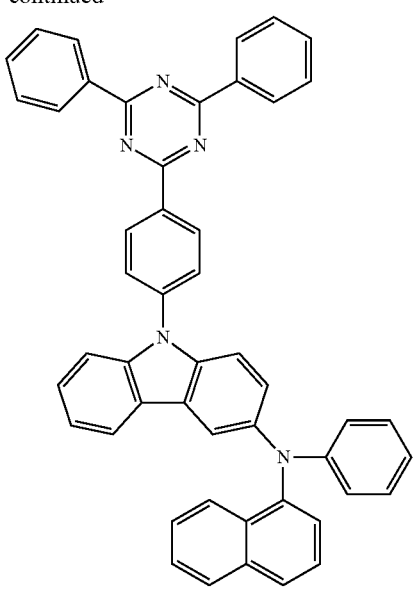
[Formula 67]
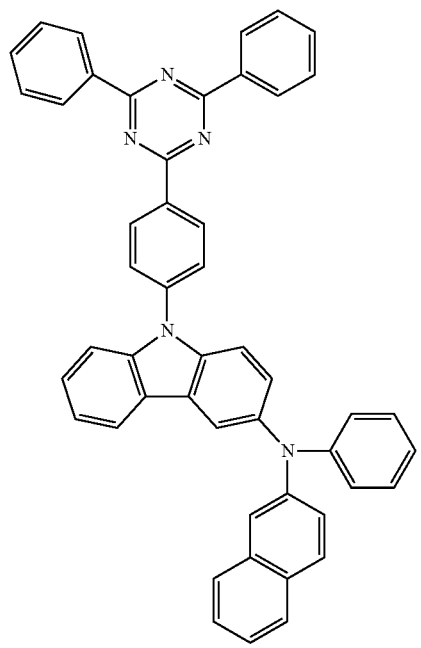
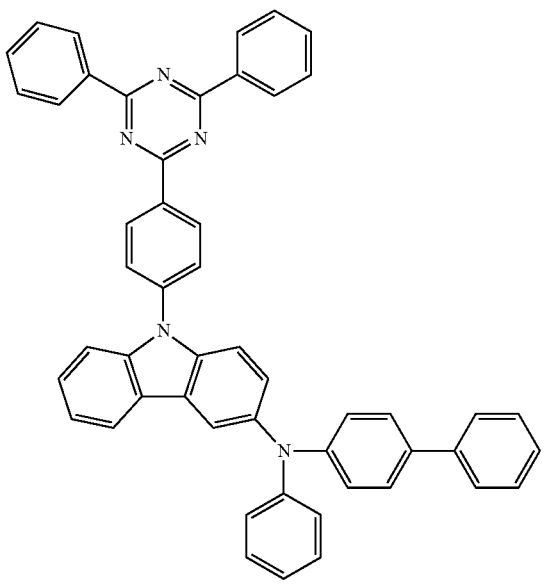

81
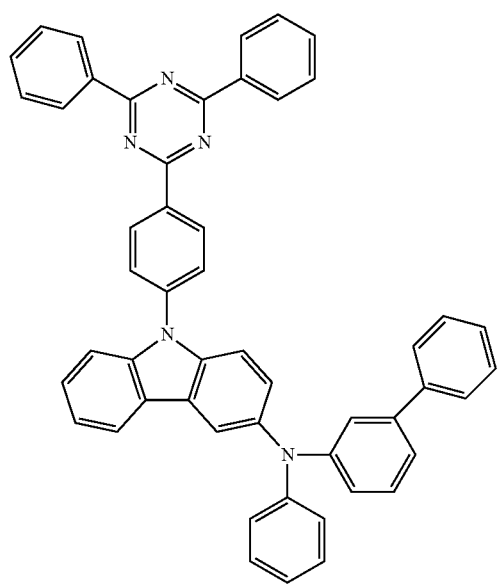
82
-continued
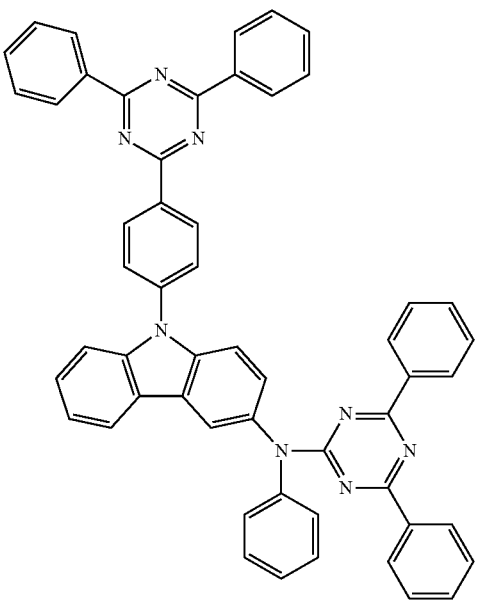
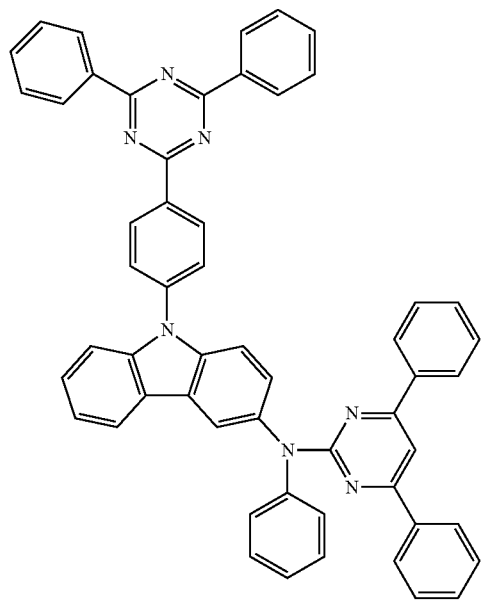
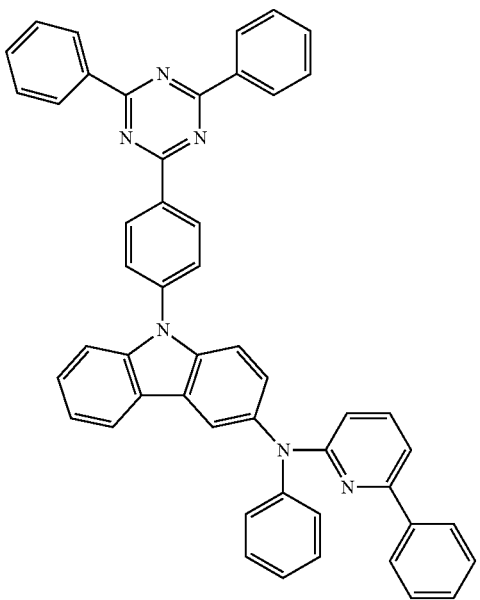

[Formula 68]
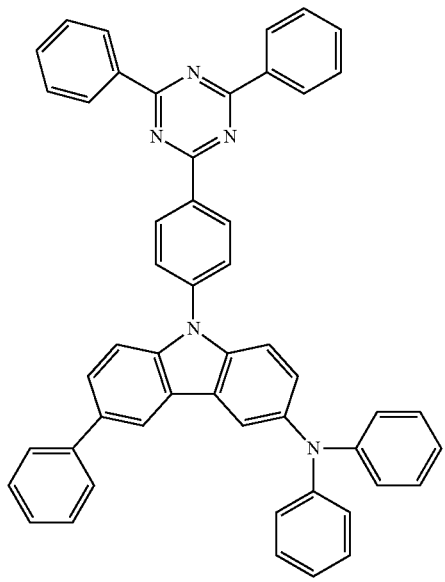
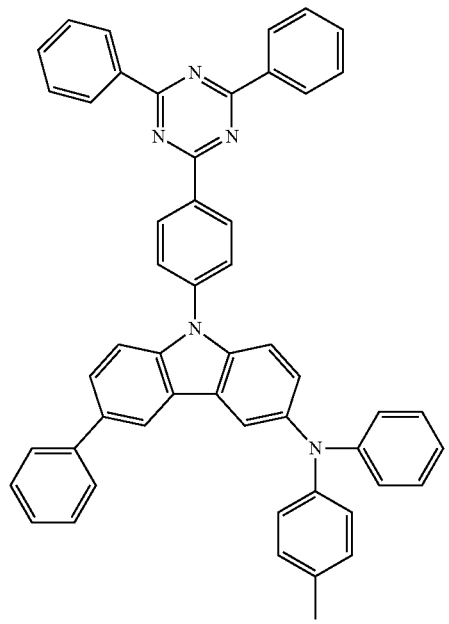
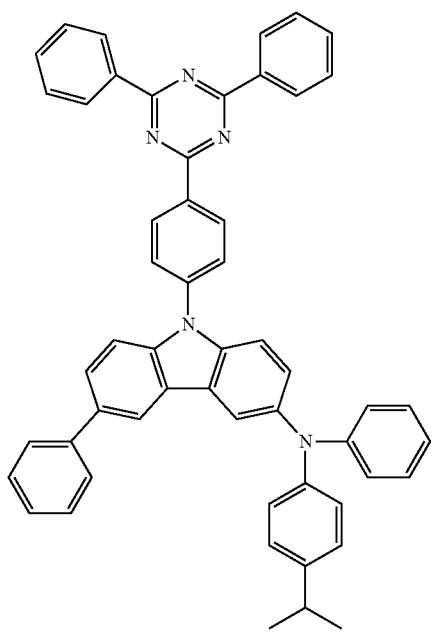
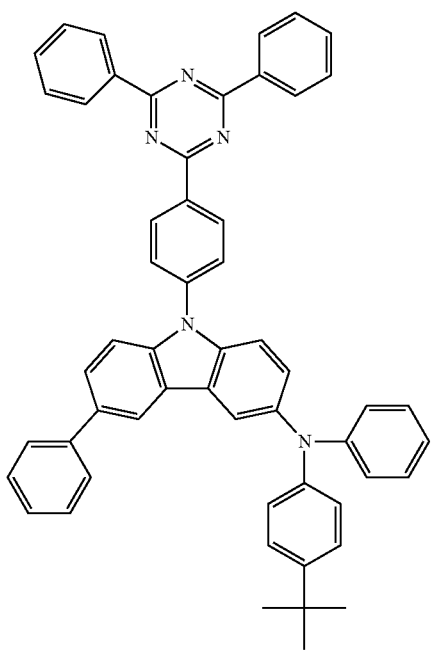

85
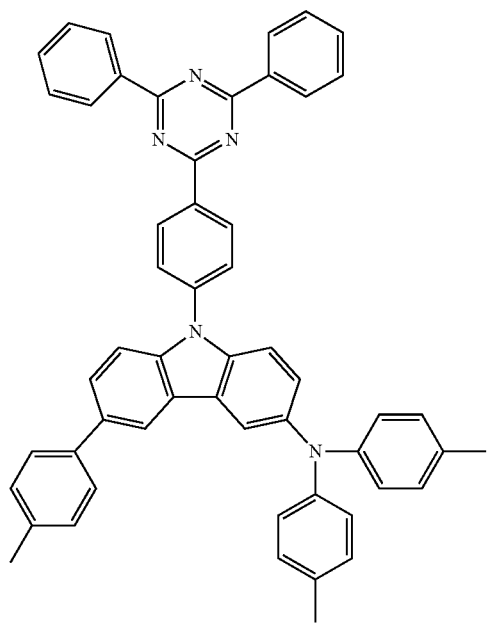
86
-continued
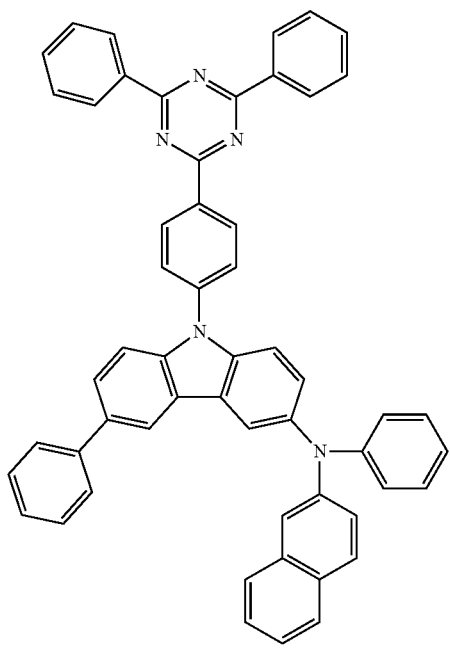
[Formula 69]
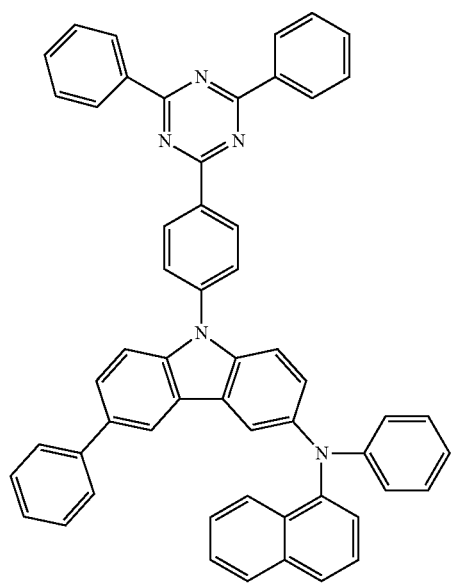
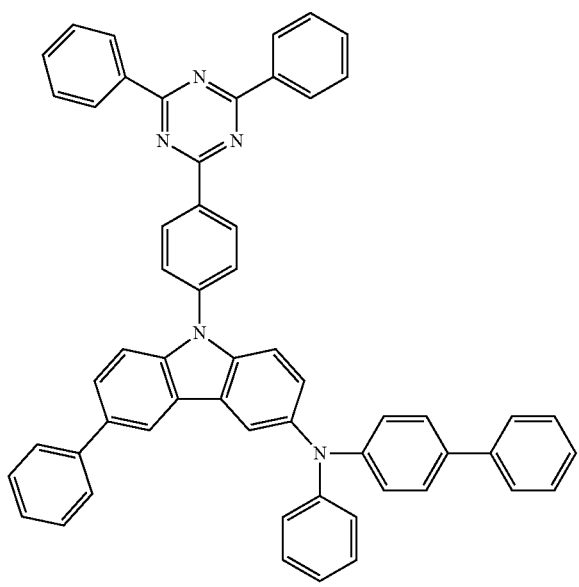

-continued
87
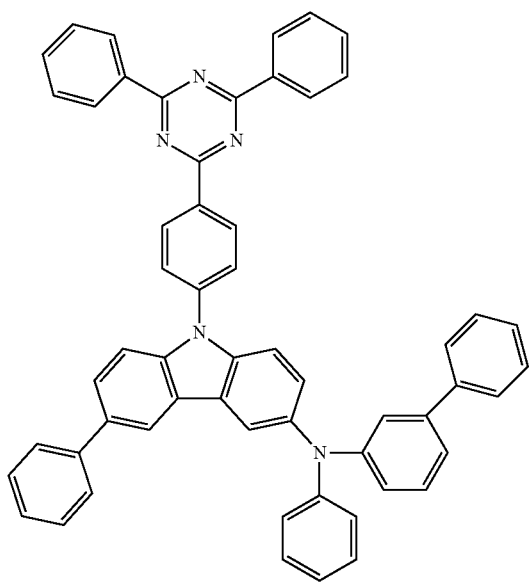
88
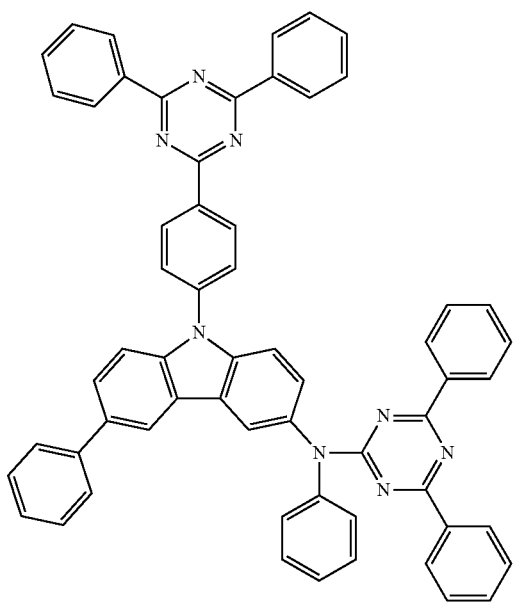
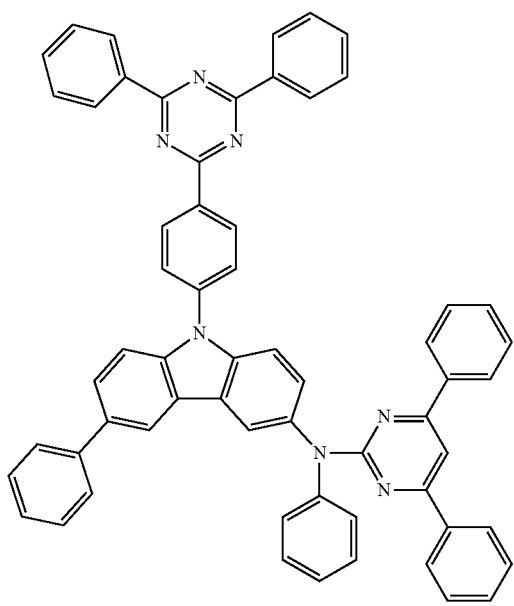
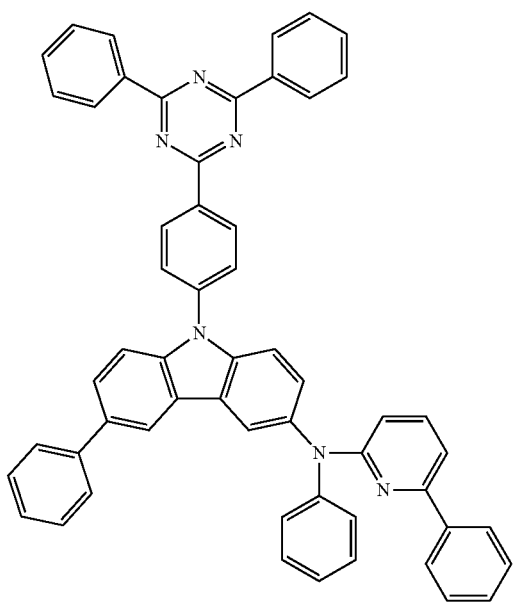

[Formula 70]
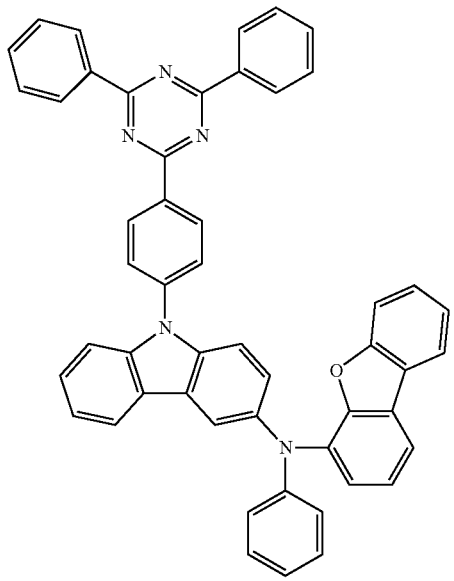
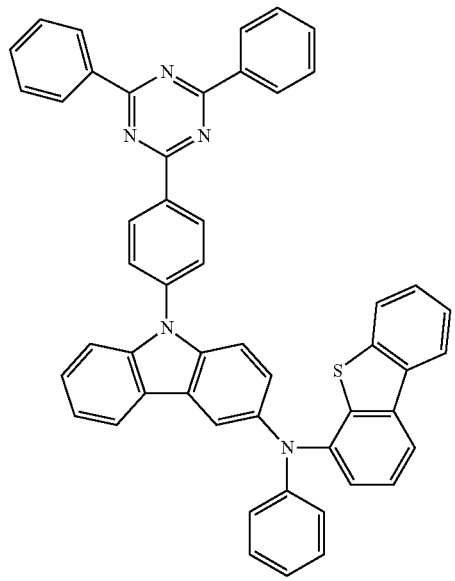
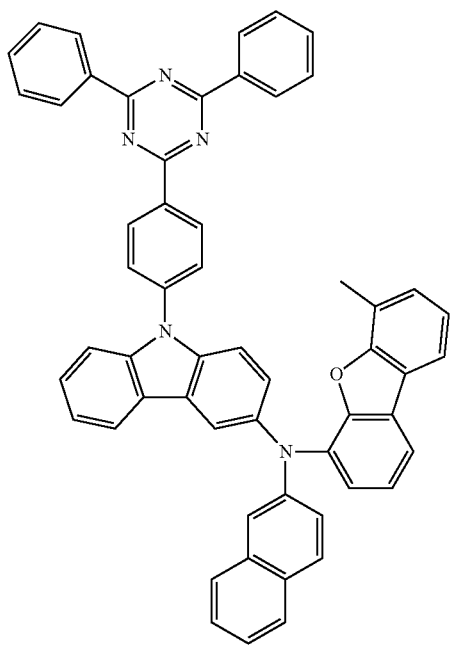
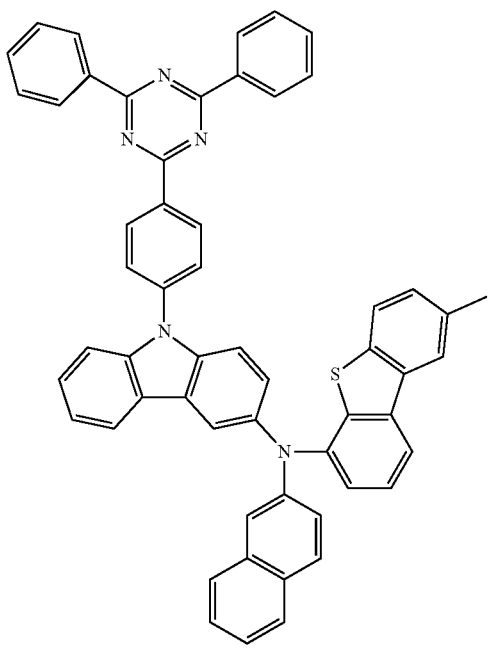

91
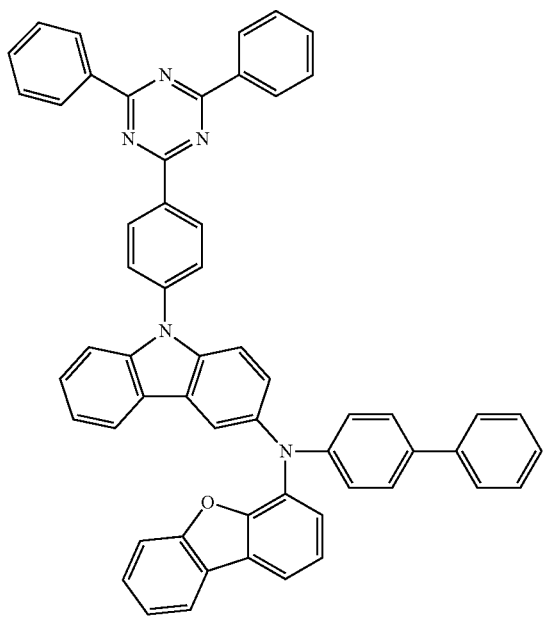
92
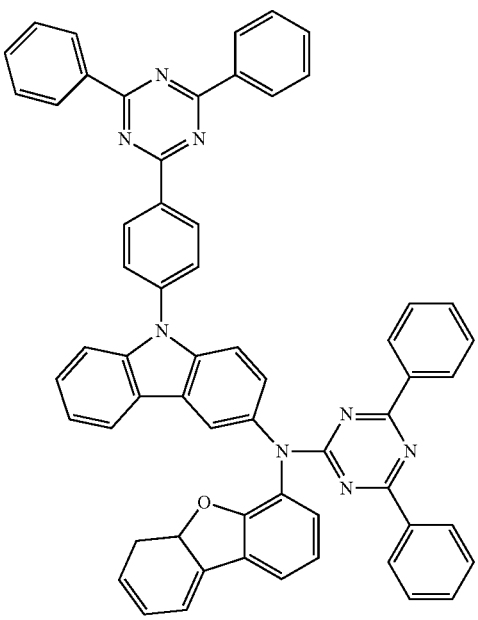
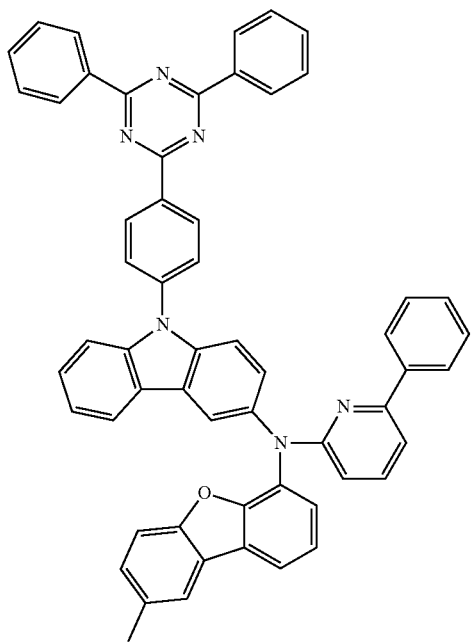

[Formula 71]
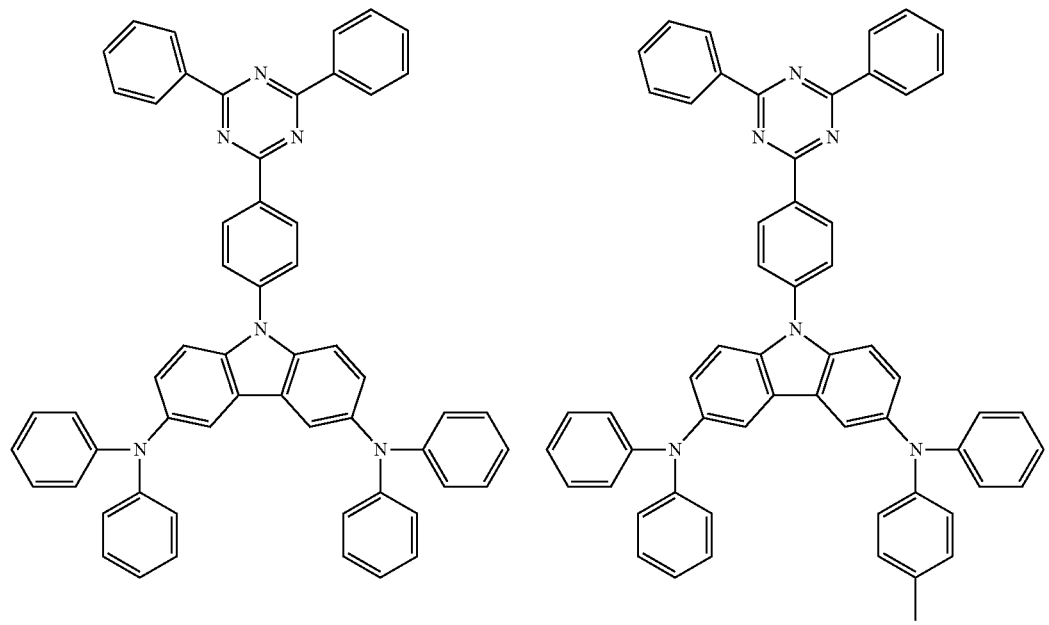
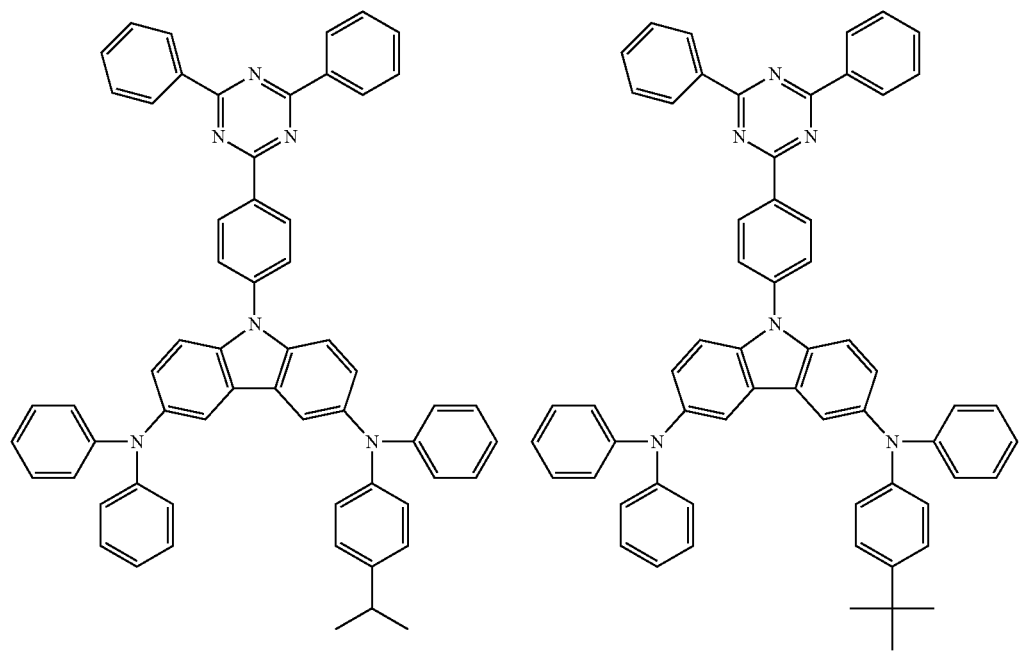

-continued
95 96
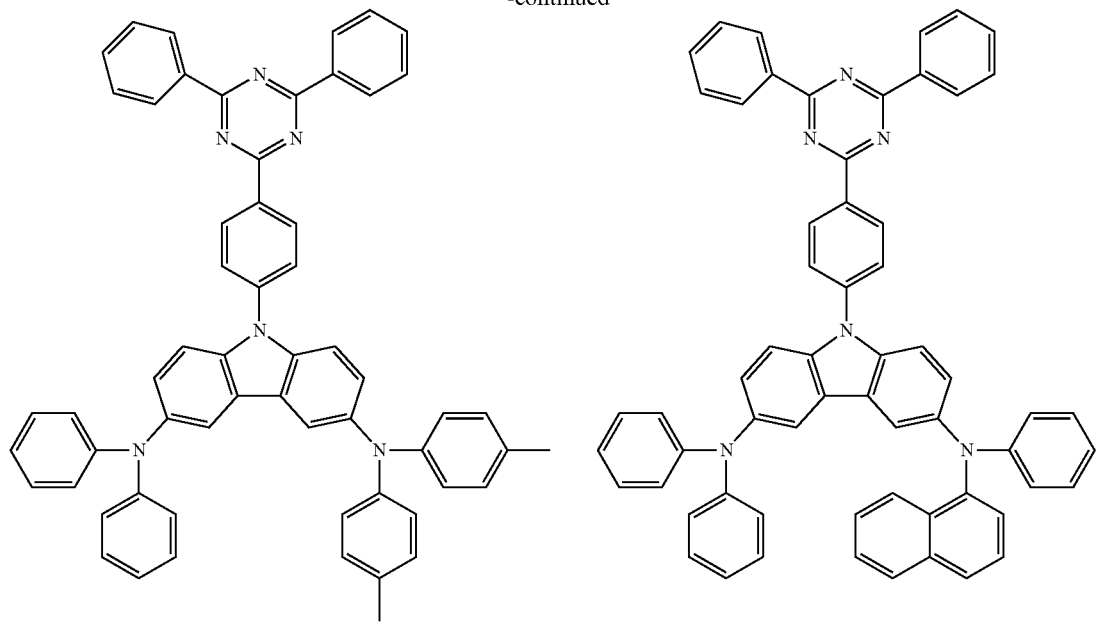
[Formula 72]
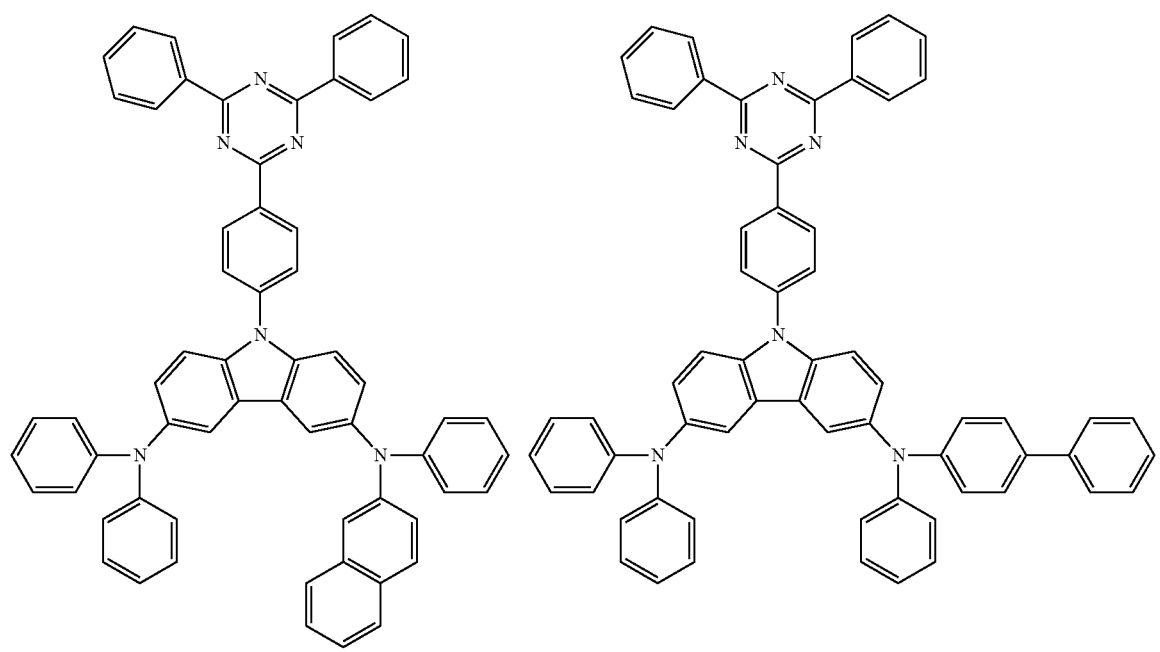

97
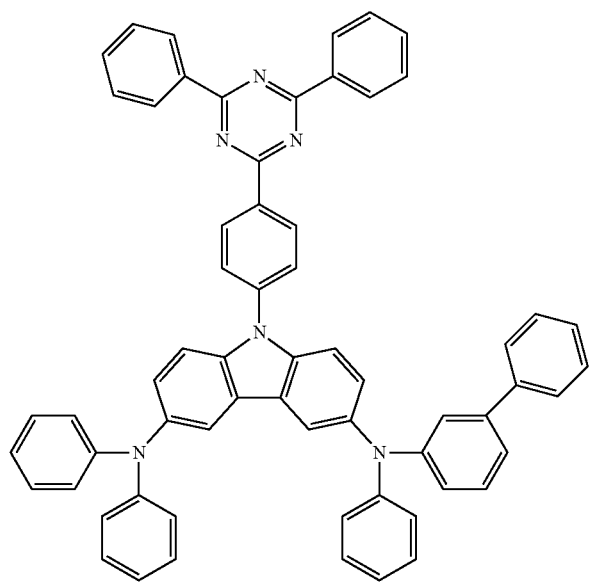
-continued
98
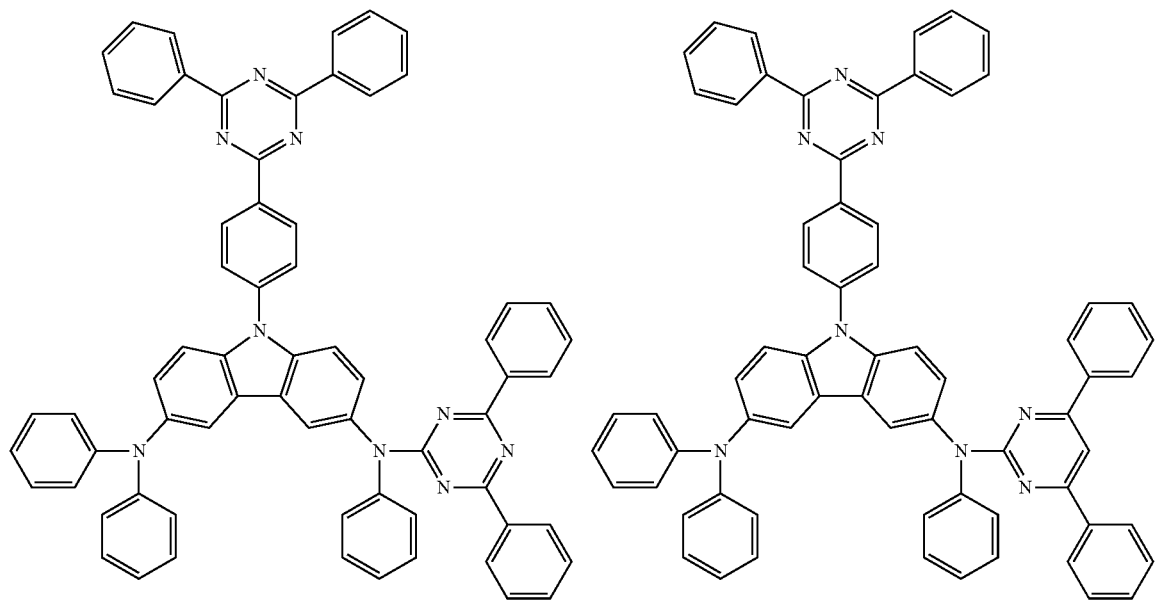

-continued
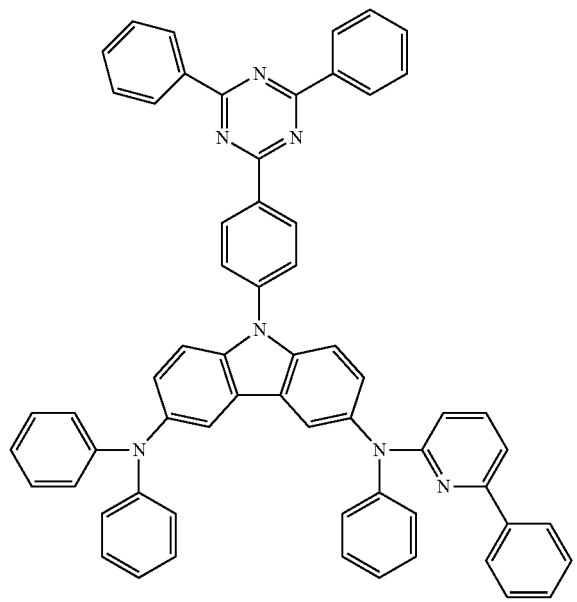
[Formula 73]
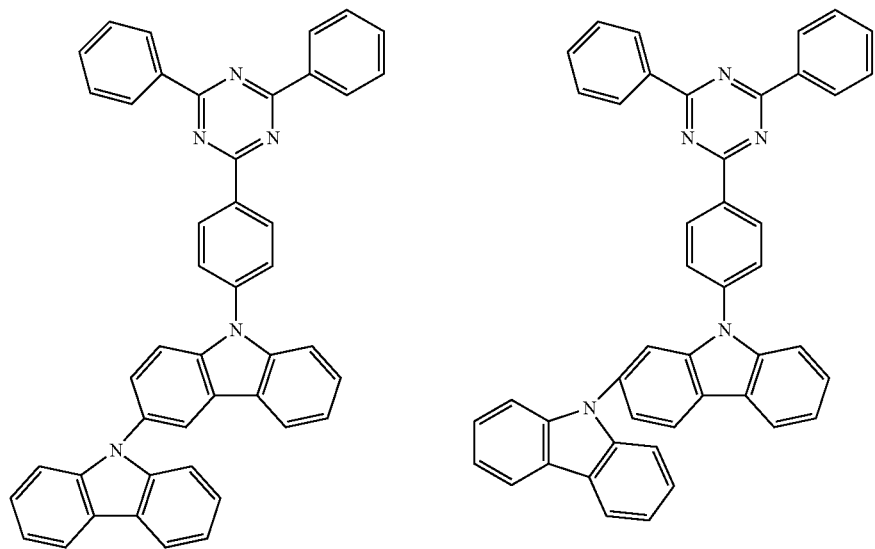

-continued
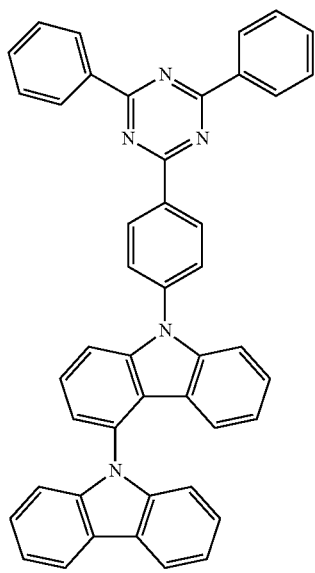
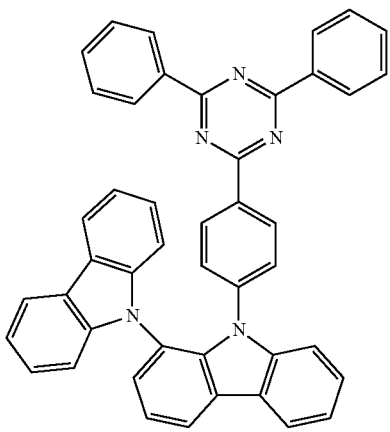
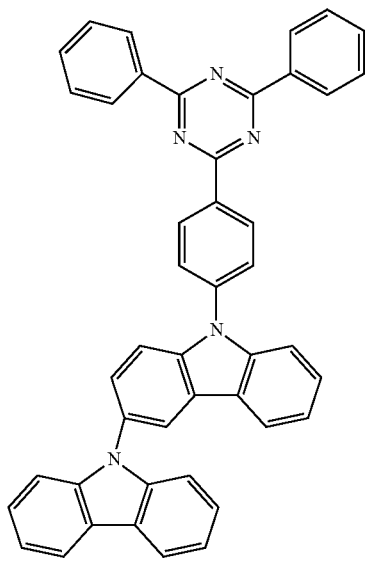
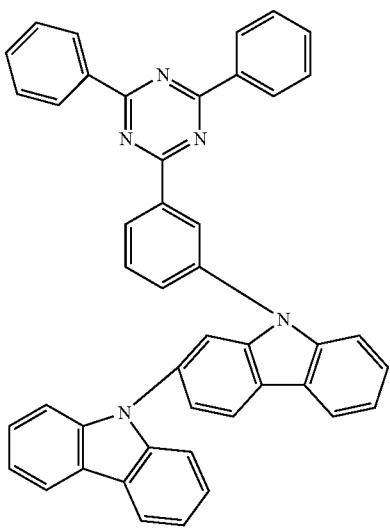
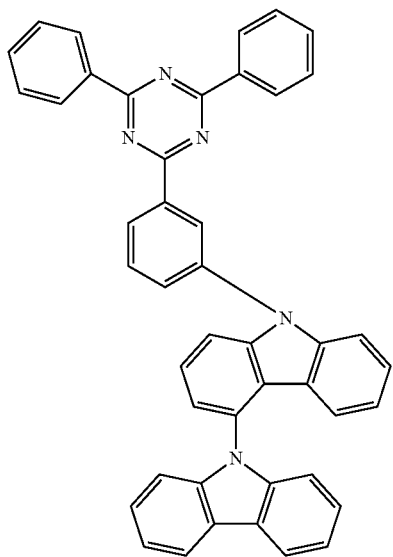
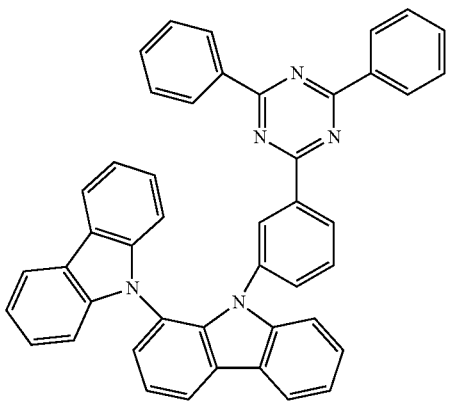

-continued
[Formula 74]
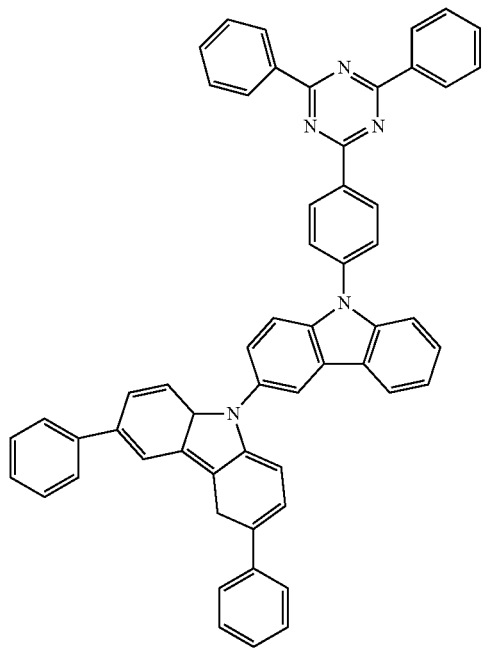
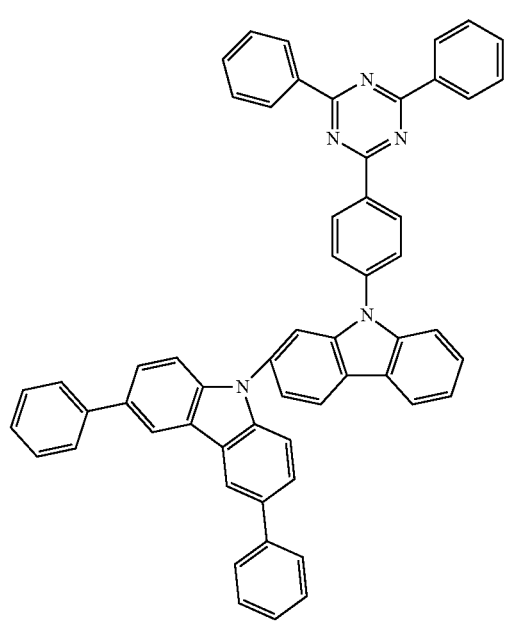
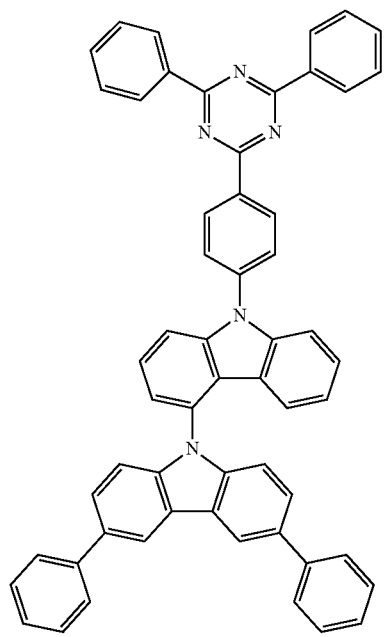

[Formula 75]
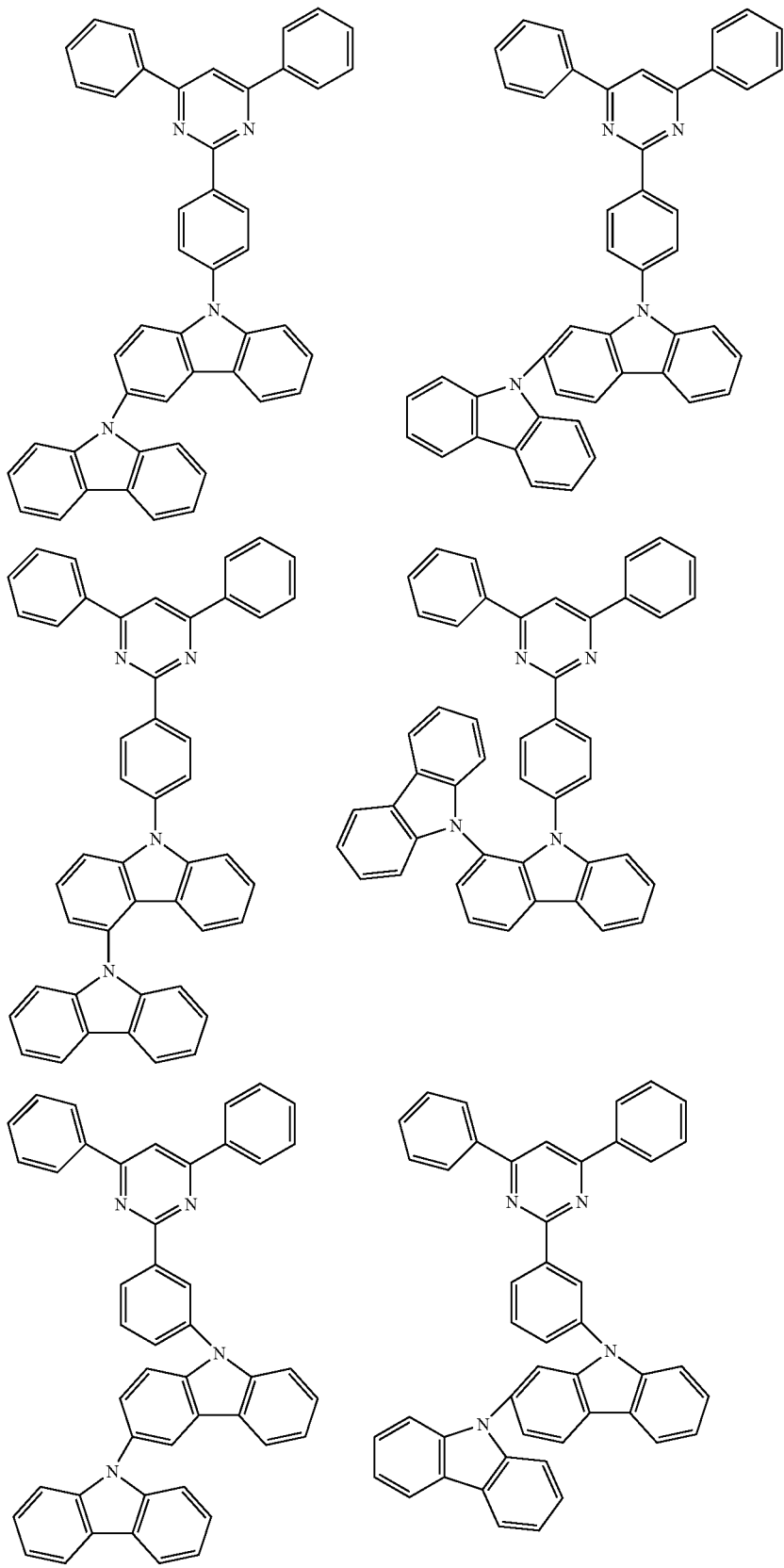

-continued
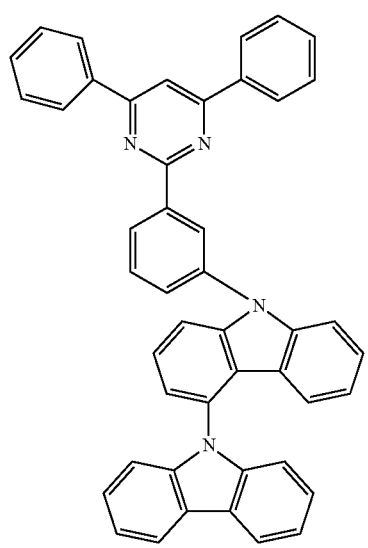
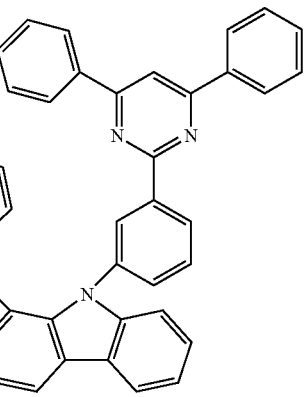
[Formula 76]
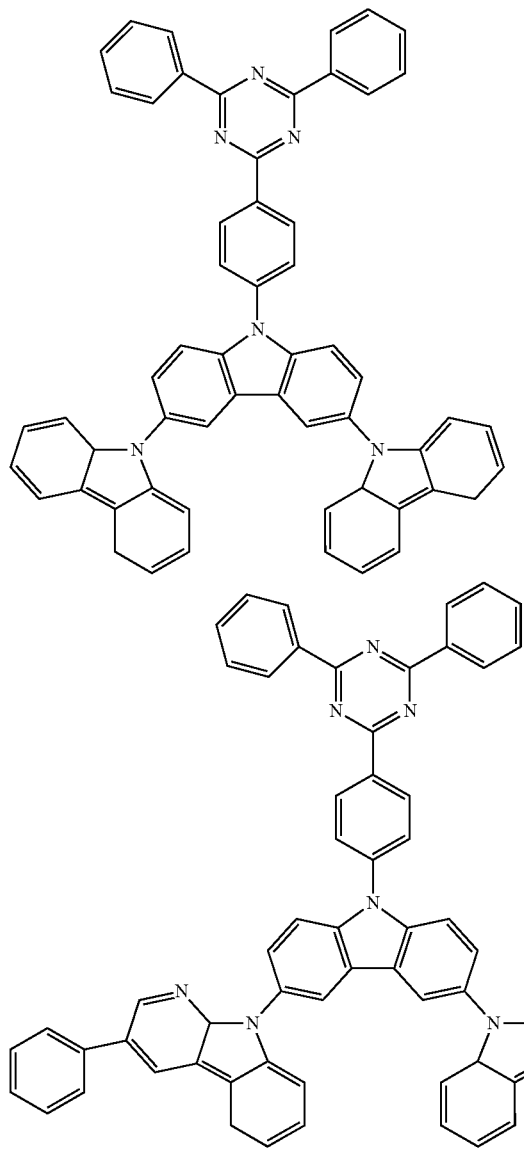

-continued
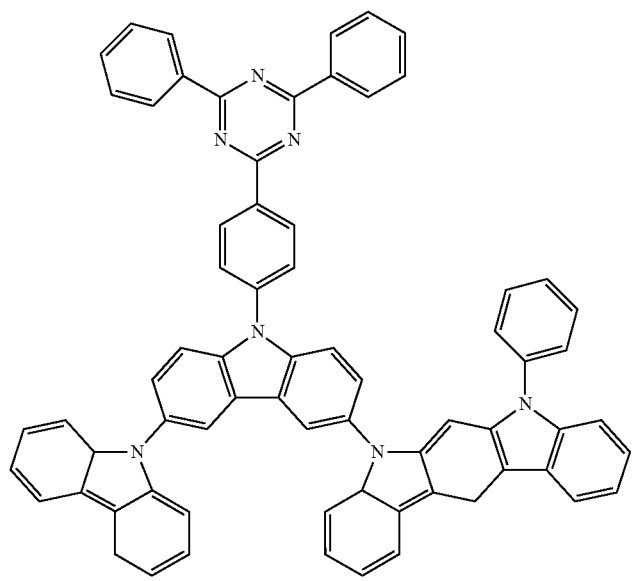
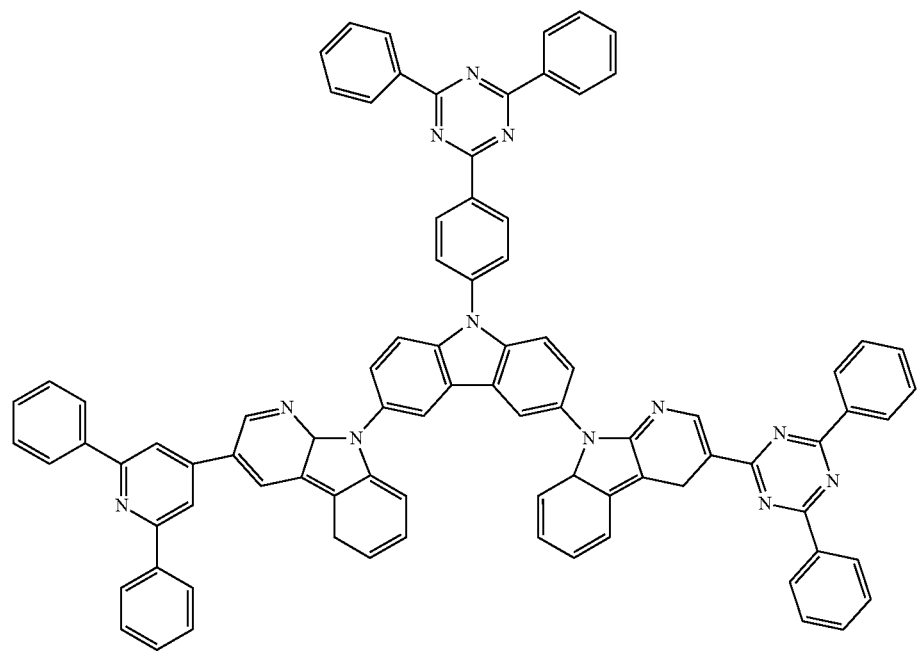

[Formula 77]
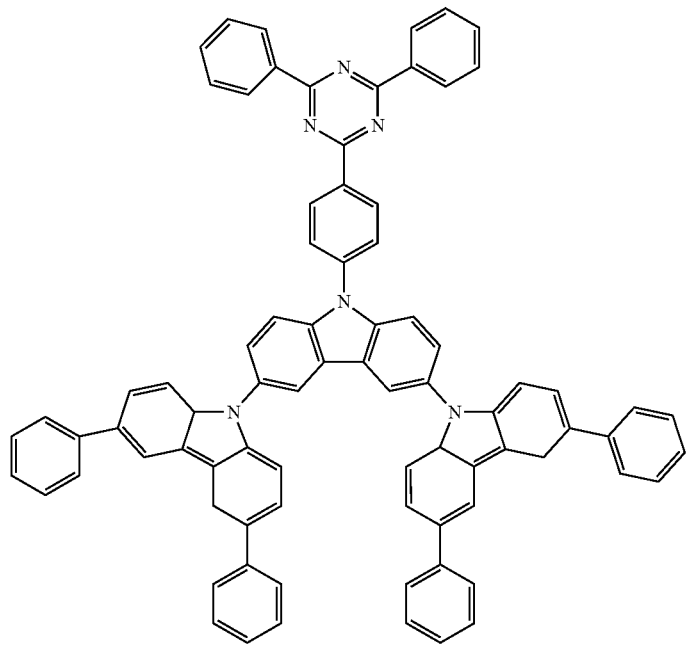
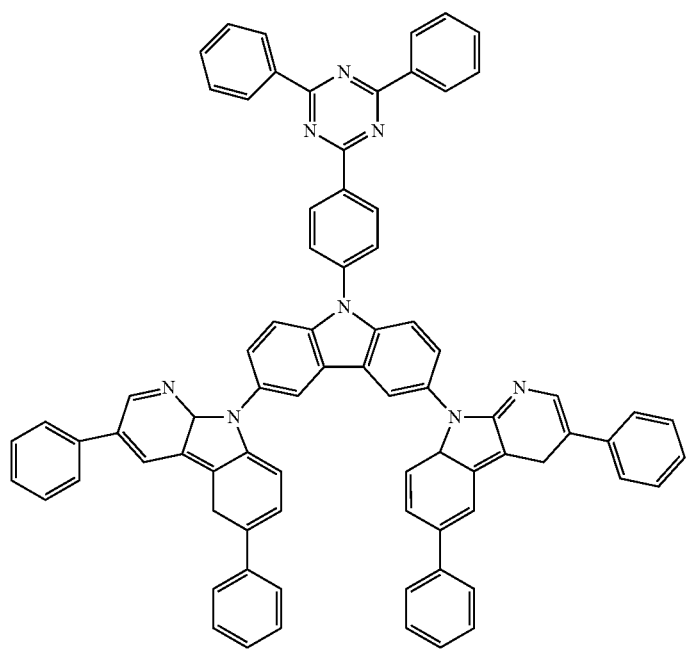

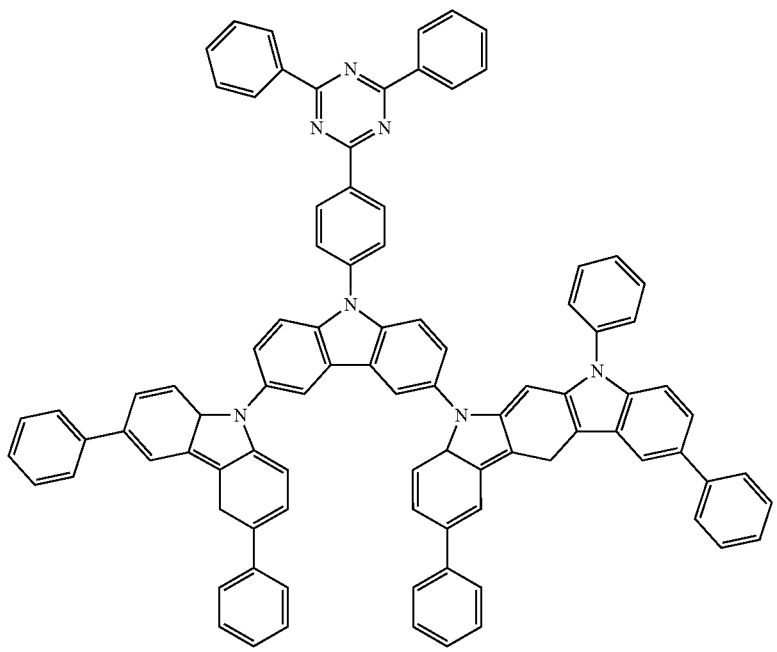
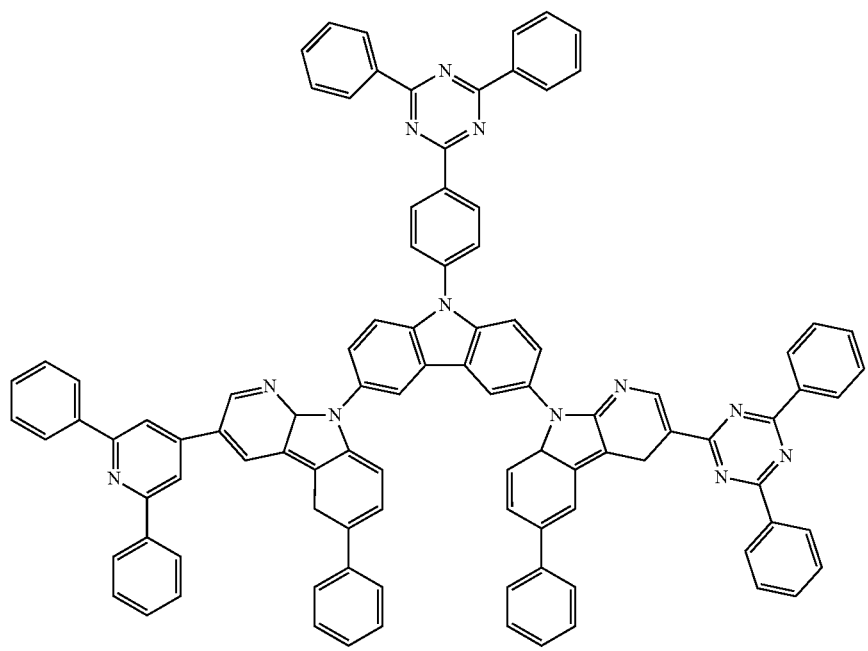

[Formula 78]
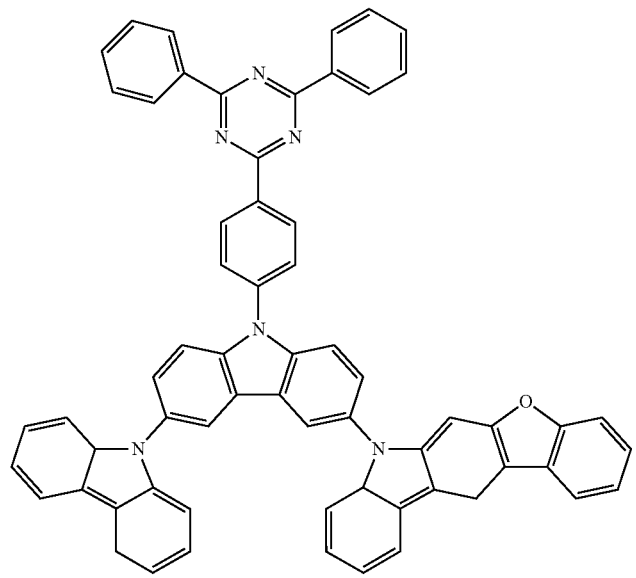
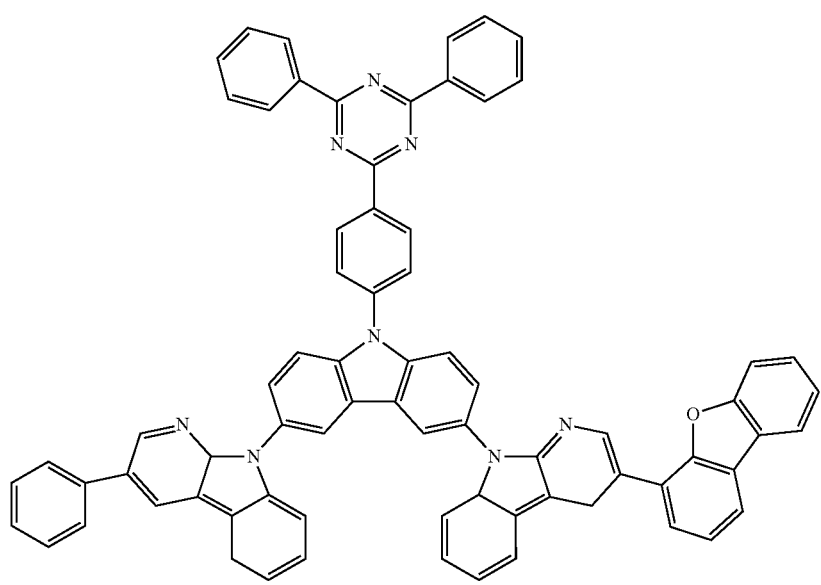

-continued
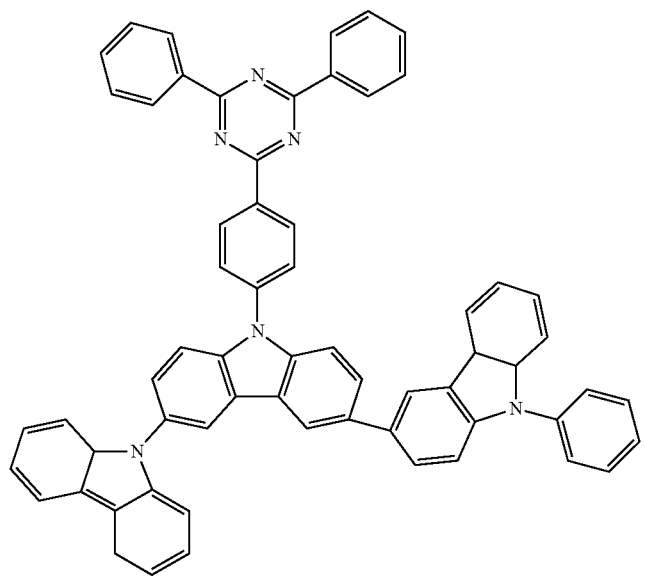
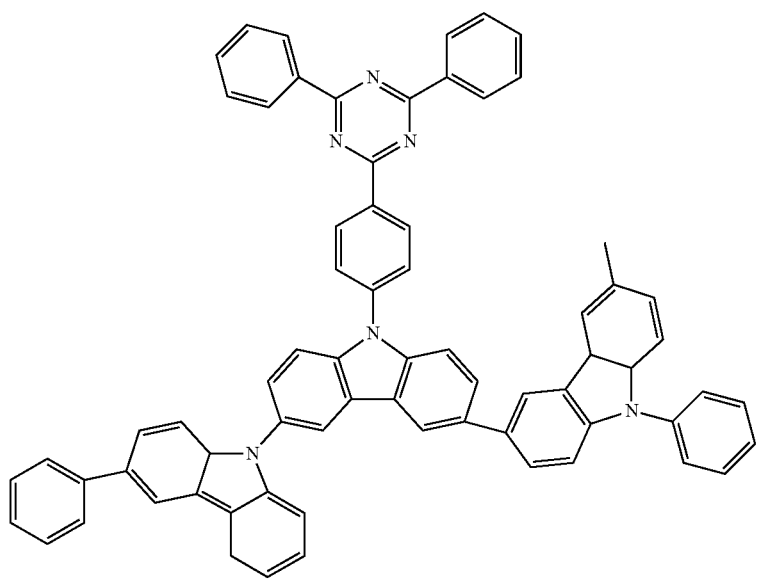

-continued
[Formula 79]
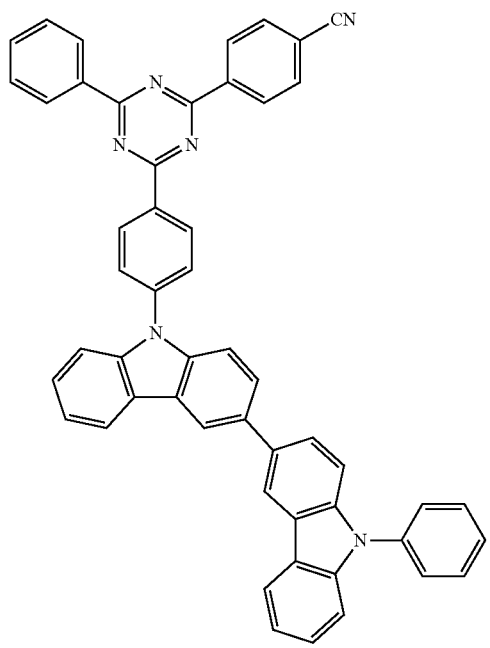
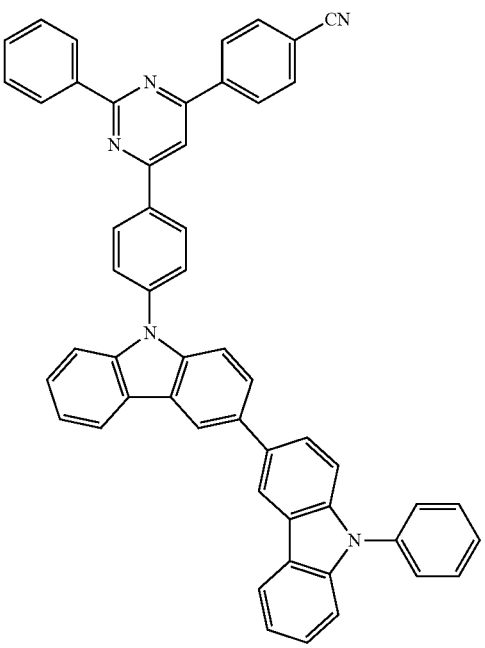
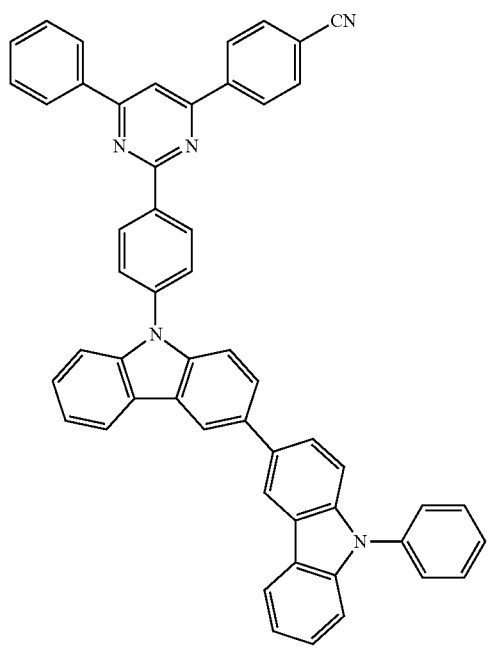
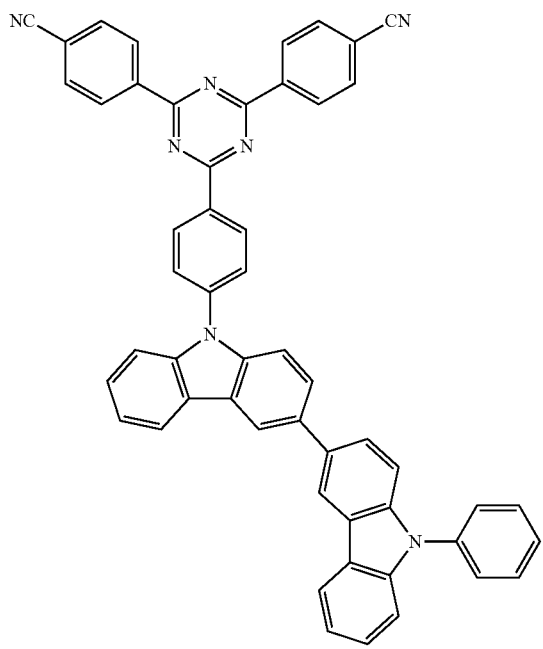

[Formula 80]
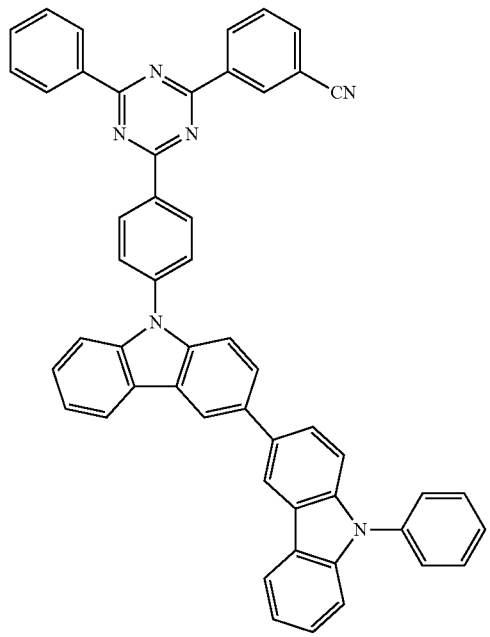
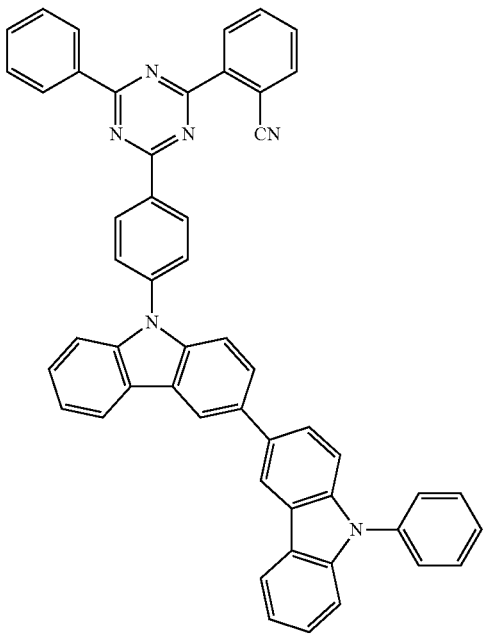
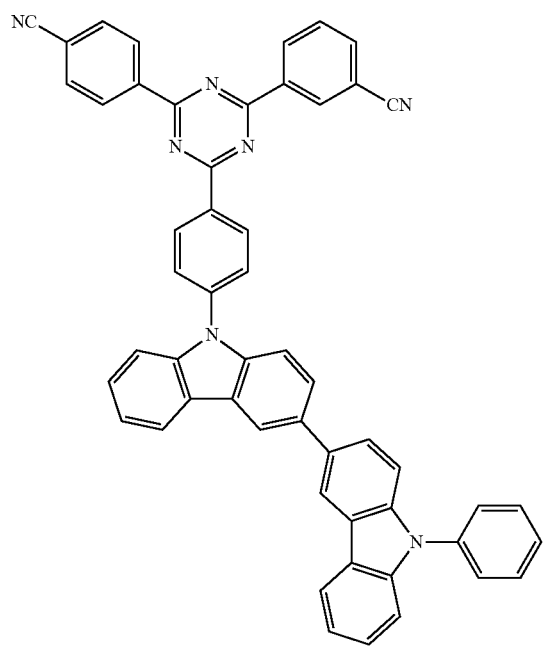
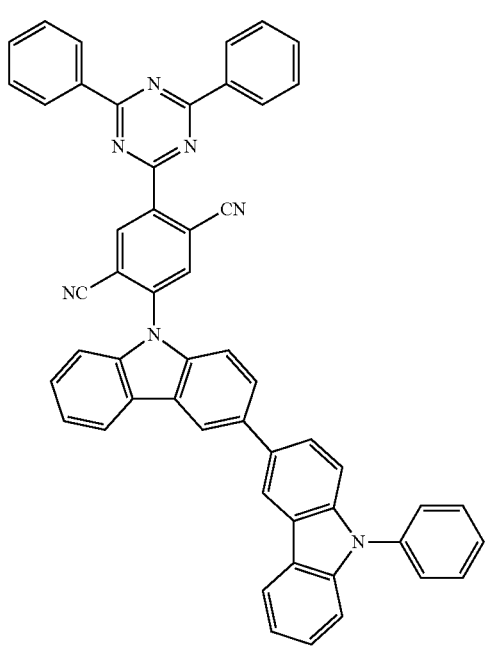

123
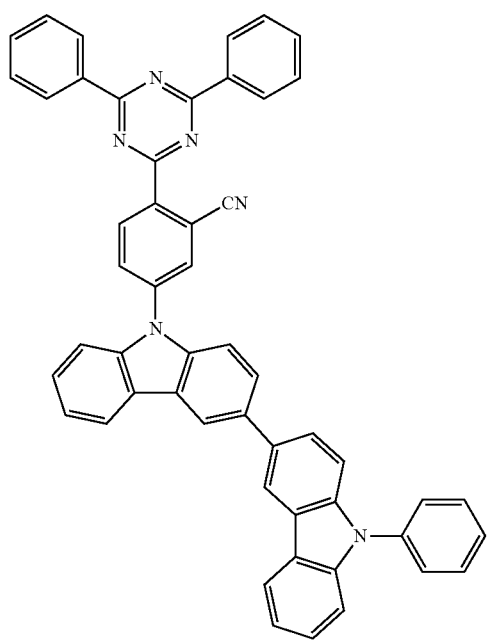
124
-continued
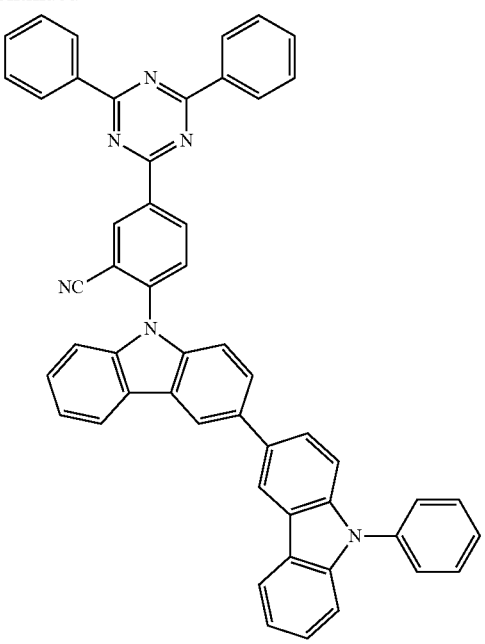
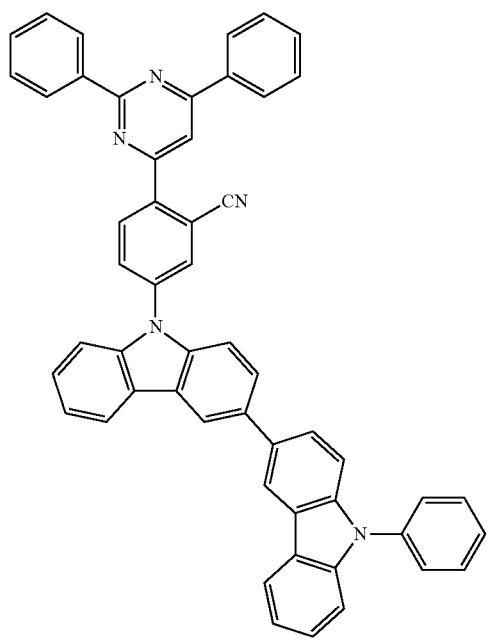
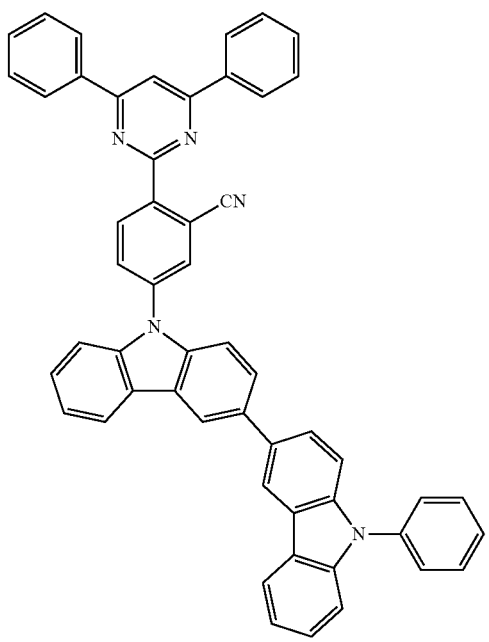

[Formula 81]
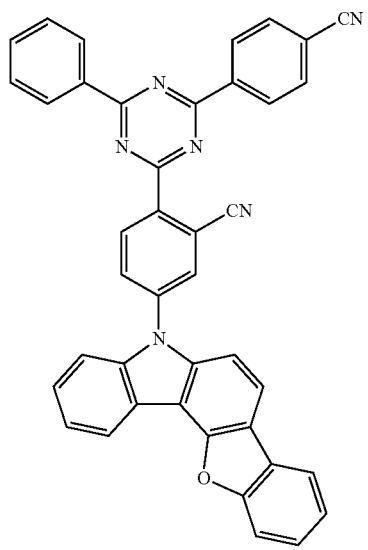
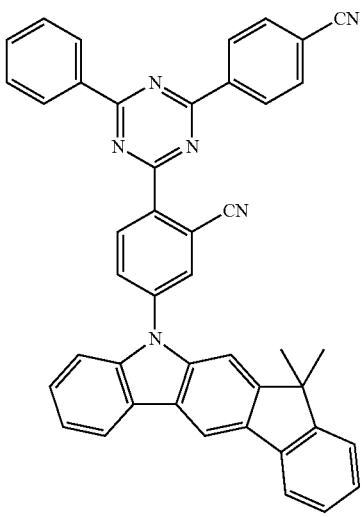
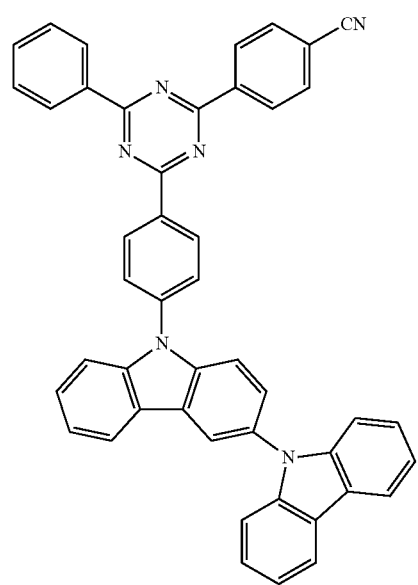
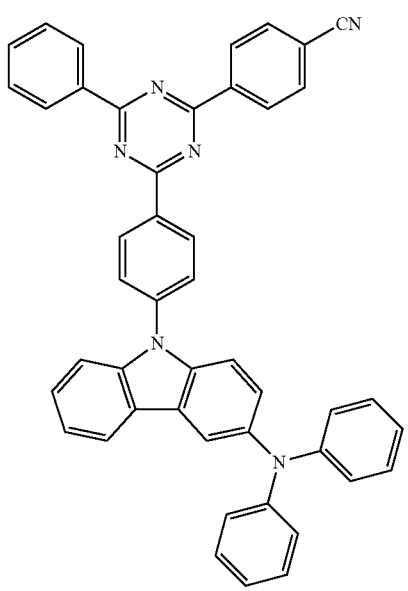

-continued
127
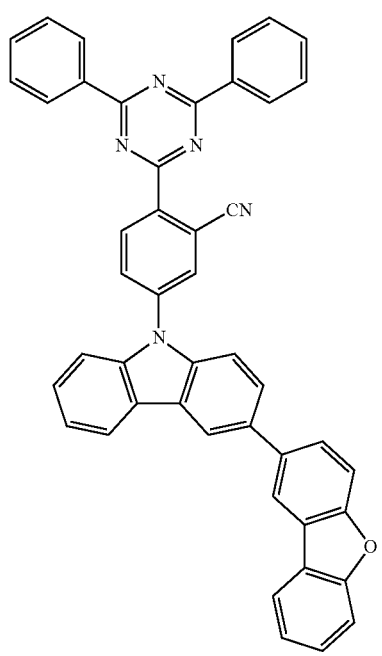
128
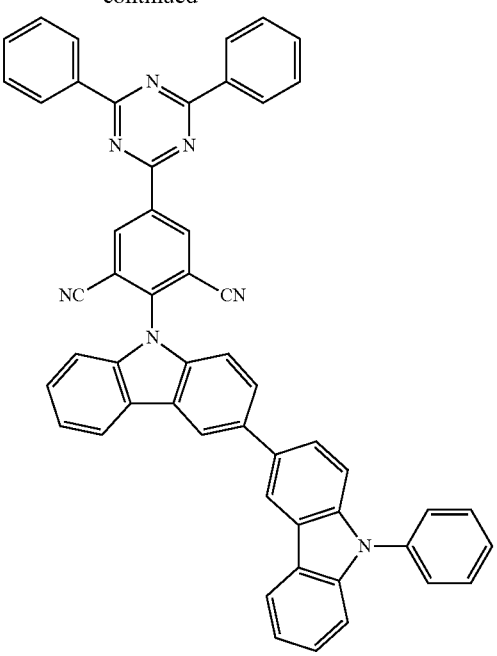
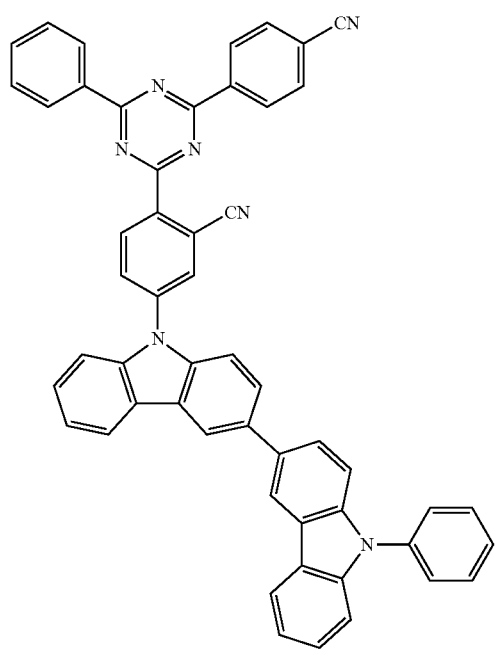
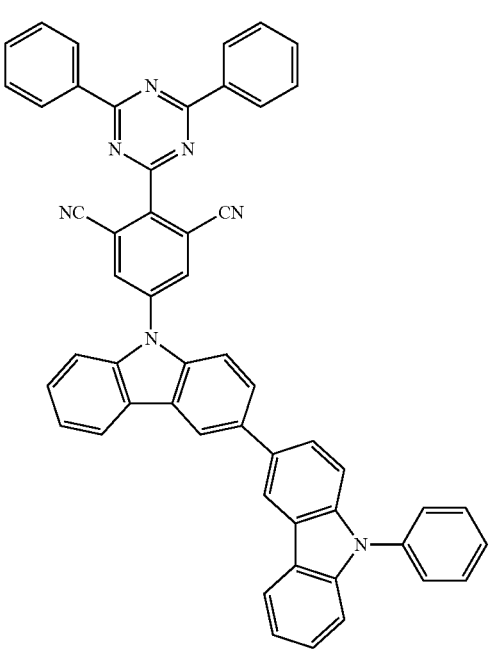

-continued
[Formula 82]
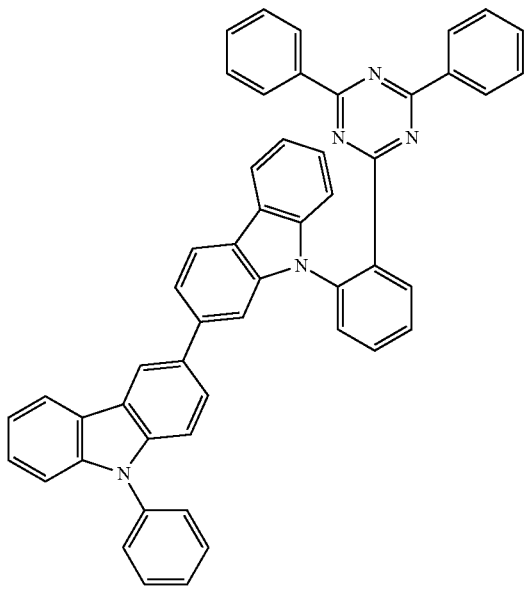
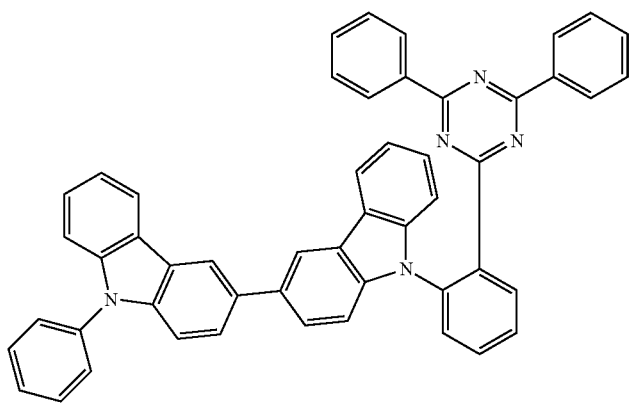
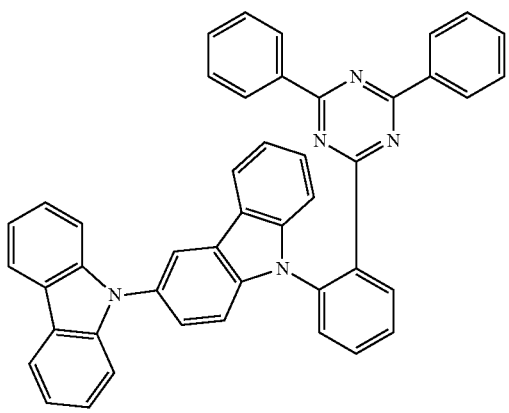
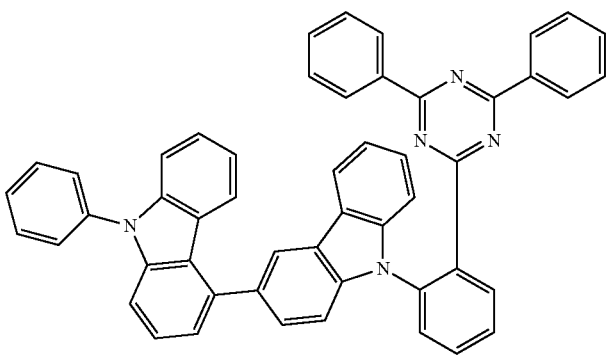

-continued
131
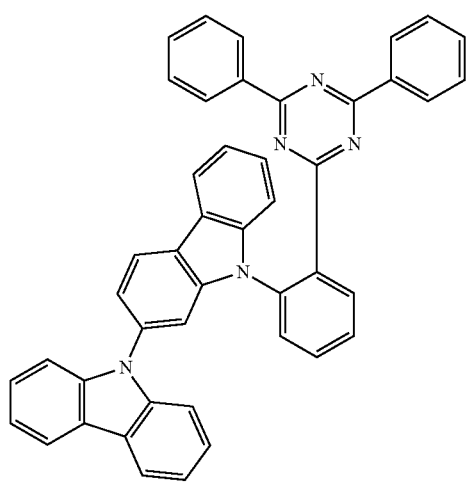
132
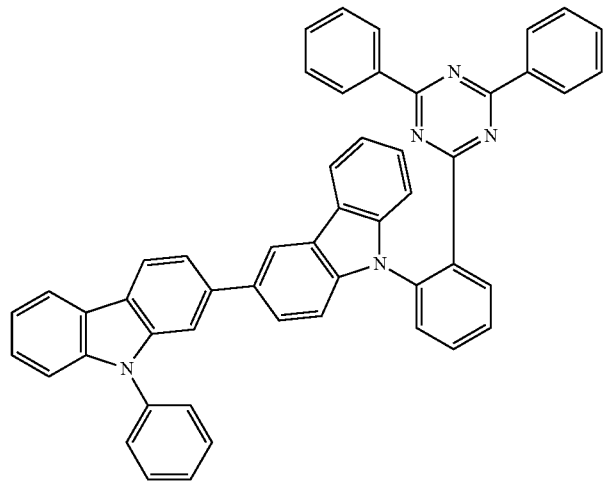
[Formula 83]
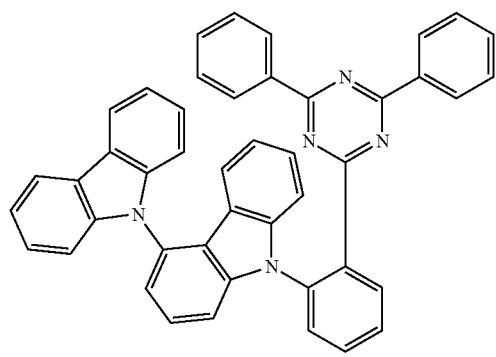
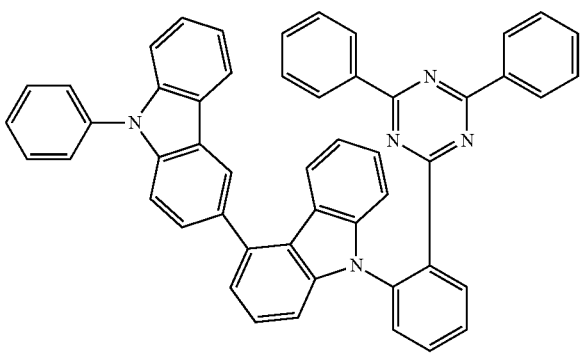
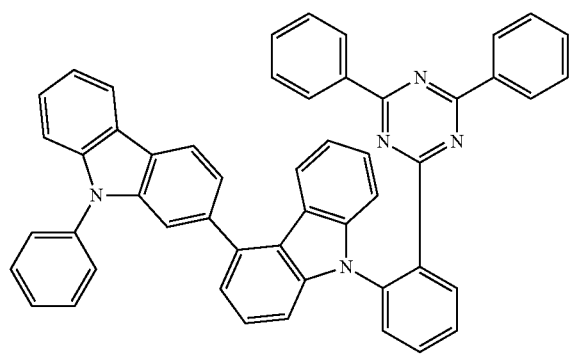
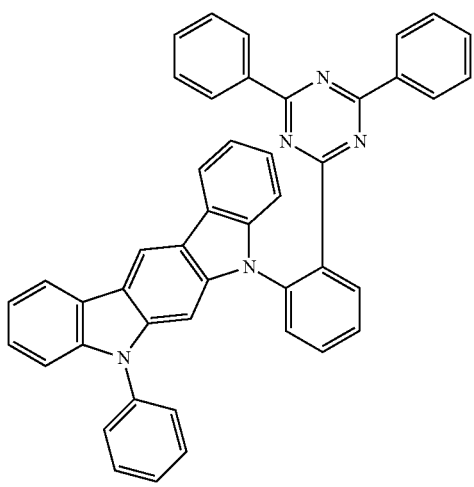

-continued
133
134
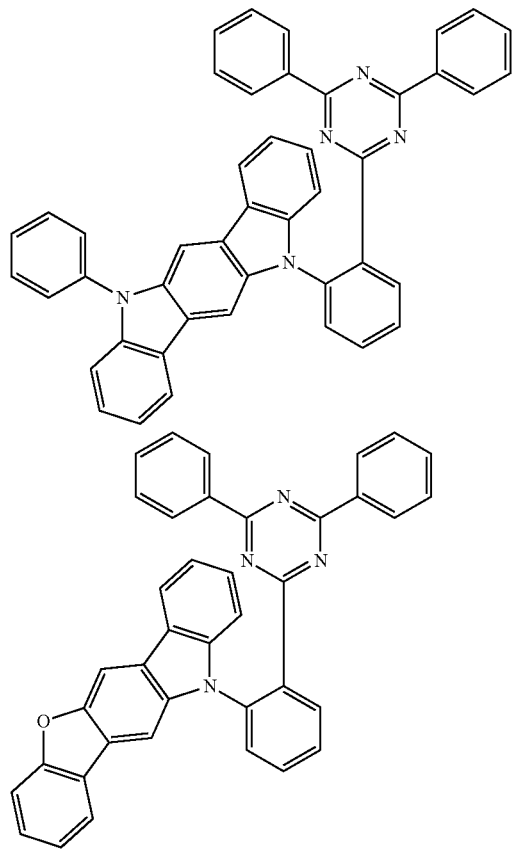
[Formula 84]
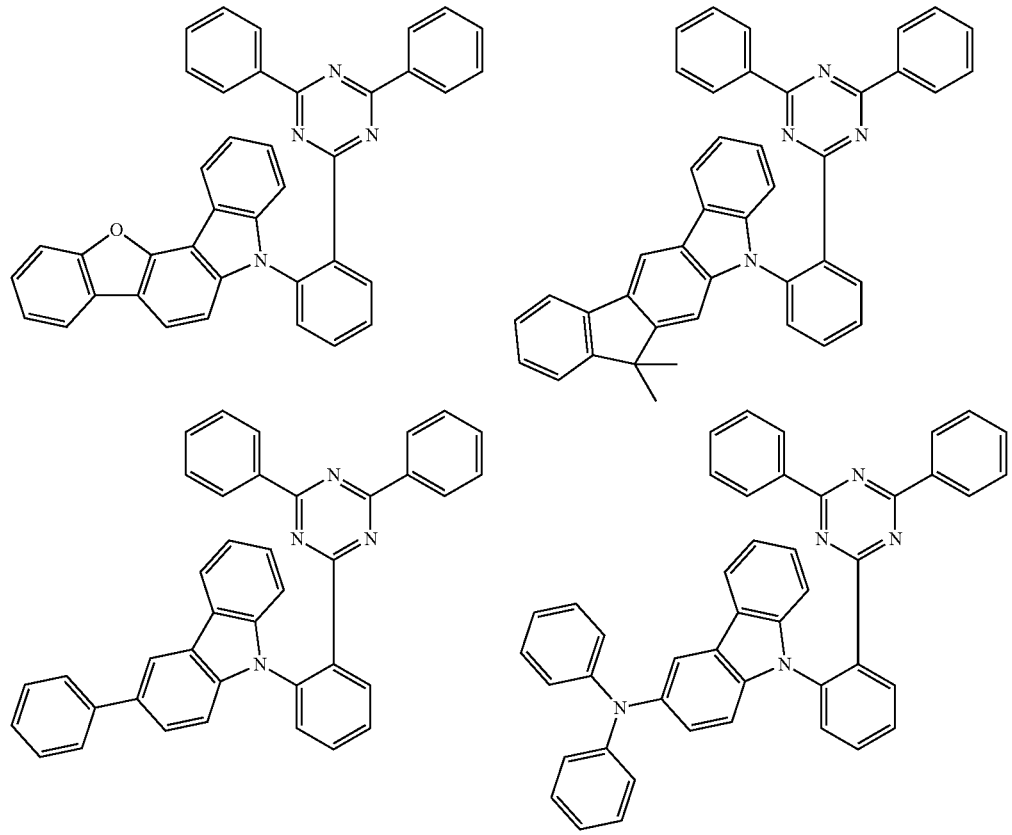

-continued
135
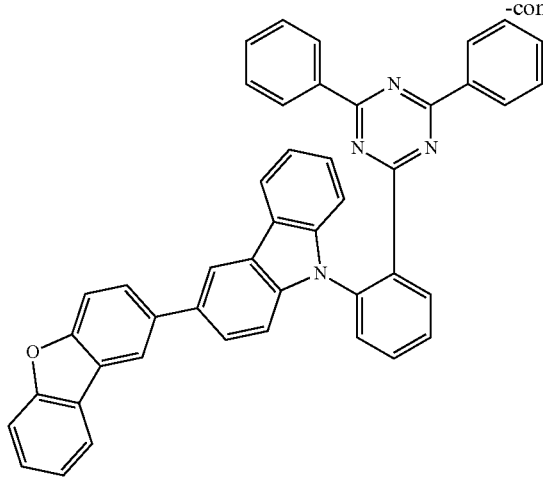
136
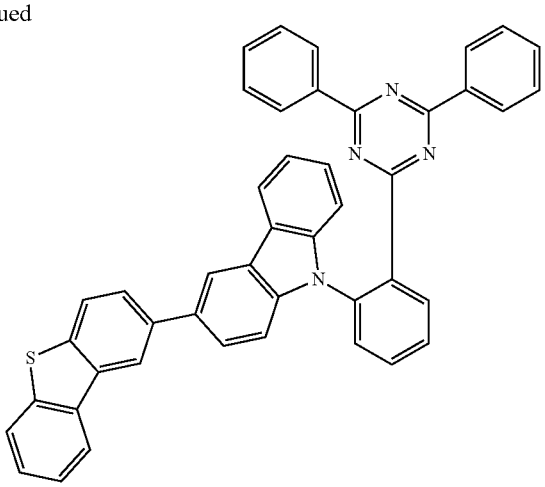
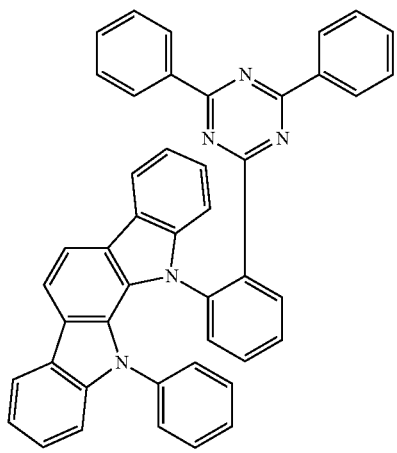
[Formula 85]
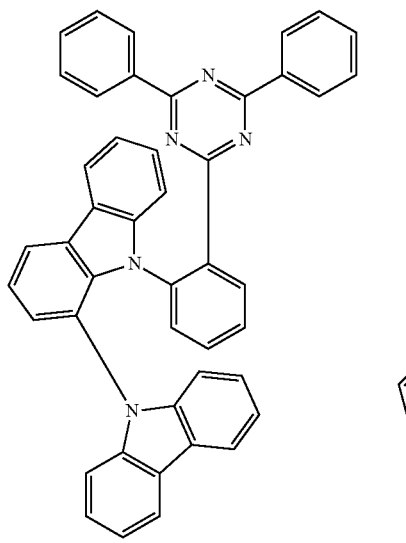
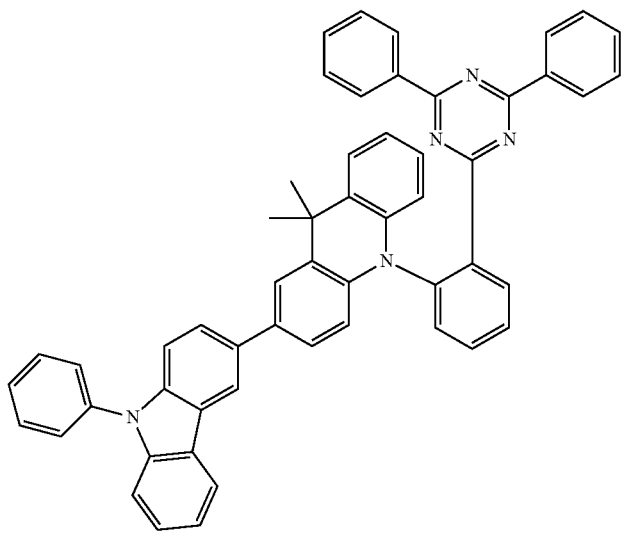

-continued
137
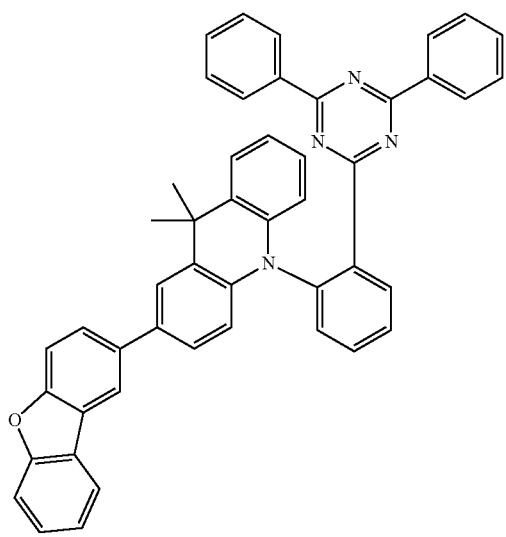
138
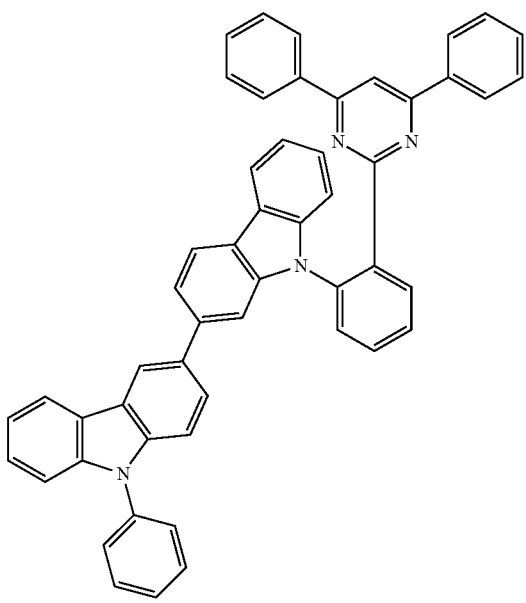
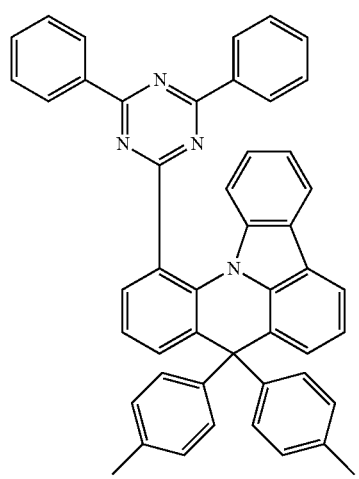
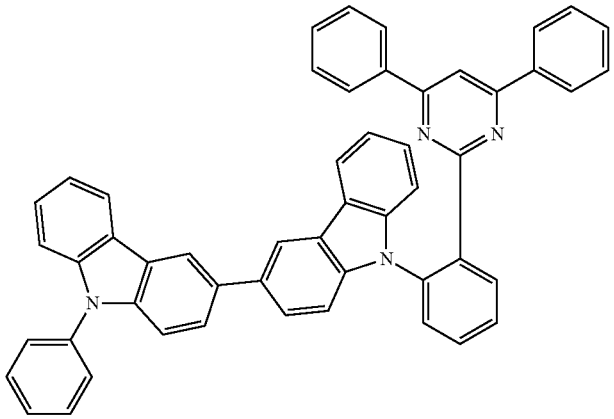
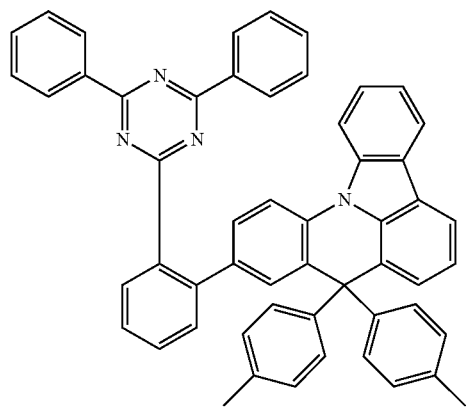

[Formula 86]
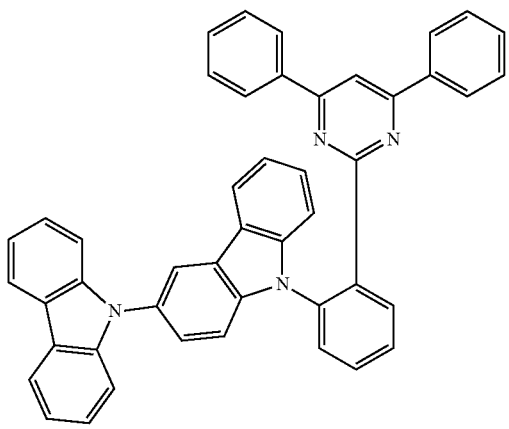
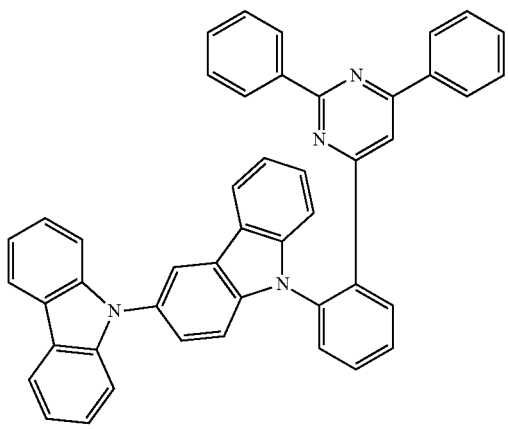
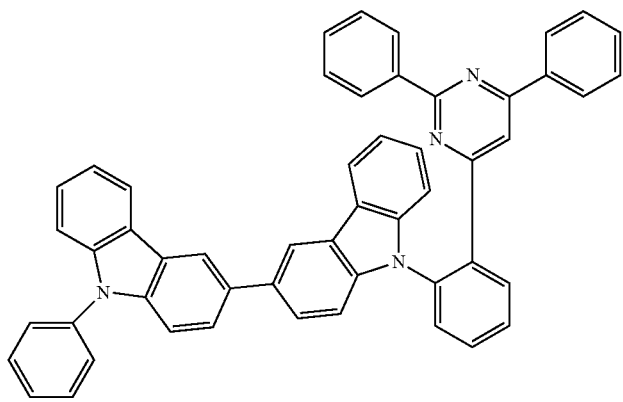
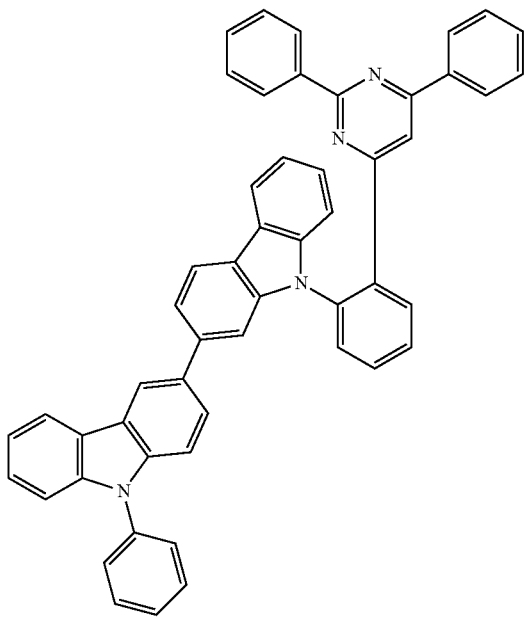

-continued
141
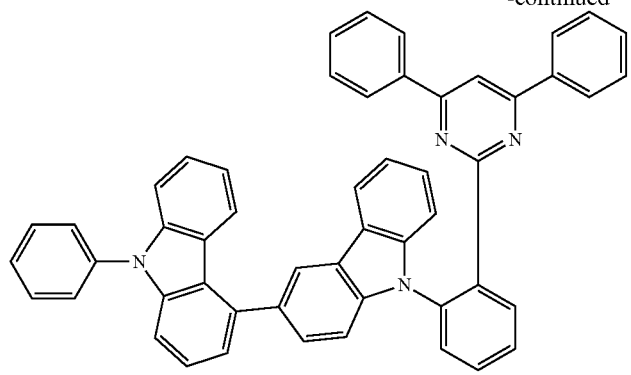
142
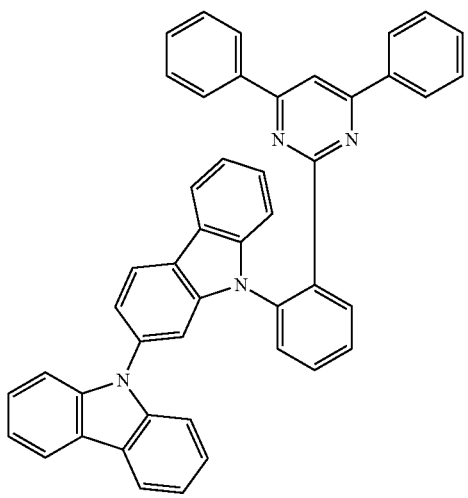
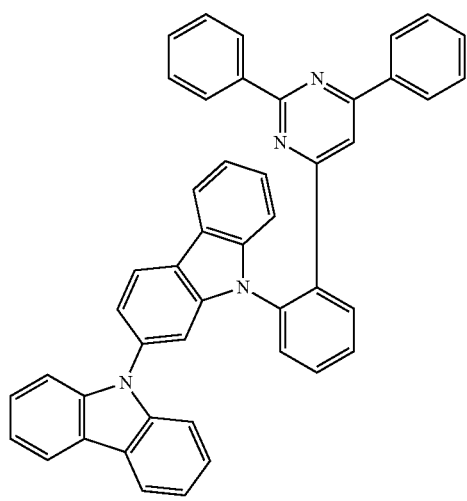
[Formula 87]
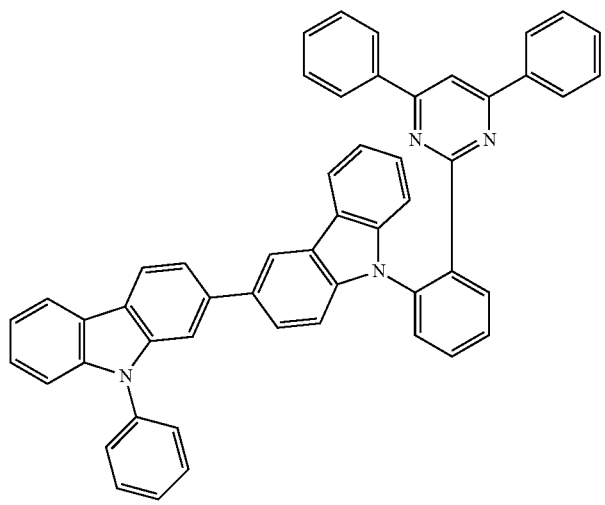

-continued
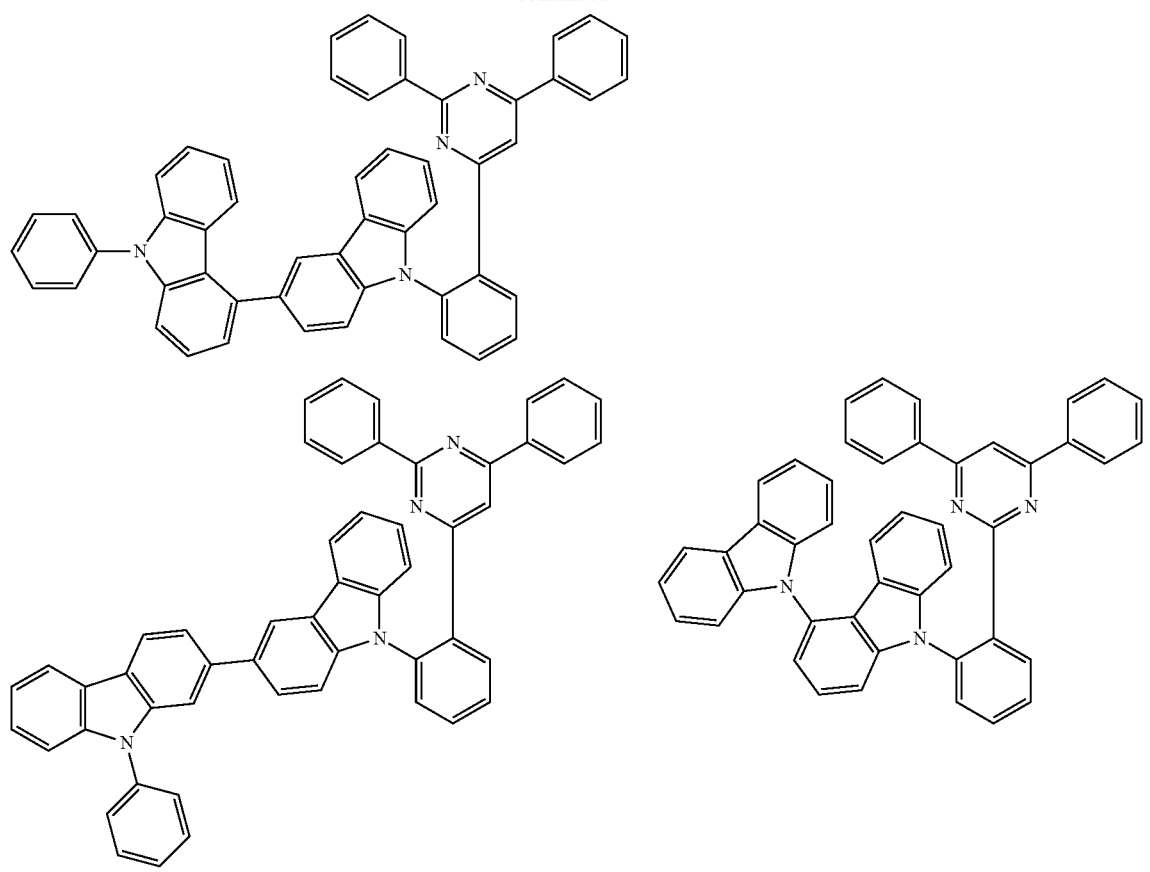
[Formula 88]
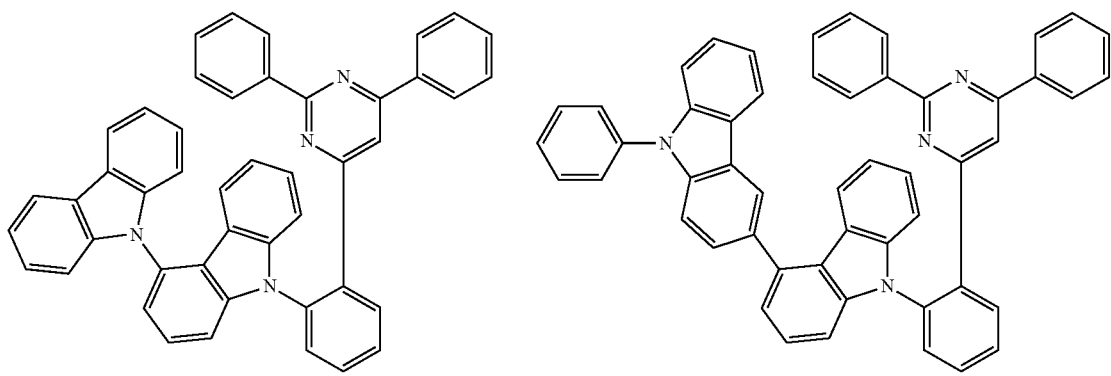

-continued
145
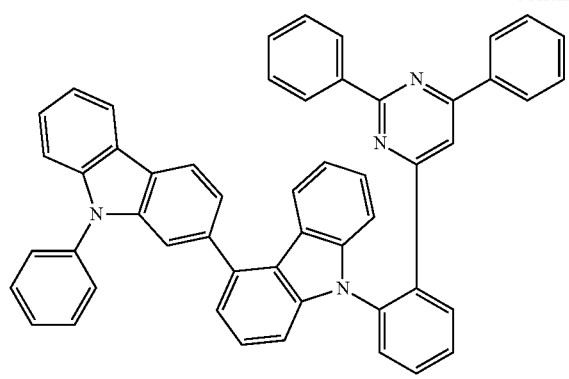
146
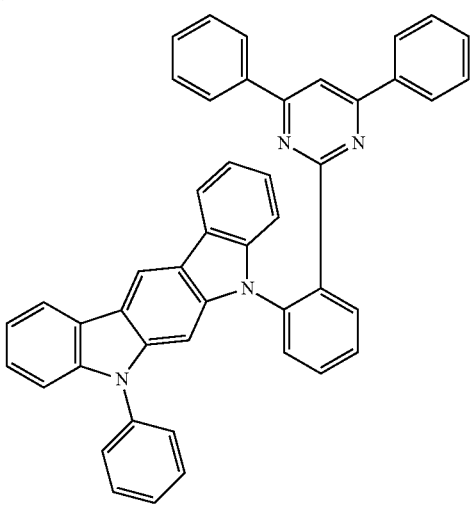
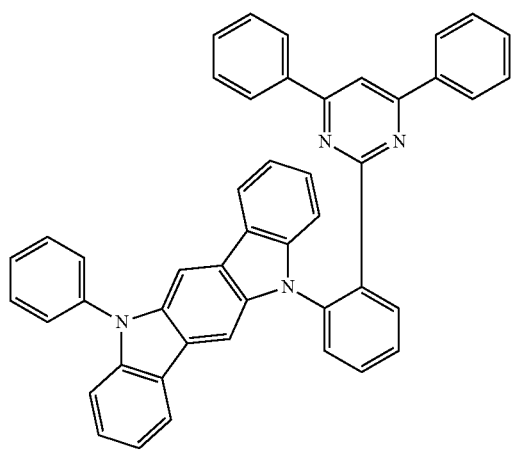
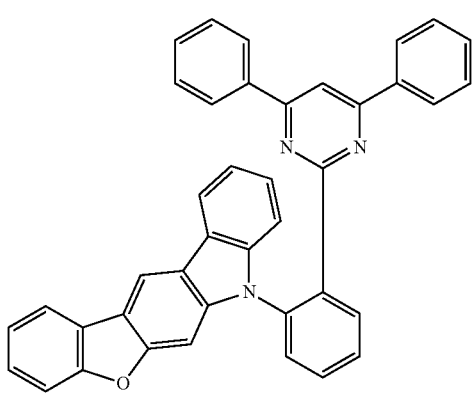
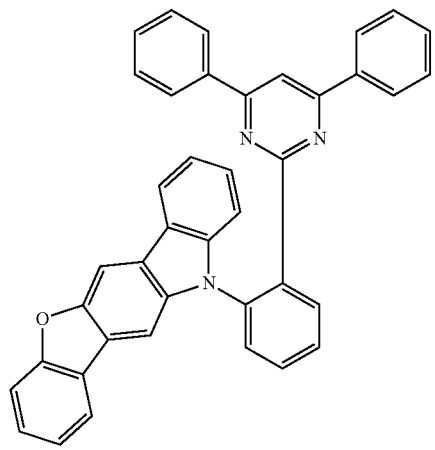

[Formula 89]
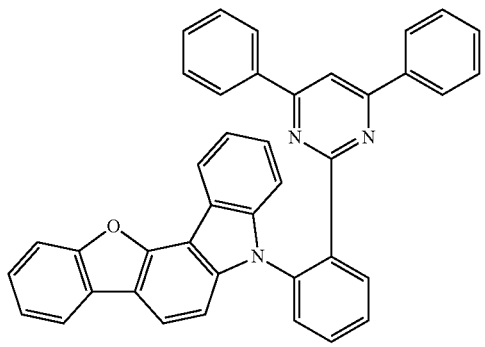
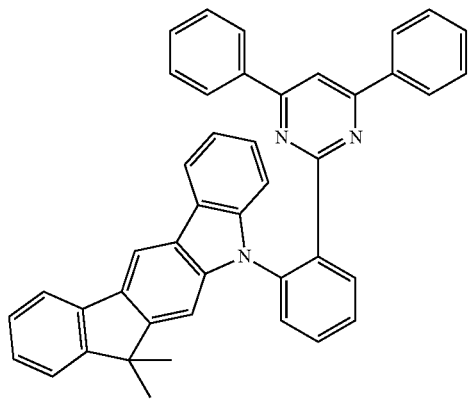
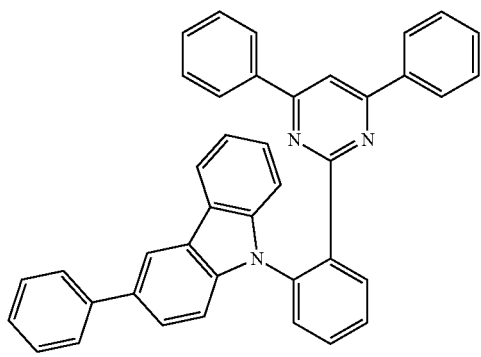
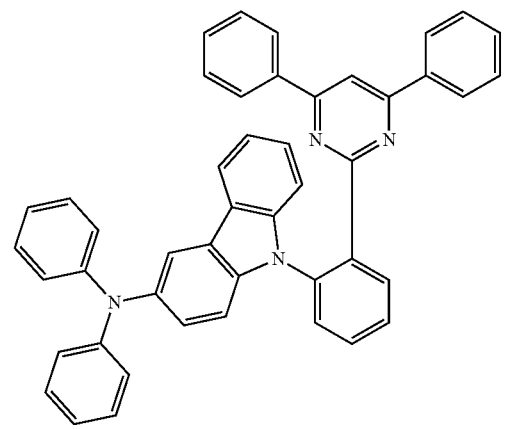
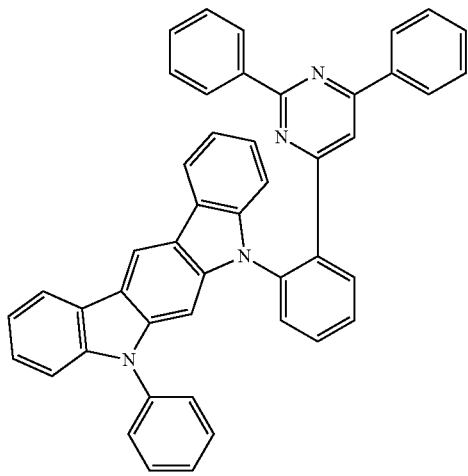
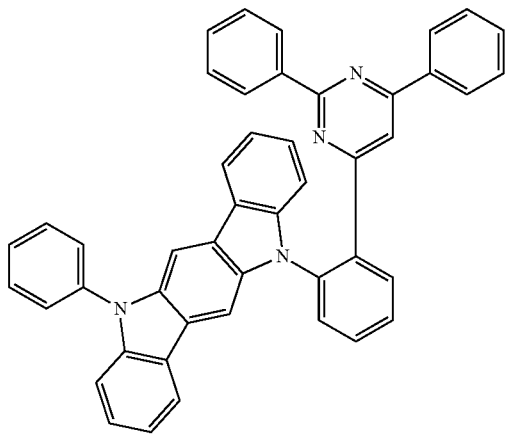

149
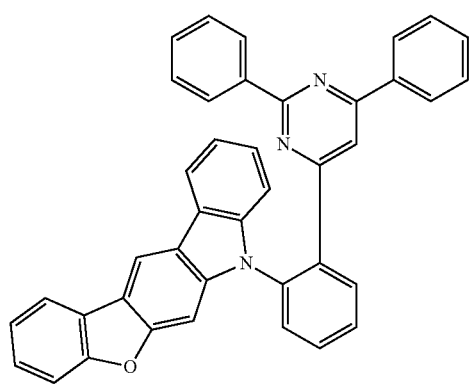
150
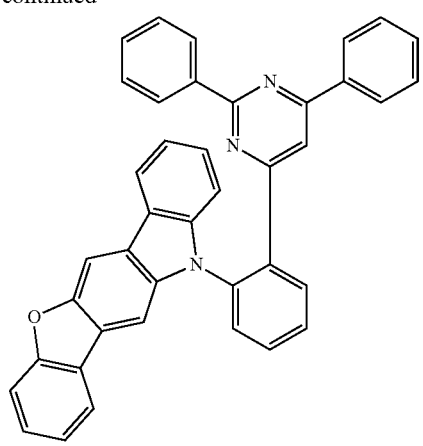
[Formula 90]
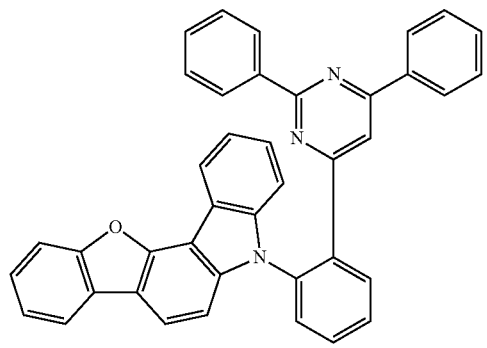
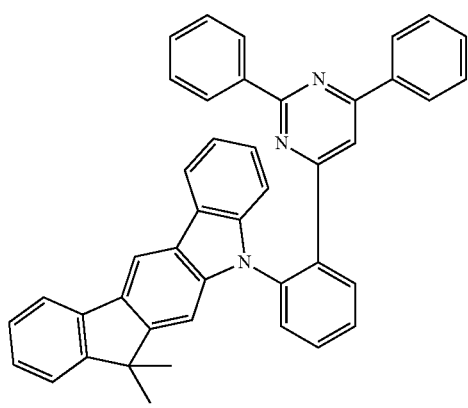
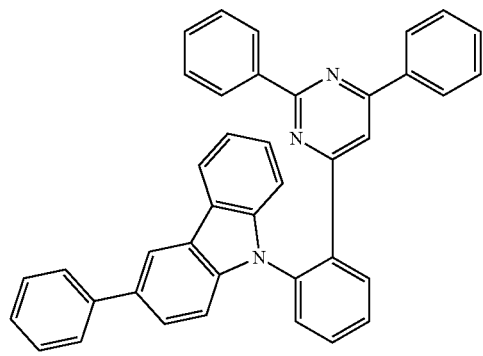
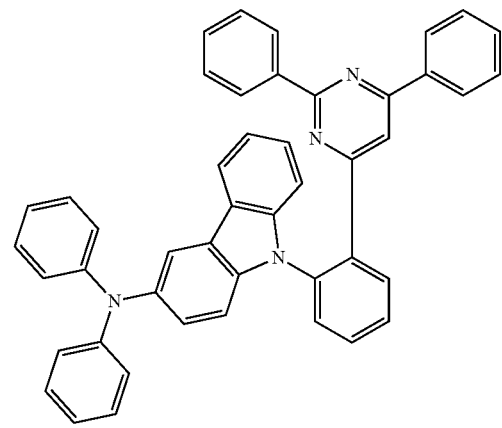

-continued
151
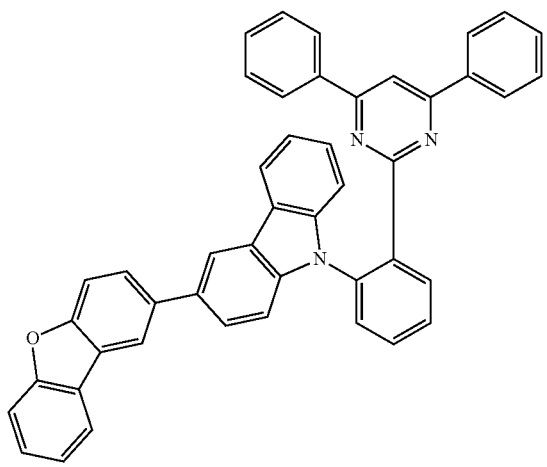
152
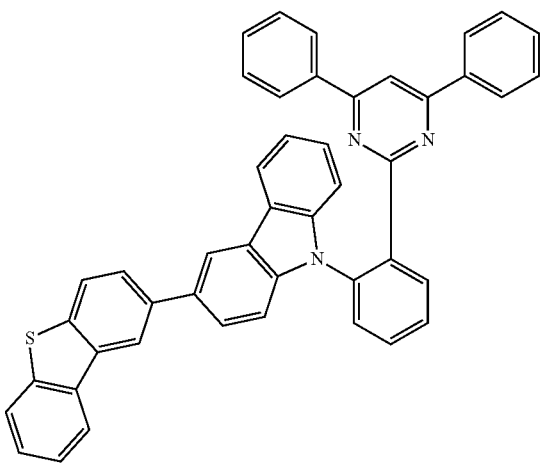
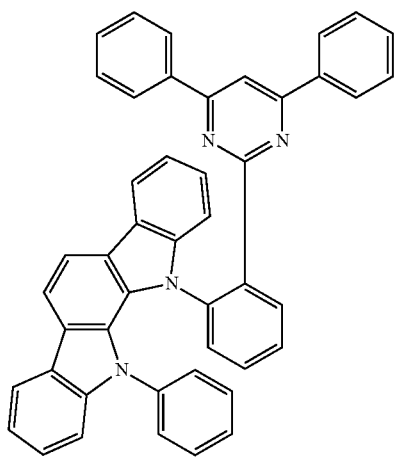
[Formula 91]
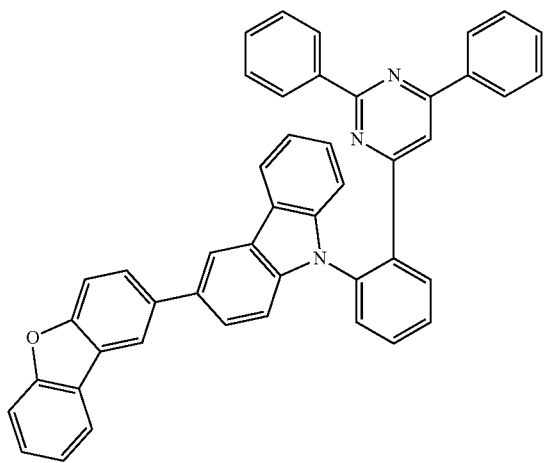
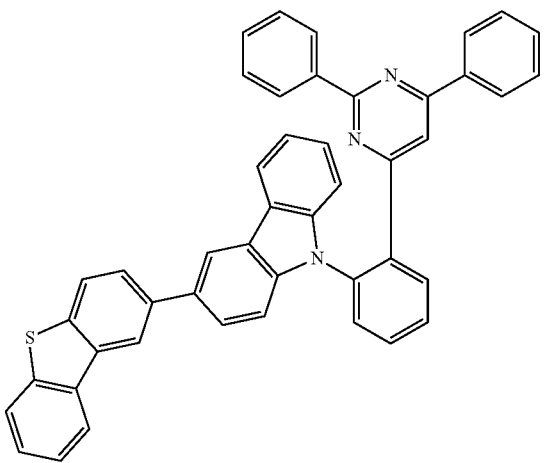

153
154
-continued
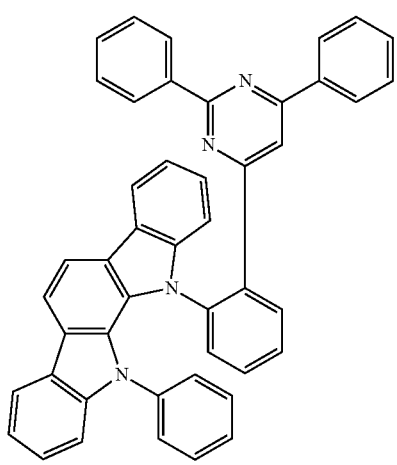
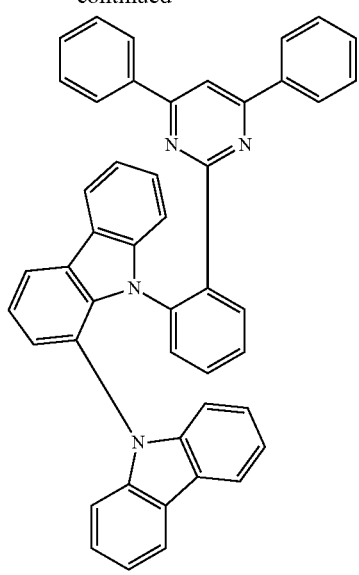
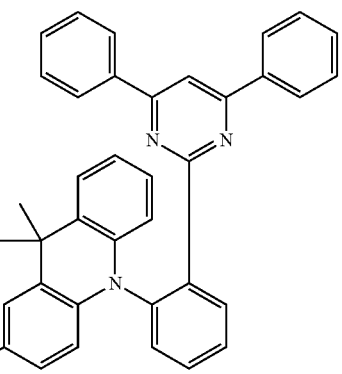
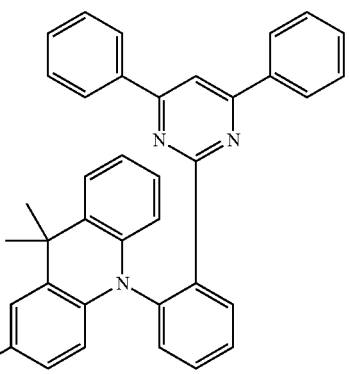
[Formula 92]
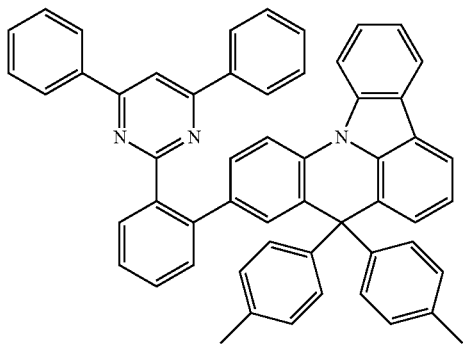
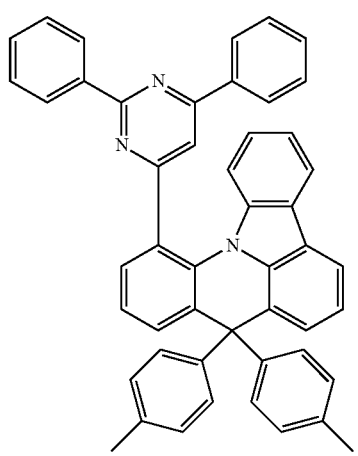

-continued
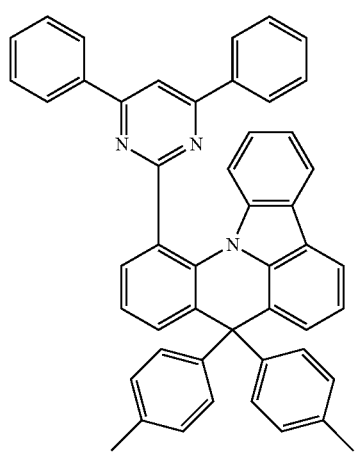
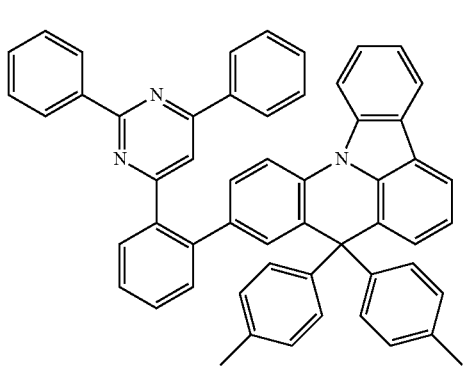
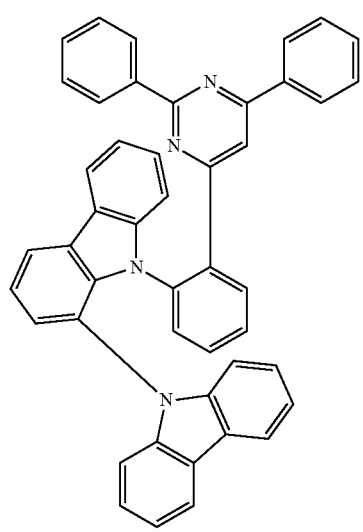
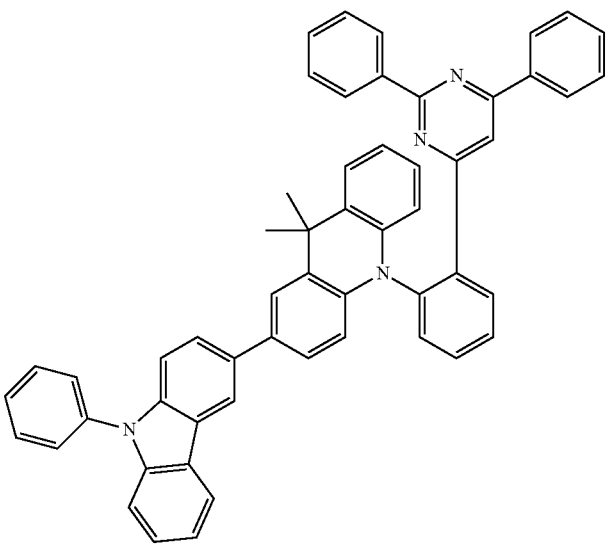
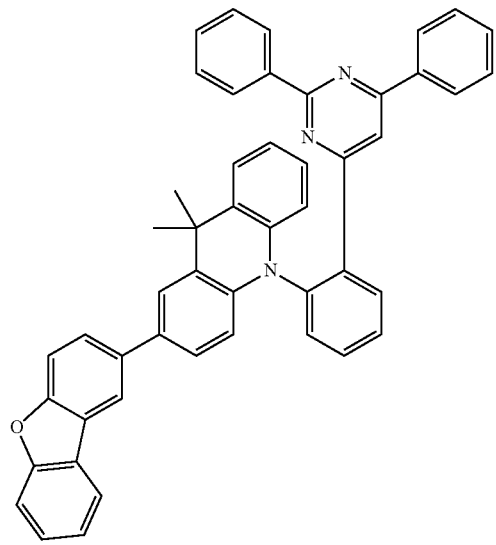

[Formula 93]
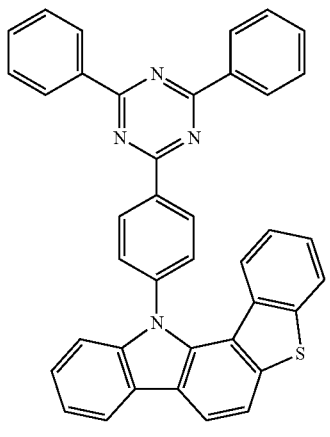
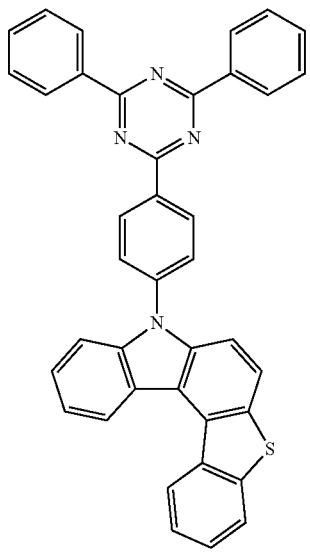
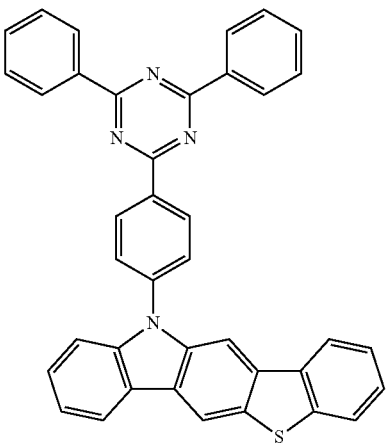
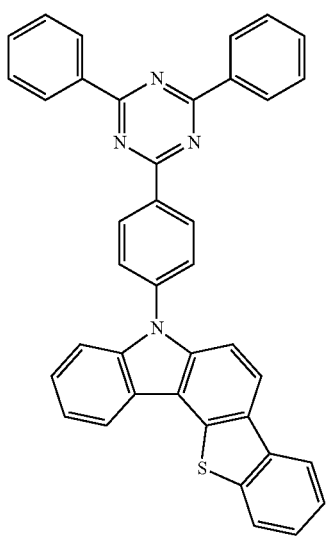
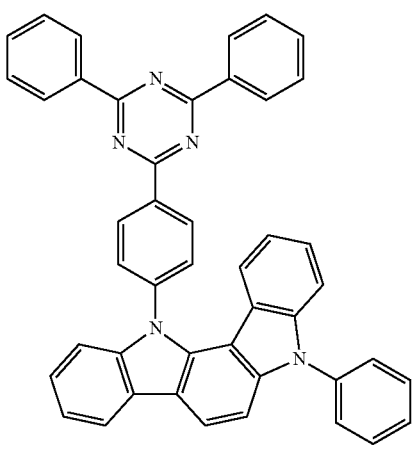 [SMILES: c1ccc(-c2cc(-c3ccc(-n4c5ccccc5c5ccc6c(c7ccccc7n6-c6ccccc6)c54)cc3)nc(-c3ccccc3)n2)cc1]
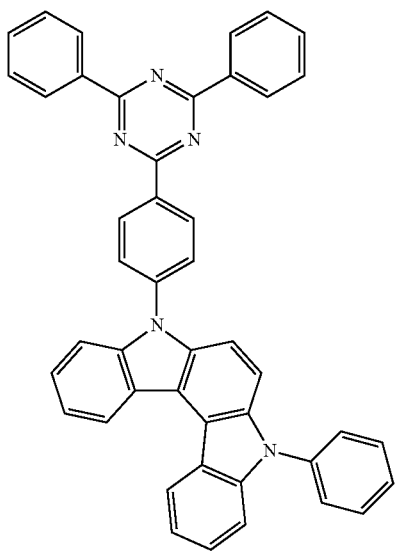
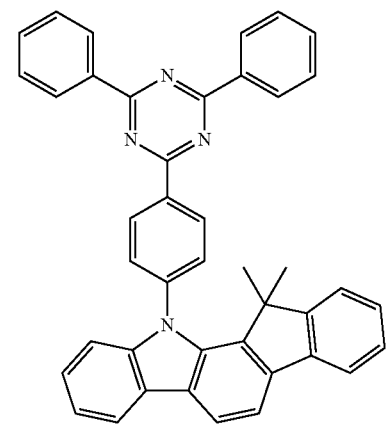

-continued
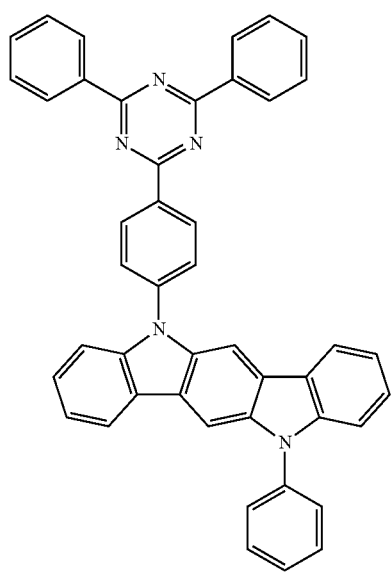
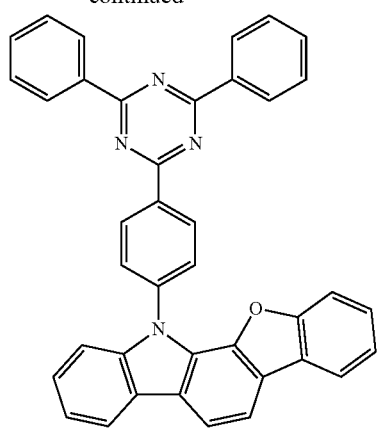
[Formula 94]
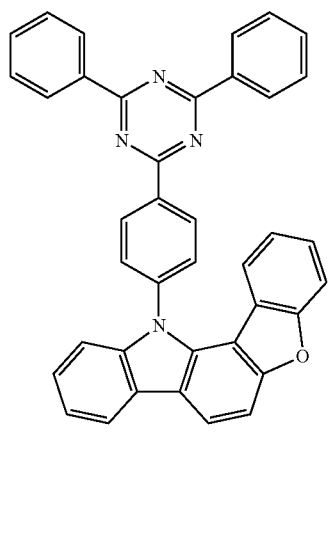
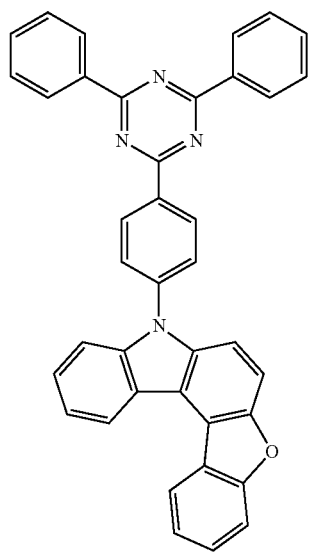
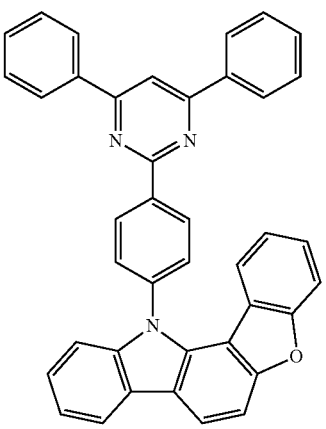
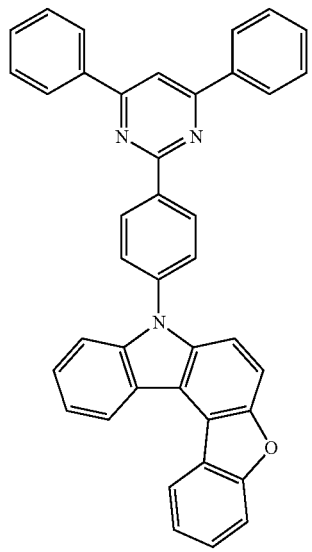
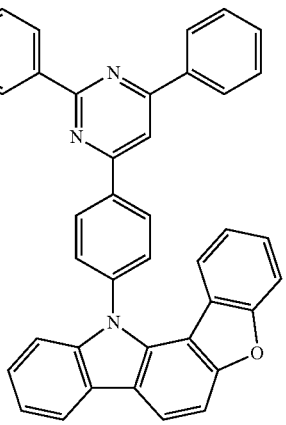
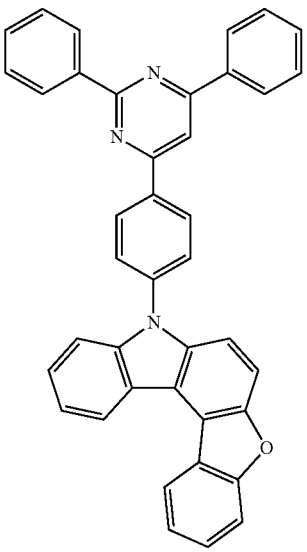

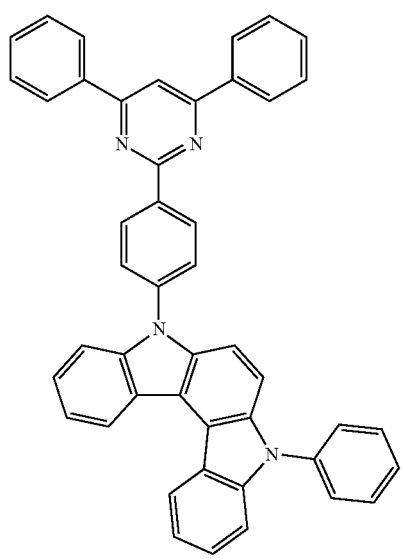
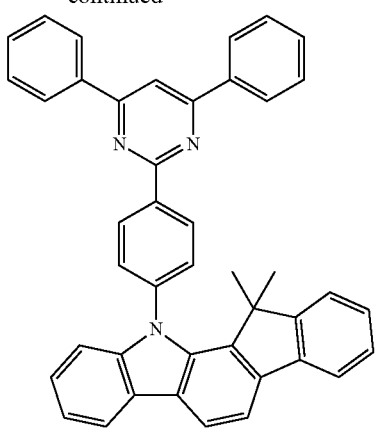
[Formula 95]
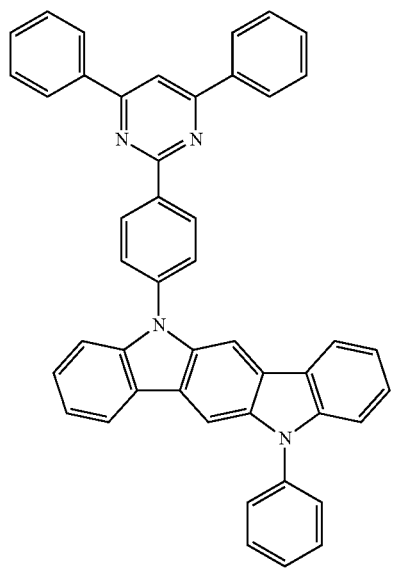
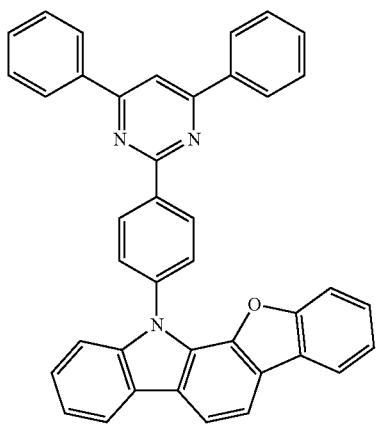
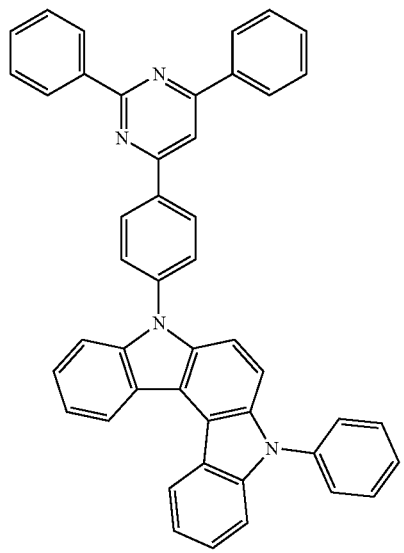
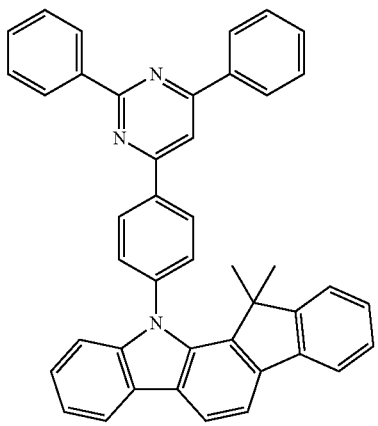

-continued
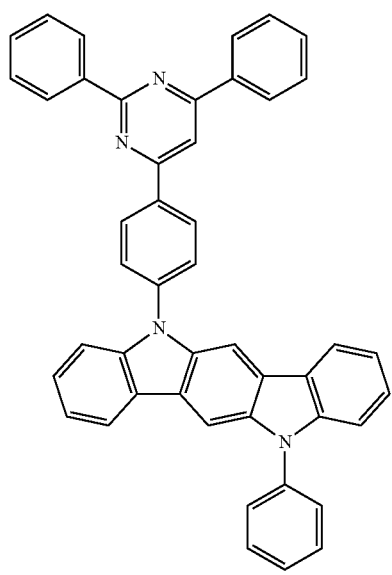
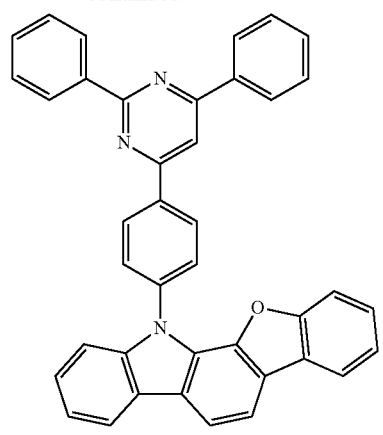
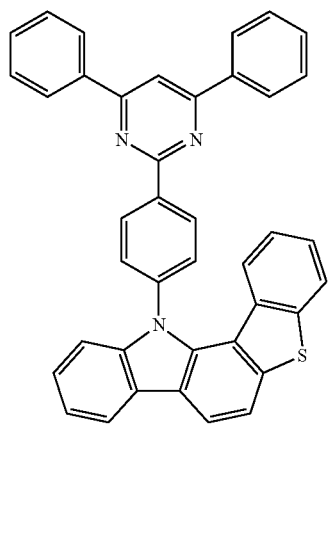
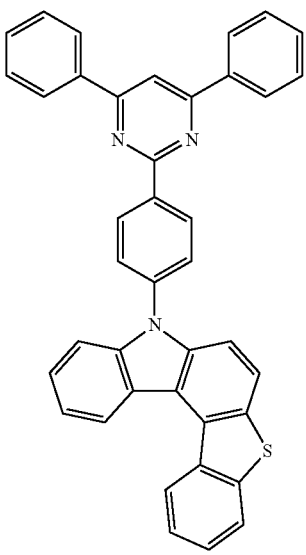
[Formula 96]
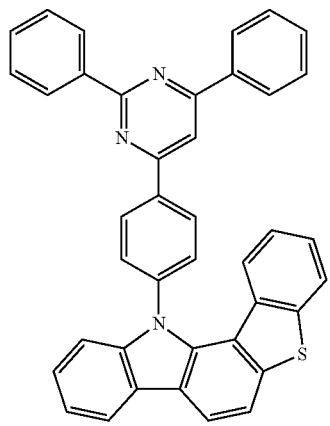
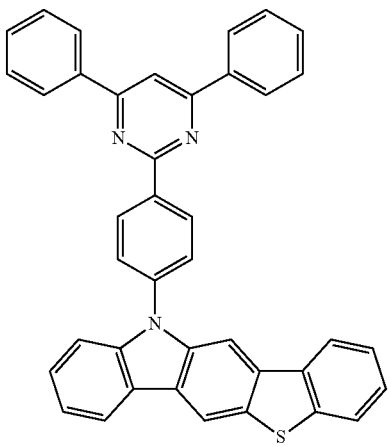
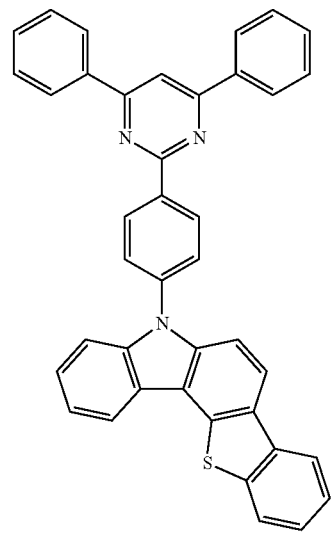

-continued

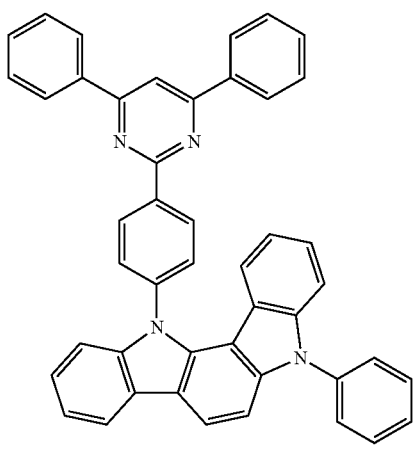
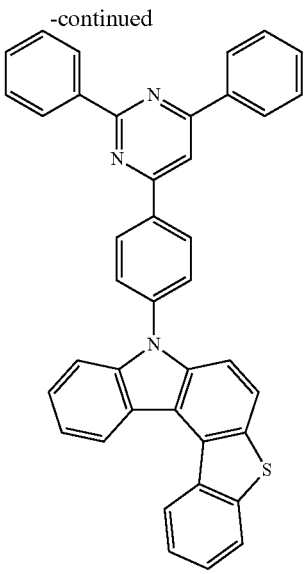
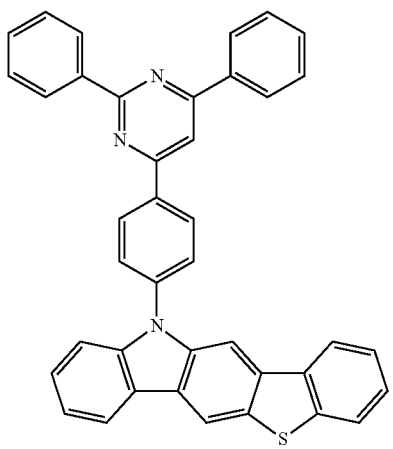
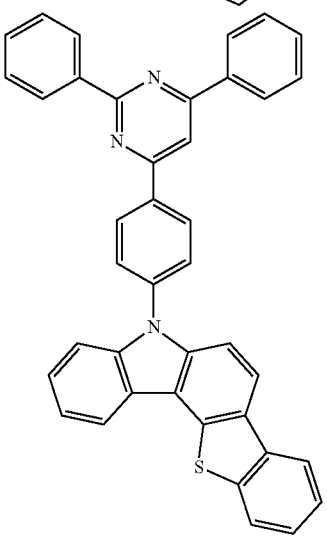
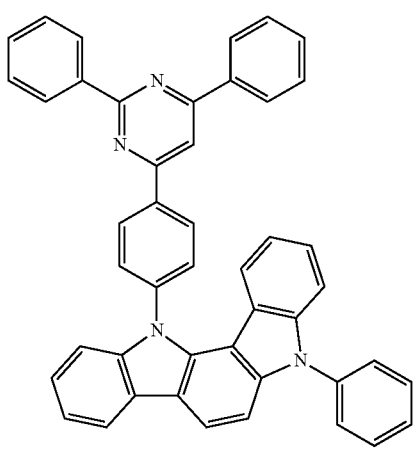

The dopant material according to the first exemplary embodiment may be synthesized by a known synthetic method.

Host Material

The host material is not particularly limited and may be any host material usable in an organic EL device.

In the first exemplary embodiment, an energy gap $Eg_{77K}$(H1) of the host material at 77[K] is preferably larger than the energy gap $Eg_{77K}$(D1) of the compound used as the dopant material at 77[K].

A compound used as the host material may be, for instance, an amine derivative, azine derivative or fused polycyclic aromatic derivative.

Examples of the amine derivative include a monoamine compound, diamine compound, triamine compound, tetramine compound and amine compound substituted by a carbazole group.

Examples of the azine derivative include a monoazine derivative, diazine derivative and triazine derivative.

Examples of the fused polycyclic aromatic derivative include compounds having a fused polycyclic aryl ring skeleton and compounds having a fused polycyclic heterocyclic skeleton, among which fused polycyclic aryl having no heterocyclic skeleton is preferable and examples of the fused polycyclic aryl include fused polycyclic aryl such as naphthalene, anthracene, phenanthrene, chrysene, fluoranthene and triphenylene, and derivatives thereof.

A film thickness of the emitting layer is preferably in a range of 5 nm to 50 nm, more preferably in a range of 7 nm to 50 nm and most preferably in a range of 10 nm to 50 nm. The thickness of less than 5 nm may cause difficulty in forming the emitting layer and in controlling chromaticity, while the thickness of more than 50 nm may raise drive voltage.

In the emitting layer, a ratio of the host material and the dopant material is preferably in a range of 99:1 to 50:50 at a mass ratio.

Substrate

The organic EL device according to the exemplary embodiment is formed on a light-transmissive substrate. The light-transmissive substrate supports the anode, organic compound layer, cathode and the like of the organic EL device. The light-transmissive substrate is preferably a smoothly-shaped substrate that transmits 50% or more of light in a visible region of 400 nm to 700 nm.

The light-transmissive plate is exemplified by a glass plate and a polymer plate.

The glass plate is particularly formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide and polysulfone.

Anode and Cathode

The anode of the organic EL device injects holes into the emitting layer, so that it is efficient that the anode has a work function of 4.5 eV or higher.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Ω/square or lower. The thickness of the anode is typically in the range of 10 nm to 1 µm, and preferably in the range of 10 nm to 200 nm, though it depends on the material of the anode.

The cathode is preferably formed of a material with smaller work function in order to inject electrons into the emitting layer.

Although a material for the cathode is not particularly limited, examples of the material are indium, aluminium, magnesium, alloy of magnesium and indium, alloy of magnesium and aluminium, alloy of aluminium and lithium, alloy of aluminium, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region. Sheet resistance of the cathode is preferably several hundreds Ω/sq. or lower. The thickness of the cathode is typically in the range of 10 nm to 1 µm, and preferably in the range of 50 nm to 200 nm, though it depends on the material of the cathode.

Hole Injecting•Transporting Layer

The hole injection/transport layer helps injection of holes to the emitting layer and transport the holes to an emitting region. A compound having a large hole mobility and a small ionization energy is used as the hole injection/transport layer.

A material for forming the hole injecting layer and the hole transporting layer is preferably a material for transporting the holes to the emitting layer at a lower electric field intensity. For instance, an aromatic amine compound is preferably used. The material for the hole injecting layer is preferably a porphyrin compound, an aromatic tertiary amine compound or a styryl amine compound, particularly preferably the aromatic tertiary amine compound such as hexacyanohexaazatriphenylene (HAT).

Electron Injecting•Transporting Layer

The electron injecting•transporting layer helps injection of the electrons into the emitting layer and transports the electrons to an emitting region. A compound having a large electron mobility is used as the electron injecting•transporting layer.

A preferable example of the compound used as the electron injecting•transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton, or a fused aromatic cyclic compound having a nitrogen-containing six-membered or five-membered ring skeleton. Moreover, the electron injecting/transporting layer may contain an alkali metal and the like.

In the organic EL device according to the invention, in addition to the aforementioned compounds, any compound selected from compounds to be used in a typical organic El device is usable as a compound for the organic compound layer other than the emitting layer.

Layer Formation Method(s)

A method for forming each layer of the organic EL device according to the invention is subject to no limitation except for the above particular description. However, known methods of dry film-forming such as vacuum deposition, sputtering, plasma or ion plating and wet film-forming such as spin coating, dipping, flow coating or ink-jet are applicable.

Thickness

The thickness of each organic layer of the organic EL device according to the invention is subject to no limitation except for the thickness particularly described above. However, the thickness is typically preferably in a range of several nanometers to 1 µm because an excessively thin film is likely to entail defects such as a pin hole while an excessively thick film requires high applied voltage and deteriorates efficiency.

Second Exemplary Embodiment

Arrangement(s) of an organic EL device according to a second exemplary embodiment will be described. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable unless particularly described.

The organic EL device in the second exemplary embodiment has the same device arrangement as in the first exemplary embodiment. The compound contained in the emitting layer is a compound represented by the formula (2). The compound represented by the formula (2) is substantially the same as the compound represented by the formula (1).

Preferable examples of the compound contained in the emitting layer, substituents and the like for the organic EL device in the second exemplary embodiment are the same as those described for the organic EL device in the first exemplary embodiment.

In the organic EL device in the second exemplary embodiment, an emission from the compound represented by the formula (2) is a maximum emission component of an emission from the organic EL device. In other words, when the organic EL device in the second exemplary embodiment emits light, the compound represented by the formula (2) is the compound achieving the maximum luminous intensity according to the emission spectrum.

The organic EL device in the second exemplary embodiment, in which an emission from the compound represented by the formula (2) contained in the emitting layer is a maximum emission component of an emission from the organic EL device, can be improved in luminous efficiency.

Third Exemplary Embodiment

Arrangement(s) of an organic EL device according to a third exemplary embodiment will be described. In the description of the third exemplary embodiment, the same components as those in the first exemplary embodiment are denoted by the same reference signs and names to simplify or omit an explanation of the components. In the third exemplary embodiment, the same materials and compounds as described in the first exemplary embodiment are usable unless particularly described.

The organic EL device in the third exemplary embodiment has the same device arrangement as in the first exemplary embodiment. The compound contained in the emitting layer is a compound represented by the formula (3). The compound represented by the formula (3) is substantially the same as the compound represented by the formula (1). Preferable examples of the compound contained in the emitting layer, substituents and the like for the organic EL device in the third exemplary embodiment are the same as those described for the first exemplary embodiment.

In the organic EL device in the third exemplary embodiment, the compound represented by the formula (3) is a delayed fluorescence emitter. In other words, in the organic EL device in the third exemplary embodiment, the compound represented by the formula (3) in the emitting layer emits delayed fluorescence.

In the organic EL device in the third exemplary embodiment, the emitting layer contains a delayed fluorescence compound in the form of the compound represented by the formula (3), an emission from which causes the TADF mechanism to function to improve the luminous efficiency.

Fourth Exemplary Embodiment

Arrangement(s) of an organic EL device according to a fourth exemplary embodiment will be described. In the description of the fourth exemplary embodiment, the same components as those in the first exemplary embodiment are denoted by the same reference signs and names to simplify or omit an explanation of the components. In the fourth exemplary embodiment, the same materials and compounds as described in the first exemplary embodiment are usable unless particularly described.

The organic EL device in the fourth exemplary embodiment has the same device arrangement as in the first exemplary embodiment, except that the compound represented by the formula (1) is represented by a formula (40) below. The compound represented by the formula (40) below is contained in the emitting layer.

[Formula 97]

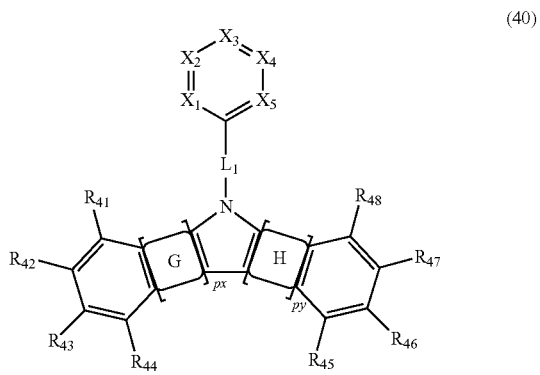

(40)

In the formula (40), $X_1$ to $X_5$ each independently represent $CR_1$ or a nitrogen atom and at least one of $X_1$ to $X_5$ is a nitrogen atom.

In the formula (40), one to three of $X_1$ to $X_5$ are preferably nitrogen atom(s). In the formula (40), substituents $R_1$ of adjacent carbon atoms may be bonded to each other to form a cyclic structure.

When one nitrogen atom is provided, $X_1$ or $X_5$ is preferably a nitrogen atom. When two nitrogen atoms are provided, $X_1$ and $X_5$ are preferably nitrogen atoms. When three nitrogen atoms are provided, $X_1$, $X_3$ and $X_5$ are preferably nitrogen atoms. Among the above arrangements, a triazine ring in which $X_1$, $X_3$ and $X_5$ are nitrogen atoms is preferable in the formula (40).

In the formula (40), $L_1$ represents a substituted or unsubstituted divalent aromatic hydrocarbon group.

In the formula (40), $R_1$ and $R_{41}$ to $R_{48}$ are each independently a hydrogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

Each of pairs of $R_{41}$ and $R_{42}$, $R_{42}$ and $R_{43}$, $R_{43}$ and $R_{44}$, $R_{45}$ and $R_{46}$, $R_{46}$ and $R_{47}$, and $R_{47}$ and $R_{48}$ may be mutually bonded to form a cyclic structure.

In the formula (40), G and H each independently represent a cyclic structure represented by a formula (3g) below or a cyclic structure represented by a formula (3h) below. Each of the cyclic structure G and the cyclic structure H is fused to an adjacent cyclic structure at any position.

px and py are each independently an integer of 0 to 4 and respectively represent the number of the cyclic structure G and the number of the cyclic structure H. When px is an integer of 2 to 4, a plurality of cyclic structures G may be mutually the same or different. When py is an integer of 2 to 4, a plurality of cyclic structures H may be mutually the same or different. Accordingly, for instance, when px is 2, the cyclic structures G may be either two cyclic structures represented by the formula (3g) below or two cyclic structures represented by the formula (3h), or alternatively, the cyclic structures G may be a combination of one cyclic structure represented by the formula (3g) and one cyclic structure represented by the formula (3h).

[Formula 98]

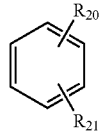

(3g)

[Formula 99]

(3h)

In the formula (3g), $R_{20}$ and $R_{21}$ each independently represent the same as $R_1$ described above and may be mutually bonded to form a cyclic structure. $R_{20}$ and $R_{21}$ are respectively bonded to carbon atoms forming the six-membered ring of the formula (3g).

In the formula (3h), $Z_8$ represents $CR_{22}R_{23}$, $NR_{24}$, a sulfur atom, or an oxygen atom. $R_{22}$ to $R_{24}$ each independently represent a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

$R_{22}$ and $R_{23}$ are each independently preferably a substituted or unsubstituted alkyl group having 1 to 30 carbon atoms or a substituted or unsubstituted aryl group having 6 to 30 ring carbon atoms. Specific examples of $R_{22}$ and $R_{23}$ include a methyl group, ethyl group, n-propyl group, phenyl group, biphenyl group, and terphenyl group. $R_{24}$ is preferably a substituted or unsubstituted aryl group having 6 to 30 ring carbon atoms or a substituted or unsubstituted heterocyclic group having 5 to 30 ring atoms. Specific examples of $R_{24}$ include a phenyl group, biphenyl group, terphenyl group, naphthyl group, phenanthryl group, triphenylenyl group, dibenzofuranyl group, dibenzothiophenyl group, and carbazolyl group. $R_{24}$ is more preferably a substituted or unsubstituted aryl group having 6 to 30 ring carbon atoms. Specific examples of $R_{24}$ include a phenyl group, biphenyl group, terphenylyl group, naphthyl group, phenanthryl group and triphenylenyl group.

In the formula (40), at least one of combinations of substituents selected from $R_{41}$ to $R_{48}$ and $R_{20}$ to $R_{24}$ may be mutually bonded to form a cyclic structure.

$L_1$ of the formula (40) preferably has a divalent six-membered ring structure, more preferably a divalent six-membered ring structure represented by a formula (4), (4a) or (4b) below, further preferably a divalent six-membered ring structure represented by the formula (4) below.

[Formula 100]

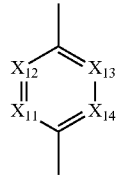

(4)

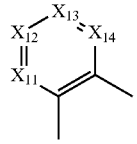

(4a)

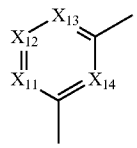

(4b)

In the formulae (4), (4a) and (4b), $X_{11}$ to $X_{14}$ each independently represent $CR_{11}$ or a nitrogen atom, in which $R_{11}$ each independently represents a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

$X_{11}$ to $X_{14}$ of the formulae (4), (4a) and (4b) are each independently preferably $CR_{11}$, in which $R_{11}$ is more preferably a hydrogen atom, alkyl group, alkoxy group, aryloxy group, cyano group, halogen atom and silyl group.

Particularly preferably, $L_1$ is represented by the formula (4); $X_{11}$ to $X_{14}$ are each independently $CR_{11}$; $X_1$, $X_3$ and $X_5$ of the formula (40) are nitrogen atoms; and $X_2$ and $X_4$ are $CR_1$. In other words, the dopant material is preferably provided by a compound in which the electron-accepting moiety represented by the formula (1b) is a substituted or unsubstituted triazine ring, which is connected to the electron-donating moiety represented by the formula (1a) via a substituted or unsubstituted p-phenylene group. The compound with this arrangement is represented by a formula (41) below.

[Formula 101]

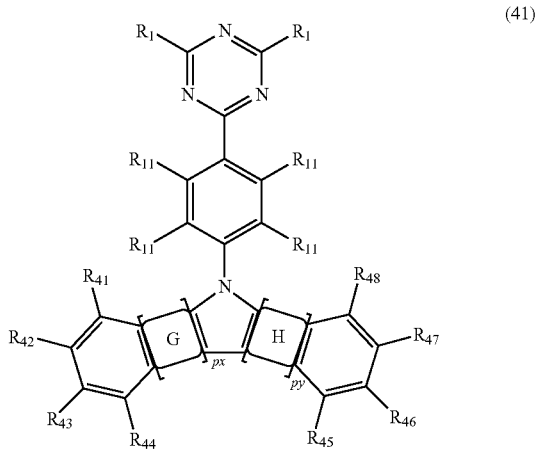

(41)

In the formula (41), $R_1$, $R_{11}$, $R_{41}$ to $R_{48}$, the cyclic structure G, the cyclic structure H, px and py respectively represent the same as $R_1$, $R_{11}$, $R_{41}$ to $R_{48}$, the cyclic structure G, the cyclic structure H, px and py described in the formulae (4) and (40).

In the third exemplary embodiment, px and py are preferably the same integer, among which px and py are preferably 2. In this arrangement, the formula (40) is represented by a formula (42) below.

[Formula 102]

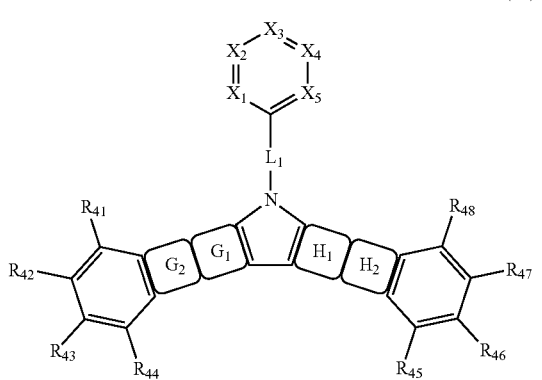

(42)

In the formula (42), $X_1$ to $X_5$, $R_{41}$ to $R_{48}$ and $L_1$ respectively independently represent the same as $X_1$ to $X_5$, $R_{41}$ to $R_{48}$ and $L_1$ of the formula (40).

The cyclic structure $G_1$ and the cyclic structure $G_2$ each independently represent the same as the cyclic structure G described above. The cyclic structure $H_1$ and the cyclic structure $H_2$ each independently represent the same as the cyclic structure H described above.

In the formula (42), the cyclic structure $G_1$ and the cyclic structure $H_1$ are each independently the cyclic structure represented by the formula (3g). The cyclic structure $G_2$ and the cyclic structure $H_2$ are each independently the cyclic structure represented by the formula (3h).

In the third exemplary embodiment, it is also preferable that one of px and py is 0 while the other of px and py is 4. For instance, when px is 4 and py is 0, the formula (40) is represented by a formula (43) below.

[Formula 103]

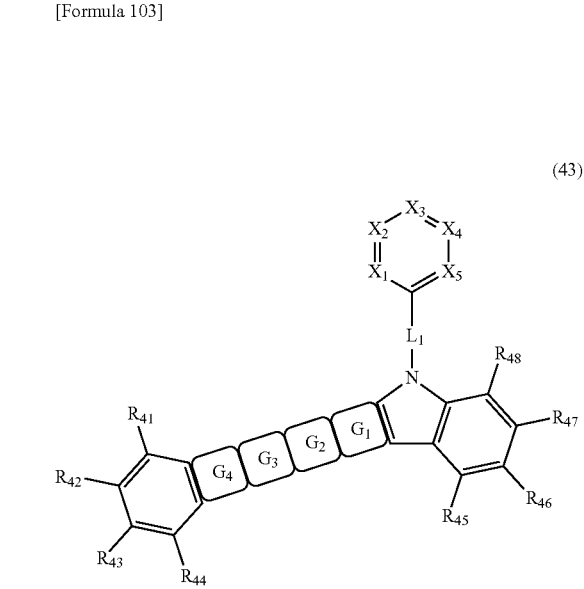

(43)

In the formula (43), $X_1$ to $X_5$, $R_{41}$ to $R_{48}$ and $L_1$ respectively independently represent the same as $X_1$ to $X_5$, $R_{41}$ to $R_{48}$ and $L_1$ of the formula (40).

The cyclic structure $G_1$, the cyclic structure $G_2$, a cyclic structure $G_3$, and a cyclic structure $G_4$ each independently represent the same as the cyclic structure G.

In the formula (43), the cyclic structure $G_1$ and the cyclic structure $G_3$ are each independently the cyclic structure represented by the formula (3g). The cyclic structure $G_2$ and the cyclic structure $G_4$ are each independently the cyclic structure represented by the formula (3h).

In the formulae (42) and (43), $X_1$ to $X_5$ and $L_1$ are preferably the above preferable examples of $X_1$ to $X_5$ and $L_1$.

Also in the third exemplary embodiment, it is preferable that a difference $\Delta ST(D1)$ between singlet energy EgS(D1) and energy gap $Eg_{77K}(D1)$ at 77[K] in the compound represented by the formula (40) satisfies the above numerical formula (1).

Specific examples of the compound represented by the formula (40) in the third exemplary embodiment are shown below, but the invention is not limited thereto.

[Formula 104]
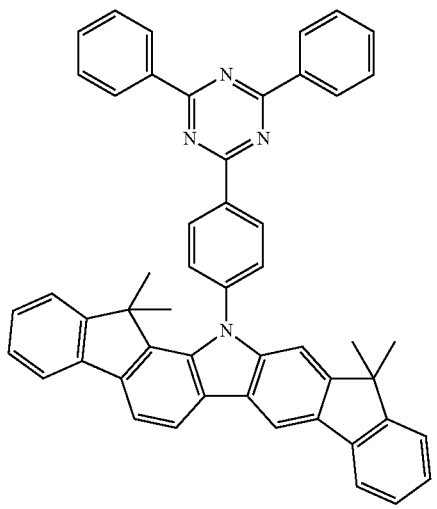
[Formula 105]
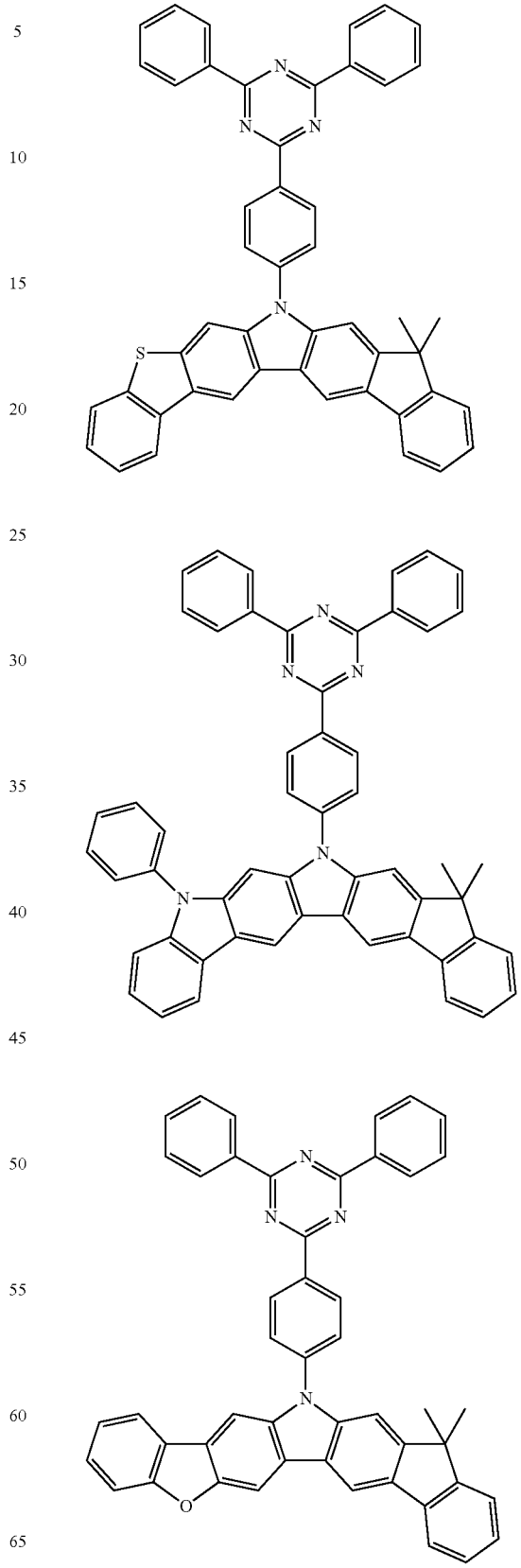

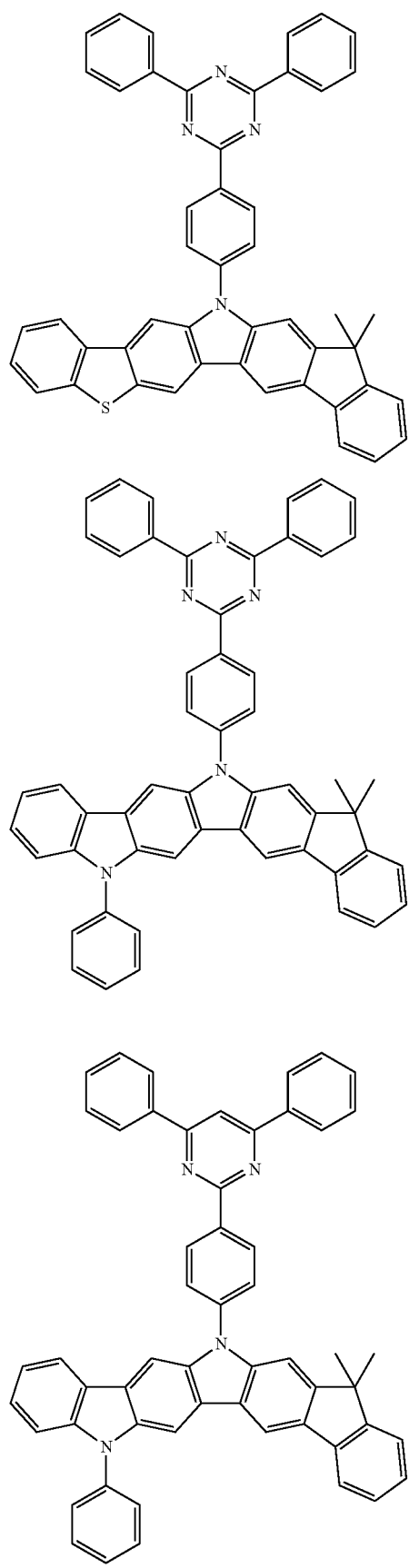
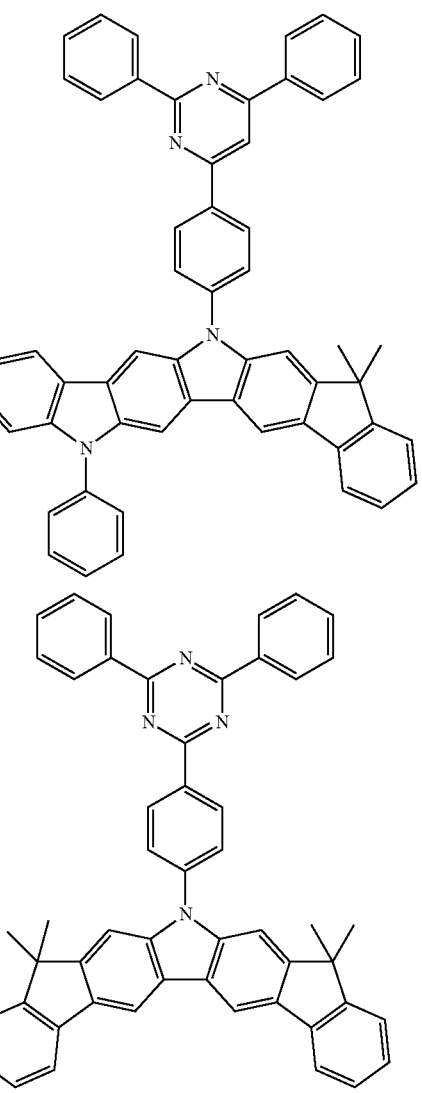
[Formula 106]
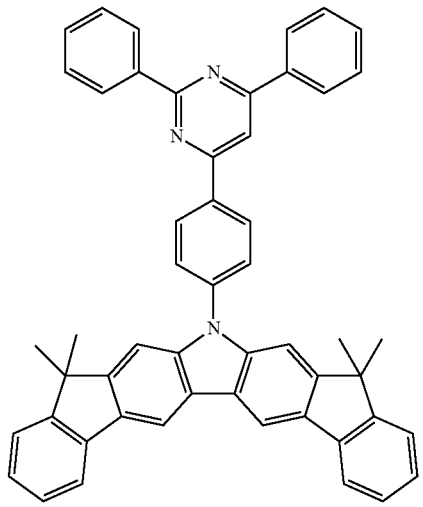

179
-continued
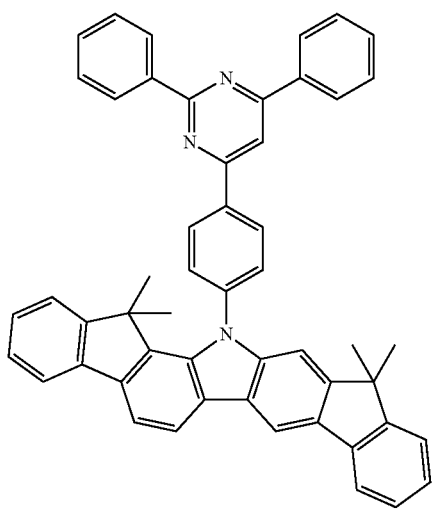
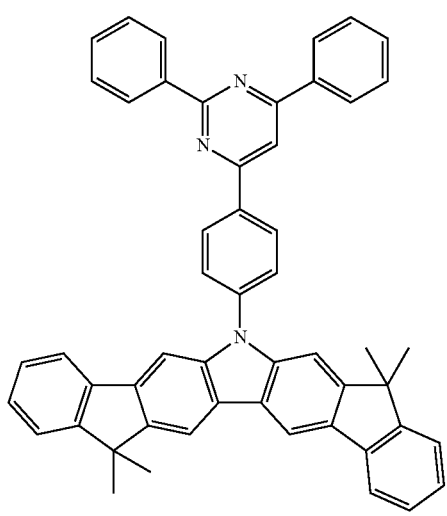
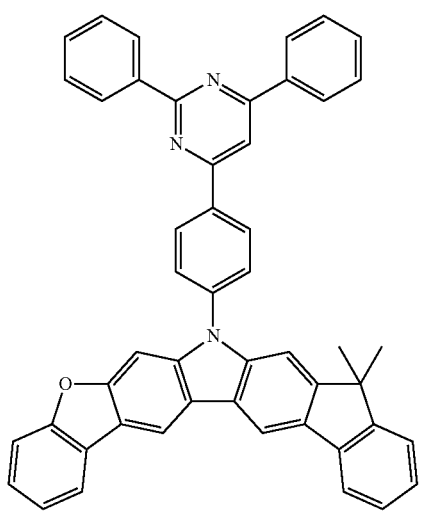 [SMILES: CC1(C)c2ccccc2-c2cc3c4cc5c(cc4n(-c4ccc(-c6cc(-c7ccccc7)nc(-c7ccccc7)n6)cc4)c3cc21)sc1ccccc15]
180
-continued
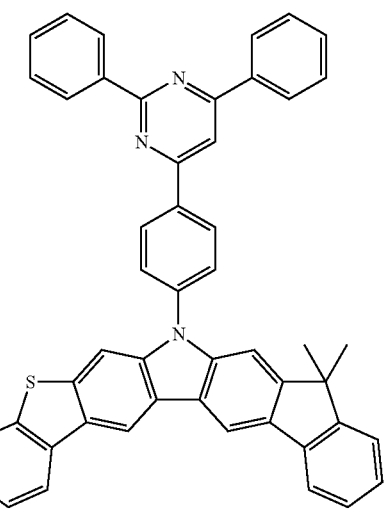
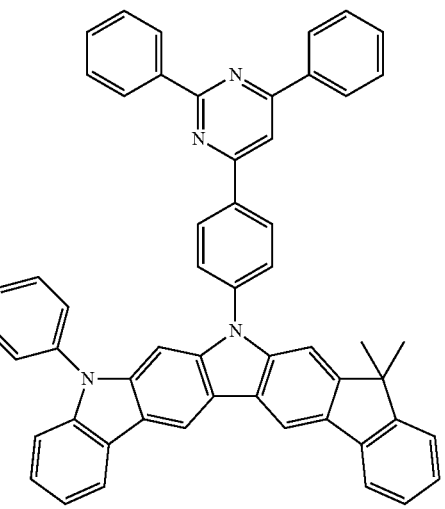
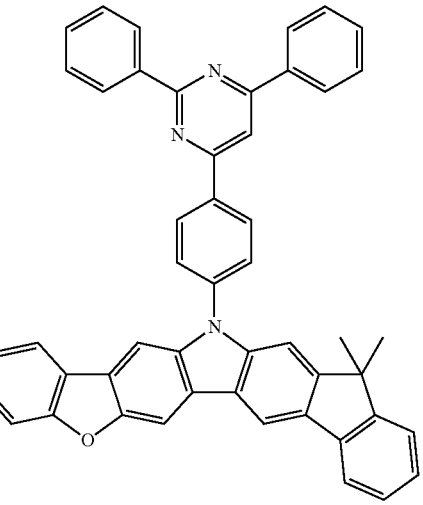

181
-continued
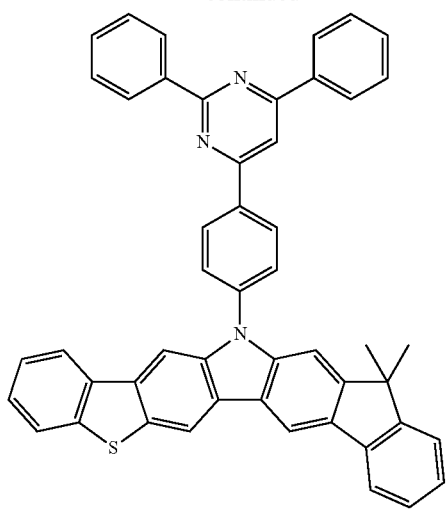
[Formula 107]
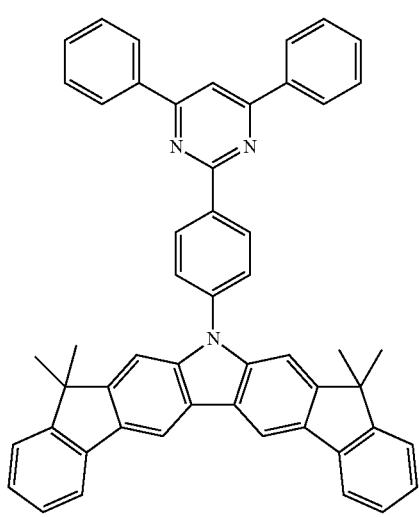
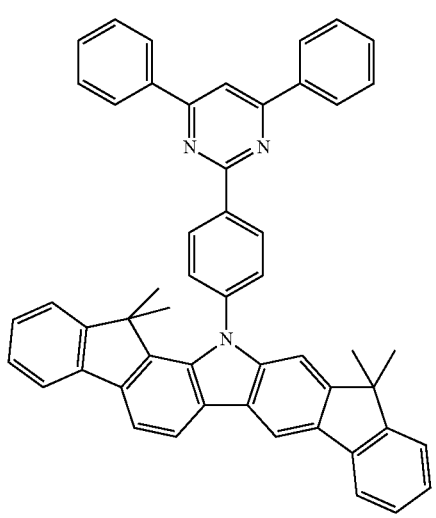
182
-continued
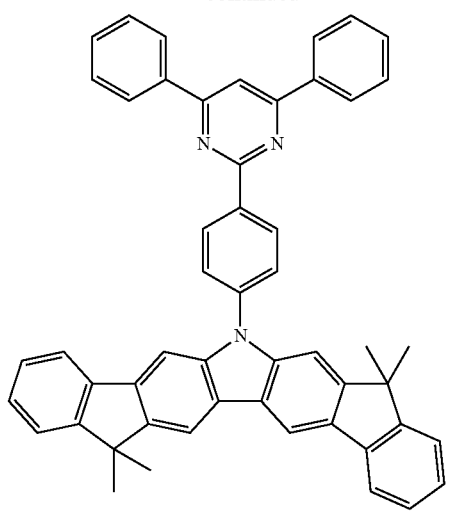
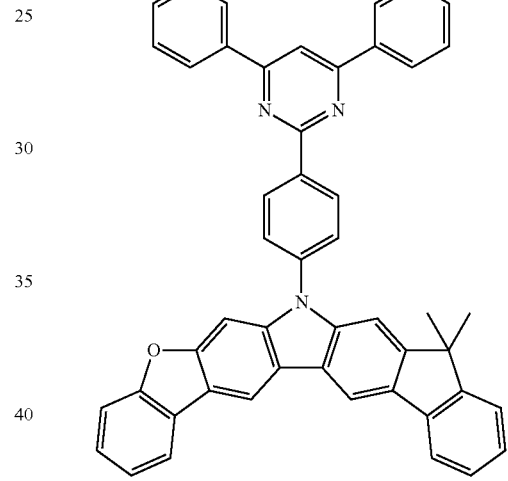
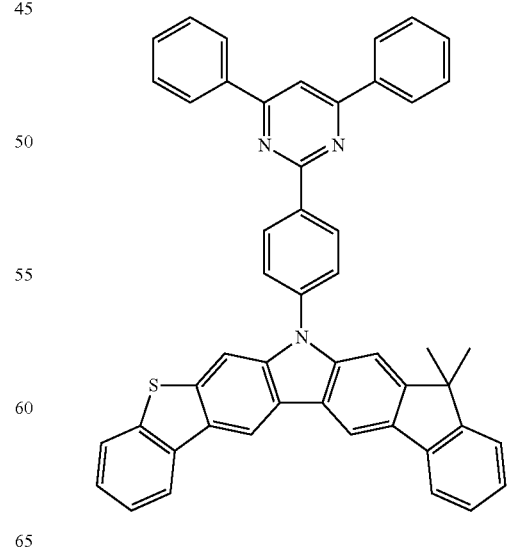

-continued
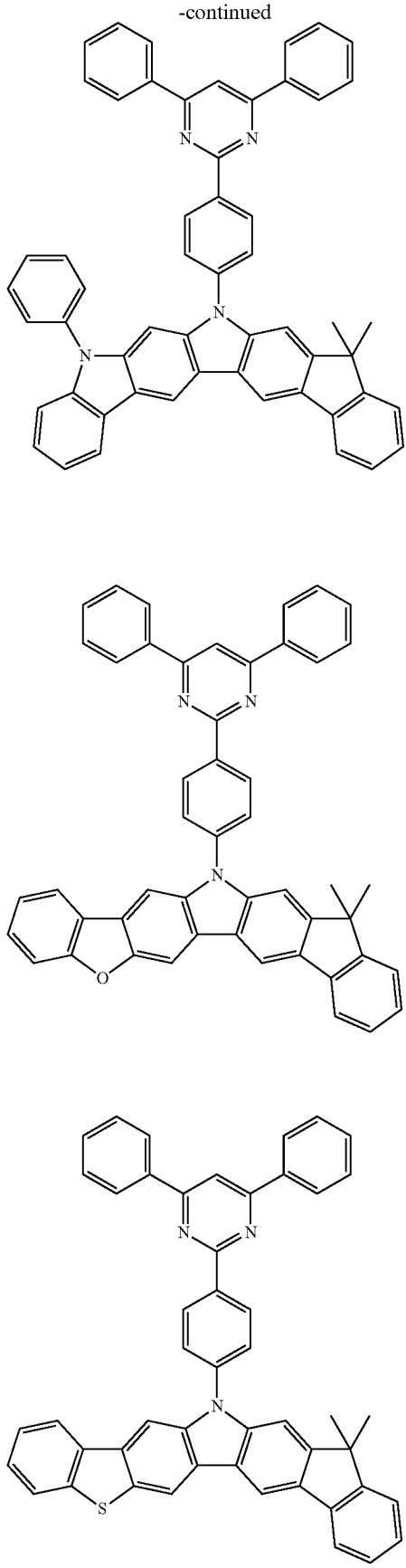
[Formula 108]
-continued
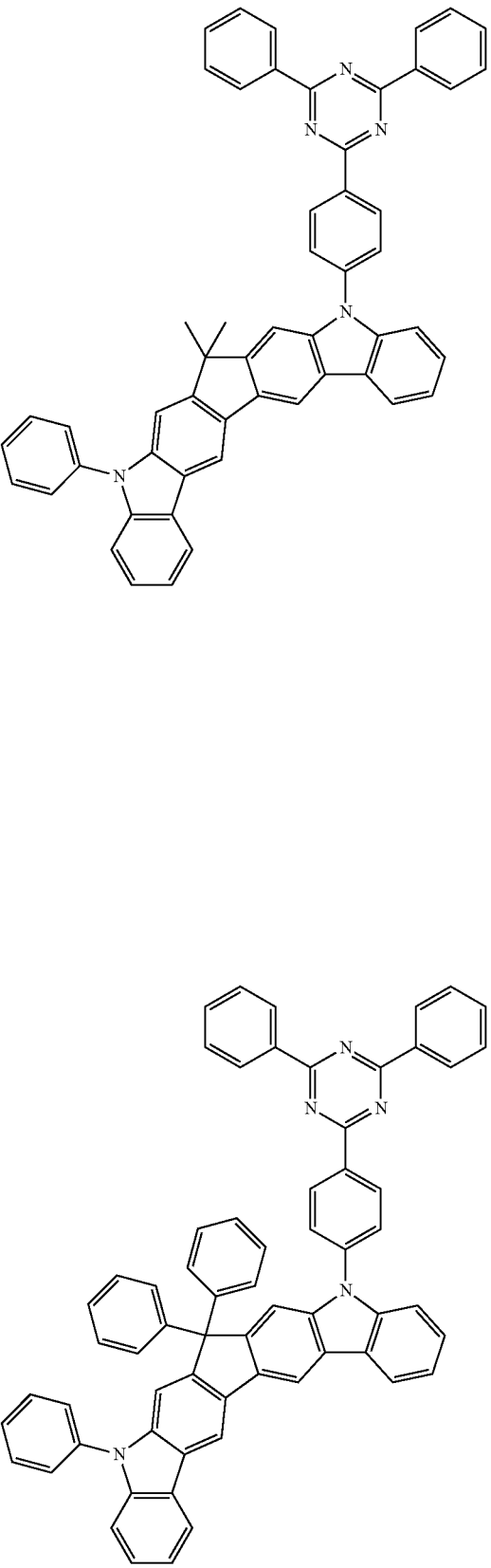

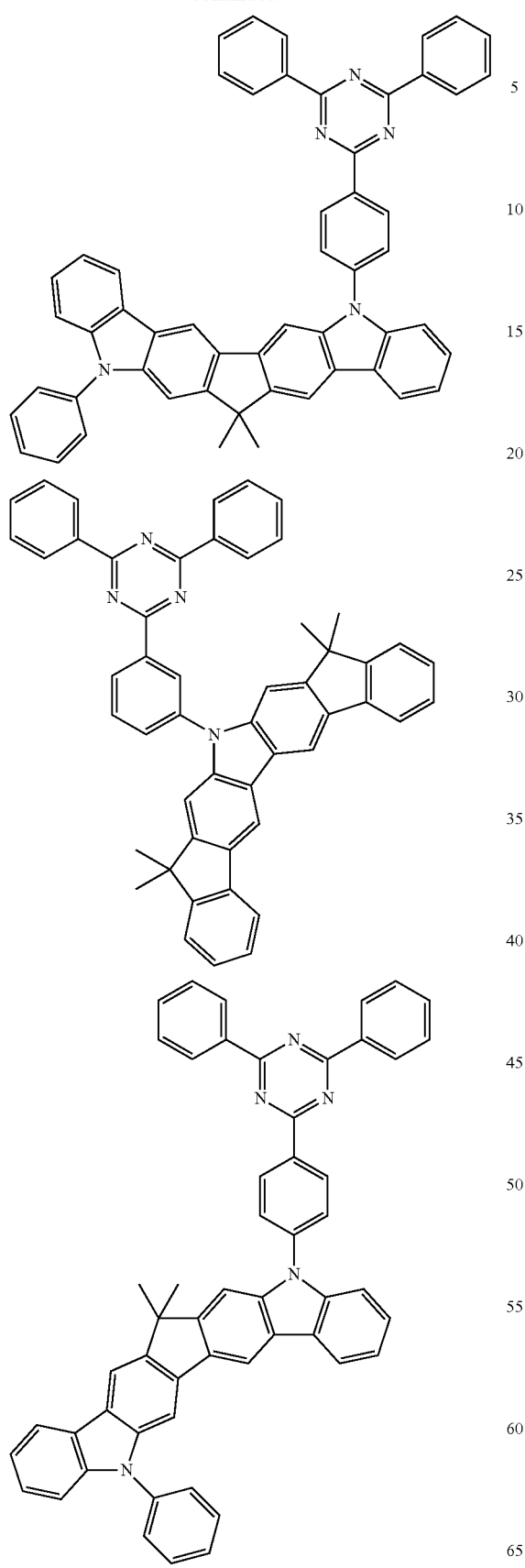
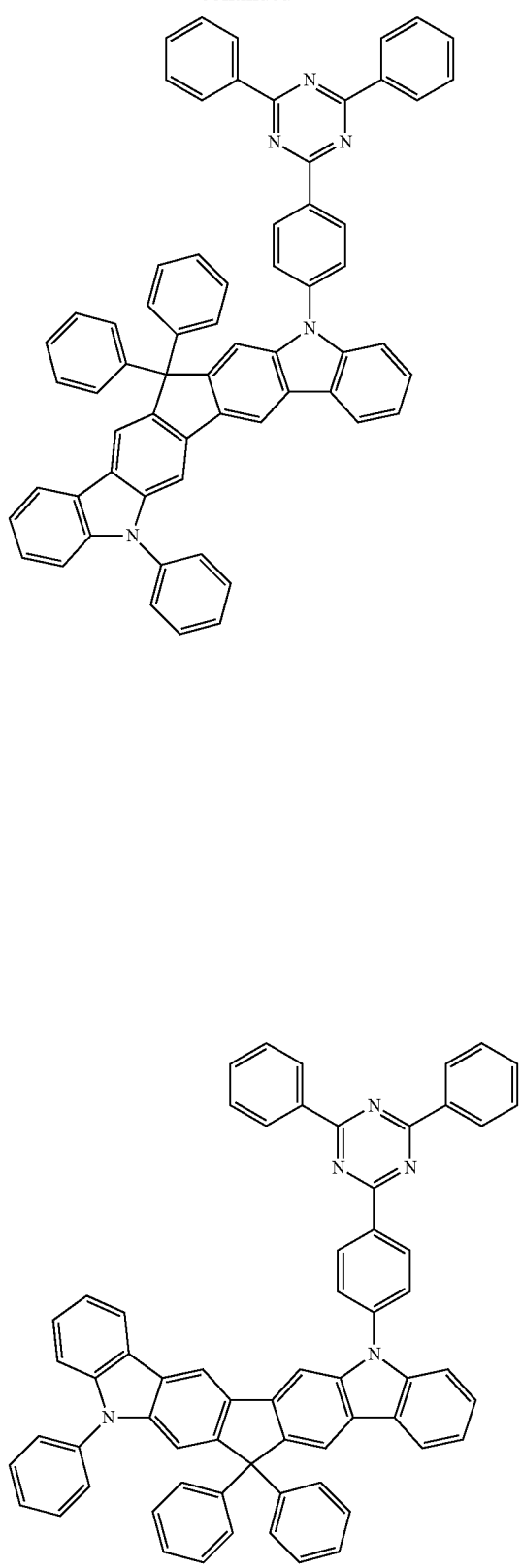

187
-continued
[Formula 109]
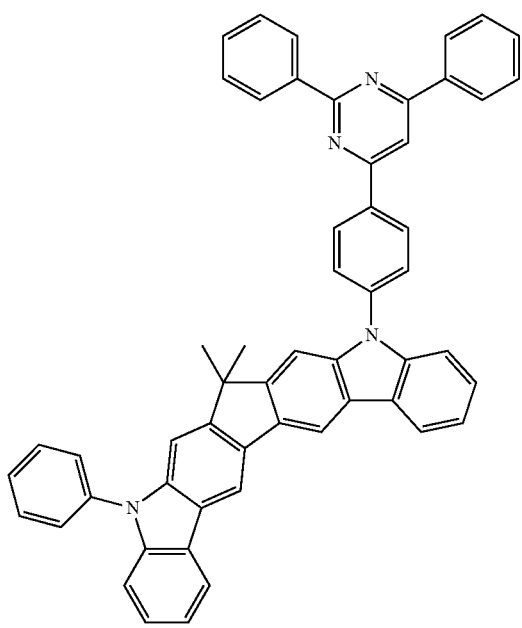
188
-continued
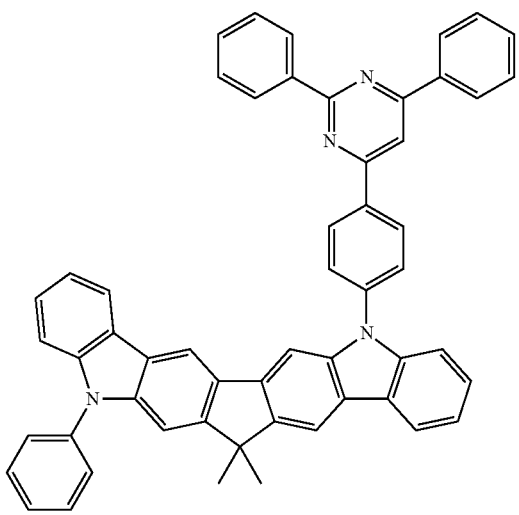
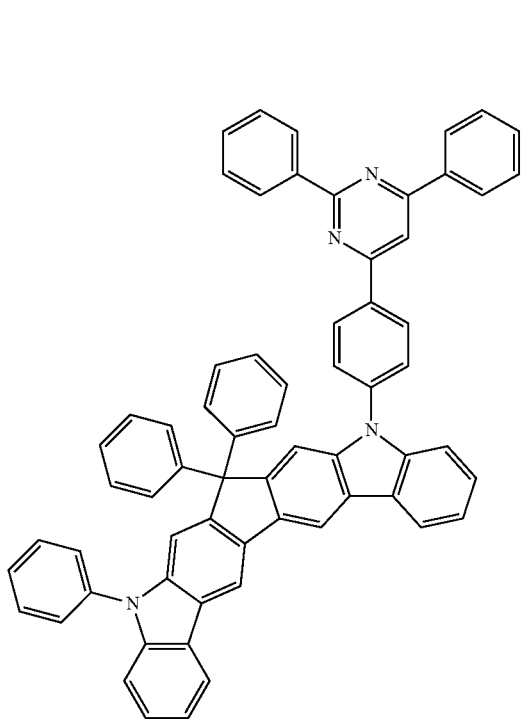
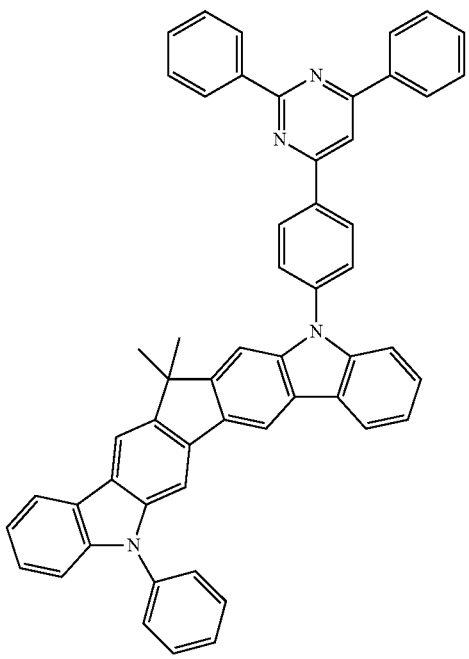

189
-continued
190
-continued
[Formula 110]
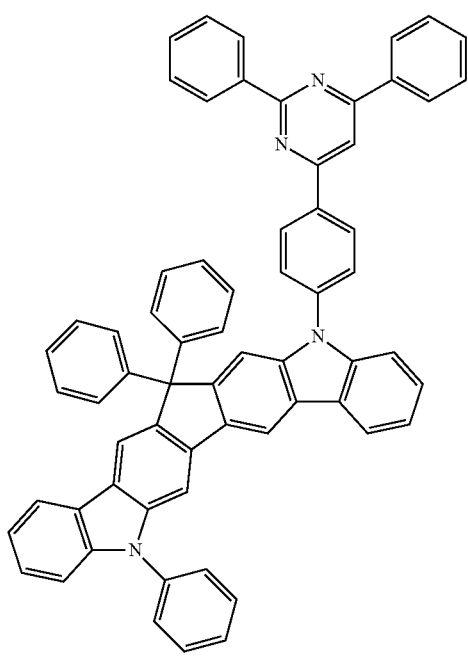
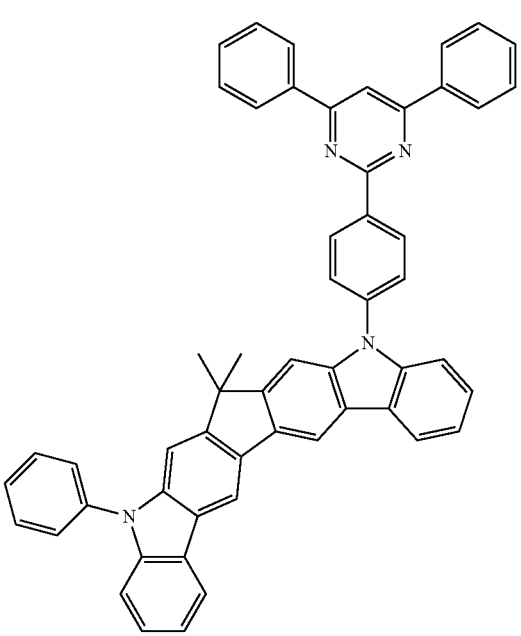

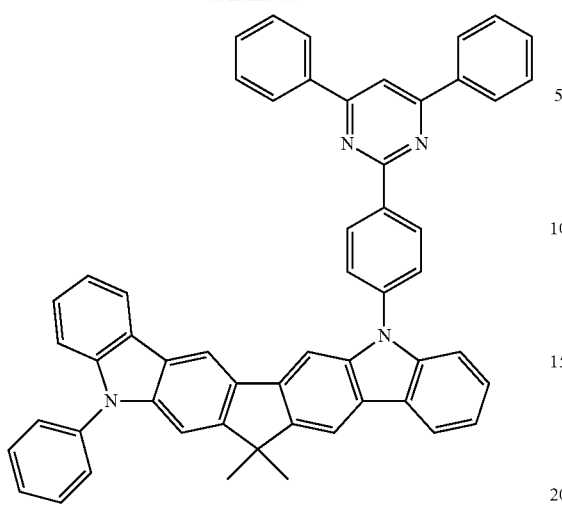
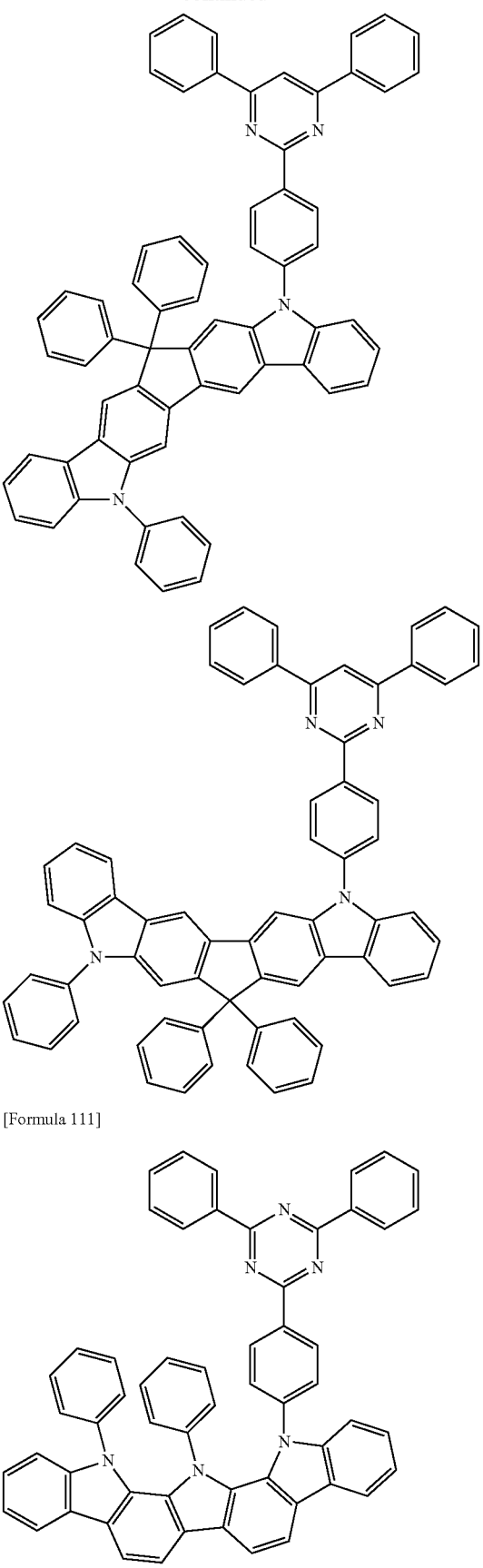 [SMILES: c1ccc(-c2cc(-c3ccccc3)nc(-c3ccc(-n4c5ccccc5c5cc6c(cc54)C(c4ccccc4)(c4ccccc4)c4cc5c7ccccc7n(-c7ccccc7)c5cc4-6)cc3)n2)cc1 ; c1ccc(-c2cc(-c3ccccc3)nc(-c3ccc(-n4c5ccccc5c5cc6c(cc54)-c4cc5c7ccccc7n(-c7ccccc7)c5cc4C6(c4ccccc4)c4ccccc4)cc3)n2)cc1 ; c1ccc(-c2nc(-c3ccccc3)nc(-c3ccc(-n4c5ccccc5c5ccc6c7ccc8c9ccccc9n(-c9ccccc9)c8c7n(-c7ccccc7)c6c54)cc3)n2)cc1]
[Formula 111]

-continued
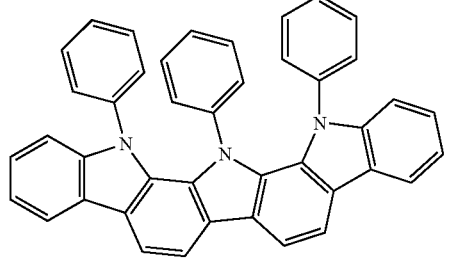
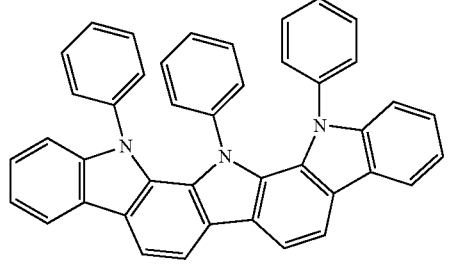
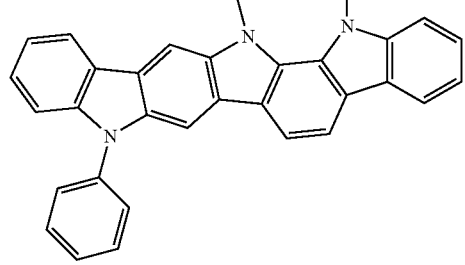
-continued
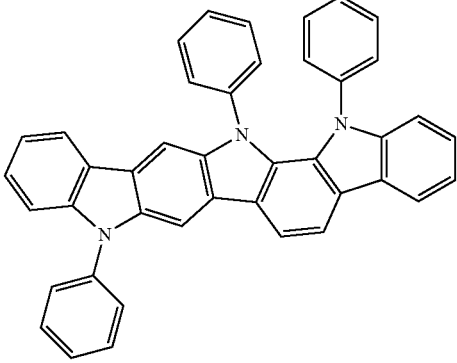
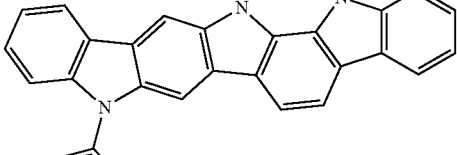

195
-continued
[Formula 112]
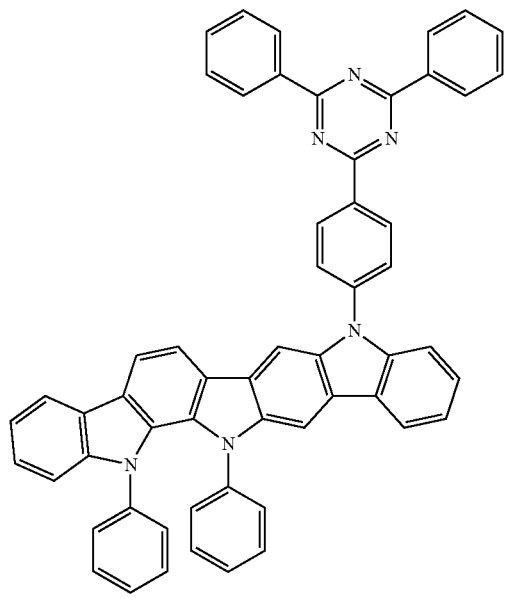
196
-continued
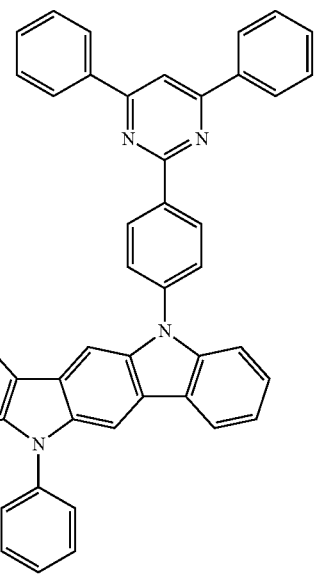
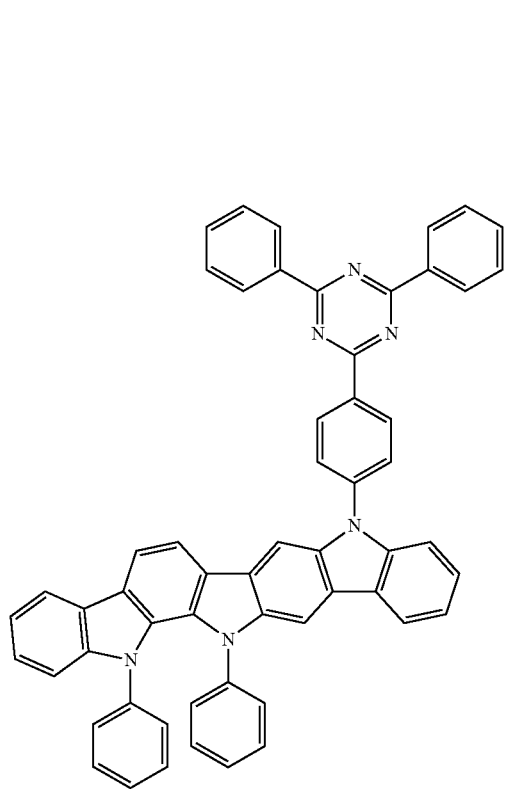
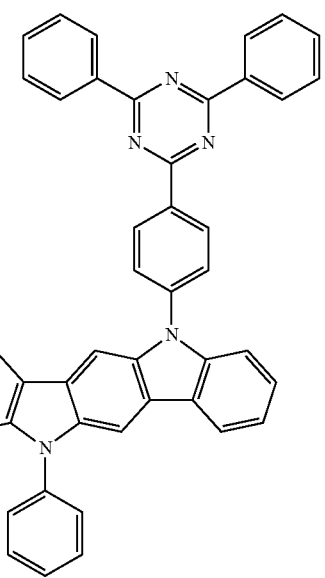

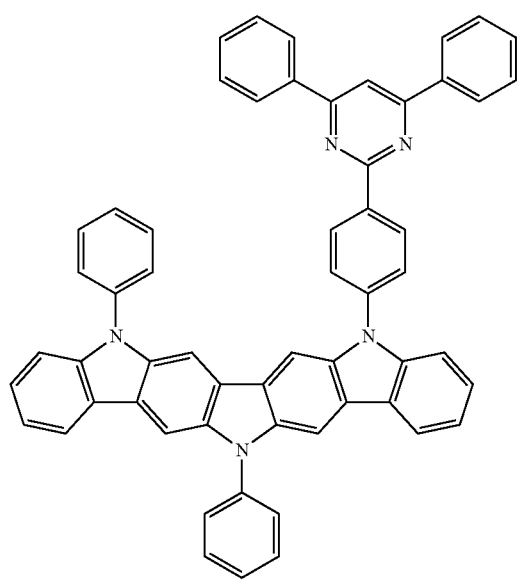 [SMILES: c1ccc(-c2nc(-c3ccccc3)nc(-c3ccc(-n4c5ccccc5c5cc6c(cc54)c4cc5c(cc4n6-c4ccccc4)c4ccccc4n5-c4ccccc4)cc3)n2)cc1]
[Formula 113]
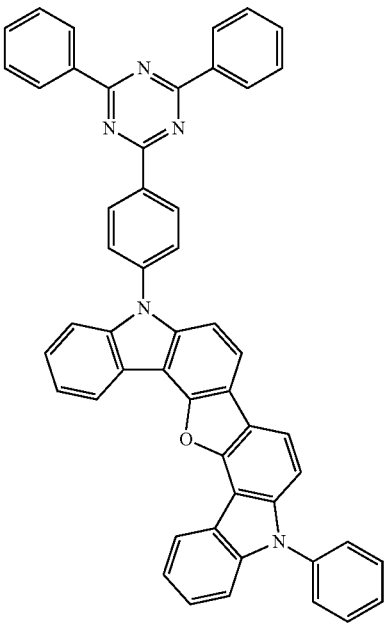
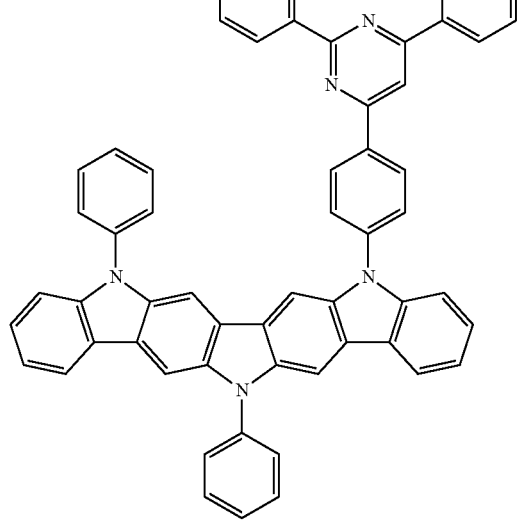
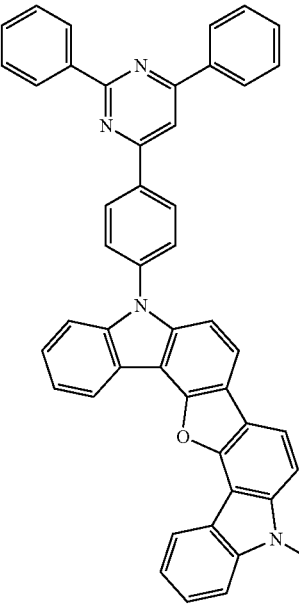

-continued

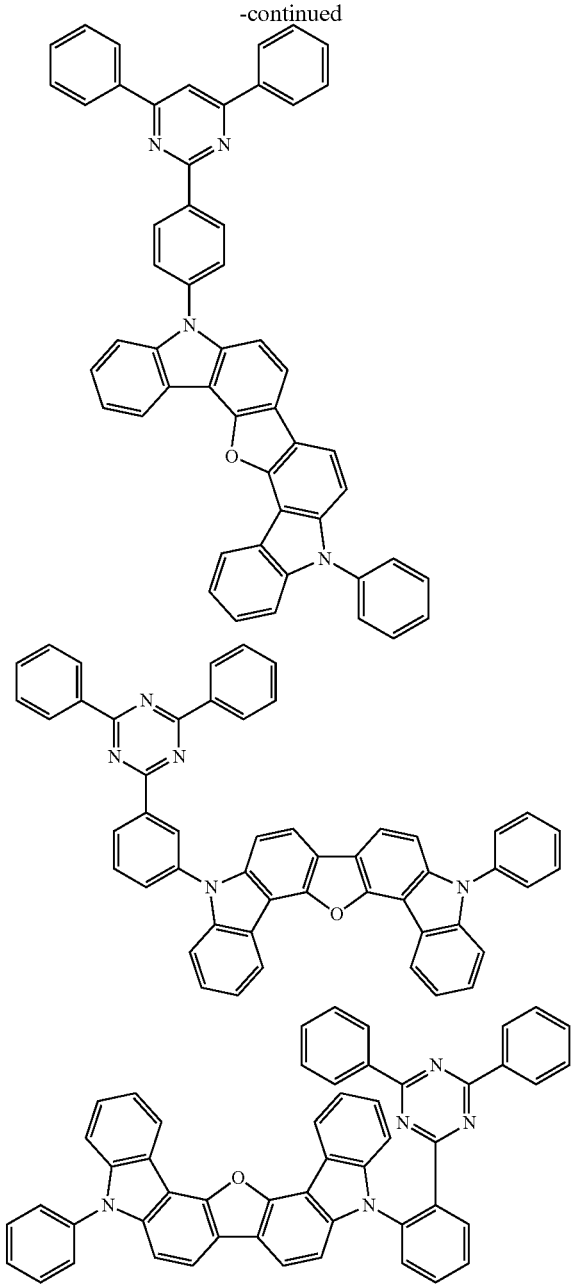

Modifications of Embodiment(s)

It should be noted that the invention is not limited to the above exemplary embodiment but may include any modification and improvement as long as such modification and improvement are compatible with the invention.

The emitting layer is not limited to a single layer, but may be provided as laminate by a plurality of emitting layers. When the organic EL device includes the plurality of emitting layers, it is only required that at least one of the emitting layers includes the compound represented by the formula (1). The rest of the emitting layers may be a fluorescent emitting layer or a phosphorescent emitting layer.

When the organic EL device includes the plurality of emitting layers, the plurality of emitting layers may be adjacent to each other, or may be laminated on each other via an intermediate layer, a so-called tandem organic EL device.

Figure 3:
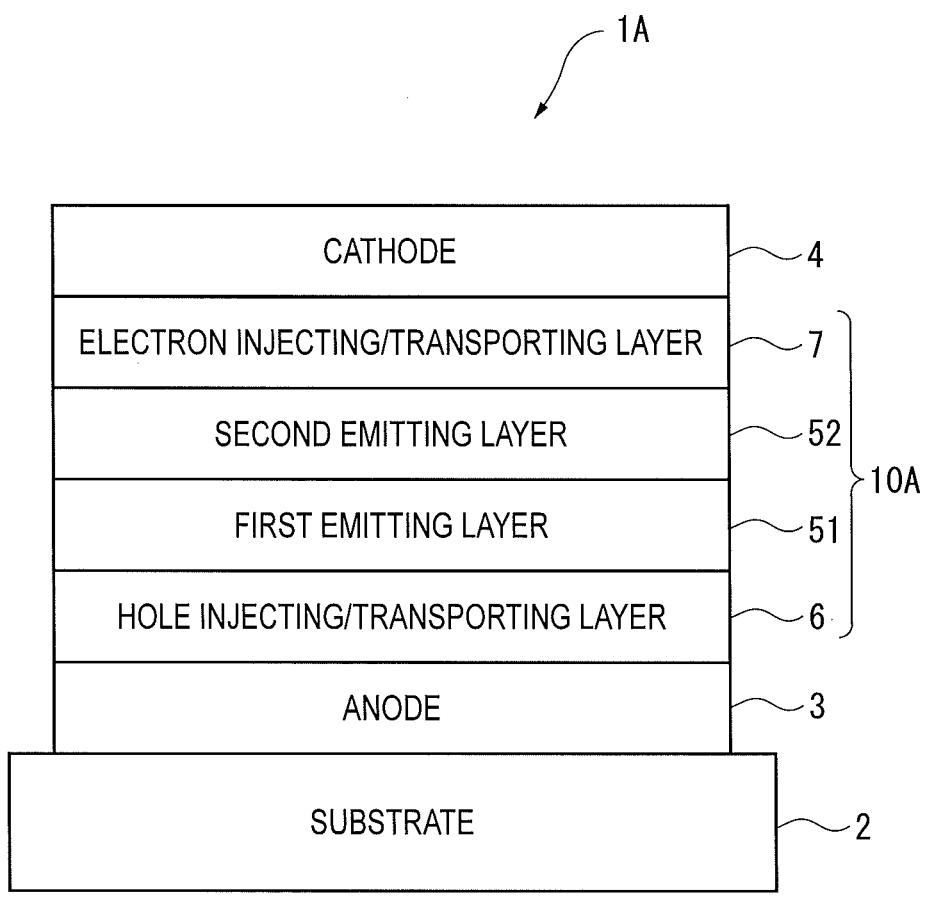
FIG. 3 schematically shows an exemplary arrangement of an organic electroluminescence device according to a modification of the exemplary embodiment of the invention.

When the plurality of emitting layers are laminated, an organic EL device 1A is exemplarily shown in FIG. 3. The organic EL device 1A includes an organic layer 10A. The organic EL device 1A is different from the organic EL device 1 shown in FIG. 1 in that the organic layer 10A has a first emitting layer 51 and a second emitting layer 52 between the hole injecting/transporting layer 6 and the electron injecting/transporting layer 7. At least one of the first emitting layer 51 and the second emitting layer 52 contains the compound represented by the formula (1). As for other points, the organic EL device 1A is formed in the same manner as the organic EL device 1.

For instance, the electron blocking layer may be provided to the emitting layer adjacent to the anode while the hole blocking layer may be provided adjacent to the emitting layer near the cathode. With this arrangement, the electrons and the holes can be trapped in the emitting layer, thereby enhancing probability of exciton generation in the emitting layer.

The organic EL device according to any one of the exemplary embodiments of the invention is usable in display components for organic EL panel module and the like, in displays for television, mobile phone, tablet, personal computer and the like, and in electronic devices for illuminator, vehicle lamp and the like.

Further, the specific arrangement and disposition for practicing the invention may be altered to other arrangements and dispositions as long as such other arrangements and dispositions are compatible with the invention.

EXAMPLES

Examples of the invention will be described below. However, the invention is not limited by these Examples.

Compounds used in Examples will be shown as follows.

[Formula 114]

(Example Compound 1)

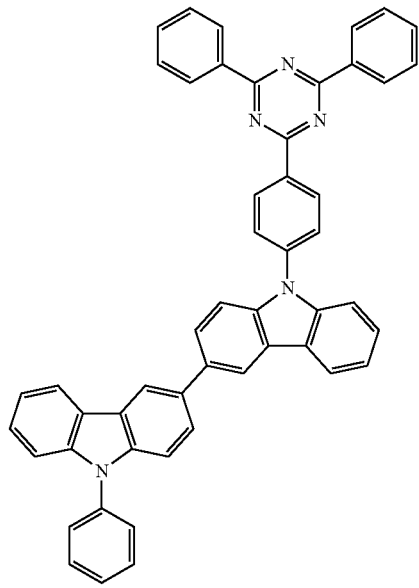

-continued
(Comparative Compound 1)
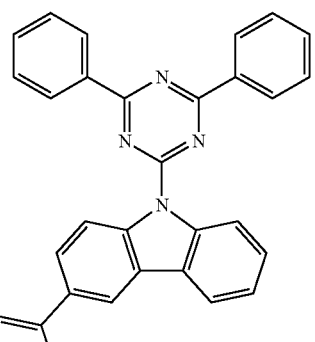
[Formula 115]
(Example Compound 2)
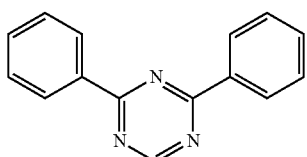
(Example Compound 3)
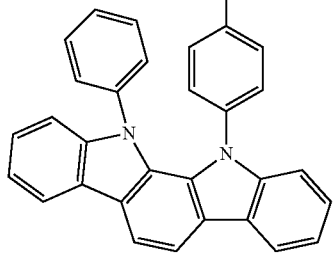
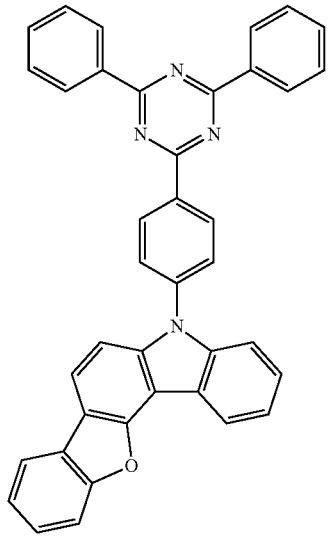
-continued
[Formula 116]
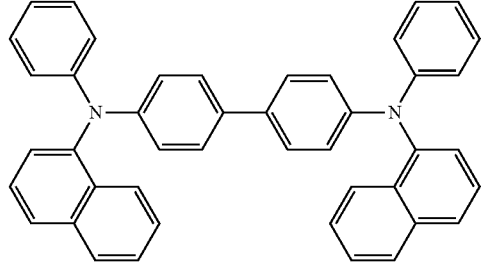
NPD
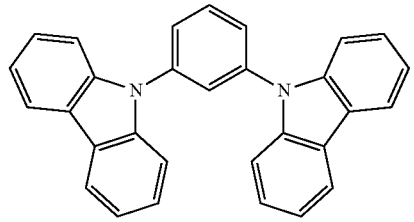
mCP
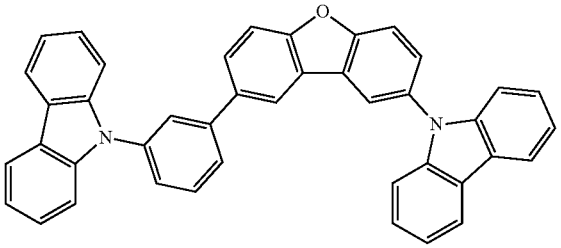
TH1
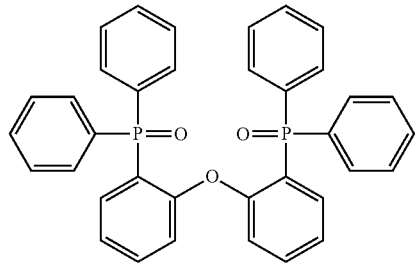
DPEPO
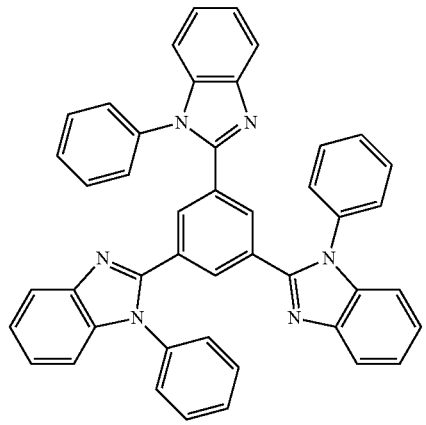
TPBi
Evaluation of Compounds
Next, properties of the compounds used in Example were measured. Target compounds included example compounds 1 to 3 and comparative compound 1. A measurement method or a calculation method is described below. Measurement results or calculation results are shown in Table 1.

(1) Singlet Energy EgS

Singlet Energy EgS was obtained according to the following method.

The target compound to be measured was deposited by evaporation on a quartz substrate to prepare a sample. An absorption spectrum of the sample was measured at a normal temperature (300K). A sample was 100 nm thick. The absorption spectrum was expressed in coordinates of which ordinate axis indicated absorbance and of which abscissa axis indicated the wavelength. A tangent was drawn to the fall of the absorption spectrum on the long-wavelength side, and a wavelength value λedge (nm) at an intersection of the tangent and the abscissa axis was obtained. The wavelength value was converted to an energy value by the following conversion equation. The energy value was defined as EgS.

$EgS$ [eV]=1239.85/λedge    Conversion Equation:

For the measurement of the absorption spectrum, a spectrophotometer (U3310 manufactured by Hitachi, Ltd.) was used.

The tangent to the fall of the absorption spectrum on the long-wavelength side was drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less was not included in the above-mentioned maximum absorbance on the long-wavelength side.

(2) Energy Gap $Eg_{77K}$ and Triplet Energy $EgT_D$ $Eg_{77K}$ and $EgT_D$ were obtained by the following method.

Each of the compounds was measured by a known method of measuring phosphorescence (e.g. a method described in "Hikarikagaku no Sekai (The World of Photochemistry)" (edited by The Chemical Society of Japan, 0.1993, on and near page 50). Specifically, the organic material was dissolved in a solvent (sample: 10 μmol/L, EPA (diethylether:isopentane:ethanol=5:5:2 in volume ratio, each solvent in a spectroscopic grade), thereby forming a sample for phosphorescence measurement. The sample for phosphorescence measurement was put into a quartz cell, cooled to 77[K] and irradiated with excitation light, so that phosphorescence intensity was measured while changing a wavelength. The phosphorescence spectrum was expressed in coordinates of which ordinate axis indicated phosphorescence intensity and of which abscissa axis indicated the wavelength.

A tangent was drawn to the rise of the phosphorescent spectrum on the short-wavelength side, and a wavelength value λedge (nm) at an intersection of the tangent and the abscissa axis was obtained. The wavelength value was converted to an energy value by the following conversion equation. The energy value was defined as $Eg_{77K}(H)$ or $EgT_D(Eg_{77K}(D))$.

$Eg_{77K}(H)$ [eV]=1239.85/λedge    Conversion Equation:

$EgT_D$ [eV]=1239.85/λedge    Conversion Equation:

The tangent at the rise of the phosphorescence spectrum on the short-wavelength side was drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent is increased as the curve rises (i.e., a value of the ordinate axis is increased). A tangent drawn at a point of the maximum inclination was defined as the tangent to the rise of the phosphorescence spectrum on the short-wavelength side.

The maximum with peak intensity being 10% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

For phosphorescence measurement, a spectrophotofluorometer body F-4500 and optional accessories for low temperature measurement (which were manufactured by Hitachi High-Technologies Corporation) were used. The measurement instrument is not limited to this arrangement. A combination of a cooling unit, a low temperature container, an excitation light source and a light-receiving unit may be used for measurement.

(3) ΔST

ΔST was obtained as a difference between EgS and $Eg_{77K}$ respectively measured in the above (1) and (2) (see the above numerical formula (1)). The results are shown in Table 1. In order to cause delayed fluorescence emission, ΔST is preferably 0.3 or less, more preferably 0.2 or less.

TABLE 1

| Dopant Material | EgS [eV] | Eg(77K) [eV] | Δ ST [eV] |
|---|---|---|---|
| Ex. Compound 1 | 2.98 | 2.80 | 0.18 |
| Ex. Compound 2 | 3.08 | 2.84 | 0.24 |
| Ex. Compound 3 | 3.05 | 2.85 | 0.20 |
| Comp. Compound 1 | 3.34 | 2.84 | 0.50 |

(4) Delayed Fluorescence Emission

Occurrence of delayed fluorescence emission was determined by measuring transient photoluminescence (PL) using a device shown in FIG. 2. A sample was prepared by co-depositing each of example compounds and a compound TH-2 below to form a 100 nm thick thin film. The used example compounds included examples compounds 1, 2 and 3.

Delayed fluorescence emission can be obtained using the device shown in FIG. 2. There are two types of emission: Prompt emission observed immediately when the excited state is achieved by exciting the example compound(s) with a pulse beam (i.e., a beam emitted from a pulse laser) having an absorbable wavelength; and Delay emission observed not immediately when but after the excited state is achieved. In the exemplary embodiment(s), occurrence of delayed fluorescence emission is determined when the amount of Delay emission is 5% or more relative to the amount of Prompt emission. The amount of Delay emission of each of example compounds 1, 2 and 3 has been found to be 5% or more relative to the amount of Prompt emission.

The amount of Prompt emission and the amount of Delay emission can be obtained in the same method as a method described in "Nature 492, 234-238, 2012." The amount of Prompt emission and the amount of Delay emission may be calculated using a device different from ones shown in FIG. 2 and described in the literature.

[Formula 117]

TH-2

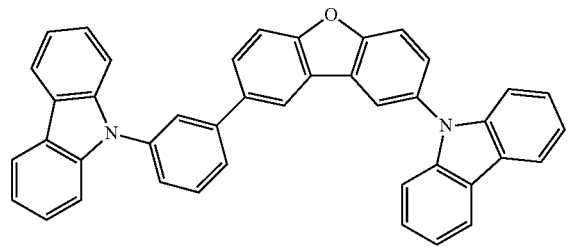

(5) PLQY

The fluorescence quantum yield of a compound may be measured using an absolute PL quantum yield measuring device C9920-02 (manufactured by Hamamatsu Photonics K. K.).

Target compounds to be subjected to measurement of fluorescence quantum yield included measurement compounds 1 to 15 and comparative measurement compounds 1 to 11 below. Measurement results of the fluorescent quantum yield of each of the measurement target compounds are shown in Table 2.

[Formula 118]

(Measurement Compound 1)

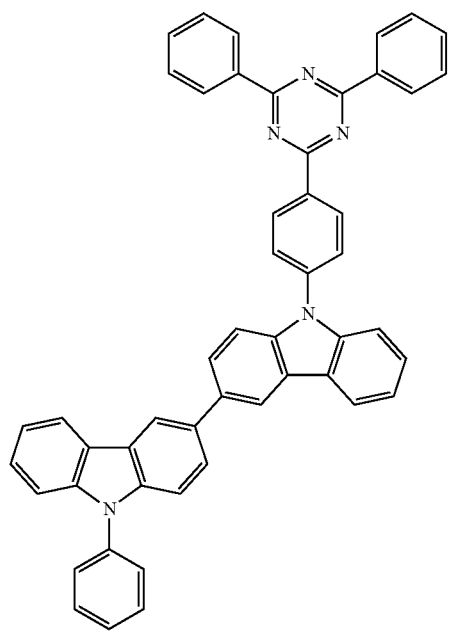

(Measurement Compound 2)

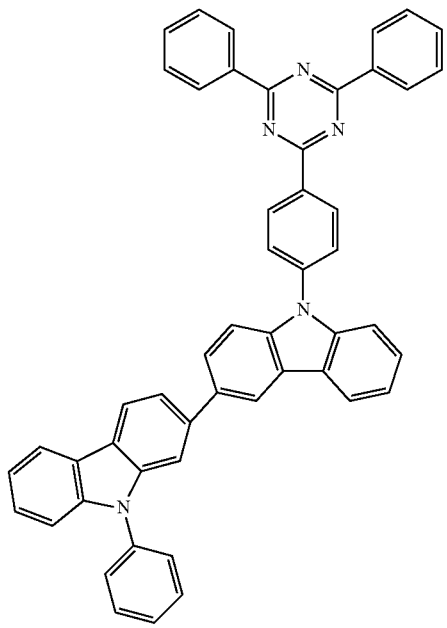

(Measurement Compound 3)

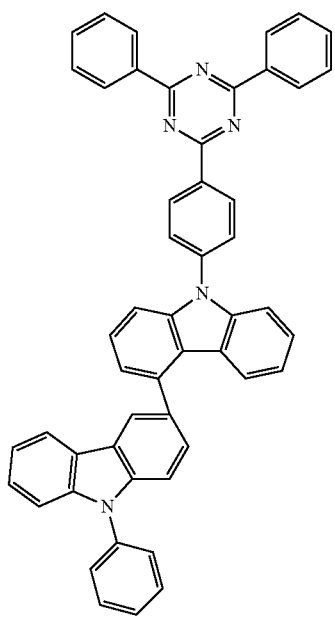

(Measurement Compound 4)
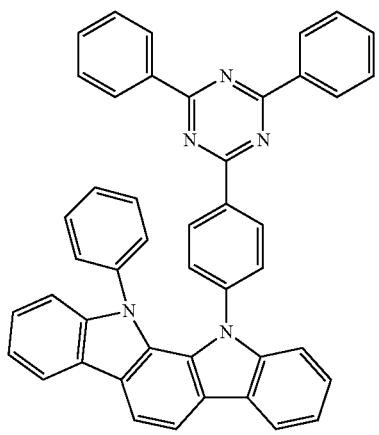
[Formula 119]
(Measurement Compound 5)
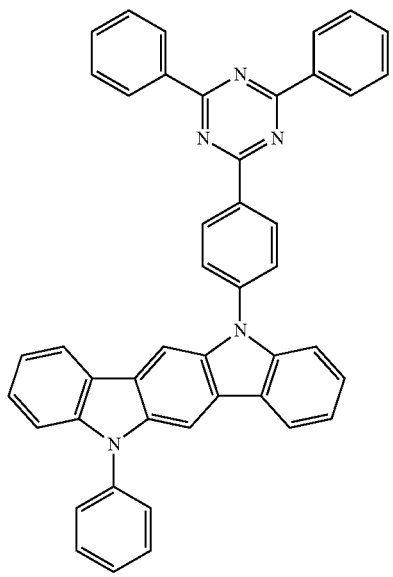
(Measurement Compound 6)
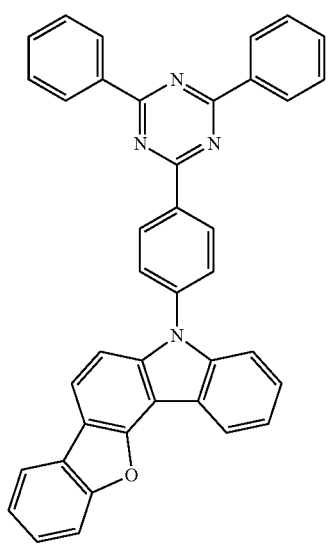
(Measurement Compound 7)
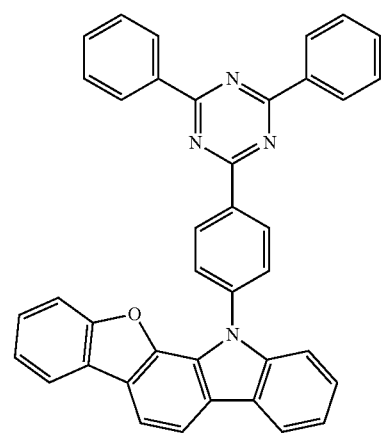
(Measurement Compound 8)
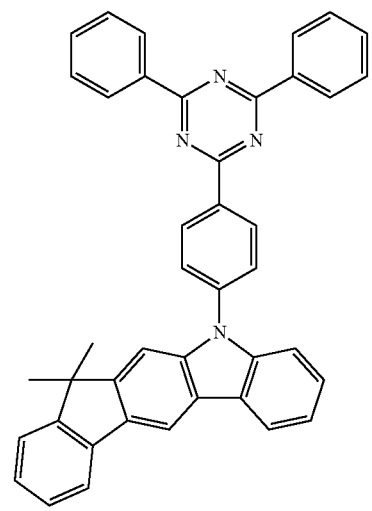
[Formula 120]
(Measurement Compound 9)
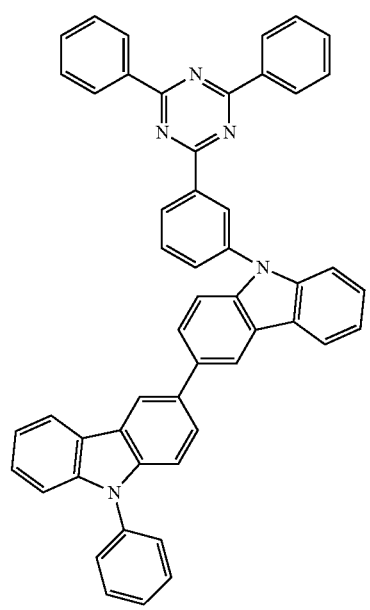

(Measurement Compound 10)
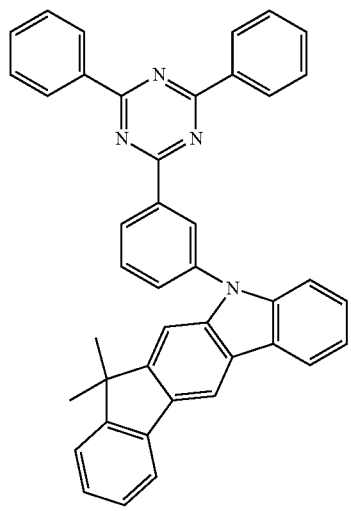
(Measurement Compound 11)
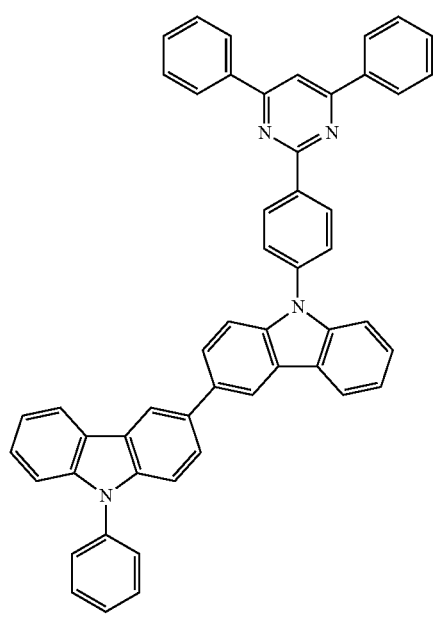
(Measurement Compound 12)
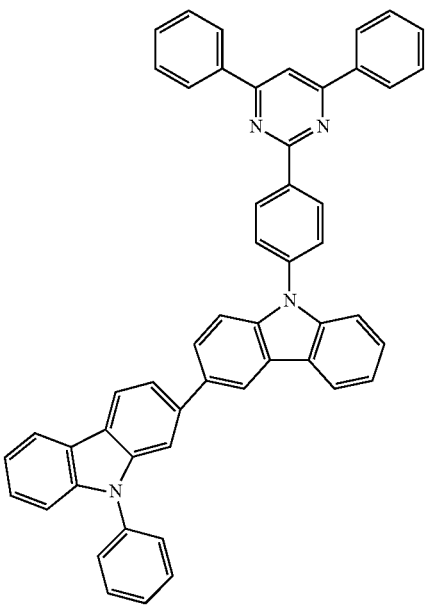
[Formula 121]
(Measurement Compound 13)
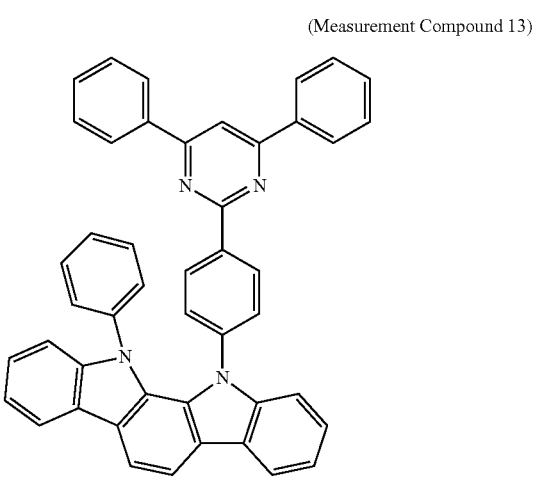

(Measurement Compound 14)
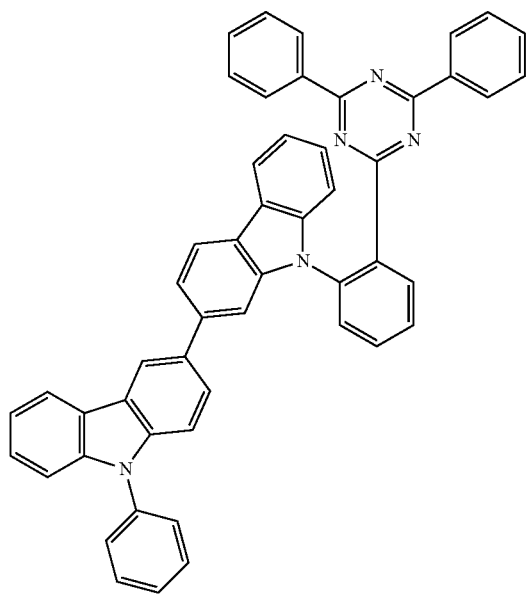
(Comparative Measurement Compound 1)
[Formula 122]
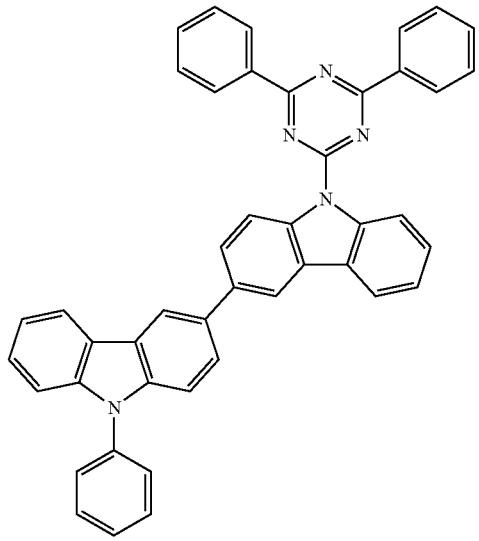
(Comparative Measurement Compound 2)
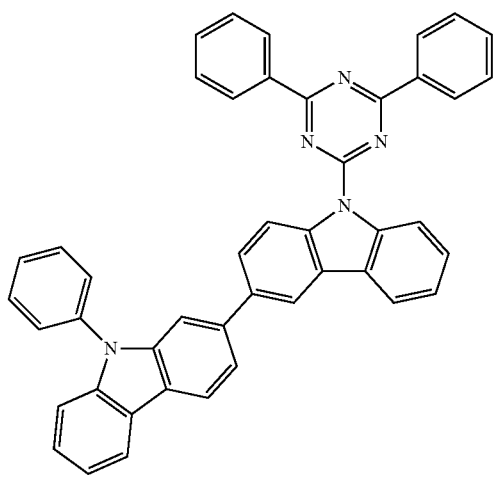
(Measurement Compound 15)
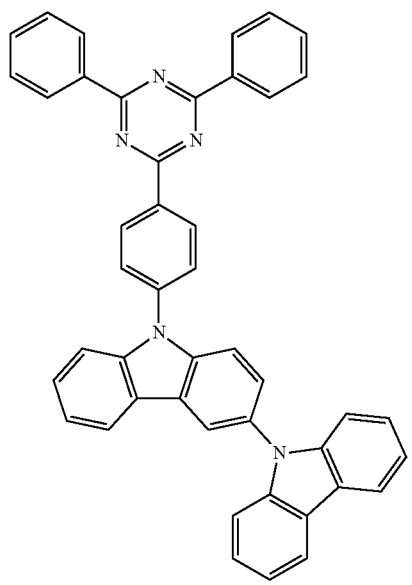
(Comparative Measurement Compound 3)
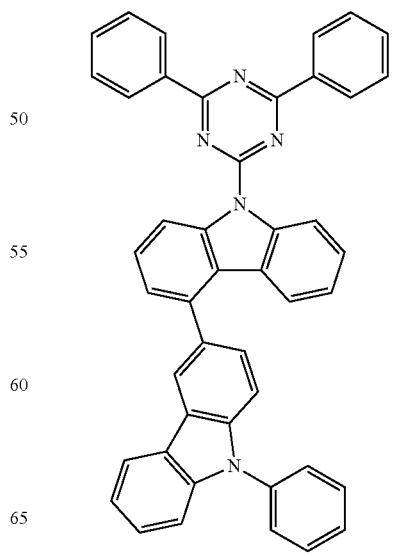

-continued
(Comparative Measurement Compound 4)
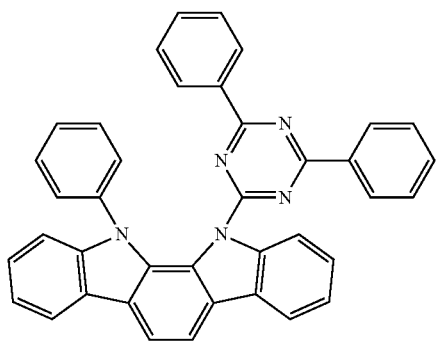
[Formula 123]
(Comparative Measurement Compound 5)
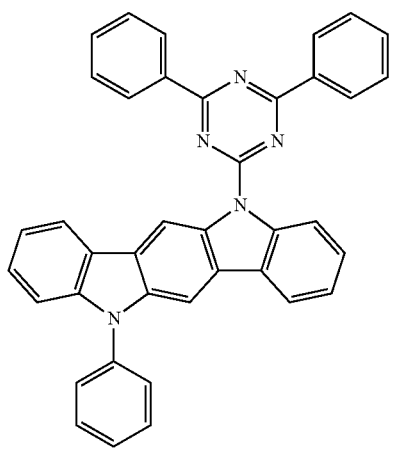
(Comparative Measurement Compound 6)
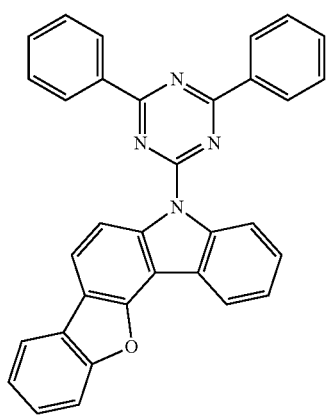
(Comparative Measurement Compound 7)
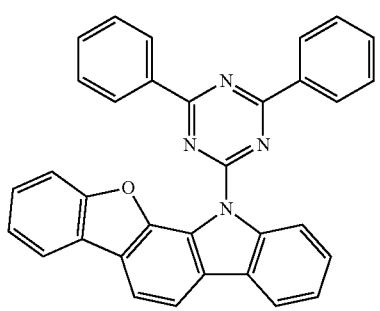
-continued
(Comparative Measurement Compound 8)
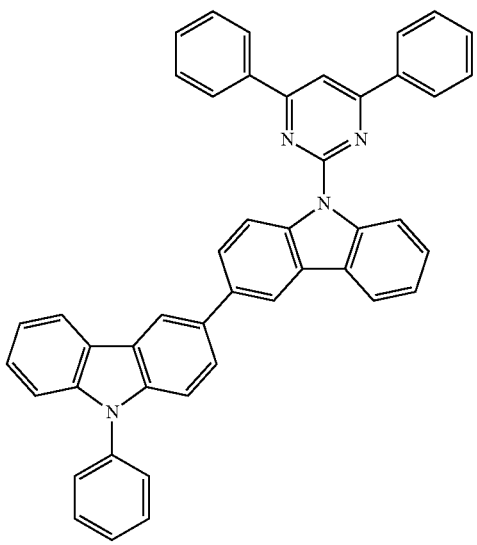
[Formula 124]
(Comparative Measurement Compound 9)
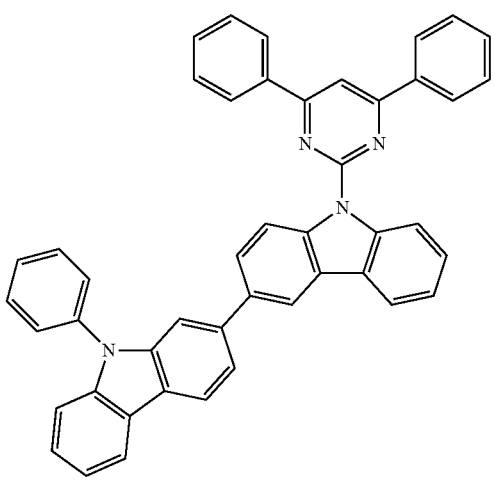
(Comparative Measurement Compound 10)
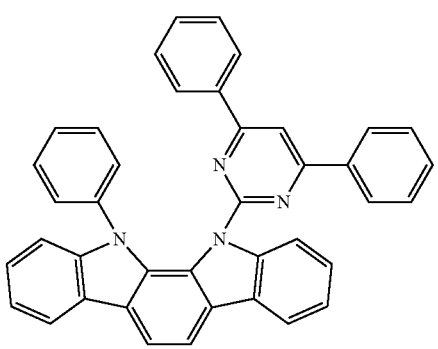

-continued
(Comparative Measurement Compound 11)

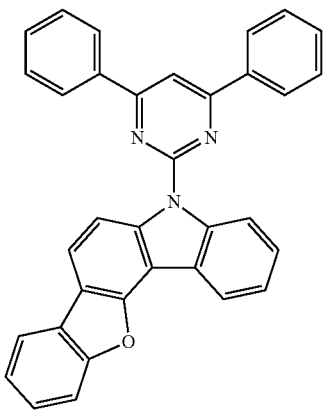

TABLE 2

| Measurement Target | Fluorescence Quantum Yield [%] |
| --- | --- |
| Meas. Compound 1 | 0.71 |
| Meas. Compound 2 | 0.74 |
| Meas. Compound 3 | 0.78 |
| Meas. Compound 4 | 0.73 |
| Meas. Compound 5 | 0.64 |
| Meas. Compound 6 | 0.78 |
| Meas. Compound 7 | 0.78 |
| Meas. Compound 8 | 0.70 |
| Meas. Compound 9 | 0.28 |
| Meas. Compound 10 | 0.22 |
| Meas. Compound 11 | 0.49 |
| Meas. Compound 12 | 0.55 |
| Meas. Compound 13 | 0.41 |
| Meas. Compound 14 | 0.19 |
| Meas. Compound 15 | 0.75 |
| Comp. Meas. Compound 1 | 0.09 |
| Comp. Meas. Compound 2 | 0.08 |
| Comp. Meas. Compound 3 | 0.11 |
| Comp. Meas. Compound 4 | 0.10 |
| Comp. Meas. Compound 5 | 0.05 |
| Comp. Meas. Compound 6 | 0.11 |
| Comp. Meas. Compound 7 | 0.03 |
| Comp. Meas. Compound 8 | 0.11 |
| Comp. Meas. Compound 9 | 0.07 |
| Comp. Meas. Compound 10 | 0.10 |
| Comp. Meas. Compound 11 | 0.03 |

Preparation and Evaluation of Organic EL Device

The organic EL device was prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound NPD was evaporated on a surface of the glass substrate where the transparent electrode line was provided in a manner to cover the transparent electrode, thereby forming a 100 nm thick film of the compound NPD. The NPD film serves as a hole injecting layer.

After the film formation of the NPD film, the compound mCP was deposited on the NPD film to form a 10 nm thick mCP film. The mCP film serves as a hole transporting layer.

The compound DPEPO (the host material) and the example compound 1 (the dopant material) were co-deposited on the mCP film to form a 20 nm thick emitting layer. The concentration of the dopant material was set at 24 mass %.

The compound DPEPO was deposited on this emitting layer to form a hole blocking layer of 5 nm thickness.

The compound TPBi was deposited on the DPEPO film to form a film of the compound TPBi of 20 nm thickness. The film of the compound TPBi serves as an electron transporting layer.

LiF was deposited on the electron transporting layer to form a 1 nm thick LiF film.

A metal Al was deposited on the LiF film to form an 80 nm thick metal cathode.

A device arrangement of the organic EL device in Example 1 is simply shown as follows.

ITO(130)/NPD(100)/mCP(10)/DPEPO: Example Compound 1 (20, 24%)/DPEPO(5)/TPBi(20)/LiF(1)/Al(80)

Numerals in parentheses represent a film thickness (unit: nm). Numerals represented by percentage in the same parentheses represent a ratio (mass %) of an added component such as the dopant material in the emitting layer.

Comparative 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound NPD was evaporated on a surface of the glass substrate where the transparent electrode line was provided in a manner to cover the transparent electrode, thereby forming a 100 nm thick film of the compound NPD. The NPD film serves as a hole injecting layer.

After the film formation of the NPD film, the compound mCP was deposited on the NPD film to form a 10 nm thick mCP film. The mCP film serves as a hole transporting layer.

The compound DPEPO (the host material) and the comparative compound 1 were co-deposited on the mCP film to form a 20 nm thick emitting layer. The concentration of the dopant material was set at 24 mass %.

The compound DPEPO was deposited on this emitting layer to form a hole blocking layer of 5 nm thickness.

The compound TPBi was deposited on the DPEPO film to form a film of the compound TPBi of 20 nm thickness. The film of the compound TPBi serves as an electron transporting layer.

LiF was deposited on the electron transporting layer to form a 1 nm thick LiF film.

A metal Al was deposited on the LiF film to form an 80 nm thick metal cathode.

A device arrangement of the organic EL device in Comparative 1 is simply shown as follows.

ITO(130)/NPD(100)/mCP(10)/DPEPO: Comparative Compound 1 (20, 24%)/DPEPO(5)/TPBi(20)/LiF(1)/Al(80)

Numerals in parentheses represent a film thickness (unit: nm). Numerals represented by percentage in the same parentheses represent a ratio (mass %) of an added component such as the dopant material in the emitting layer.

Example 2

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound NPD was evaporated on a surface of the glass substrate where the transparent electrode line was provided in a manner to cover the transparent electrode, thereby forming a 90 nm thick film of the compound NPD. The NPD film serves as a hole injecting layer.

After the film formation of the NPD film, the compound mCP (the host material) was deposited, and mCP and the example compound 2 (the dopant material) were co-deposited on the NPD film to form a 10 nm thick emitting layer. The concentration of the dopant material was set at 6 mass %. This emitting layer is referred to as a first emitting layer.

The compound DPEPO (the host material) and the example compound 2 (the dopant material) were co-deposited on the first emitting layer to form a 20 nm thick emitting layer. The concentration of the dopant material was set at 12 mass %. This emitting layer is referred to as a second emitting layer.

The compound DPEPO was deposited on the second emitting layer to form a hole blocking layer of 5 nm thickness.

The compound TPBi was deposited on the DPEPO film to form a film of the compound TPBi of 35 nm thickness. The film of the compound TPBi serves as an electron transporting layer.

LiF was deposited on the electron transporting layer to form a 1 nm thick LiF film.

A metal Al was deposited on the LiF film to form an 80 nm thick metal cathode.

A device arrangement of the organic EL device in Example 2 is simply shown as follows.

ITO(130)/NPD(90)/mCP: Example Compound 2 (10, 6%)/DPEPO: Example Compound 2 (20, 12%)/DPEPO(5)/TPBi(35)/LiF(1)/Al(80)

Numerals in parentheses represent a film thickness (unit: nm). Numerals represented by percentage in the same parentheses represent a ratio (mass %) of an added component such as the dopant material in the emitting layer.

Example 3

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound NPD was evaporated on a surface of the glass substrate where the transparent electrode line was provided in a manner to cover the transparent electrode, thereby forming a 90 nm thick film of the compound NPD. The NPD film serves as a hole injecting layer.

After the film formation of the NPD film, the compound mCP (the host material) was deposited, and mCP and the example compound 3 (the dopant material) were co-deposited on the NPD film to form a 10 nm thick emitting layer. The concentration of the dopant material was set at 6 mass %. This emitting layer is referred to as a first emitting layer.

The compound DPEPO (the host material) and the example compound 3 (the dopant material) were co-deposited on the first emitting layer to form a 20 nm thick emitting layer. The concentration of the dopant material was set at 24 mass %. This emitting layer is referred to as a second emitting layer.

The compound DPEPO was deposited on the second emitting layer to form a hole blocking layer of 5 nm thickness.

The compound TPBi was deposited on the DPEPO film to form a film of the compound TPBi of 35 nm thickness. The film of the compound TPBi serves as an electron transporting layer.

LiF was deposited on the electron transporting layer to form a 1 nm thick LiF film.

A metal Al was deposited on the LiF film to form an 80 nm thick metal cathode.

A device arrangement of the organic EL device in Example 3 is simply shown as follows.

ITO(130)/NPD(90)/mCP: Example Compound 3 (10, 6%)/DPEPO: Example Compound 3 (20.24%)/DPEPO(5)/TPBi(35)/LiF(1)/Al(80)

Numerals in parentheses represent a film thickness (unit: nm). Numerals represented by percentage in the same parentheses represent a ratio (mass %) of an added component such as the dopant material in the emitting layer.

Example 4

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound NPD was evaporated on a surface of the glass substrate where the transparent electrode line was provided in a manner to cover the transparent electrode, thereby forming a 90 nm thick film of the compound NPD. The NPD film serves as a hole injecting layer.

After the film formation of the NPD film, the compound mCP was deposited, and TH1 (the host material) and the example compound 1 (the dopant material) were co-deposited on the NPD film to form a 10 nm thick emitting layer. The concentration of the dopant material was set at 6 mass %. This emitting layer is referred to as a first emitting layer.

The compound DPEPO (the host material) and the example compound 1 (the dopant material) were co-deposited on the first emitting layer to form a 20 nm thick emitting layer. The concentration of the dopant material was set at 12 mass %. This emitting layer is referred to as a second emitting layer.

The compound DPEPO was deposited on the second emitting layer to form a hole blocking layer of 5 nm thickness.

The compound TPBi was deposited on the DPEPO film to form a film of the compound TPBi of 35 nm thickness. The film of the compound TPBi serves as an electron transporting layer.

LiF was deposited on the electron transporting layer to form a 1 nm thick LiF film.

A metal Al was deposited on the LiF film to form an 80 nm thick metal cathode.

A device arrangement of the organic EL device in Example 4 is simply shown as follows.

ITO(130)/NPD(90)/TH1(10): Example Compound 1 (10, 6%)/DPEPO: Example Compound 1 (20, 12%)/DPEPO(5)/TPBi(35)/LiF(1)/Al(80)

Numerals in parentheses represent a film thickness (unit: nm). Numerals represented by percentage in the same parentheses represent a ratio (mass %) of an added component such as the dopant material in the emitting layer.

Evaluation of Organic EL Devices

The prepared organic EL devices of Examples 1 to 4 and Comparative 1 were evaluated as follows. Table 3 shows evaluation results of the organic EL device of Example 1. Table 4 shows evaluation results of organic EL device of Comparative 1. Table 5 shows evaluation results of Example 2. Table 6 shows evaluation results of Example 3. Table 7 shows evaluation results of Example 4.

Drive Voltage

Voltage was applied between the ITO transparent electrode and the metal Al cathode such that the current density was 0.1 mA/cm$^2$, 1 mA/cm$^2$ or 10 mA/cm$^2$, where voltage (unit: V) was measured.

Luminance and CIE1931 Chromaticity

Voltage was applied on each of the organic EL devices such that the current density was 0.1 mA/cm$^2$, 1 mA/cm$^2$ or 10 mA/cm$^2$, where luminance and CIE1931 chromaticity coordinates (x, y) were measured using a spectroradiometer CS-1000 (manufactured by Konica Minolta, Inc.).

Current Efficiency L/J and Power Efficiency η

Voltage was applied on each of the organic EL devices such that the current density was 0.1 mA/cm$^2$, 1.00 mA/cm$^2$ or 10.00 mA/cm$^2$, where spectral radiance spectra were measured by the aforementioned spectroradiometer. Based on the obtained spectral radiance spectra, the current efficiency (unit: cd/A) and the power efficiency η (unit: 1 m/W) were calculated.

Main Peak Wavelength $\lambda_p$

A main peak wavelength $\lambda_p$ was calculated based on the obtained spectral-radiance spectra.

External Quantum Efficiency EQE

Voltage was applied on each of the organic EL devices such that the current density was 0.1 mA/cm$^2$, 1 mA/cm$^2$ or 10 mA/cm$^2$, where spectral-radiance spectra were measured using a spectroradiometer CS-1000 (manufactured by Konica Minolta, Inc.). The external quantum efficiency EQE (unit: %) was calculated based on the obtained spectral-radiance spectra, assuming that the spectra were provided under a Lambertian radiation.

TABLE 3

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 1 | 0.1 | 4.48 | 41.7 | 41.72 | 29.23 | 0.207 | 0.390 | 486 | 17.78 |
| | 1.0 | 5.44 | 328.0 | 32.80 | 18.95 | 0.205 | 0.383 | 485 | 14.11 |
| | 10.0 | 7.16 | 1784.0 | 17.84 | 7.83 | 0.203 | 0.371 | 484 | 7.82 |

TABLE 4

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Comp. 1 | 0.1 | 4.50 | 17.7 | 17.74 | 12.38 | 0.276 | 0.442 | 502 | 6.90 |
| | 1.0 | 5.47 | 155.2 | 15.52 | 8.92 | 0.277 | 0.441 | 503 | 6.04 |
| | 10.0 | 7.21 | 1029.0 | 10.29 | 4.48 | 0.277 | 0.439 | 503 | 4.01 |

TABLE 5

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 2 | 0.1 | 4.71 | 6.8 | 6.78 | 4.52 | 0.149 | 0.111 | 456 | 7.05 |
| | 1.0 | 5.80 | 41.1 | 4.11 | 2.23 | 0.149 | 0.102 | 454 | 4.60 |
| | 10.0 | 7.70 | 233.4 | 2.33 | 0.95 | 0.150 | 0.094 | 451 | 2.81 |

TABLE 6

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 3 | 0.1 | 4.41 | 17.7 | 17.73 | 12.62 | 0.148 | 0.186 | 467 | 12.57 |
| | 1.0 | 5.32 | 108.1 | 10.81 | 6.38 | 0.147 | 0.174 | 467 | 8.02 |
| | 10.0 | 7.02 | 610.8 | 6.11 | 2.73 | 0.147 | 0.158 | 466 | 4.86 |

TABLE 7

| | Current Density [mA/cm$^2$] | Voltage [V] | Luminance [cd/m$^2$] | L/J [cd/A] | η [l/W] | Chromaticity x | Chromaticity y | λ$_p$ [nm] | EQE [%] |
|---|---|---|---|---|---|---|---|---|---|
| Ex. 4 | 0.1 | 4.96 | 40.0 | 39.96 | 25.30 | 0.223 | 0.389 | 491 | 16.31 |
| | 1.0 | 6.03 | 254.2 | 25.42 | 13.24 | 0.223 | 0.386 | 491 | 10.41 |
| | 10.0 | 7.79 | 1163.0 | 11.63 | 4.69 | 0.222 | 0.375 | 491 | 4.84 |

Example 5

An organic EL device in Example 5 was prepared in the same manner as in Example 1 except that the dopant material in Example 1 was replaced by a compound 4 below, the concentration of the dopant material in Example 1 was changed to 18 mass %, and the thickness of the film of the compound TPBi (the electron transporting layer) in Example 1 was changed to 40 nm.

A device arrangement of the organic EL device in Example 5 is simply shown as follows.

ITO(130)/NPD(100)/mCP(10)/DPEPO: Compound 4 (20, 18%)/DPEPO(5)/TPBi(40)/LiF(1)/Al(80)

Numerals in parentheses represent a film thickness (unit: nm). Numerals represented by percentage in the same parentheses represent a ratio (mass %) of an added component such as the dopant material in the emitting layer.

[Formula 125]

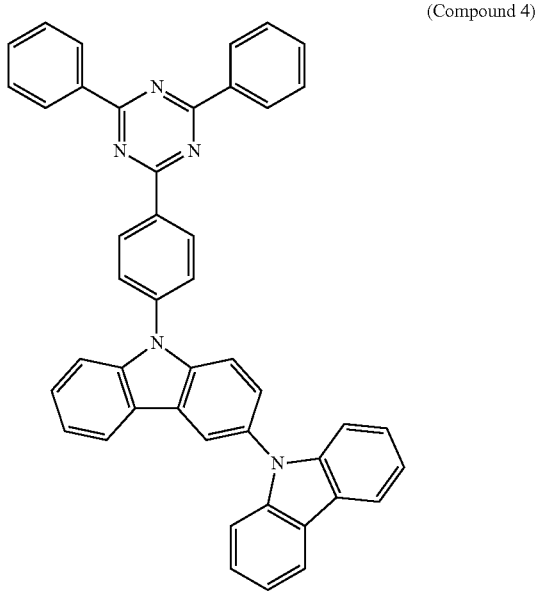

(Compound 4)

Example 6

An organic EL device in Example 6 was prepared in the same manner as the organic EL device in Example 5 except that the concentration of the dopant material in Example 5 was changed to 6 mass %.

A device arrangement of the organic EL device in Example 6 is simply shown as follows.

ITO(130)/NPD(100)/mCP(10)/DPEPO: Compound 4 (20, 6%)/DPEPO(5)/TPBi(40)/LiF(1)/Al(80)

Example 7

An organic EL device in Example 7 was prepared in the same manner as the organic EL device in Example 5 except that the concentration of the dopant material in Example 5 was changed to 24 mass %.

A device arrangement of the organic EL device in Example 7 is simply shown as follows.

ITO(130)/NPD(100)/mCP(10)/DPEPO: Compound 4 (20, 24%)/DPEPO(5)/TPBi(40)/LiF(1)/Al(80)

Example 8

An organic EL device in Example 8 was prepared in the same manner as the organic EL device in Example 5 except that the concentration of the dopant material in Example 5 was changed to 50 mass %.

A device arrangement of the organic EL device in Example 8 is simply shown as follows.

ITO(130)/NPD(100)/mCP(10)/DPEPO: Compound 4 (20, 50%)/DPEPO(5)/TPBi(40)/LiF(1)/Al(80)

Comparative 2

An organic EL device in Comparative 2 was prepared in the same manner as the organic EL device in Example 5 except that only the compound 4 is deposited to form a 20 nm thick film of the compound 4 in formation of the emitting layer in Example 5.

A device arrangement of the organic EL device in Comparative 2 is simply shown as follows.

ITO(130)/NPD(100)/mCP(10)/Compound 4(20)/DPEPO (5)/TPBi(40)/LiF(1)/Al(80)

Evaluation of Organic EL Devices

The prepared organic EL devices of Examples 5 to 8 and Comparative 2 were evaluated in the same manner as described above. Table 8 shows evaluation results of the organic EL device of Example 5. Table 9 shows evaluation results of Example 6. Table 10 shows evaluation results of Example 7. Table 11 shows evaluation results of Example 8. Table 12 shows evaluation results of the organic EL device of Comparative 4.

TABLE 8

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 5 | 0.1 | 4.46 | 32 | 32.0 | 22.6 | 0.162 | 0.263 | 477 | 17.8 |
| | 1.0 | 5.43 | 202 | 20.2 | 11.7 | 0.162 | 0.256 | 477 | 11.4 |
| | 10.0 | 7.24 | 1018 | 10.2 | 4.4 | 0.160 | 0.237 | 475 | 6.0 |

TABLE 9

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 6 | 0.1 | 5.41 | 15 | 14.5 | 8.4 | 0.155 | 0.203 | 471 | 9.7 |
| | 1.0 | 6.78 | 81 | 8.1 | 3.8 | 0.156 | 0.201 | 472 | 5.5 |
| | 10.0 | 9.10 | 331 | 3.3 | 1.1 | 0.158 | 0.194 | 469 | 2.3 |

TABLE 10

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 7 | 0.1 | 4.40 | 35 | 35.5 | 25.3 | 0.165 | 0.292 | 481 | 18.4 |
| | 1.0 | 5.32 | 233 | 23.3 | 13.7 | 0.164 | 0.283 | 481 | 12.3 |
| | 10.0 | 7.09 | 1195 | 11.9 | 5.3 | 0.162 | 0.262 | 479 | 6.7 |

TABLE 11

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Ex. 8 | 0.1 | 4.21 | 28 | 27.6 | 20.6 | 0.175 | 0.338 | 485 | 13.0 |
| | 1.0 | 5.18 | 220 | 22.0 | 13.4 | 0.172 | 0.322 | 485 | 10.7 |
| | 10.0 | 6.87 | 1251 | 12.5 | 5.7 | 0.166 | 0.290 | 481 | 6.5 |

TABLE 12

| | Current Density [mA/cm$^2$] | Voltage [V] | Luminance [cd/m$^2$] | L/J [cd/A] | η [l/W] | Chromaticity x | Chromaticity y | $\lambda_p$ [nm] | EQE [%] |
|---|---|---|---|---|---|---|---|---|---|
| Comp. 2 | 0.1 | 4.63 | 5 | 5.3 | 3.6 | 0.156 | 0.238 | 479 | 3.1 |
| | 1.0 | 5.57 | 50 | 5.0 | 2.8 | 0.153 | 0.228 | 477 | 3.1 |
| | 10.0 | 7.42 | 410 | 4.1 | 1.7 | 0.152 | 0.220 | 475 | 2.6 |

Comparison between Comparative 2 and Examples 1 to 8 reveals that the organic EL device of each of Examples 1 to 8, which includes the emitting layer containing the dopant material, emits light with higher efficiency.

Further, comparison between Comparative 1 and Example 1 reveals that the organic EL device of Example 1, which includes the emitting layer containing the dopant material provided by a compound in which carbazole (the electron donating moiety) and azine (the electron accepting moiety) are bonded to each other via p-phenylene as a linking group, emits light with high efficiency.

As is apparent from the data in Table 2, such a highly efficient emission is supposed to be related to the fact that a compound in which a liking group exists between the electron donating moiety and the electron accepting moiety has a large fluorescence quantum yield as compared with a compound in which the electron donating moiety and the electron accepting moiety are directly bonded to each other.

In other words, the above results may support the idea that an organic EL device in which a compound with a large fluorescent quantum yield is contained as a dopant material in an emitting layer should be easily improvable in luminous efficiency.

The invention claimed is:

1. An organic electroluminescence device, comprising:
an anode;
a cathode; and
a single- or multi-layer organic layer interposed between the anode and the cathode, the organic layer comprising a light-emitting layer comprising a host material and a dopant material, the dopant material comprising a delayed fluorescence emitter represented by a formula (3) below:

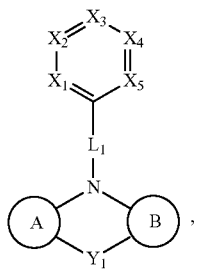

(3)

wherein:
$X_1$ to $X_5$ each independently represent $CR_1$ or a nitrogen atom and at least one of $X_1$ to $X_5$ is a nitrogen atom;
$L_1$ represents a substituted or unsubstituted divalent aromatic hydrocarbon group;
A and B are each independently a cyclic structure, at least one of the cyclic structure A and the cyclic structure B having a plurality of substituents, adjacent substituents forming a ring comprising a five-membered ring, such that the five-membered ring comprises an oxygen atom;
$Y_1$ is a single bond, $CR_2R_3$, $SiR_4R_5$ or $GeR_6R_7$; and
$R_1$ to $R_7$ each independently represent a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

2. An organic electroluminescence device, comprising:
an anode;
a cathode; and
a single- or multi-layer organic layer interposed between the anode and the cathode, the organic layer comprising a light-emitting layer comprising a host material and a dopant material, the dopant material comprising a compound represented by a formula (2) below, an emission from which is a maximum emission component of an emission from the light-emitting layer of the organic electroluminescence device:

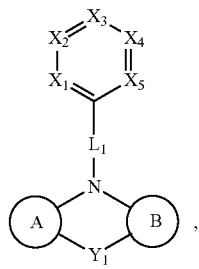

(2)

wherein:
$X_1$ to $X_5$ each independently represent $CR_1$ or a nitrogen atom and at least one of $X_1$ to $X_5$ is a nitrogen atom;
$L_1$ represents a substituted or unsubstituted divalent aromatic hydrocarbon group;
A and B are each independently a cyclic structure, at least one of the cyclic structure A and the cyclic structure B having a plurality of substituents, adjacent substituents forming a ring comprising a five-membered ring, such that the five-membered ring comprises an oxygen atom;
$Y_1$ is a single bond, $CR_2R_3$, $SiR_4R_5$ or $GeR_6R_7$; and
$R_1$ to $R_7$ each independently represent a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

3. An organic electroluminescence device, comprising:
an anode;
a cathode; and
a single- or multi-layer organic layer interposed between the anode and the cathode, the organic layer comprising a light-emitting layer comprising a host material and a dopant material comprising a compound represented by a formula (1) below:

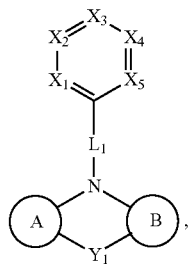

(1)

wherein:

$X_1$ to $X_5$ each independently represent $CR_1$ or a nitrogen atom and at least one of $X_1$ to $X_5$ is a nitrogen atom;

$L_1$ represents a substituted or unsubstituted divalent aromatic hydrocarbon group;

A and B are each independently a cyclic structure, at least one of the cyclic structure A and the cyclic structure B having a plurality of substituents, adjacent substituents forming a ring comprising a five-membered ring, such that the five-membered ring comprises an oxygen atom;

$Y_1$ is a single bond, $CR_2R_3$, $SiR_4R_5$ or $GeR_6R_7$; and $R_1$ to $R_7$ each independently represent a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

4. The organic electroluminescence device according to claim 1, wherein:

the delayed fluorescence emitter represented by the formula (3) is a compound represented by a formula (1A) below:

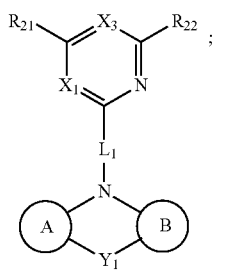

(1A)

$X_1$ and $X_3$ each independently represent $CR_1$, and $R_{21}$ and $R_{22}$ have the same meanings as $R_1$ to $R_7$ in the formula (3); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (3).

5. The organic electroluminescence device according to claim 1, wherein:

the delayed fluorescence emitter represented by the formula (3) is a compound represented by a formula (1B) below:

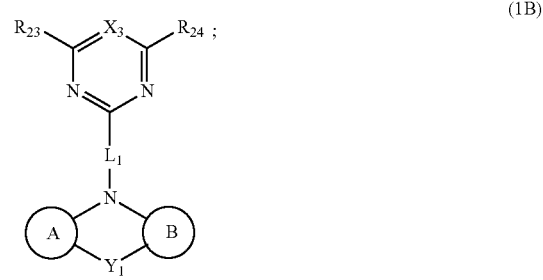

(1B)

$X_3$ represents $CR_1$, and $R_{23}$ and $R_{24}$ have the same meanings as $R_1$ to $R_7$ in the formula (3); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (3).

6. The organic electroluminescence device according to claim 1, wherein:

the delayed fluorescence emitter represented by the formula (3) is a compound represented by a formula (1C) below:

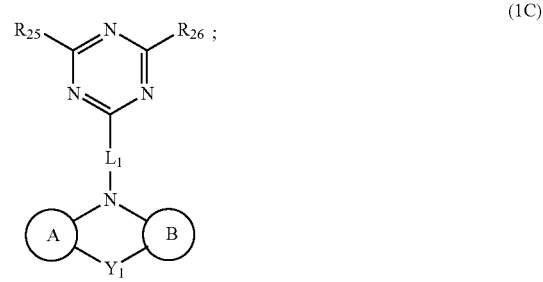

(1C)

$R_{25}$ and $R_{26}$ have the same meanings as $R_1$ to $R_7$ in the formula (3); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (3).

7. The organic electroluminescence device according to claim 1, wherein:

the delayed fluorescence emitter represented by the formula (3) is a compound represented by a formula (40) below:

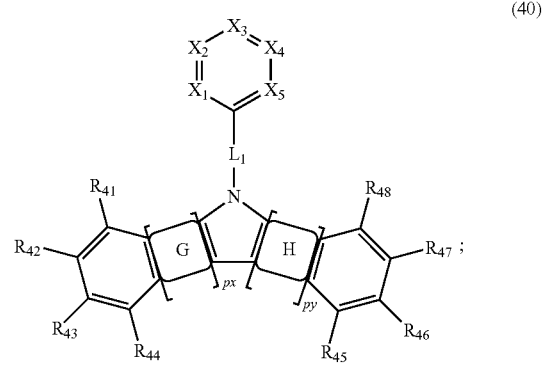

(40)

$X_1$ to $X_5$ each independently represent $CR_1$ or a nitrogen atom, at least one of $X_1$ to $X_5$ is a nitrogen atom, and substituents $R_1$ of adjacent carbon atoms are optionally bonded to each other to form a cyclic structure;

$L_1$ represents a substituted or unsubstituted divalent aromatic hydrocarbon group:

$R_1$ and $R_{41}$ to $R_{48}$ each independently represent a hydrogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms;

each of pairs of $R_{41}$ and $R_{42}$, $R_{42}$ and $R_{43}$, $R_{43}$ and $R_{44}$, $R_{45}$ and $R_{46}$, $R_{46}$ and $R_{47}$, and $R_{47}$ and $R_{48}$ are optionally mutually bonded to form a cyclic structure;

G and H each independently represent a cyclic structure represented by a formula (3g) below or a cyclic structure represented by a formula (3h) below, the cyclic structure G and the cyclic structure H each being fused to an adjacent cyclic structure at any position, with the proviso that the delayed fluorescence emitter represented by the formula (40) comprises at least a cyclic structure represented by a formula (3h); and px and py are each independently an integer of 0 to 4 and respectively represent the number of the cyclic structure G and the number of the cyclic structure H, the plural cyclic structures G being optionally mutually the same or different when px is an integer of 2 to 4, plural cyclic structures H being optionally mutually the same or different when py is an integer of 2 to 4,

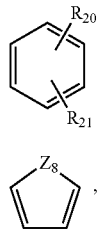

(3g)

(3h)

where:

$R_{20}$ and $R_{21}$ in the formula (3g) each independently have the same meanings as $R_1$ defined above, are optionally bonded to each other to form a cyclic structure, and are each bonded to a carbon atom of a six-membered ring represented by the formula (3g);

$Z_8$ in the formula (3h) represents an oxygen atom;

$R_{22}$ to $R_{23}$ each independently have the same meanings as $R_1$ defined above; and at least one of combinations of substituents selected from $R_{41}$ to $R_{48}$ and $R_{20}$ to $R_{21}$ are optionally mutually bonded to each other to form a cyclic structure.

8. The organic electroluminescence device according to claim 7, wherein the formula (40) is represented by a formula (42):

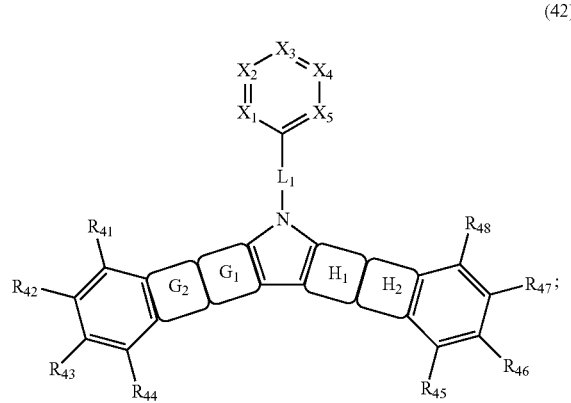

(42)

$X_1$ to $X_5$, $R_{41}$ to $R_{48}$ and $L_1$ respectively independently have the same meanings as $X_1$ to $X_5$, $R_{41}$ to $R_{48}$ and $L_1$ in the formula (40); and a cyclic structure $G_1$ and a cyclic structure $G_2$ each independently have the same meanings as the cyclic structure G, and a cyclic structure $H_1$ and a cyclic structure $H_2$ each independently have the same meanings as the cyclic structure H.

9. The organic electroluminescence device according to claim 7, wherein the formula (40) is represented by a formula (43):

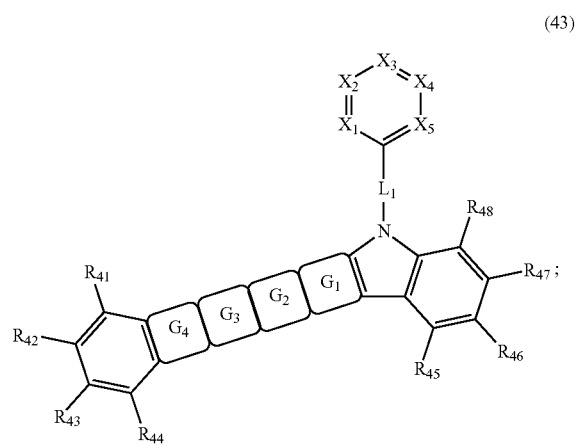

(43)

$X_1$ to $X_5$, $R_{41}$ to $R_{48}$ and $L_1$ respectively independently have the same meanings as $X_1$ to $X_5$, $R_{41}$ to $R_{48}$ and $L_1$ in the formula (40); and a cyclic structure $G_1$, a cyclic structure $G_2$, a cyclic structure $G_3$, and a cyclic structure $G_4$ each independently have the same meanings as the cyclic structure G.

10. The organic electroluminescence device according to claim 1, wherein:

the delayed fluorescence emitter represented by the formula (3) is a compound represented by a formula (6) below:

(6)

$X_1$ to $X_5$ and $L_1$ respectively have the same meanings as $X_1$ to $X_5$ and $L_1$ in the formula (3);

$R_{41}$ and $R_{44}$ each independently have the same meanings as $R_1$ to $R_7$ in the formula (3);

t is 4;

v is 4:

C represents a cyclic structure represented by a formula (7) below and D represents a cyclic structure represented by a formula (8) below, the cyclic structure C and the cyclic structure D each being fused to an adjacent cyclic structure at any position, with the proviso that the delayed fluorescence emitter represented by the formula (6) comprises at least a cyclic structure represented by a formula (8); and n is an integer of 1 to 4, (7)

(8)

where:

$R_{42}$ and $R_{43}$ in the formula (7) each independently have the same meanings as $R_1$ to $R_7$ in the formula (3), and optionally form a ring when $R_{42}$ and $R_{43}$ are substituents at adjacent positions, and $Y_2$ in the formula (8) represents an oxygen atom.

11. The organic electroluminescence device according to claim 10, wherein n in the formula (6) is 1.

12. The organic electroluminescence device according to claim 7, wherein:

$X_5$ is a nitrogen atom; and $X_1$ to $X_4$ are each $CR_1$.

13. The organic electroluminescence device according to claim 7, wherein:

$X_1$ and $X_5$ are each a nitrogen atom; and $X_2$ to $X_4$ are each $CR_1$.

14. The organic electroluminescence device according to claim 7, wherein:

$X_1$, $X_3$ and $X_5$ are each a nitrogen atom; and $X_2$ and $X_4$ are each $CR_1$.

15. The organic electroluminescence device according to claim 1, wherein $L_1$ is a divalent six-membered ring structure.

16. The organic electroluminescence device according to claim 1, wherein:

$L_1$ is represented by a formula (4A) below:

(4A)

$X_{11}$ to $X_{14}$ each independently represent $CR_{11}$ or a nitrogen atom; and $R_{11}$ each independently have the same meanings as $R_1$ to $R_7$ in the formula (3).

17. The organic electroluminescence device according to claim 16, wherein $X_{11}$ to $X_{14}$ each independently represent $CR_{11}$.

18. The organic electroluminescence device according to claim 1, wherein the delayed fluorescence emitter represented by the formula (3) has a difference $\Delta ST(D1)$ between a singlet energy $EgS(D1)$ and an energy gap $Eg_{77K}(D1)$ at 77[K] satisfying a numerical formula (1) below:

$\Delta ST(D1)=EgS(D1)-Eg_{77K}(D1)<0.3$ [eV]  (Numerical Formula 1).

19. The organic electroluminescence device according to claim 1, wherein an energy gap $Eg_{77K}(H1)$ of the host material at 77[K] is larger than an energy gap $Eg_{77K}(D1)$ of the delayed fluorescence emitter represented by the formula (3) at 77[K].

20. The organic electroluminescence device according to claim 2, wherein:

the compound represented by the formula (2) is a compound represented by a formula (1A) below:

(1A)

$X_1$ and $X_3$ each independently represent $CR_1$, and $R_{11}$ and $R_{22}$ have the same meanings as $R_1$ to $R_7$ in the formula (2); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (2).

21. The organic electroluminescence device according to claim 3, wherein:

the dopant material represented by the formula (1) is a compound represented by a formula (1A) below:

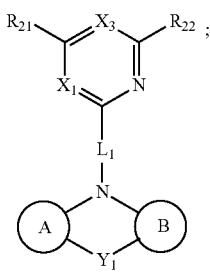

(1A)

$X_1$ and $X_3$ each independently represent $CR_1$, and $R_{21}$ and $R_{22}$ have the same meanings as $R_1$ to $R_7$ in the formula (1); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (1).

22. The organic electroluminescence device according to claim 2, wherein:

the compound represented by the formula (2) is a compound represented by a formula (1B) below:

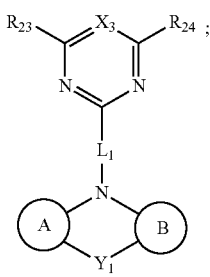

(1B)

$X_3$ represents $CR_1$, and $R_{23}$ and $R_{24}$ have the same meanings as $R_1$ to $R_7$ in the formula (2); and $R_1$, $L_1$ the cyclic structure A, the cyclic structure B and $Y_1$ respectively have the same meanings as $R_1$, $L_1$, the cyclic structure A, the cyclic structure B and $Y_1$ in the formula (2).

23. The organic electroluminescence device according to claim 3, wherein:

the dopant material represented by the formula (1) is a compound represented by a formula (1B) below:

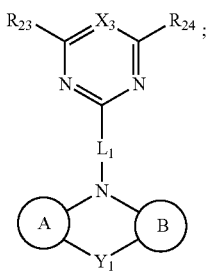

(1B)

$X_3$ represents $CR_1$, and $R_{23}$ and $R_{24}$ have the same meanings as $R_1$ to $R_7$ in the formula (1); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (1).

24. The organic electroluminescence device according to claim 2, wherein:

the compound represented by the formula (2) is a compound represented by a formula (1C) below:

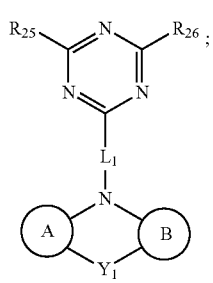

(1C)

$R_{25}$ and $R_{26}$ have the same meanings as $R_1$ to $R_7$ in the formula (2); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (2).

25. The organic electroluminescence device according to claim 3, wherein:

the dopant material represented by the formula (1) is a compound represented by a formula (1C) below:

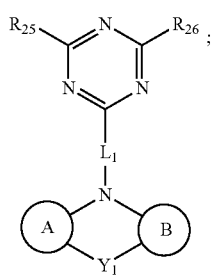

(1C)

$R_{25}$ and $R_{26}$ have the same meanings as $R_1$ to $R_7$ in the formula (1); and $R_1$, $L_1$, the cyclic structure A, the cyclic structure B and $Y_1$ respectively have the same meanings as $R_1$, $L_1$, the cyclic structure A, the cyclic structure B and $Y_1$ in the formula (1).

26. The organic electroluminescence device according to claim 2, wherein:

the compound represented by the formula (2) is a compound represented by a formula (40) below:

(40)

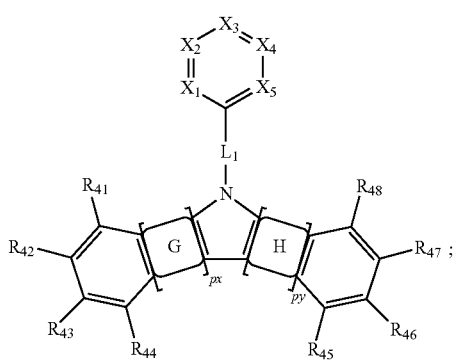

$X_1$ to $X_5$ each independently represent $CR_1$ or a nitrogen atom, at least one of $X_1$ to $X_5$ is a nitrogen atom, and substituents $R_1$ of adjacent carbon atoms are optionally bonded to each other to form a cyclic structure;

$L_1$ represents a substituted or unsubstituted divalent aromatic hydrocarbon group;

$R_1$ and $R_{41}$ to $R_{48}$ each independently represent a hydrogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms;

each of pairs of $R_{41}$ and $R_{42}$, $R_{42}$ and $R_{43}$, $R_{43}$ and $R_{44}$, $R_{45}$ and $R_{46}$, $R_{46}$ and $R_{47}$, and $R_{47}$ and $R_{48}$ are optionally mutually bonded to form a cyclic structure;

G and H each independently represent a cyclic structure represented by a formula (3g) below or a cyclic structure represented by a formula (3h) below, the cyclic structure G and the cyclic structure H each being fused to an adjacent cyclic structure at any position, with the proviso that the delayed fluorescence emitter represented by the formula (40) comprises at least a cyclic structure represented by a formula (3h); and px and py are each independently an integer of 0 to 4 and respectively represent the number of the cyclic structure G and the number of the cyclic structure H, the plural cyclic structures G being optionally mutually the same or different when px is an integer of 2 to 4, plural cyclic structures H being optionally mutually the same or different when py is an integer of 2 to 4, (3g)

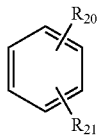

(3h)

where:

$R_{20}$ and $R_{21}$ in the formula (3g) each independently have the same meanings as $R_1$ defined above, are optionally bonded to each other to form a cyclic structure, and are each bonded to a carbon atom of a six-membered ring represented by the formula (3g):

$Z_8$ in the formula (3h) represents an oxygen atom; and at least one of combinations of substituents selected from $R_{41}$ to $R_{48}$ and $R_{20}$ to $R_{21}$ are optionally mutually bonded to each other to form a cyclic structure.

27. The organic electroluminescence device according to claim 3, wherein:

the dopant material represented by the formula (1) is a compound represented by a formula (40) below:

(40)

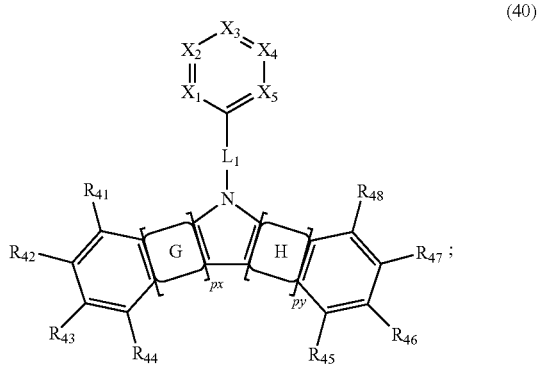

$X_1$ to $X_5$ each independently represent $CR_1$ or a nitrogen atom, at least one of $X_1$ to $X_5$ is a nitrogen atom, and substituents $R_1$ of adjacent carbon atoms are optionally bonded to each other to form a cyclic structure:

$L_1$ represents a substituted or unsubstituted divalent aromatic hydrocarbon group;

$R_1$ and $R_{41}$ to $R_{48}$ each independently represent a hydrogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms;

each of pairs of $R_{41}$ and $R_{42}$, $R_{42}$ and $R_{43}$, $R_{43}$ and $R_{44}$, $R_{45}$ and $R_{46}$, $R_{46}$ and $R_{47}$, and $R_{47}$ and $R_{48}$ are optionally mutually bonded to form a cyclic structure;

G and H each independently represent a cyclic structure represented by a formula (3g) below or a cyclic structure represented by a formula (3h) below, the cyclic structure G and the cyclic structure H each being fused to an adjacent cyclic structure at any position, with the proviso that the delayed fluorescence emitter represented by the formula (40) comprises at least a cyclic structure represented by a formula (3h); and px and py are each independently an integer of 0 to 4 and respectively represent the number of the cyclic structure G and the number of the cyclic structure H, the plural cyclic structures G being optionally mutually the same or different when px is an integer of 2 to 4, plural cyclic structures H being optionally mutually the same or different when py is an integer of 2 to 4,

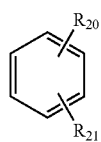
(3g)

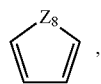
(3h)

where:
$R_{20}$ and $R_{21}$ in the formula (3g) each independently have the same meanings as $R_1$ defined above, are optionally bonded to each other to form a cyclic structure, and are each bonded to a carbon atom of a six-membered ring represented by the formula (3g);

$Z_8$ in the formula (3h) represents an oxygen atom; and at least one of combinations of substituents selected from $R_{41}$ to $R_{48}$ and $R_{20}$ to $R_{21}$ are optionally mutually bonded to each other to form a cyclic structure.

28. The organic electroluminescence device according to claim 2, wherein:
the compound represented by the formula (2) is a compound represented by a formula (6) below:

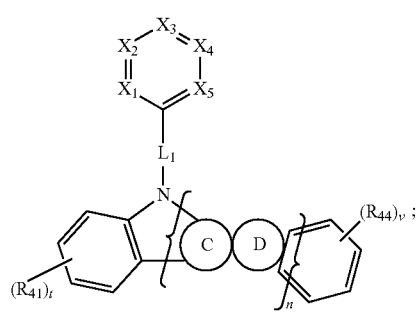
(6)

$X_1$ to $X_5$ and $L_1$ respectively have the same meanings as $X_1$ to $X_5$ and $L_1$ in the formula (2);
$R_{41}$ and $R_{44}$ each have the same meanings as $R_1$ to $R_7$ in the formula (2);
t is 4;
v is 4;
C represents a cyclic structure represented by a formula (7) below and D represents a cyclic structure represented by a formula (8) below, the cyclic structure C and the cyclic structure D each being fused to an adjacent cyclic structure at any position, with the proviso that the compound represented by the formula (6) comprises at least a cyclic structure represented by a formula (8); and
n is an integer of 1 to 4,

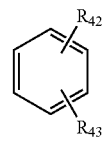
(7)

(8)

where:
$R_{42}$ and $R_{43}$ in the formula (7) each have the same meanings as $R_1$ to $R_7$ in the formula (2), and optionally form a ring when $R_{42}$ and $R_{43}$ are substituents at adjacent positions, and
$Y_2$ in the formula (8) represents an oxygen atom.

29. The organic electroluminescence device according to claim 3, wherein:
the dopant material represented by the formula (1) is a compound represented by a formula (6) below:

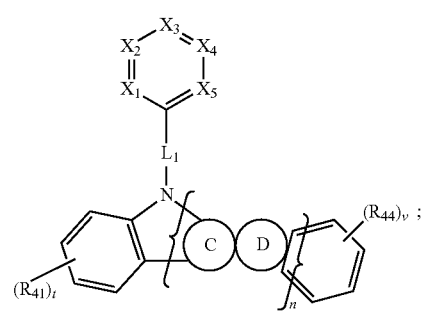
(6)

$X_1$ to $X_5$ and $L_1$ respectively have the same meanings as $X_1$ to $X_5$ and $L_1$ in the formula (1);
$R_{41}$ and $R_{44}$ each have the same meanings as $R_1$ to $R_7$ in the formula (1);
t is 4;
v is 4;
C represents a cyclic structure represented by a formula (7) below and D represents a cyclic structure represented by a formula (8) below, the cyclic structure C and the cyclic structure D each being fused to an adjacent cyclic structure at any position, with the proviso that the compound represented by the formula (6) comprises at least a cyclic structure represented by a formula (8); and
n is an integer of 1 to 4,

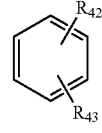
(7)

-continued (8)

where:
R$_{42}$ and R$_{43}$ in the formula (7) each independently have the same meanings as R$_1$ to R$_7$ in the formula (1), and optionally form a ring when R$_{42}$ and R$_{43}$ are substituents at adjacent positions, and
Y$_2$ in the formula (8) represents an oxygen atom.

30. The organic electroluminescence device according to claim 2, wherein L$_1$ is a divalent six-membered ring structure.

31. The organic electroluminescence device according to claim 3, wherein L$_1$ is a divalent six-membered ring structure.

32. The organic electroluminescence device according to claim 2, wherein:
L$_1$ is represented by a formula (4A) below:

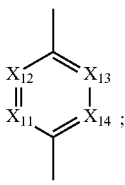

(4A)

X$_{11}$ to X$_{14}$ each independently represent CR$_{11}$; and
R$_{11}$ each independently represent the same as R$_1$ to R$_7$ in the formula (2).

33. The organic electroluminescence device according to claim 3, wherein:
L$_1$ is represented by a formula (4A) below:

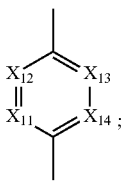

(4A)

X$_{11}$ to X$_{14}$ each independently represent CR$_{11}$; and
R$_{11}$ each independently represent the same as R$_1$ to R$_7$ in the formula (1).

34. The organic electroluminescence device according to claim 2, wherein the compound represented by the formula (2) has a difference ΔST(D1) between a singlet energy EgS(D1) and an energy gap Eg$_{77K}$(D1) at 77[K] satisfying a numerical formula (1) below:

$$\Delta ST(D1)=EgS(D1)-Eg_{77K}(D1)<0.3 \text{ [eV]} \quad \text{(Numerical Formula 1)}.$$

35. The organic electroluminescence device according to claim 3, wherein the dopant material represented by the formula (1) has a difference ΔST(D1) between a singlet energy EgS(D1) and an energy gap Eg$_{77K}$(D1) at 77[K] satisfying a numerical formula (1) below:

$$\Delta ST(D1)=EgS(D1)-Eg_{77K}(D1)<0.3 \text{ [eV]} \quad \text{(Numerical Formula 1)}.$$

36. The organic electroluminescence device according to claim 2, wherein an energy gap Eg$_{77K}$(H1) of the host material at 77[K] is larger than an energy gap Eg$_{77K}$(D1) of the compound represented by the formula (2) at 77[K].

37. The organic electroluminescence device according to claim 3, wherein an energy gap Eg$_{77K}$(H1) of the host material at 77[K] is larger than an energy gap Eg$_{77K}$(D1) of the dopant material represented by the formula (1) at 77[K].

38. The organic electroluminescence device according to claim 1, wherein the dopant material consists of the delayed fluorescence emitter represented by the formula (3).

39. The organic electroluminescence device according to claim 2, wherein the dopant material consists of the compound represented by the formula (2).

40. The organic electroluminescence device according to claim 3, wherein the dopant material consists of the compound represented by the formula (1).

41. The organic electroluminescence device according to claim 1, wherein a lowest singlet state S1$_H$ of the host material is greater than a lowest singlet state S1$_D$ of the dopant material.

42. The organic electroluminescence device according to claim 2, wherein a lowest singlet state S1$_H$ of the host material is greater than a lowest singlet state S1$_D$ of the dopant material.

43. The organic electroluminescence device according to claim 3, wherein a lowest singlet state S1$_H$ of the host material is greater than a lowest singlet state S1$_D$ of the dopant material.

44. The organic electroluminescence device according to claim 1, wherein the dopant material comprises a delayed fluorescence emitter represented by formula (6E) below:

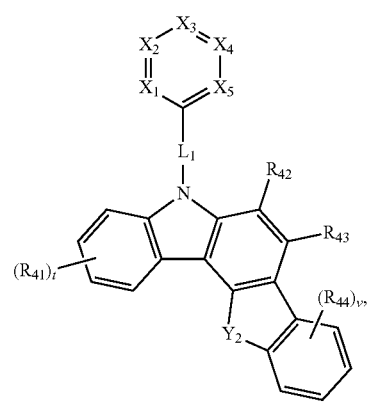

(6E)

wherein:
X$_1$ to X$_5$ and L$_1$ represent the same as X$_1$ to X$_5$ and L$_1$ in the formula (3), respectively;
R$_{41}$ to R$_{44}$ each independently represent the same as R$_1$ to R$_7$ in the formula (3);
t is 4;
v is 4;
R$_{41}$ and R$_{44}$ are each bonded to a carbon atom of a six-membered ring; and
Y$_2$ is an oxygen atom.

45. The organic electroluminescence device according to claim 2, wherein the dopant material comprises a compound represented by formula (6E) below:

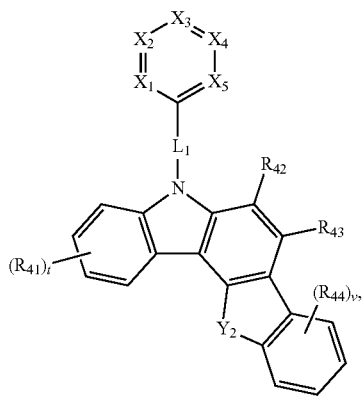

wherein:
$X_1$ to $X_5$ and $L_1$ represent the same as $X_1$ to $X_5$ and $L_1$ in the formula (2), respectively;
$R_{41}$ to $R_{44}$ each independently represent the same as $R_1$ to $R_7$ in the formula (2);
t is 4;
v is 4;
$R_{41}$ and $R_{44}$ are each bonded to a carbon atom of a six-membered ring; and
$Y_2$ is an oxygen atom.

46. The organic electroluminescence device according to claim 3, wherein the dopant material comprises a compound represented by formula (6E) below:

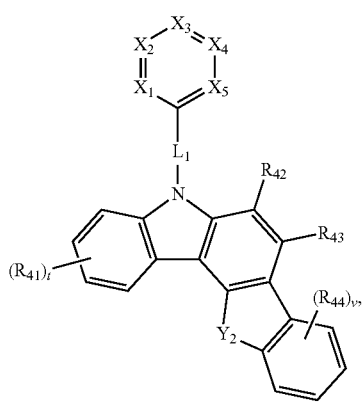

wherein:
$X_1$ to $X_5$ and $L_1$ represent the same as $X_1$ to $X_5$ and $L_1$ in the formula (1), respectively;
$R_{41}$ to $R_{44}$ each independently represent the same as $R_1$ to $R_7$ in the formula (1);
t is 4;
v is 4;
$R_{41}$ and $R_{44}$ are each bonded to a carbon atom of a six-membered ring; and
$Y_2$ is an oxygen atom.

47. An organic electroluminescence device, comprising:
an anode;
a cathode; and
a single- or multi-layer organic layer interposed between the anode and the cathode, the organic layer comprising a light-emitting layer comprising a delayed fluorescence emitter represented by a formula (3) below:

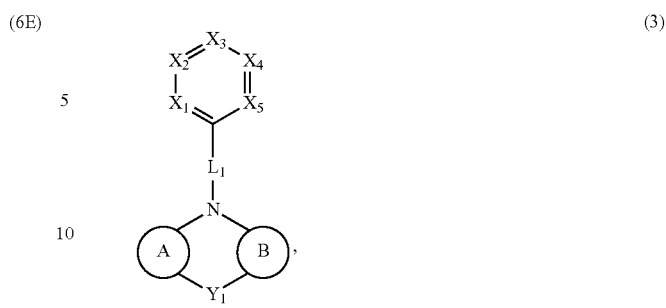

wherein:
$X_1$ to $X_5$ each independently represent $CR_1$ or a nitrogen atom and at least one of $X_1$ to $X_5$ is a nitrogen atom;
$L_1$ represents a substituted or unsubstituted divalent aromatic hydrocarbon group;
A and B are each independently a cyclic structure, at least one of the cyclic structure A and the cyclic structure B having a plurality of substituents, adjacent substituents forming a ring comprising a five-membered ring, such that the five-membered ring comprises an oxygen atom;
$Y_1$ is a single bond, $CR_2R_3$, $SiR_4R_5$ or $GeR_6R_7$; and
$R_1$ to $R_7$ each independently represent a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, or a substituted or unsubstituted arylthio group having 6 to 30 ring carbon atoms.

48. The organic electroluminescence device according to claim 47, wherein the dopant material comprises a delayed fluorescence emitter represented by formula (6E) below:

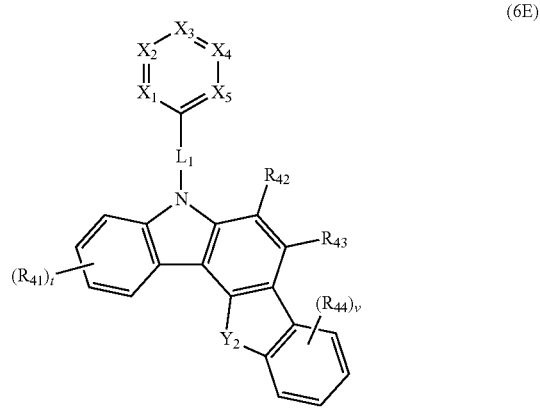

wherein:

$X_1$ to $X_5$ and $L_1$ represent the same as $X_1$ to $X_5$ and $L_1$ in the formula (3), respectively;

$R_{41}$ to $R_{44}$ each independently represent the same as $R_1$ to $R_7$ in the formula (3);

t is 4;

v is 4;

$R_{41}$ and $R_{44}$ are each bonded to a carbon atom of a six-membered ring; and $Y_2$ is an oxygen atom.

49. The organic electroluminescence device according to claim 1, wherein the dopant material comprises a delayed fluorescence emitter represented by any one of formulae (6A) to (6F) below:

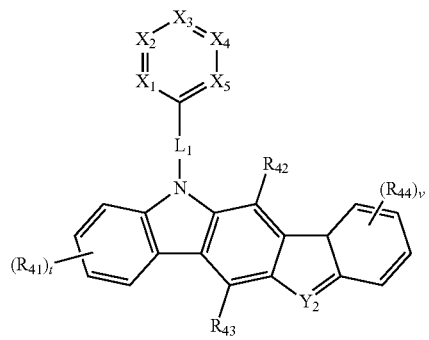
(6A)

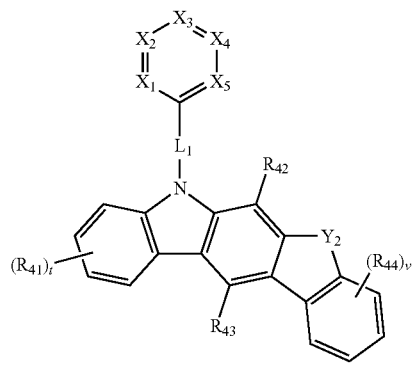
(6B)

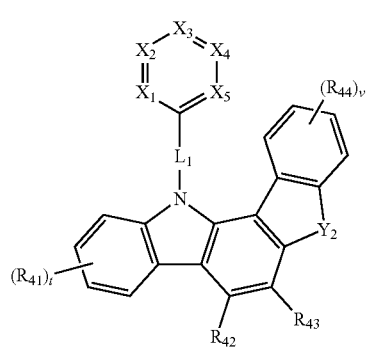
(6C)

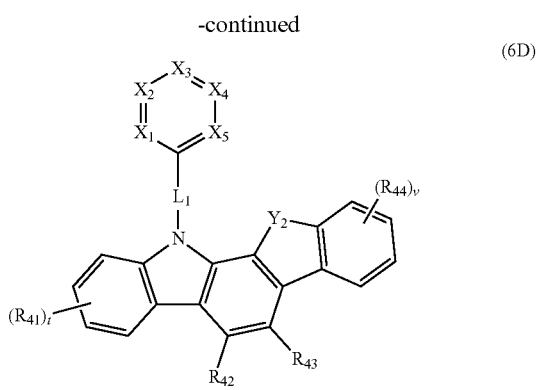
(6D)

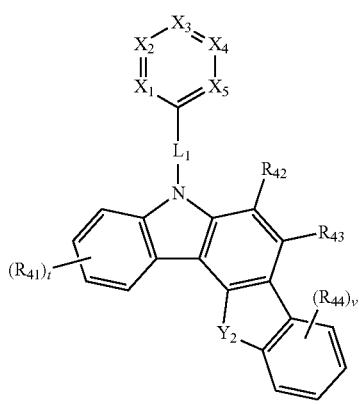
(6E)

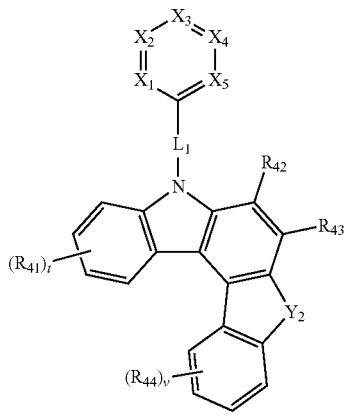
(6F)

wherein:

$X_1$ to $X_5$ and $L_1$ represent the same as $X_1$ to $X_5$ and $L_1$ in the formula (3), respectively;

$R_{41}$ to $R_{44}$ each independently represent the same as $R_1$ to $R_7$ in the formula (3);

t is 4;

v is 4;

$R_{41}$ and $R_{44}$ are each bonded to a carbon atom of a six-membered ring; and $Y_2$ is an oxygen atom.

50. The organic electroluminescence device according to claim 47, wherein the dopant material comprises a delayed fluorescence emitter represented by a formula (6) below:

(6)

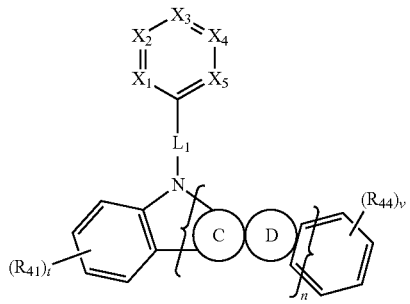

wherein:
$X_1$ to $X_5$ and $L_1$ represent the same as $X_1$ to $X_5$ and $L_1$ in the formula (3), respectively;
$R_{41}$ and $R_{44}$ each independently represent the same as $R_1$ to $R_7$ in the formula (3);
t is 4;
v is 4;
C represents a cyclic structure represented by a formula (7) below and D represents a cyclic structure represented by a formula (8) below, the cyclic structure C and the cyclic structure D each being fused to an adjacent cyclic structure at any position, with the proviso that the delayed fluorescence emitter represented by the formula (6) comprises at least the cyclic structure represented by the formula (8); and
n is an integer of 1 to 4, (7)

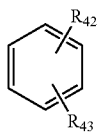

(8)

wherein:
$R_{42}$ and $R_{43}$ in the formula (7) each independently represent the same as $R_1$ to $R_7$ in the formula (3), and optionally form a ring when $R_{42}$ and $R_{43}$ are substituents at adjacent positions; and
$Y_2$ in the formula (8) represents an oxygen atom.

51. The organic electroluminescence device according to claim 47, wherein the dopant material comprises a delayed fluorescence emitter represented by any one of formulae (6A) to (6F) below:

(6A)

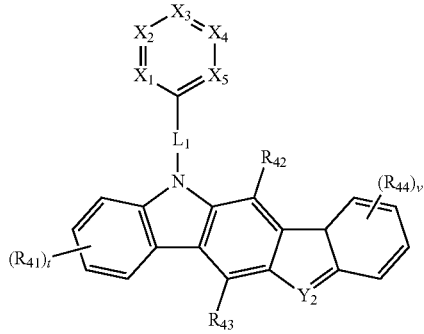

(6B)

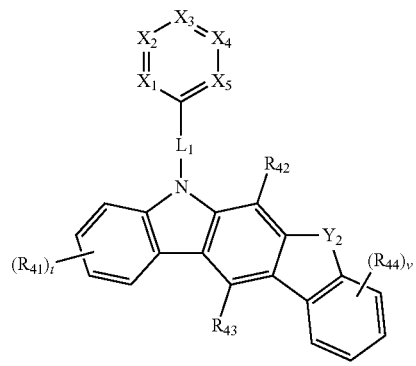

(6C)

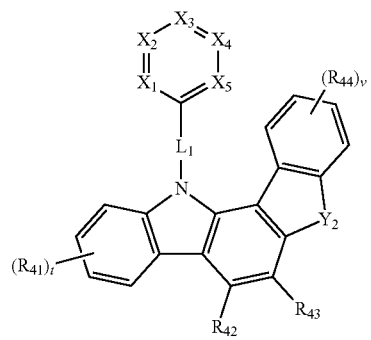

(6D)

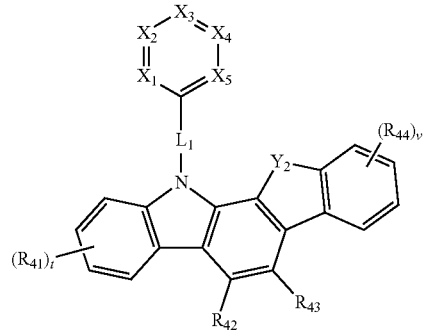

(6E)

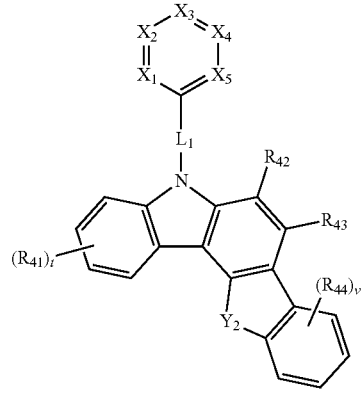

-continued
(6F)
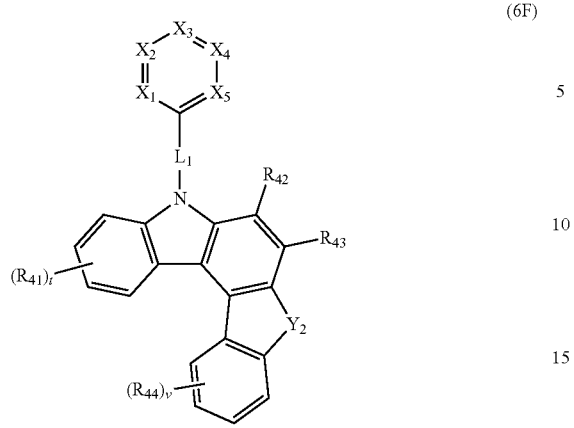
wherein:
$X_1$ to $X_5$ and $L_1$ represent the same as $X_1$ to $X_5$ and $L_1$ in the formula (3), respectively;
$R_{41}$ to $R_{44}$ each independently represent the same as $R_1$ to $R_7$ in the formula (3);
t is 4;
v is 4;
$R_{41}$ and $R_{44}$ are each bonded to a carbon atom of a six-membered ring; and
$Y_2$ is an oxygen atom.
* * * * *